(12) United States Patent
Masuda et al.

(10) Patent No.: US 12,058,930 B2
(45) Date of Patent: Aug. 6, 2024

(54) ORGANIC ELECTROLUMINESCENCE DEVICE AND ELECTRONIC APPARATUS

(71) Applicant: IDEMITSU KOSAN CO., LTD., Tokyo (JP)

(72) Inventors: Tetsuya Masuda, Sodegaura (JP); Yuki Nakano, Sodegaura (JP); Takushi Shiomi, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 727 days.

(21) Appl. No.: 16/971,244

(22) PCT Filed: Feb. 20, 2019

(86) PCT No.: PCT/JP2019/006321
§ 371 (c)(1),
(2) Date: Aug. 19, 2020

(87) PCT Pub. No.: WO2019/163824
PCT Pub. Date: Aug. 29, 2019

(65) Prior Publication Data
US 2020/0388767 A1 Dec. 10, 2020

(30) Foreign Application Priority Data
Feb. 20, 2018 (JP) .................. 2018-027694

(51) Int. Cl.
*H10K 85/60* (2023.01)
*C09K 11/06* (2006.01)
(Continued)

(52) U.S. Cl.
CPC ............ *H10K 85/654* (2023.02); *C09K 11/06* (2013.01); *H10K 85/6574* (2023.02);
(Continued)

(58) Field of Classification Search
CPC .................................................. H10K 85/654
See application file for complete search history.

(56) References Cited

U.S. PATENT DOCUMENTS

2007/0247063 A1 10/2007 Murase et al.
2012/0126221 A1* 5/2012 Kitamura ............ H10K 85/654
257/E51.026
(Continued)

FOREIGN PATENT DOCUMENTS

CN 101969103 A 2/2011
CN 102850329 A 1/2013
(Continued)

OTHER PUBLICATIONS

International Preliminary Search Report on Patentability and Written Opinion dated Aug. 27, 2020 for corresponding International Patent Application No. PCT/JP2019/006321.
(Continued)

*Primary Examiner* — Sean M DeGuire
(74) *Attorney, Agent, or Firm* — Foley & Lardner LLP

(57) ABSTRACT

An organic electroluminescence device, comprising: an anode, an emitting layer, a first electron-transporting layer, a second electron-transporting layer and a cathode in this order, wherein the second electron-transporting layer comprises a compound represented by the following formula (1), and the emitting layer comprises a compound represented by the following formula (10).

(Continued)

-continued

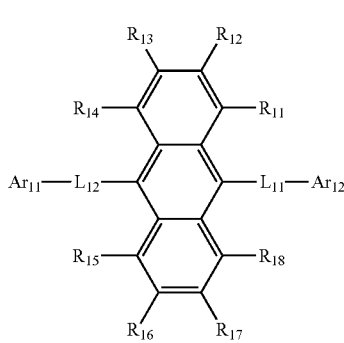
(10)

38 Claims, 1 Drawing Sheet

(51) Int. Cl.
   *H10K 50/16* (2023.01)
   *H10K 101/00* (2023.01)
(52) U.S. Cl.
   CPC ............... *C09K 2211/1007* (2013.01); *C09K 2211/1011* (2013.01); *C09K 2211/1018* (2013.01); *H10K 50/166* (2023.02); *H10K 2101/27* (2023.02)

(56) References Cited

U.S. PATENT DOCUMENTS

| 2012/0138907 | A1* | 6/2012 | Murase | H10K 85/6572 257/E51.026 |
|---|---|---|---|---|
| 2014/0001456 | A1 | 1/2014 | Mizutani et al. | |
| 2014/0073784 | A1 | 3/2014 | Mizutani et al. | |
| 2015/0025239 | A1 | 1/2015 | Ahn et al. | |
| 2015/0171340 | A1 | 6/2015 | Lee et al. | |
| 2016/0020405 | A1 | 1/2016 | Ito et al. | |
| 2016/0111655 | A1 | 4/2016 | Mizutani et al. | |
| 2016/0197285 | A1 | 7/2016 | Zeng et al. | |
| 2016/0197289 | A1 | 7/2016 | Sado et al. | |
| 2016/0225992 | A1 | 8/2016 | Ito et al. | |
| 2016/0276596 | A1* | 9/2016 | Jang | H10K 2101/40 |
| 2016/0329502 | A1 | 11/2016 | Dyatkin et al. | |
| 2017/0018723 | A1 | 1/2017 | Cha et al. | |
| 2017/0104167 | A1 | 4/2017 | Sim et al. | |
| 2017/0250353 | A1 | 8/2017 | Koenen et al. | |
| 2017/0279055 | A1* | 9/2017 | Jang | H10K 85/6572 |
| 2018/0013071 | A1 | 1/2018 | Cha et al. | |
| 2018/0102485 | A1 | 4/2018 | Mizutani et al. | |
| 2018/0331299 | A1 | 11/2018 | Mizutani et al. | |
| 2018/0337348 | A1 | 11/2018 | Jung et al. | |
| 2019/0348615 | A1 | 11/2019 | Mizutani et al. | |

FOREIGN PATENT DOCUMENTS

| CN | 104245686 A | 12/2014 |
|---|---|---|
| CN | 104812750 A | 7/2015 |
| CN | 106573947 A | 4/2017 |
| CN | 106946859 A | 7/2017 |
| CN | 107021926 A | 8/2017 |
| CN | 107056783 A | 8/2017 |
| CN | 108383842 | 8/2018 |
| EP | 1 962 354 A1 | 8/2008 |
| JP | 2005-314239 A | 11/2005 |
| JP | 2015-512875 A | 4/2015 |
| JP | 2017-529320 A | 10/2017 |
| KR | 10-2011-0079401 A | 7/2011 |
| KR | 10-2014-0046541 A | 4/2014 |
| KR | 10-2014-0101661 A | 8/2014 |
| KR | 10-2015-0070860 A | 6/2015 |
| KR | 10-2015-0099750 A | 9/2015 |
| KR | 10-2016-0006633 A | 1/2016 |
| KR | 10-2017-0134264 A | 12/2017 |
| KR | 10-2018-0128181 A | 12/2018 |
| WO | WO-2005/113531 A1 | 12/2005 |
| WO | WO-2007/069569 A1 | 6/2007 |
| WO | WO-2013/077352 A1 | 5/2013 |
| WO | WO-2014/054912 A1 | 4/2014 |
| WO | WO-2016/126022 A1 | 8/2016 |
| WO | WO-2017/111036 A1 | 6/2017 |
| WO | WO-2018/103749 A1 | 6/2018 |
| WO | WO-2018/139662 A1 | 8/2018 |

OTHER PUBLICATIONS

International Preliminary Search Report on Patentability and Written Opinion dated Aug. 27, 2020 for corresponding International Patent Application No. PCT/JP2019/006322.
International Preliminary Search Report on Patentability and Written Opinion dated Aug. 27, 2020 for corresponding International Patent Application No. PCT/JP2019/006323.
International Search Report dated May 21, 2019 for corresponding International Patent Application No. PCT/JP2019/006321.
International Search Report dated May 21, 2019 for corresponding International Patent Application No. PCT/JP2019/006322.
International Search Report dated May 28, 2019 for corresponding International Patent Application No. PCT/JP2019/006323.
Office Action issued in corresponding Chinese Patent Application No. 201980014408.5, dated Apr. 28, 2023.
Office Action issued in corresponding Chinese Patent Application No. 201980014508.8 dated Dec. 7, 2023 (9 pages).
Office Action issued in corresponding Korean Patent Application No. 10-2020-7022710 dated Mar. 26, 2024 (19 pages).
Office Action issued in corresponding Korean Patent Application No. 10-2020-7022675 dated Apr. 19, 2024 (16 pages).

* cited by examiner

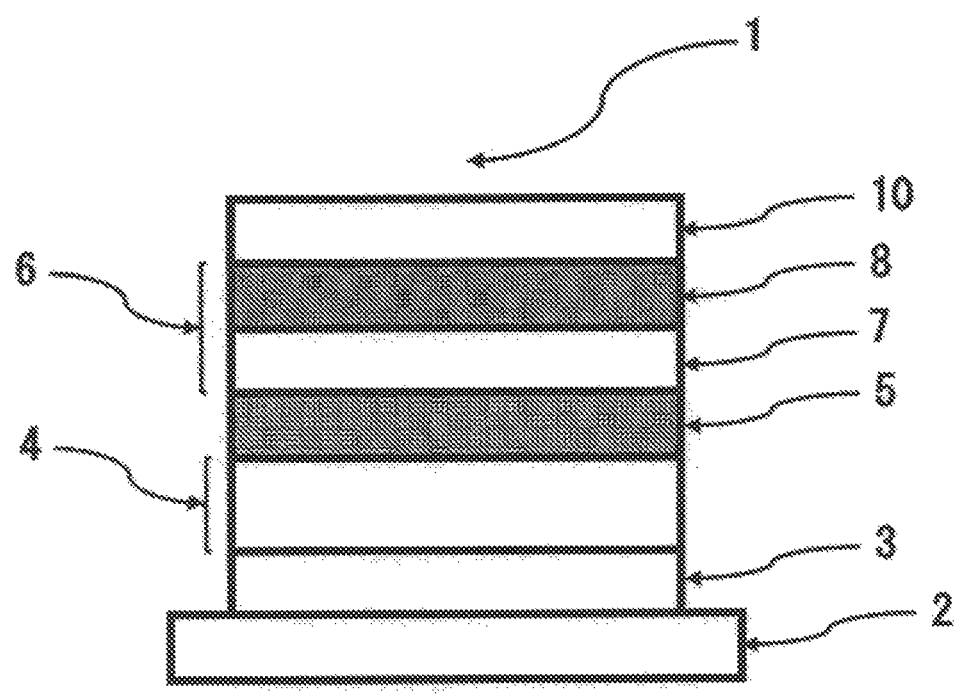

ORGANIC ELECTROLUMINESCENCE DEVICE AND ELECTRONIC APPARATUS

TECHNICAL FIELD

The invention relates to an organic electroluminescence device and an electronic apparatus.

BACKGROUND ART

When voltage is applied to an organic electroluminescence device (hereinafter, referred to as an organic EL device in several cases), holes and electrons are injected into an emitting layer from an anode and a cathode, respectively. Then, thus injected holes and electrons are recombined in the emitting layer, and excitons are formed therein.

The organic EL device includes the emitting layer between the anode and the cathode. Further, the organic EL device has a stacked structure including an organic layer such as a hole-injecting layer, a hole-transporting layer, an electron-injecting layer, and an electron-transporting layer in several cases.

Documents disclosing such an organic EL device include, for example, Patent Documents 1 to 4 below.

RELATED ART DOCUMENTS

Patent Documents

Patent Document 1: WO2005/113531
Patent Document 2: US2016/0020405
Patent Document 3: WO2016/126022
Patent Document 4: US2017/0018723

SUMMARY OF THE INVENTION

An object of the invention is to provide a high performance organic electroluminescence device. In particular, it is an object of the invention to provide an organic electroluminescent device having high luminous efficiency, an organic electroluminescent device having long life, or an organic electroluminescent device having high luminous efficiency and long life. Moreover, an object of the invention is providing an electronic device using such an organic electroluminescent device.

According to the invention, the following organic EL device and electric apparatus can be provided.

1. An organic electroluminescence device, comprising:
    an anode, an emitting layer, a first electron-transporting layer, a second electron-transporting layer and a cathode in this order, wherein
    the second electron-transporting layer comprises a compound represented by the following formula (1):

$$\text{Ar}_1 \diagdown \underset{X_2 \diagup\!\!\!\diagdown X_3}{\overset{X_1 \diagup\!\!\!\diagdown L_1}{\diagup\!\!\!\diagdown}} \diagdown \text{FA} \qquad (1)$$
$$|$$
$$\text{Ar}_2$$

wherein in the formula (1),
FA is a substituted or unsubstituted fused aryl group including 13 to 50 carbon atoms that form a ring (hereinafter referred to as "ring carbon atoms"), which is formed by condensing three or more hydrocarbon rings;
$L_1$ is a single bond, or selected from the group consisting of
    a substituted or unsubstituted phenylene group,
    a substituted or unsubstituted biphenylene group,
    a substituted or unsubstituted terphenylene group,
    a substituted or unsubstituted quater phenylene group,
    an arylene group which is a substituted or unsubstituted condensed ring including 10 to 30 ring carbon atoms, and
    a group that 1 to 3 substituted or unsubstituted phenylene groups and 1 to 3 substituted or unsubstituted arylene groups which is a condensed ring including 10 to 30 ring carbon atoms are linked via a single bond;
$Ar_1$ and $Ar_2$ are independently a substituted or unsubstituted aryl group including 6 to 12 ring carbon atoms, or a substituted or unsubstituted monovalent heterocyclic group including 5 to 30 atoms that form a ring (hereinafter referred to as "ring atoms");
$X_1$ to $X_3$ are independently N or $CR_1$;
provided that two or more of $X_1$ to $X_3$ are N; R does not form a ring by combining with adjacent $L_1$, $Ar_1$ or $Ar_2$;
$R_1$ is a hydrogen atom, a halogen atom, a substituted or unsubstituted alkyl group including 1 to 20 carbon atoms, a substituted or unsubstituted cycloalkyl group including 3 to 20 carbon atoms, a substituted or unsubstituted aryl group including 6 to 30 ring carbon atoms, or a substituted or unsubstituted monovalent heterocyclic group including 5 to 30 ring atoms:
and, the emitting layer comprises a compound represented by the following formula (10):

$$(10)$$

[Chemical structure of formula (10): a tetracene (naphthacene) core with substituents $R_{11}$ through $R_{18}$ at the peripheral positions, and $Ar_{11}-L_{12}-$ and $-L_{11}-Ar_{12}$ groups attached at the central (5 and 12) positions]

wherein in the formula (10),
$R_{11}$ to $R_{18}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms, a substituted or unsubstituted aralkyl group including 7 to 50 carbon atoms,
—Si($R_{101}$)($R_{102}$)($R_{103}$),
—C(=O)$R_{104}$,
—COO$R_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms;

$R_{101}$ to $R_{107}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms;

when two or more of each of $R_{101}$ to $R_{107}$ are present, the two or more of each of $R_{101}$ to $R_{107}$ may be the same or different;

provided that at least one of $Ar_{11}$ and $Ar_{12}$ is a monovalent group represented by the following formula (11);

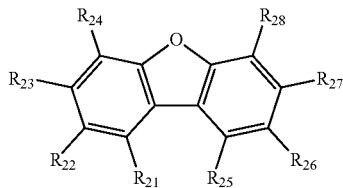

(11)

wherein in the formula (11),
one of $R_{21}$ to $R_{28}$ is bonded with $L_1$ or $L_{12}$; and
$R_{21}$ to $R_{28}$ which do not bonded with $L_1$ or $L_{12}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{101}$)($R_{102}$)($R_{103}$),
—C(=O)$R_{104}$,
—COO$R_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms;

$R_{101}$ to $R_{107}$ are as defined above:
$Ar_{11}$ or $Ar_{12}$, which is not the monovalent group represented by the formula (11), is an unsubstituted aryl group including 6 to 50 ring carbon atoms, an aryl group including 6 to 50 ring carbon atoms, which is substituted with an unsubstituted alkyl group including 1 to 50 carbon atoms, or an aryl group including 6 to 50 ring carbon atoms, which is substituted with an unsubstituted aryl group including 6 to 50 ring carbon atoms;

$L_{11}$ and $L_{12}$ are independently a single bond, a substituted or unsubstituted alkylene group including 1 to 50 carbon atoms, a substituted or unsubstituted arylene group including 6 to 50 ring carbon atoms, or a substituted or unsubstituted divalent heterocyclic group including 5 to 50 ring atoms.

2. An electronic apparatus provided with the organic electroluminescence device according to the above 1.

According to the invention, high performance organic electroluminescence device is provided. In particular, an organic electroluminescent device having high luminous efficiency, an organic electroluminescent device having long life, or an organic electroluminescent device having high luminous efficiency and long life is provided. Moreover, According to the invention, an electronic device using such an organic electroluminescent device is provided.

BRIEF DESCRIPTION OF THE DRAWINGS

FIG. 1 is a diagram showing a schematic configuration of the first embodiment of an organic EL device of the invention.

MODE FOR CARRYING OUT THE INVENTION

Definition

In the present specification, a hydrogen atom means an atom including isotopes different in the number of neutrons, namely, a protium, a deuterium and a tritium.

In the present specification, a term "ring carbon atoms" represents the number of carbon atoms among atoms forming a subject ring itself of a compound having a structure in which atoms are bonded in a ring form (for example, a monocyclic compound, a fused ring compound, a cross-linked compound, a carbocyclic compound or a heterocyclic compound). When the subject ring is substituted by a substituent, the carbon contained in the substituent is not included in the number of ring carbon atoms. The same shall apply to the "ring carbon atoms" described below, unless otherwise noted. For example, a benzene ring has 6 ring carbon atoms, a naphthalene ring has 10 ring carbon atoms, a pyridine ring has 5 ring carbon atoms, and a furan ring has 4 ring carbon atoms. Further, for example, a 9,9-diphenylfluorenyl group has 13 ring carbon atoms, and a 9,9'-spirobifluorenyl group has 25 ring carbon atoms.

Further, when the benzene ring or the naphthalene ring is substituted by an alkyl group as a substituent, for example, the number of carbon atoms of the alkyl group is not included in the ring carbon atoms.

In the present specification, a term "ring atoms" represents the number of atoms forming a subject ring itself of a compound having a structure in which atoms are bonded in a ring form (for example, a monocycle, a fused ring and a ring assembly) (for example, a monocyclic compound, a fused ring compound, a cross-linked compound, a carbocyclic compound or a heterocyclic compound). The atoms that do not form the ring (e.g., a hydrogen atom that terminates bonds which are not used to form the ring) or the atoms contained in a substituent where the ring is substituted by the substituent is not included in the number of ring atom. The same shall apply to the "ring atoms" described below, unless otherwise noted. For example, a pyridine ring has 6 ring atoms, a quinazoline ring has 10 ring atoms, and a furan ring has 5 ring atoms. A hydrogen atom bonded with a carbon atom of the pyridine ring or the quinazoline ring or an atom forming the substituent is not included in the number of the ring atoms.

In the present specification, a term "XX to YY carbon atoms" in an expression of "substituted or unsubstituted ZZ group including XX to YY carbon atoms" represents the number of carbon atoms when the ZZ group is unsubstituted. The number of carbon atoms of a substituent when the ZZ group is substituted is not included. Here, "YY" is larger than "XX", and "XX" and "YY" each mean an integer of 1 or more.

In the present specification, a term "XX to YY atoms" in an expression of "substituted or unsubstituted ZZ group including XX to YY atoms" represents the number of atoms when the ZZ group is unsubstituted. The number of atoms of a substituent when the group is substituted is not included. Here, "YY" is larger than "XX", and "XX" and "YY" each mean an integer of 1 or more.

A term "unsubstituted" in the case of "substituted or unsubstituted ZZ group" means that the ZZ group is not substituted by a substituent, and a hydrogen atom is bonded therewith. Alternatively, a term "substituted" in the case of "substituted or unsubstituted ZZ group" means that one or more hydrogen atoms in the ZZ group are substituted by a substituent. Similarly, a term "substituted" in the case of "BB group substituted by an AA group" means that one or more hydrogen atoms in the BB group are substituted by the AA group.

Hereinafter, the substituent described herein will be described.

The number of the ring carbon atoms of the "unsubstituted aryl group" described herein is 6 to 50, preferably 6 to 30, and more preferably 6 to 18, unless otherwise specified.

The number of the ring carbon atoms of the "unsubstituted heterocyclic group" described herein is 5 to 50, preferably 5 to 30, and more preferably 5 to 18, unless otherwise specified.

The number of the carbon atoms of the "unsubstituted alkyl group" described herein is 1 to 50, preferably 1 to 20, and more preferably 1 to 6, unless otherwise specified.

The number of the carbon atoms of the "unsubstituted alkenyl group" described herein is 2 to 50, preferably 2 to 20, and more preferably 2 to 6, unless otherwise specified.

The number of the carbon atoms of the "unsubstituted alkynyl group" described herein is 2 to 50, preferably 2 to 20, and more preferably 2 to 6, unless otherwise specified.

The number of the ring carbon atoms of the "unsubstituted cycloalkyl group" described herein is 3 to 50, preferably 3 to 20, and more preferably 3 to 6, unless otherwise specified.

The number of the ring carbon atoms of the "unsubstituted arylene group" described herein is 6 to 50, preferably 6 to 30, and more preferably 6 to 18, unless otherwise specified.

The number of the ring atoms of the "unsubstituted divalent heterocyclic group" described herein is 5 to 50, preferably 5 to 30, and more preferably 5 to 18, unless otherwise specified.

The number of the carbon atoms of the "unsubstituted alkylene group" described herein is 1 to 50, preferably 1 to 20, and more preferably 1 to 6, unless otherwise specified.

Specific examples (specific example group G1) of the "substituted or unsubstituted aryl group" described herein include an unsubstituted aryl group and a substituted aryl group described below. (Here, a term "unsubstituted aryl group" refers to a case where the "substituted or unsubstituted aryl group" is the "unsubstituted aryl group," and a term "substituted aryl group" refers to a case where the "substituted or unsubstituted aryl group" is the "substituted aryl group". Hereinafter, a case of merely "aryl group" includes both the "unsubstituted aryl group" and the "substituted aryl group".

The "substituted aryl group" refers to a case where the "unsubstituted aryl group" has a substituent, and specific examples thereof include a group in which the "unsubstituted aryl group" has the substituent, and a substituted aryl group described below. It should be noted that examples of the "unsubstituted aryl group" and examples of the "substituted aryl group" listed herein are only one example, and the "substituted aryl group" described herein also includes a group in which a group in which "unsubstituted aryl group" has a substituent or the like further has a substituent, and a group in which "substituted aryl group" further has a substituent.

An unsubstituted aryl group:
a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranethenyl group,
a benzofluoranethenyl group, and
a perylenyl group.
A substituted aryl group:
an o-tolyl group,
a m-tolyl group,
a p-tolyl group,
a p-xylyl group,
a m-xylyl group, an o-xylyl group,
a p-isopropyl phenyl group,
a m-isopropyl phenyl group,
an o-isopropyl phenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group
a 9,9-di(4-methylphenyl)fluorenyl group,
a 9,9-di(4-isopropylphenyl)fluorenyl group,
a 9,9-di(4-t-butylphenyl)fluorenyl group,
a cyanophenyl group,
a triphenylsilylphenyl group,
a trimethylsilylphenyl group,
a phenylnaphthyl group, and
a naphthylphenyl group.

The "heterocyclic group" described herein is a ring group having at least one hetero atom in the ring atom. Specific examples of the hetero atom include a nitrogen atom, an oxygen atom, a sulfur atom, a silicon atom, a phosphorus atom and a boron atom.

The "heterocyclic group" described herein may be a monocyclic group, or a fused ring group.

The "heterocyclic group" described herein may be an aromatic heterocyclic group, or an aliphatic heterocyclic group.

Specific examples (specific example group G2) of the "substituted or unsubstituted heterocyclic group" include an unsubstituted heterocyclic group and a substituted heterocyclic group described below. (Here, the unsubstituted heterocyclic group refers to a case where the "substituted or unsubstituted heterocyclic group" is the "unsubstituted heterocyclic group," and the substituted heterocyclic group refers to a case where the "substituted or unsubstituted heterocyclic group" is the "substituted heterocyclic group". Hereinafter, the case of merely "heterocyclic group" includes both the "unsubstituted heterocyclic group" and the "substituted heterocyclic group".

The "substituted heterocyclic group" refers to a case where the "unsubstituted heterocyclic group" has a substituent, and specific examples thereof include a group in which the "unsubstituted heterocyclic group" has a substituent, and a substituted heterocyclic group described below. It should be noted that examples of the "unsubstituted heterocyclic group" and examples of the "substituted heterocyclic group" listed herein are merely one example, and the "substituted heterocyclic group" described herein also includes a group in which "unsubstituted heterocyclic group" which has a substituent or the like further has a substituent, and a group in which "substituted heterocyclic group" further has a substituent.

An unsubstituted heterocyclic group having a nitrogen atom:
  a pyrrolyl group,
  an imidazolyl group,
  a pyrazolyl group,
  a triazolyl group,
  a tetrazolyl group,
  an oxazolyl group,
  an isoxazolyl group,
  an oxadiazolyl group,
  a thiazolyl group,
  an isothiazolyl group,
  a thiadiazolyl group,
  a pyridyl group,
  a pyridazinyl group,
  a pyrimidinyl group,
  a pyrazinyl group,
  a triazinyl group,
  an indolyl group,
  an isoindolyl group,
  an indolizinyl group,
  a quinolizinyl group,
  a quinolyl group,
  an isoquinolyl group,
  a cinnolyl group,
  a phthalazinyl group,
  a quinazolinyl group,
  a quinoxalinyl group,
  a benzimidazolyl group,
  an indazolyl group,
  a phenanthrolinyl group,
  a phenanthridinyl group
  an acridinyl group,
  a phenazinyl group,
  a carbazolyl group,
  a benzocarbazolyl group,
  a morpholino group,
  a phenoxazinyl group,
  a phenothiazinyl group,
  an azacarbazolyl group, and
  a diazacarbazolyl group.

An unsubstituted heterocyclic group having an oxygen atom:
  a furyl group,
  an oxazolyl group,
  an isoxazolyl group,
  an oxadiazolyl group,
  a xanthenyl group,
  a benzofuranyl group,
  an isobenzofuranyl group,
  a dibenzofuranyl group,
  a naphthobenzofuranyl group,
  a benzooxazolyl group,
  a benzisoxazolyl group,
  a phenoxazinyl group,
  a morpholino group,
  a dinaphthofuranyl group,
  an azadibenzofuranyl group,
  a diazadibenzofuranyl group,
  an azanaphthobenzofuranylgroup, and
  a diazanaphthobenzofuranyl group.

An unsubstituted heterocyclic group having a sulfur atom:
  a thienyl group,
  a thiazolyl group,
  an isothiazolyl group,
  a thiadiazolyl group,
  a benzothiophenyl group,
  an isobenzothiophenyl group,
  a dibenzothiophenyl group,
  a naphthobenzothiophenyl group,
  a benzothiazolyl group,
  a benzisothiazolyl group,
  a phenothiazinyl group,
  a dinaphthothiophenyl group,
  an azadibenzothiophenyl group,
  a diazadibenzothiophenyl group,
  an azanaphthobenzothiophenyl group, and
  a diazanaphthobenzothiophenyl group.

A substituted heterocyclic group having a nitrogen atom:
  a (9-phenyl)carbazolyl group,
  a (9-biphenylyl)carbazolyl group, a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

A substituted heterocyclic group having an oxygen atom:
a phenyldibenzofuranyl group,
a methyldibenzofuranyl group,
a t-butyldibenzofuranyl group, and
a monovalent residue of spiro[9H-xanthene-9,9'-[9H]fluorene].

A substituted heterocyclic group having a sulfur atom:
a phenyldibenzothiophenyl group,
a methyldibenzothiophenyl group,
a t-butyldibenzothiophenyl group, and
a monovalent residue of spiro[9H-thioxantene-9,9'-[9H]fluorene].

A monovalent group derived from the following unsubstituted heterocyclic ring containing at least one of a nitrogen atom, an oxygen atom and a sulfur atom, and a group in which a monovalent group derived from the following unsubstituted heterocyclic ring has a substituent:

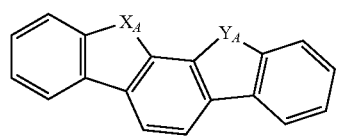

(XY-1)

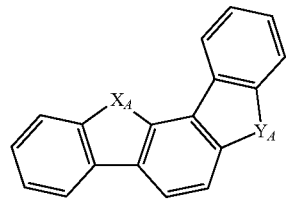

(XY-2)

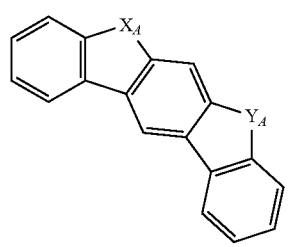

(XY-3)

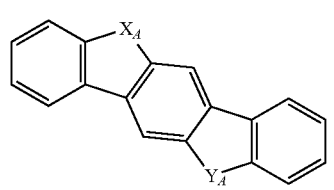

(XY-4)

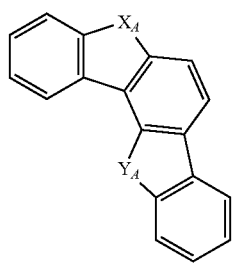

(XY-5)

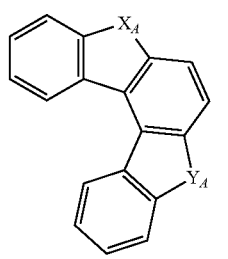

(XY-6)

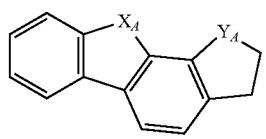

(XY-7)

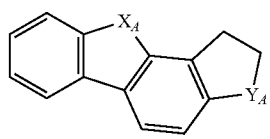

(XY-8)

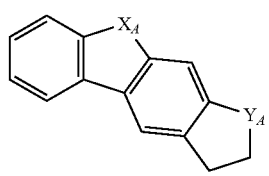

(XY-9)

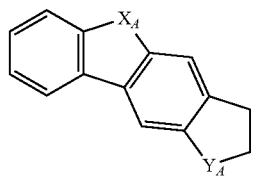

(XY-10)

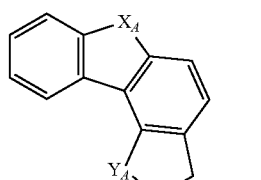

(XY-11)

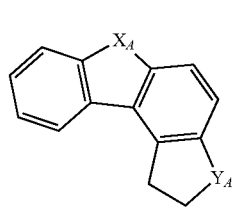

(XY-12)

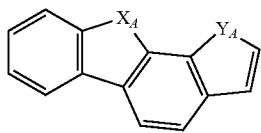
(XY-13)

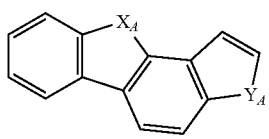
(XY-14)

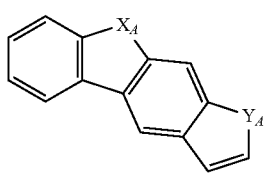
(XY-15)

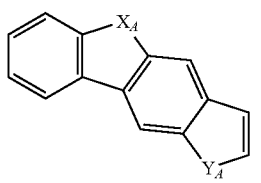
(XY-16)

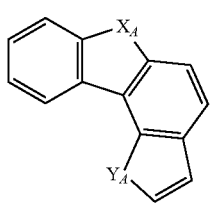
(XY-17)

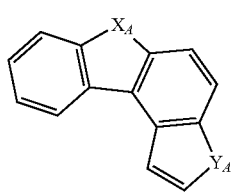
(XY-18)

In the formulas (XY-1) to (XY-18), $X_A$ and $Y_A$ are independently an oxygen atom, a sulfur atom, NH or $CH_2$. However, at least one of $X_A$ and $Y_A$ is an oxygen atom, a sulfur atom or NH.

The heterocyclic ring represented by the formulas (XY-1) to (XY-18) becomes a monovalent heterocyclic group having a bond at an arbitrary position.

An expression "the monovalent group formed from the unsubstituted heterocyclic ring represented by the formulas (XY-1) to (XY-18) has a substituent" refers to a case where the hydrogen atom bonded with the carbon atom of a skeleton of the formulas is substituted by a substituent, or a state in which $X_A$ or $Y_A$ is NH or $CH_2$, and the hydrogen atom in the NH or $CH_2$ is replaced with a substituent.

Specific examples (specific example group G3) of the "substituted or unsubstituted alkyl group" include an unsubstituted alkyl group and a substituted alkyl group described below. (Here, the unsubstituted alkyl group refers to a case where the "substituted or unsubstituted alkyl group" is the "unsubstituted alkyl group," and the substituted alkyl group refers to a case where the "substituted or unsubstituted alkyl group" is the "substituted alkyl group"). Hereinafter, the case of merely "alkyl group" includes both the "unsubstituted alkyl group" and the "substituted alkyl group".

The "substituted alkyl group" refers to a case where the "unsubstituted alkyl group" has a substituent, and specific examples thereof include a group in which the "unsubstituted alkyl group" has a substituent, and a substituted alkyl group described below. It should be noted that examples of the "unsubstituted alkyl group" and examples of the "substituted alkyl group" listed herein are merely one example, and the "substituted alkyl group" described herein also includes a group and the like in which "unsubstituted alkyl group" has a substituent further has a substituent, a group in which "substituted alkyl group" further has a substituent.

An unsubstituted alkyl group:
a methyl group,
an ethyl group,
a n-propyl group,
an isopropyl group,
a n-butyl group,
an isobutyl group,
a s-butyl group, and
a t-butyl group.
A substituted alkyl group:
a heptafluoropropyl group (including an isomer),
a pentafluoroethyl group,
a 2,2,2-trifluoroethyl group, and
a trifluoromethyl group.

Specific examples (specific example group G4) of the "substituted or unsubstituted alkenyl group" include an unsubstituted alkenyl group and a substituted alkenyl group described below. (Here, the unsubstituted alkenyl group refers to a case where the "substituted or unsubstituted alkenyl group" is the "unsubstituted alkenyl group," and the substituted alkenyl group refers to a case where the "substituted or unsubstituted alkenyl group" is the "substituted alkenyl group"). Hereinafter, the case of merely "alkenyl group" includes both the "unsubstituted alkenyl group" and the "substituted alkenyl group".

The "substituted alkenyl group" refers to a case where the "unsubstituted alkenyl group" has a substituent, and specific examples thereof include a group in which the "unsubstituted alkenyl group" has a substituent, and a substituted alkenyl group described below. It should be noted that examples of the "unsubstituted alkenyl group" and examples of the "substituted alkenyl group" listed herein are merely one example, and the "substituted alkenyl group" described herein also includes a group and the like in which "unsubstituted alkenyl group" has a substituent further has a substituent, a group in which "substituted alkenyl group" further has a substituent.

An unsubstituted alkenyl group and a substituted alkenyl group:
a vinyl group,
an allyl group,
a 1-butenyl group,
a 2-butenyl group,
a 3-butenyl group,
a 1,3-butanedienyl group,
a 1-methylvinyl group,
a 1-methylallyl group,
a 1,1-dimethylallyl group,
a 2-methylallyl group, and
a 1,2-dimethylallyl group.

Specific examples (specific example group G5) of the "substituted or unsubstituted alkynyl group" include an unsubstituted alkynyl group described below. (Here, the unsubstituted alkynyl group refers to a case where the "substituted or unsubstituted alkynyl group" is the "unsubstituted alkynyl group"). Hereinafter, a case of merely "alkynyl group" includes both the "unsubstituted alkynyl group" and the "substituted alkynyl group".

The "substituted alkynyl group" refers to a case where the "unsubstituted alkynyl group" has a substituent, and specific examples thereof include a group in which the "unsubstituted alkynyl group" described below has a substituent.

An unsubstituted alkynyl group:
an ethynyl group.

Specific examples (specific example group G6) of the "substituted or unsubstituted cycloalkyl group" described herein include an unsubstituted cycloalkyl group and a substituted cycloalkyl group described below. (Here, the unsubstituted cycloalkyl group refers to a case where the "substituted or unsubstituted cycloalkyl group" is the "unsubstituted cycloalkyl group," and the substituted cycloalkyl group refers to a case where the "substituted or unsubstituted cycloalkyl group" is the "substituted cycloalkyl group"). Hereinafter, a case of merely "cycloalkyl group" includes both the "unsubstituted cycloalkyl group" and the "substituted cycloalkyl group".

The "substituted cycloalkyl group" refers to a case where the "unsubstituted cycloalkyl group" a the substituent, and specific examples thereof include a group in which the "unsubstituted cycloalkyl group" has a substituent, and a substituted cycloalkyl group described below. It should be noted that examples of the "unsubstituted cycloalkyl group" and examples of the "substituted cycloalkyl group" listed herein are merely one example, and the "substituted cycloalkyl group" described herein also includes a group and the like in which "unsubstituted cycloalkyl group" has a substituent further has a substituent, a group in which "substituted cycloalkyl group" further has a substituent.

An unsubstituted aliphatic ring group:
a cyclopropyl group,
a cyclobutyl group,
a cyclopentyl group,
a cyclohexyl group,
a 1-adamantyl group,
a 2-adamantyl group,
a 1-norbornylgroup, and
a 2-norbornyl group.

A substituted cycloalkyl group:
a 4-methylcyclohexyl group.

Specific examples (specific example group G7) of the group represented by —Si($R_{901}$)($R_{902}$)($R_{903}$) described herein include
—Si(G1)(G1)(G1),
—Si(G1)(G2)(G2),
—Si(G1)(G1)(G2),
—Si(G2)(G2)(G2),
—Si(G5)(G5)(G5) and
—Si(G6)(G6)(G6).

In which,
G1 is the "aryl group" described in the specific example group G1.
G2 is the "heterocyclic group" described in the specific example group G2.
G3 is the "alkyl group" described in the specific example group G3.
G6 is the "cycloalkyl group" described in the specific example group G6.

Specific examples (specific example group G8) of the group represented by —O—($R_{904}$) described herein include
—O(G1),
—O(G2),
—O(G3) and
—O(G6).

In which,
G1 is the "aryl group" described in the specific example group G1.
G2 is the "heterocyclic group" described in the specific example group G2.
G3 is the "alkyl group" described in the specific example group G3.
G6 is the "cycloalkyl group" described in the specific example group G6.

Specific examples (specific example group G9) of the group represented by —S—($R_{905}$) described herein include
—S(G1),
—S(G2),
—S(G3) and
—S(G6).

In which,
G1 is the "aryl group" described in the specific example group G1.
G2 is the "heterocyclic group" described in the specific example group G2.
G3 is the "alkyl group" described in the specific example group G3.
G6 is the "cycloalkyl group" described in the specific example group G6.

Specific examples (specific example group G10) of the group represented by —N($R_{906}$)($R_{907}$) described herein include
—N(G1)(G1),
—N(G2)(G2),
—N(G1)(G2),
—N(G3)(G3) and
—N(G6)(G6).

In which,
G1 is the "aryl group" described in the specific example group G1.
G2 is the "heterocyclic group" described in the specific example group G2.
G3 is the "alkyl group" described in the specific example group G3.
G6 is the "cycloalkyl group" described in the specific example group G6.

Specific examples (specific example group G11) of the "halogen atom" described herein include a fluorine atom, a chlorine atom, a bromine atom and an iodine atom.

The "alkoxy group" described herein include a group represented by —O(G3), where G3, for examples is the "alkyl group" described in the specific example group G3. The number of carbon atoms of the "unsubstituted alkoxy group" are 1 to 50, preferably 1 to 30, and more preferably 1 to 18, unless otherwise specified.

The "alkylthio group" described herein include a group represented by —S(G3), where G3, for examples is the "alkyl group" described in the specific example group G3. The number of carbon atoms of the "unsubstituted alkylthio group" are 1 to 50, preferably 1 to 30, and more preferably 1 to 18, unless otherwise specified.

The "aryloxy group" described herein include a group represented by —O(G1), where G1, for examples is the "aryl group" described in the specific example group G1. The number of ring carbon atoms of the "unsubstituted aryloxy group" are 6 to 50, preferably 6 to 30, and more preferably 6 to 18, unless otherwise specified.

The "arylthio group" described herein include a group represented by —S(G1), where G1, for examples is the "aryl group" described in the specific example group G1. The number of ring carbon atoms of the "unsubstituted arylthio group" are 6 to 50, preferably 6 to 30, and more preferably 6 to 18, unless otherwise specified.

The "aralkyl group" described herein include a group represented by -(G3)-(G1), where G3, for examples is the "alkyl group" described in the specific example group G3, and G1, for examples is the "aryl group" described in the specific example group G1. Accordingly, the "aralkyl group" is one aspect of the "substituted alkyl group" substituted by the "aryl group". The number of carbon atoms of the "unsubstituted aralkyl group," which is the "unsubstituted alkyl group" substituted by the "unsubstituted aryl group," are 7 to 50, preferably 7 to 30, and more preferably 7 to 18, unless otherwise specified.

Specific example of the "aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, and a 2-β-naphthylisopropyl group.

The substituted or unsubstituted aryl group described herein is, unless otherwise specified, preferably a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, a 9,9-diphenylfluorenyl group, or the like.

The substituted or unsubstituted heterocyclic group described herein is, unless otherwise specified, preferably a pyridyl group, a pyrimidinyl group, a triazinyl group, a quinolyl group, an isoquinolyl group, a quinazolinyl group, a benzimidazolyl group, a phenanthrolinyl group, a carbazolyl group, a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group, a (9-biphenylyl)carbazolyl group, a (9-phenyl)phenylcarbazolyl group, a diphenylcarbazole-9-yl group, a phenylcarbazol-9-yl group, a phenyltriazinyl group, a biphenylyltriazinyl group, diphenyltriazinyl group, a phenyldibenzofuranyl group, a phenyldibenzothiophenyl group, or the like.

The substituted or unsubstituted alkyl group described herein is, unless otherwise specified, preferably a methyl group, an ethyl group, a propyl group, an isopropyl group, a n-butyl group, an isobutyl group, or the like.

The "substituted or unsubstituted arylene group" desried herein refers to a group in which the above-described "aryl group" is converted into divalence, unless otherwise specified. Specific examples (specific example group G12) of the "substituted or unsubstituted arylene group" include a group in which the "aryl group" described in the specific example group G1 is converted into divalence.

Specific examples (specific example group G13) of the "substituted or unsubstituted divalent heterocyclic group" include a group in which the "heterocyclic group" described in the specific example group G2 is converted into divalence.

Specific examples (specific example group G14) of the "substituted or unsubstituted alkylene group" include a group in which the "alkyl group" described in the specific example group G3 is converted into divalence.

The substituted or unsubstituted arylene group described herein is any group described below, unless otherwise specified.

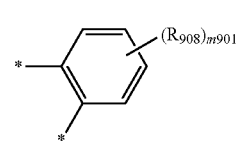

(XY-20)

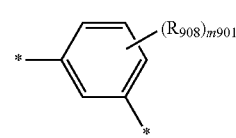

(XY-21)

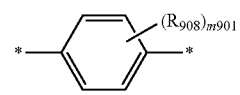

(XY-22)

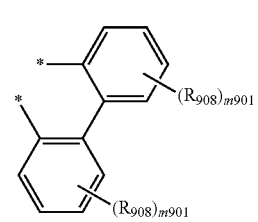

(XY-23)

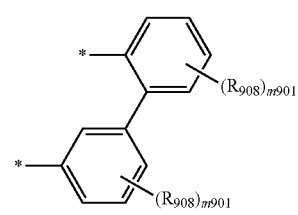

(XY-24)

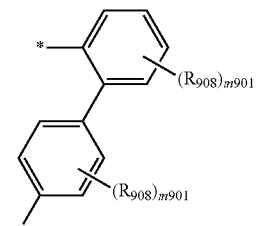

(XY-25)

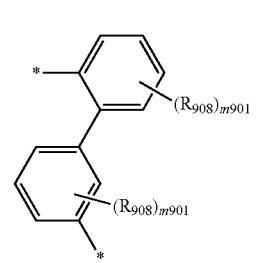

(XY-26)

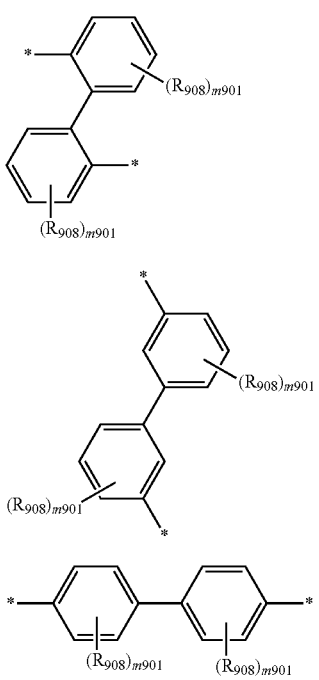
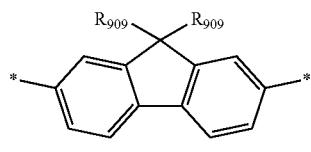
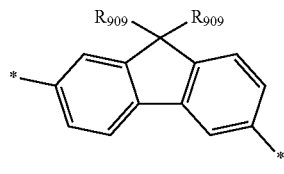
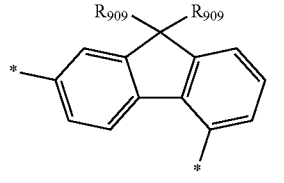
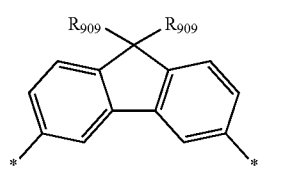
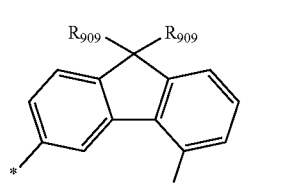
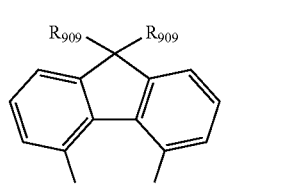
In the formulas (XY-20) to (XY-29), $R_{908}$ is a substituent. Then, m901 is an integer of 0 to 4, and when m901 is two or more, a plurality of $R_{908}$ may be the same with or different from each other.
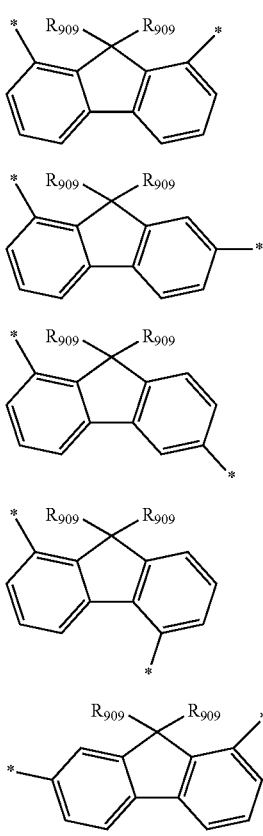
In the formulas (XY-30) to (XY-40), $R_{909}$ is independently a hydrogen atom or a substituent. Two of $R_{909}$ may be bonded with each other through a single bond to form a ring.
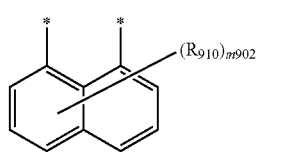
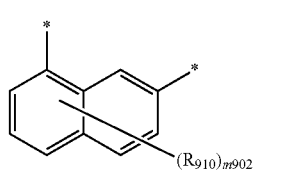

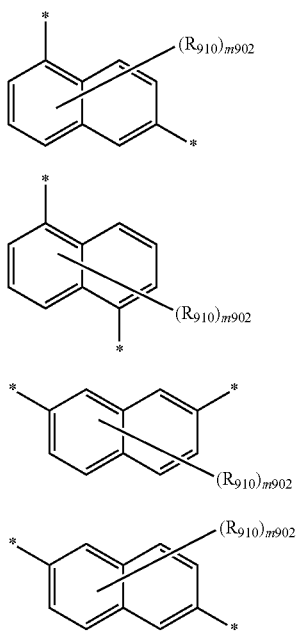
(XY-43)
(XY-44)
(XY-45)
(XY-46)
In the formulas (XY-41) to (XY-46), $R_{910}$ is a substituent.
Then, m902 is an integer of 0 to 6. When m902 is two or more, a plurality of $R_{910}$ may be the same with or different from each other.
The substituted or unsubstituted divalent heterocyclic group described herein is preferably any group described below, unless otherwise specified.
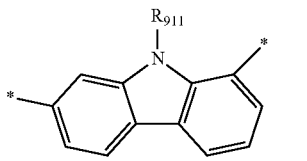
(XY-50)
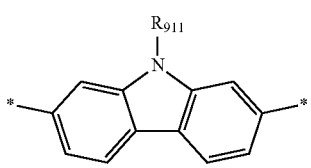
(XY-51)
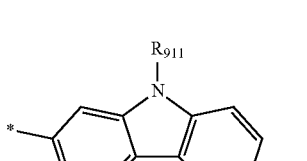
(XY-52)
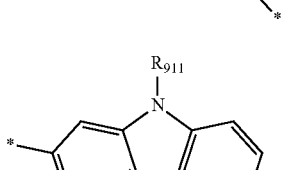
(XY-53)
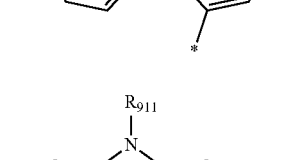
(XY-54)
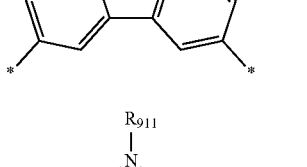
(XY-55)
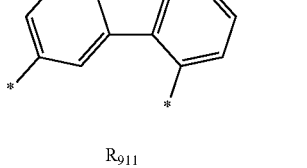
(XY-56)
(XY-57)
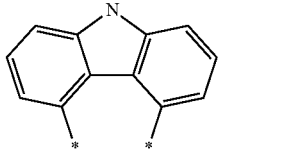
(XY-58)
(XY-59)
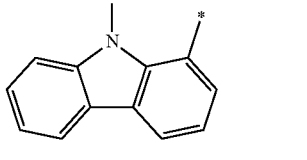
(XY-60)
(XY-61)

(XY-62)
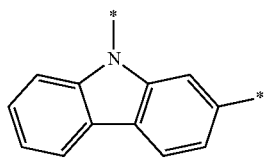

(XY-63)
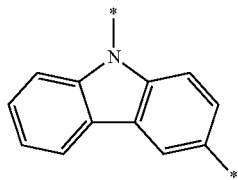

(XY-64)
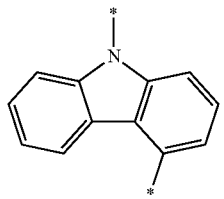

In the formulas (XY-50) to (XY-64), $R_{911}$ is a hydrogen atom or a substituent.

(XY-65)
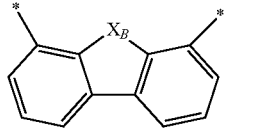

(XY-66)
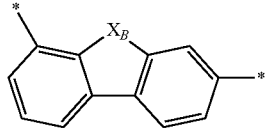

(XY-67)
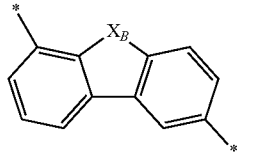

(XY-68)
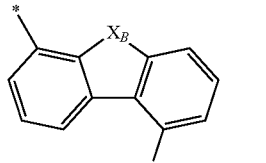

(XY-69)
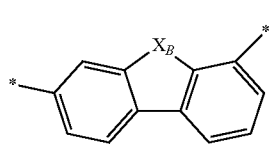

(XY-70)
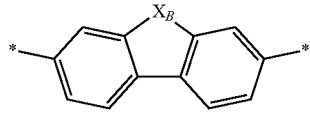

(XY-71)
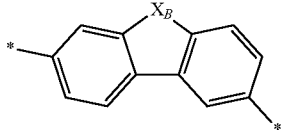

(XY-72)
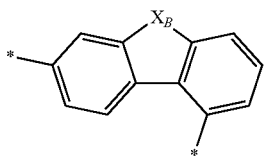

(XY-73)
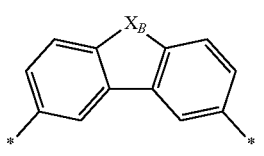

(XY-74)
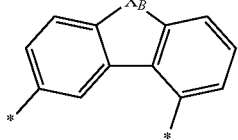

(XY-75)
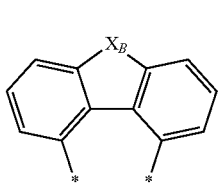

In the formulas (XY-65) to (XY-75), $X_B$ is an oxygen atom or a sulfur atom.

An organic electroluminescence device according to the first aspect of the invention (hereinafter, referred to as the organic EL device of the first aspect in several cases) is characterized in that an organic electroluminescence device comprises:

an anode, an emitting layer, a first electron-transporting layer, a second electron-transporting layer and a cathode in this order, the second electron-transporting layer comprises a compound represented by the following formula (1):

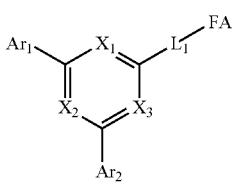

(1)

and the emitting layer comprises a compound represented by the following formula (10).

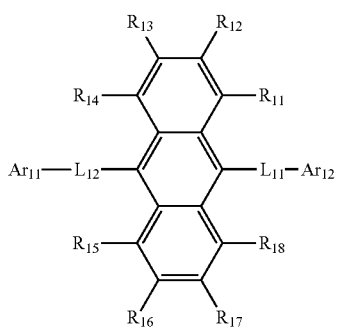

(10)

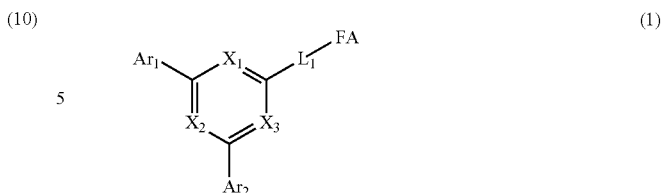

(1)

Each substituent in the above formulas (1) and (10) will be described later.

In the organic EL device of the first aspect, a high-performance organic electroluminescent device can be obtained by comprising an anode, an emitting layer, a first electron-transporting layer, a second electron-transporting layer and a cathode in this order, the second electron-transporting layer comprises a compound represented by the above formula (1), and the emitting layer comprises a compound represented by the above formula (10). In particular, it is possible to obtain an organic electroluminescent element having a high luminous efficiency, an organic electroluminescent element having a long lifetime, and an organic electroluminescent element having a high luminous efficiency and a long lifetime. It is presumed that this effect is obtained by improving the carrier balance factor by the configuration.

The first electron transport layer may or may not be directly adjacent to the light emitting layer. However, the first electron transport layer is preferably immediately adjacent to the emitting layer.

The first electron transport layer and the second electron transport layer may or may not be directly adjacent to each other. However, the first electron transport layer and the second electron transport layer are preferably immediately adjacent to each other.

When the emitting layer and the first electron-transporting layer or the first electron-transporting layer and the second electron-transporting layer are not adjacent to each other, a third electron-transporting layer or the like may be provided between the respective layers.

The second electron transport layer may or may not be directly adjacent to the cathode. When the second electron transport layer is not adjacent to the cathode, another layer may be provided between the second electron transport layer and the cathode. The other layer provided between the second electron transport layer and the cathode is preferably an electron injection layer. An electron injection layer is preferably provided between the second electron transport layer and the cathode. The material of the electron injection layer will be described later.

It is also preferable that an organic layer is provided between the anode and the emitting layer. The organic layer between the anode and the emitting layer is preferably a hole injection layer, a hole transport layer or the like. The materials for the hole injection layer and the hole transport layer will be described later.

Next, the compound represented by the formula (1) will be described.

In the formula (1),
FA is a substituted or unsubstituted fused aryl group including 13 to 50 ring carbon atoms, which is formed by condensing three or more hydrocarbon rings;
$L_1$ is a single bond, or selected from the group consisting of
a substituted or unsubstituted phenylene group,
a substituted or unsubstituted biphenylene group,
a substituted or unsubstituted terphenylene group,
a substituted or unsubstituted quarter phenylene group,
an arylene group which is a substituted or unsubstituted condensed ring including 10 to 30 ring carbon atoms, and
a group that 1 to 3 substituted or unsubstituted phenylene groups and 1 to 3 substituted or unsubstituted arylene groups which is a condensed ring including 10 to 30 ring carbon atoms are linked via a single bond;
$Ar_1$ and $Ar_2$ are independently a substituted or unsubstituted aryl group including 6 to 12 ring carbon atoms or a substituted or unsubstituted monovalent heterocyclic group including 5 to 30 ring atoms;
$X_1$ to $X_3$ are independently N or $CR_1$;
provided that two or more of $X_1$ to $X_3$ are N; R does not form a ring by combining with adjacent $L_1$, $Ar_1$ or $Ar_2$;
$R_1$ is a hydrogen atom, a halogen atom, a substituted or unsubstituted alkyl group including 1 to 20 carbon atoms, a substituted or unsubstituted cycloalkyl group including 3 to 20 carbon atoms, a substituted or unsubstituted aryl group including 6 to 30 ring carbon atoms, or a substituted or unsubstituted monovalent heterocyclic group including 5 to 30 ring atoms.

In one embodiment, the arylene group of $L_1$ in the above formula (1) is a divalent group in which two or more monocycles are bonded via a single bond, a divalent group in which two or more condensed rings are bonded via a single bond, or a divalent group in which one or more monocycles and one or more condensed rings are bonded via a single bond. For example, a biphenylene group which is a divalent group consisting of two monocycles, or a group in combination with a phenylene group and a naphthylene group which are divalent groups consisting of one or more monocycles and one or more condensed rings as shown below.

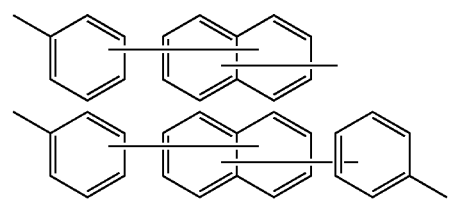

In one embodiment, FA of the above formula (1) is
a unsubstituted fused aryl group including 13 to 50 ring carbon atoms, which is formed by condensing three or more hydrocarbon rings, a fused aryl group including 13 to 50 ring carbon atoms, which is formed by condensing three or more hydrocarbon rings, and substituted with a substituted or unsubstituted aryl group including 6 to 30 ring carbon atoms, or a fused aryl group including 13 to 50 ring carbon atoms, which is formed by condensing three or more hydrocarbon rings, and substituted with a substituted or unsubstituted monovalent heterocyclic group including 5 to 30 ring atoms.

In one embodiment, FA is an unsubstituted fused aryl group including 13 to 30 ring carbon atoms, which is formed by condensing three or more hydrocarbon rings, or a fused aryl group including 13 to 30 ring carbon atoms, which is formed by condensing three or more hydrocarbon rings, and substituted with a substituted or unsubstituted aryl group including 6 to 30 ring carbon atoms.

In one embodiment, FA is a group selected from the group consisting of a substituted or unsubstituted fluorenyl group, a substituted or unsubstituted anthracenyl group, a substituted or unsubstituted phenanthrenyl group, a substituted or unsubstituted fluoranthenyl group, a substituted or unsubstituted triphenylenyl group, a substituted or unsubstituted pyrenyl group, a substituted or unsubstituted chrysenyl group, and a substituted or unsubstituted benzochrysenyl group.

FA is preferably a group selected from the group consisting of a substituted or unsubstituted fluorenyl group, a substituted or unsubstituted anthracenyl group, a substituted or unsubstituted phenanthrenyl group, a substituted or unsubstituted fluoranthenyl group, a substituted or unsubstituted triphenylenyl group, and a substituted or unsubstituted benzochrysenyl group. More preferably, FA is a group selected from the group consisting of a 9-anthracenyl group, a 10-phenylanthracene-9-yl group, a 10-biphenylylanthracene-9-yl group, a 10-terphenylanthracene-9-yl group, a 10-naphthylanthracene-9 group, a 9,10-diphenylanthracen-2-yl group, a 9,10-dinaphthylanthracen-2-yl group, a 9,9-diphenylfluorenyl group, a 9,9-dimethylfluorenyl group, a 9-phenanthryl group, a benzochrysenyl group, a triphenyl group, a fluoranthenyl group, a benzo[c]phenanthryl group, a benzo[a]phenanthryl group, a benz[a]anthracenyl group, and a pyrenyl group. Still more preferably, FA is a group selected from the group consisting of a 9,9-diphenylfluoren-2-yl group, a 9,9-diphenylfluoren-4-yl group, a 10-naphthylanthracen-9-yl group, a 10-biphenylylanthracene-9-yl group, a 9,10-diphenylanthracen-2-yl group, and groups represented by the following formulas.

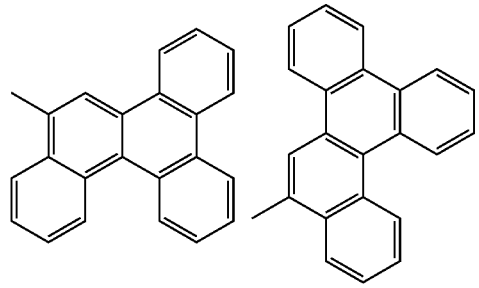

In one embodiment, $L_1$ of the above formula (1) is a single bond, or a group selected from the group consisting of a substituted or unsubstituted phenylene group,
a substituted or unsubstituted biphenylene group, and
a substituted or unsubstituted naphthylene group.

When $L_1$ has a substituent, the substituent is a substituted or unsubstituted aryl group including 6 to 30 ring carbon atoms or a substituted or unsubstituted monovalent heterocyclic group including 5 to 30 ring atoms, except for a carbazolyl group.

In one embodiment, $L_1$ is a single bond, or a group selected from the group consisting of divalent groups represented by the following formulas (a1) to (a3).

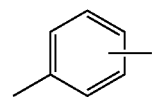

(a1)

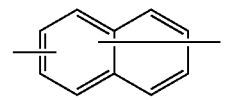

(a2)

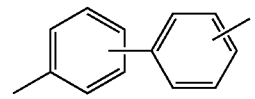

(a3)

In one embodiment, $L_1$ is a single bond, or a group selected from the group consisting of divalent groups represented by the following formulas (a1-1) to (a1-3).

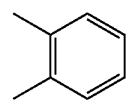

(a1-1)

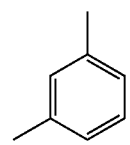

(a1-2)

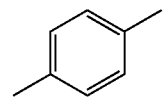

(a1-3)

The above formulas (a2) and (a3) are shown more specifically by formulas (a2-1) to (a2-9) and formulas (a3-1) to (a3-6).

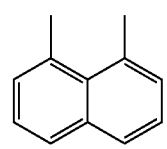

(a2-1)

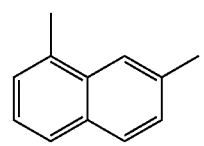

(a2-2)

(a2-3) 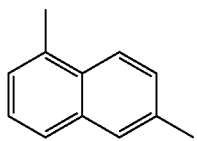

(a2-4) 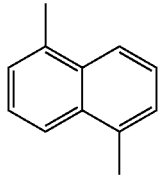

(a2-5) 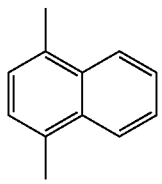

(a2-6) 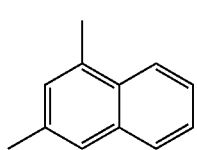

(a2-7) 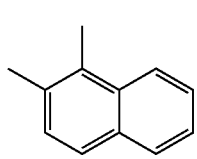

(a2-8) 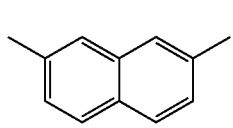

(a2-9) 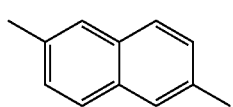

(a3-1) 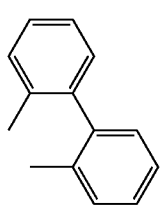

(a3-2) 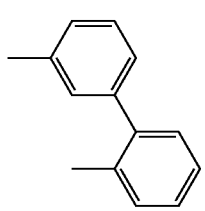

(a3-3) 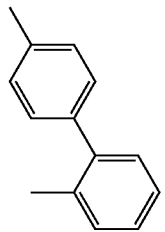

(a3-4) 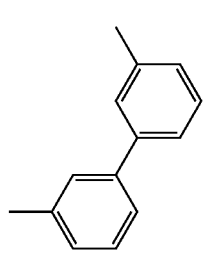

(a3-5) 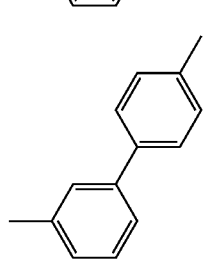

(a3-6) 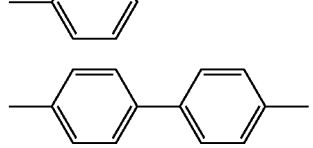

In one embodiment, $L_1$ is an unsubstituted arylene group including 6 to 12 ring carbon atoms. The substituted or unsubstituted arylene group including 6 to 12 ring carbon atoms represented by $L_1$ is specifically a divalent group represented by the following formulas (aa1) to (aa3).

(aa1) 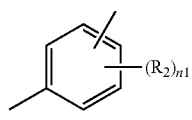

(aa2) 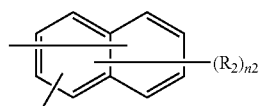

(aa3) 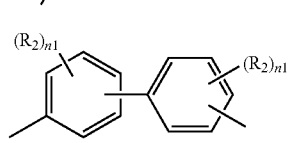

In formulas (aa1) to (aa3),
$R_2$ is a substituent;
n1 is an integer of 0 to 4 and n2 is an integer of 0 to 6. When n1 and n2 are two or more, plural $R_2$'s may be the same or different. Plural $R_2$'s substituting adjacent carbon atoms are not bonded to each other to form a ring.

In the above formulas (aa1) to (aa3), $R_2$ is bonded to any position capable of bonding on the benzene ring or the naphthalene ring. The same applies hereafter.

In one embodiment, $L_1$ is
an unsubstituted arylene group including 6 to 12 ring carbon atoms,
an arylene group including 6 to 12 ring carbon atoms, which is substituted with a substituted or unsubstituted aryl group including 6 to 30 ring carbon atoms, or
an arylene group including 6 to 12 ring carbon atoms, which is substituted with a substituted or unsubstituted monovalent heterocyclic group including 5 to 12 ring atoms.

In one embodiment, particularly preferable examples of the substituent when $L_1$ has a substituent include a phenyl group and an azine group such as a pyridinyl group, a pyrimidinyl group and a triazinyl group.

In one embodiment, $Ar_1$ and $Ar_2$ of the above formula (1) are independently a substituted or unsubstituted aryl group including 6 to 12 ring carbon atoms or a substituted or unsubstituted monovalent heterocyclic group including 5 to 12 ring atoms.

In one embodiment, $Ar_1$ and $Ar_2$ are a substituted or unsubstituted monovalent heterocyclic group including 5 to 30 ring atoms, preferably a substituted or unsubstituted dibenzofuranyl group, a substituted or unsubstituted dibenzothiophenyl group, and azine groups such as a substituted or unsubstituted pyridinyl group, a substituted or unsubstituted pyrimidinyl group, and a substituted or unsubstituted triazinyl group.

In one embodiment, $Ar_1$ and $Ar_2$ are independently a substituted or unsubstituted aryl group including 6 to 12 ring carbon atoms.

In one embodiment, $Ar_1$ and $Ar_2$ are independently a group selected from the group consisting of monovalent groups represented by the following formulas (b1) to (b3).

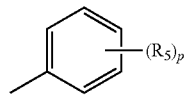
(b1)

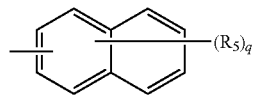
(b2)

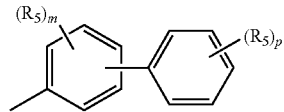
(b3)

In the formulas (b1) to (b3),
$R_5$'s are independently a substituent,
p's are an integer of 0 to 5,
q is an integer of 0 to 7,
m is an integer of 0 to 4.

When p, q or m is two or more, plural $R_5$'s may be the same or different. When p, q or m is two or more, plural $R_5$'s are not bonded with each other to form a ring.

In the above formulas (b1) to (b3), $R_5$ is bonded to any position capable of bonding on the benzene ring or the naphthalene ring. The same applies hereafter.

In one embodiment, $Ar_1$ and $Ar_2$ are independently a group selected from the group consisting of monovalent groups represented by the following formulas (b1-1), and (b3-1) to (b3-3).

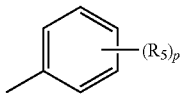
(b1-1)

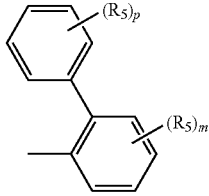
(b3-1)

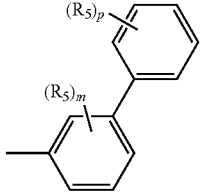
(b3-2)

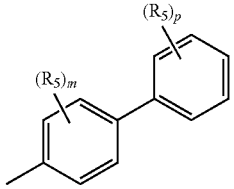
(b3-3)

In the formulas (b1-1), and (b3-1) to (b3-3),
$R_5$'s are independently a substituent,
p's are an integer of 0 to 5,
m's are an integer of 0 to 4.

When p or m is two or more, plural $R_5$'s may be the same or different. When p or m is two or more, plural $R_5$'s are not bonded with each other to form a ring.

In one embodiment, $X_1$ to $X_3$ of the above formula (1) are N.

In one embodiment, the compound represented by the formula (1) is represented by the following formula (2):

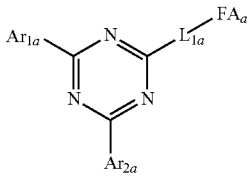
(2)

wherein in the formula (2),
$FA_a$ is
an unsubstituted fused aryl group including 13 to 50 ring carbon atoms, which is formed by condensing three or more hydrocarbon rings,
a fused aryl group including 13 to 50 ring carbon atoms, which is formed by condensing three or more hydrocarbon rings, and substituted with a substituted or unsubstituted aryl group including 6 to 30 ring carbon atoms, or
a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;
$L_{1a}$ is
a single bond,
an unsubstituted arylene group including 6 to 12 ring carbon atoms, an arylene group including 6 to 12 ring carbon atoms, which is substituted with a substituted or unsubstituted aryl group including 6 to 50 ring carbon atoms, or
an arylene group including 6 to 12 ring carbon atoms, which is substituted with a substituted or unsubstituted monovalent heterocyclic group including 5 to 50 ring atoms, except for a carbazolyl group;
$Ar_{1a}$ and $Ar_{2a}$ are independently a substituted or unsubstituted aryl group including 6 to 12 ring carbon atoms.

In one embodiment, the compound represented by the formula (1) is represented by the following formula (2-1):

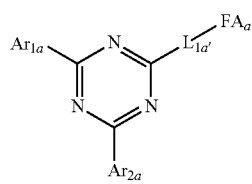

(2-1)

wherein in the formula (2-1),
$FA_a$ is
an unsubstituted fused aryl group including 13 to 50 ring carbon atoms, which is formed by condensing three or more hydrocarbon rings,
a fused aryl group including 13 to 50 ring carbon atoms, which is formed by condensing three or more hydrocarbon rings, and substituted with a substituted or unsubstituted aryl group including 6 to 30 ring carbon atoms, or
a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;
$L_{1a'}$ is a single bond or an unsubstituted arylene group including 6 to 12 ring carbon atoms;
$Ar_{1a}$ and $Ar_{2a}$ are independently a substituted or unsubstituted aryl group including 6 to 12 ring carbon atoms.

In one embodiment, the compound represented by the formula (1) is represented by the following formula (3):

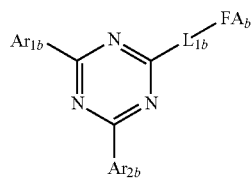

(3)

wherein in the formula (3),
$FA_a$ is
an unsubstituted fused aryl group including 13 to 50 ring carbon atoms, which is formed by condensing three or more hydrocarbon rings,
a fused aryl group including 13 to 50 ring carbon atoms, which is formed by condensing three or more hydrocarbon rings, and substituted with a substituted or unsubstituted aryl group including 6 to 30 ring carbon atoms, or
a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;
$L_{1b}$ is a single bond or a group selected from the group consisting of divalent groups represented by the following formulas (a1) to (a3):

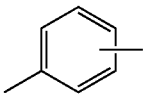
(a1)

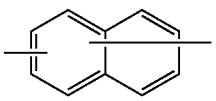
(a2)

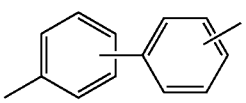
(a3)

The two bonds whose position is not specified in the above formula (a2) are bonded to any two positions of the naphthalene ring. The bond whose position is not specified in (a3) is bonded to any position capable of bonding on the benzene ring.

$Ar_{1b}$ and $Ar_{2b}$ are independently a group selected from the group consisting of monovalent groups represented by the following formulas (b1) to (b3):

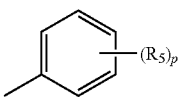
(b1)

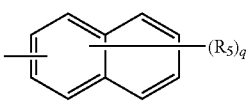
(b2)

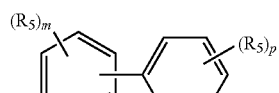
(b3)

wherein in the formulas (b1) to (b3),
$R_5$'s are independently a substituent,
p's are an integer of 0 to 5,
q is an integer of 0 to 7,
m is an integer of 0 to 4:
when p, q or m is two or more, plural $R_5$'s may be the same or different, and
when p, q or m is two or more, plural $R_5$'s are not bonded with each other to form a ring.

In one embodiment, the compound represented by the formula (1) is represented by the following formula (4):

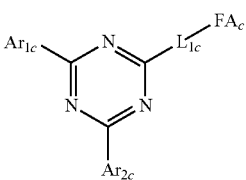

(4)

wherein in the formula (4),
$FA_c$ is a group selected from the group consisting of a substituted or unsubstituted fluorenyl group, a substituted or unsubstituted anthracenyl group, a substituted or unsubstituted phenanthrenyl group, a substituted or unsubstituted fluoranthenyl group, a substituted or unsubstituted triphenylenyl group, a substituted or unsubstituted pyrenyl group, a substituted or unsubstituted chrysenyl group, and a substituted or unsubstituted benzochrysenyl group;

$L_{1c}$ is a single bond or a group selected from the group consisting of divalent groups represented by the following formulas (a1-1) to (a1-3):

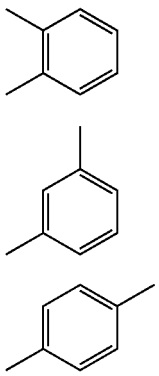

(a1-1)

(a1-2)

(a1-3)

$Ar_{1c}$ and $Ar_{2c}$ are independently a group selected from the group consisting of monovalent groups represented by the following formulas (b1-1), and (b3-1) to (b3-3):

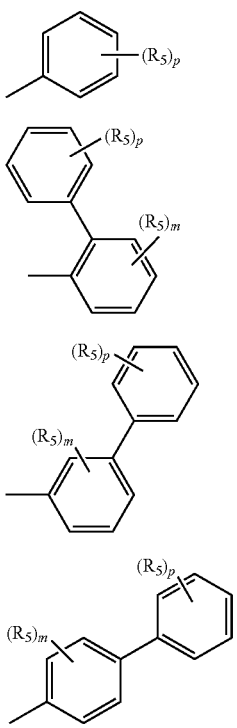

(b1-1)

(b3-1)

(b3-2)

(b3-3)

wherein in the formulas (b1-1), and (b3-1) to (b3-3),
$R_5$'s are independently a substituent,
p's are an integer of 0 to 5,
m's are an integer of 0 to 4:
when p or m is two or more, plural $R_5$'s may be the same or different, and when p or m is two or more, plural $R_5$'s are not bonded with each other to form a ring.

In one embodiment, the compound represented by the formula (1) is represented by the following formula (5):

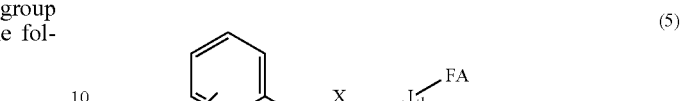

(5)

wherein in the formula (5), FA, $L_1$ and $X_1$ to $X_3$ are the same as in the formula (1);

$R_6$'s are independently a halogen atom, a cyano group, a substituted or unsubstituted alkyl group including 1 to 20 carbon atoms, a substituted or unsubstituted alkoxy group including 1 to 20 carbon atoms, a substituted or unsubstituted aryl group including 6 to 12 carbon atoms, or a substituted or unsubstituted monovalent heterocyclic group including 5 to 12 ring atoms;

r's are independently an integer of 0 to 5; when r is 2 to 5, plural $R_6$'s may be the same or different, and when plural $R_6$'s are present, plural $R_6$'s are not bonded with each other to form a ring.

In one embodiment, the compound represented by the formula (1) is represented by the following formula (6):

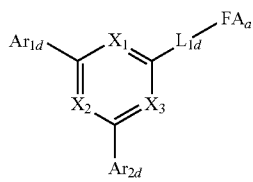

(6)

wherein in the formula (6), $X_1$ to $X_3$ are as defined in the formula (1);

$FA_a$ is
an unsubstituted fused aryl group including 13 to 50 ring carbon atoms, which is formed by condensing three or more hydrocarbon rings,
a fused aryl group including 13 to 50 ring carbon atoms, which is formed by condensing three or more hydrocarbon rings, and substituted with a substituted or unsubstituted aryl group including 6 to 30 ring carbon atoms, or
a fused aryl group including 13 to 50 ring carbon atoms, which is formed by condensing three or more hydrocarbon rings, and substituted with a substituted or unsubstituted monovalent heterocyclic group including 5 to 12 ring atoms;

$L_{1d}$ is
a single bond,
an unsubstituted arylene group including 6 to 12 ring carbon atoms,
an arylene group including 6 to 12 ring carbon atoms, which is substituted with an unsubstituted aryl group including 6 to 30 ring carbon atoms, or an arylene group including 6 to 12 ring carbon atoms, which is substituted with an unsubstituted monovalent heterocyclic group including 5 to 12 ring atoms;

$Ar_{1d}$ and $Ar_{2d}$ are independently an unsubstituted aryl group including 6 to 12 ring carbon atoms, an unsubstituted monovalent heterocyclic group including 5 to 12 ring atoms, an aryl group including 6 to 12 ring carbon atoms, which is substituted with a substituted or unsubstituted aryl group including 6 to 30 ring carbon atoms, an aryl group including 6 to 12 ring carbon atoms, which is substituted with a substituted or unsubstituted monovalent heterocyclic group including 5 to 12 ring atoms, a monovalent heterocyclic group including 5 to 12 ring atoms, which is substituted with a substituted or unsubstituted aryl group including 6 to 30 ring carbon atoms, or a monovalent heterocyclic group including 5 to 12 ring atoms, which is substituted with a substituted or unsubstituted monovalent heterocyclic group including 5 to 12 ring atoms.

In one embodiment, the substituent in the case of "substituted or unsubstituted" and the substituent which is $R_2$ and $R_5$ are selected from the group consisting of an alkyl group including 1 to 50 carbon atoms, an alkenyl group including 2 to 50 carbon atoms, an alkynyl group including 2 to 50 carbon atoms, a cycloalkyl group including 3 to 50 carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, —$Si(R_{41})(R_{42})(R_{43})$,

—$C(=O)R_{44}$,

—$COOR_{45}$,

—$S(=O)_2R_{46}$,

—$P(=O)(R_{47})(R_{48})$,

—$Ge(R_{49})(R_{50})(R_{51})$,

—$N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms, except for a carbazolyl group;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms, and when two or more of each of $R_{41}$ to $R_{53}$ are present, the two or more of each of $R_{41}$ to $R_{53}$ may be the same or different.

In one embodiment, the substituent in the case of "substituted or unsubstituted" and the substituent which is $R_2$ and $R_5$ are selected from the group consisting of an alkyl group including 1 to 50 carbon atoms, an aryl group including 6 to 12 ring carbon atoms, and a monovalent heterocyclic group including 5 to 12 ring atoms.

Specific examples of the compound represented by the above formula (1) are described below, but the invention is not limited thereto.

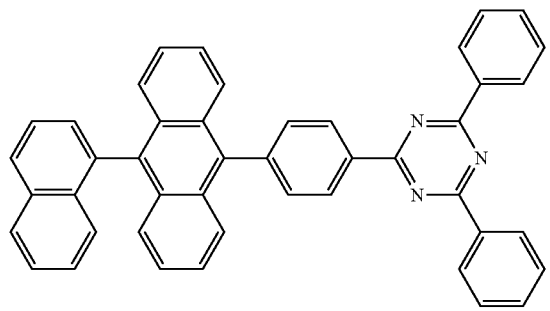

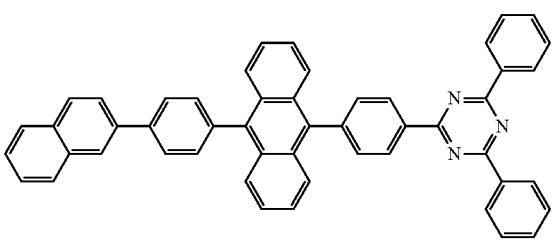

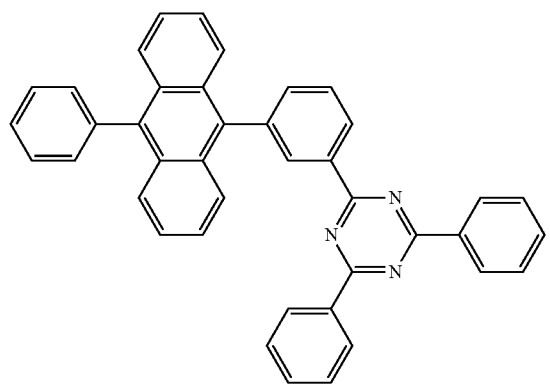

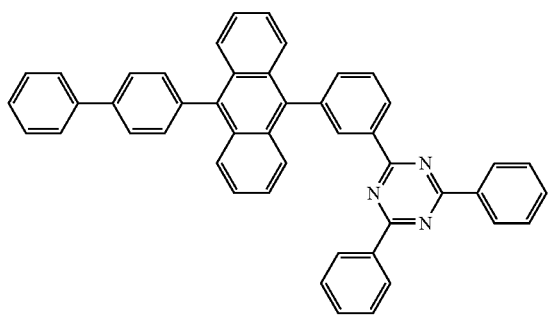

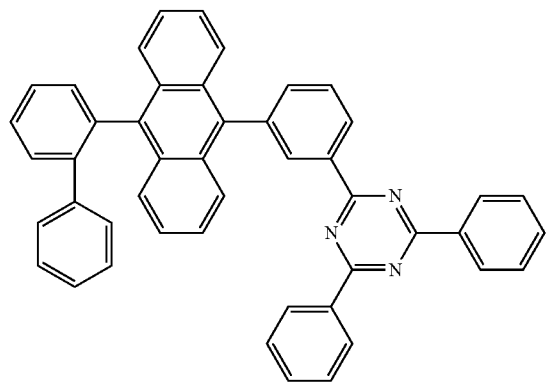

-continued
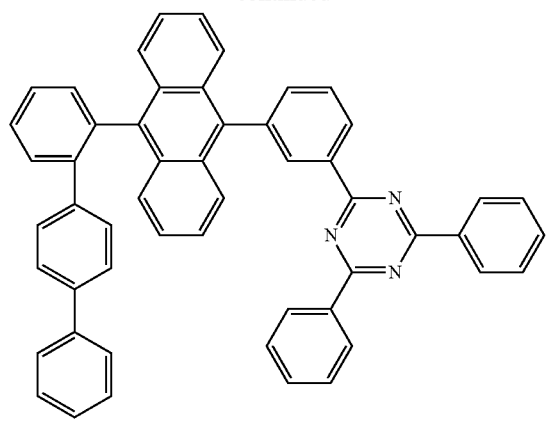
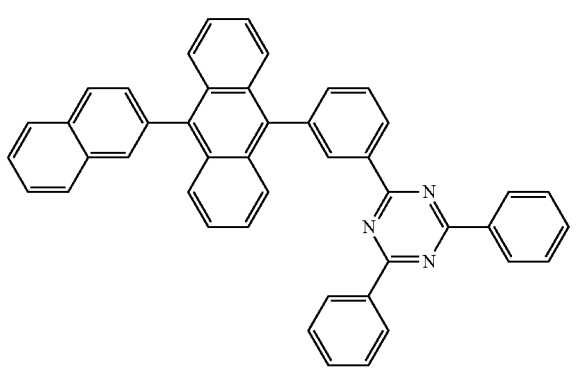
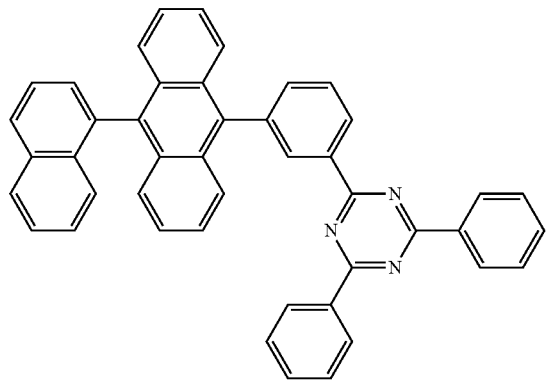
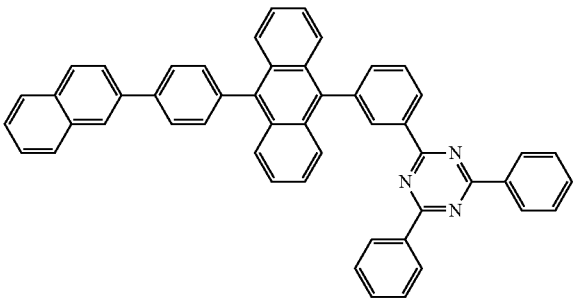
-continued
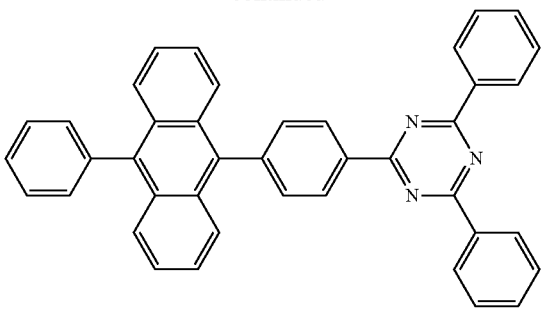
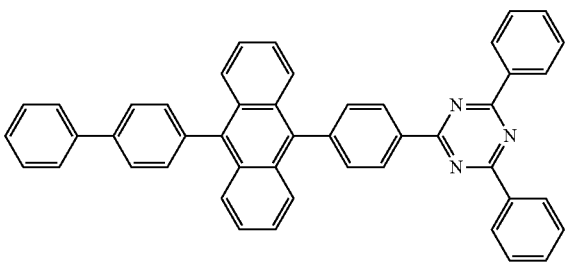
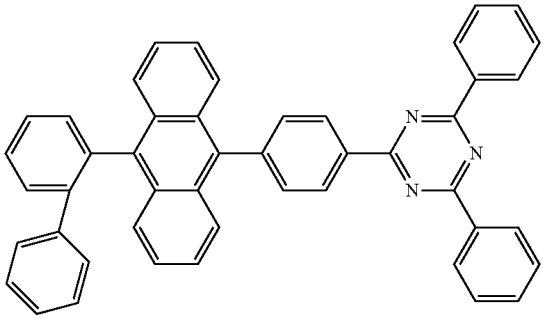
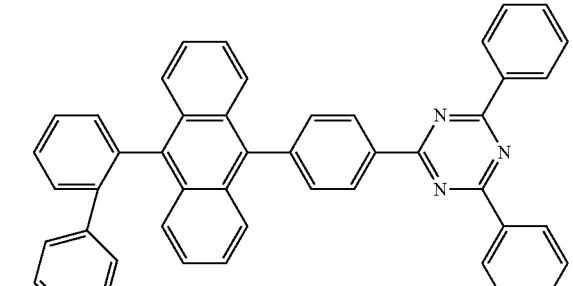
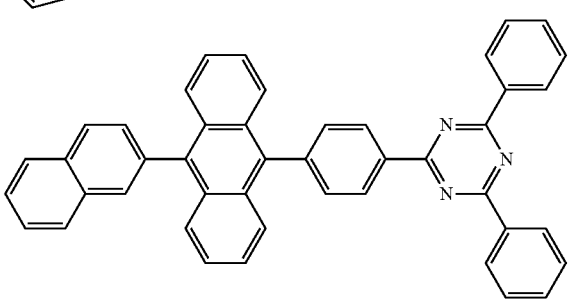

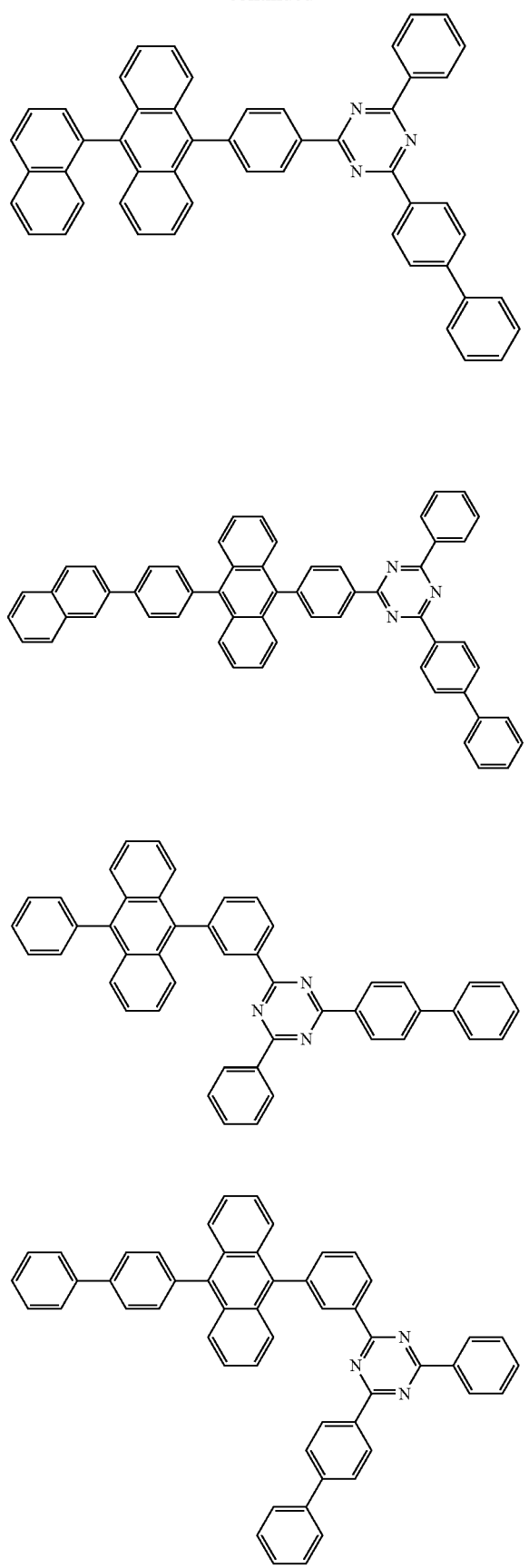
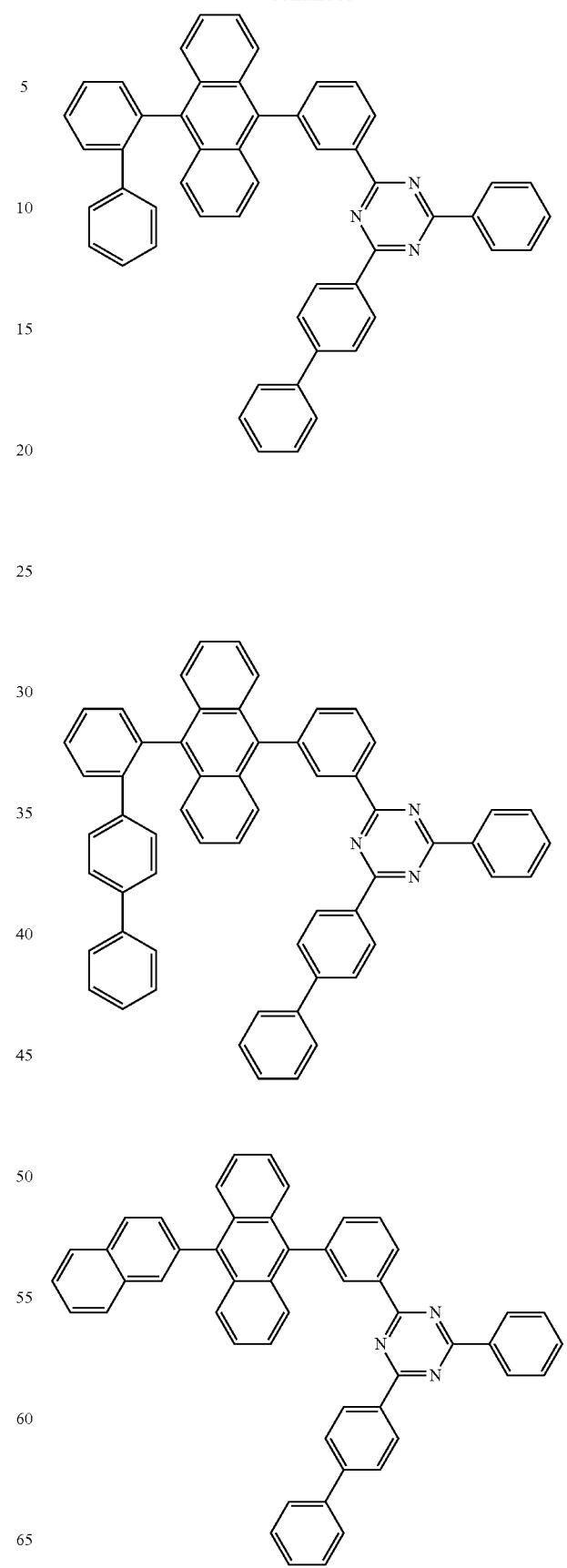

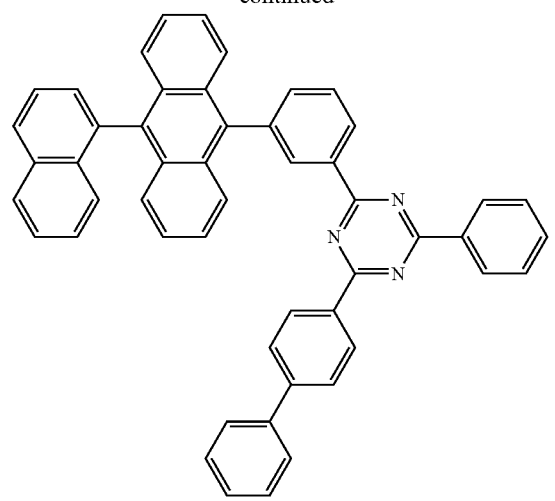
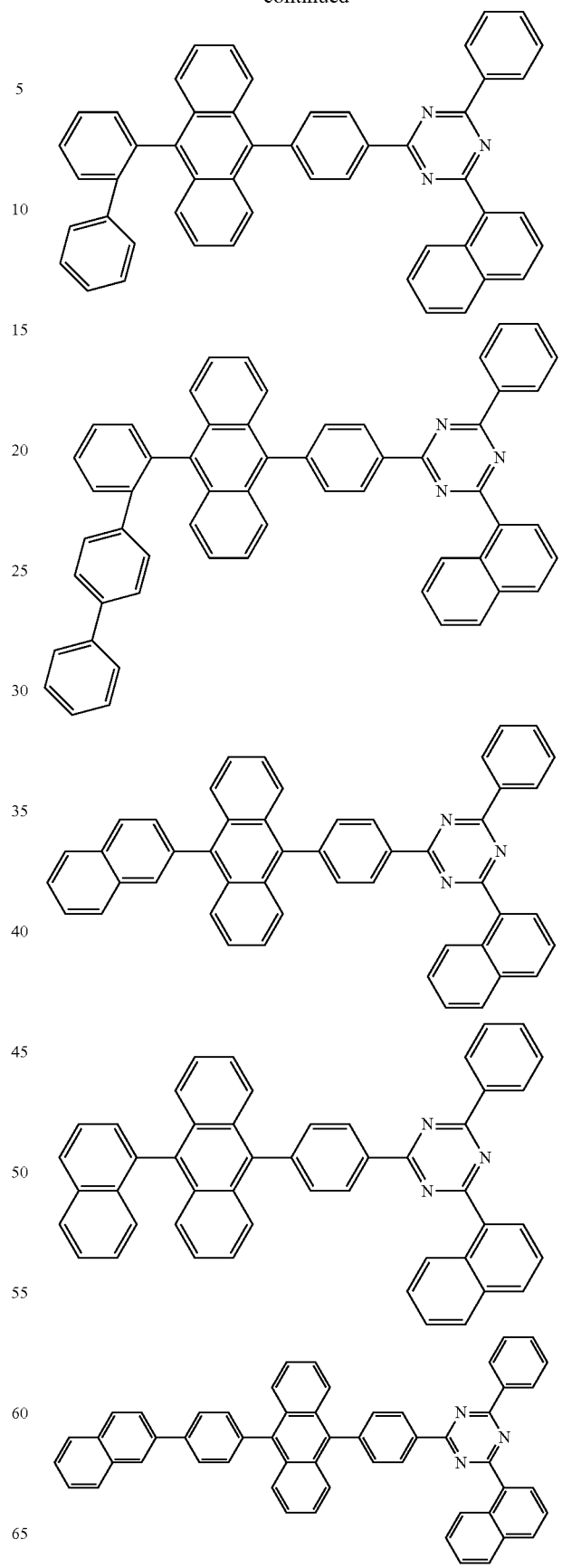

-continued
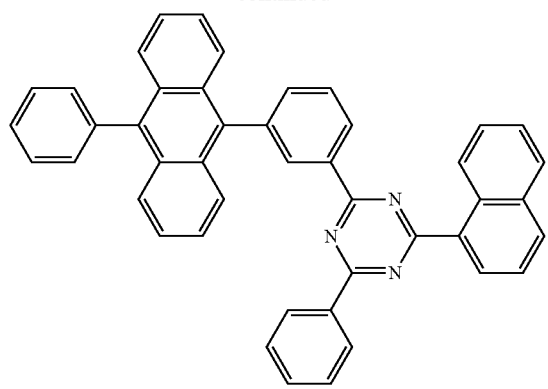
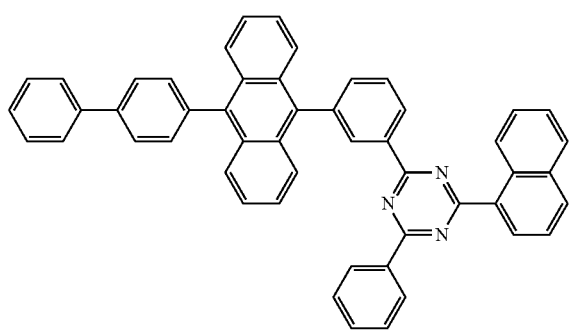
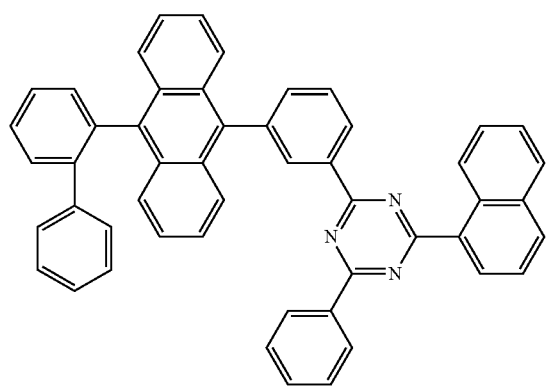
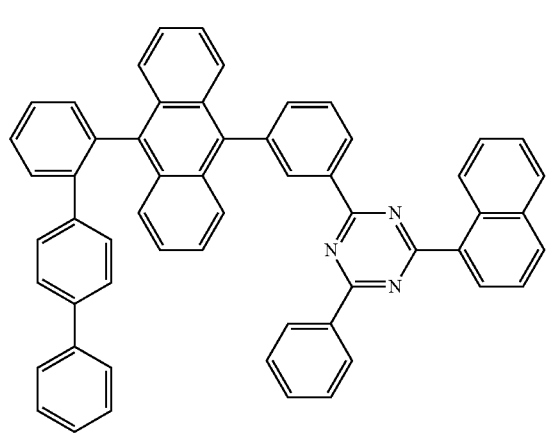
-continued
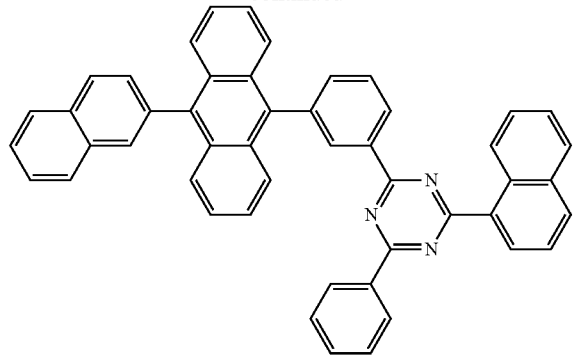
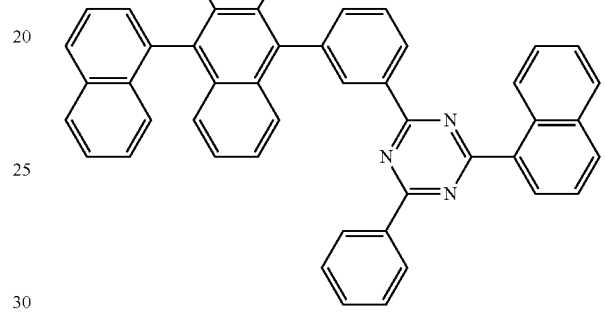
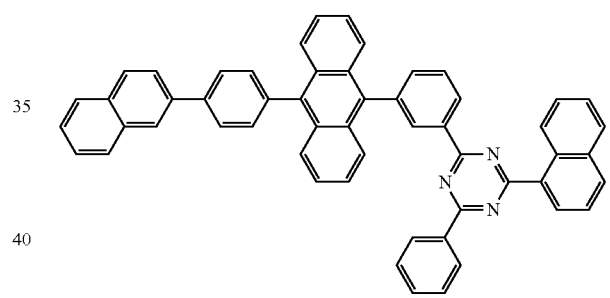
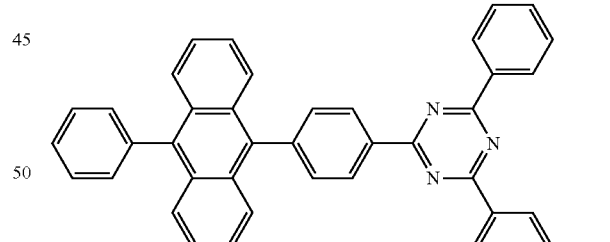
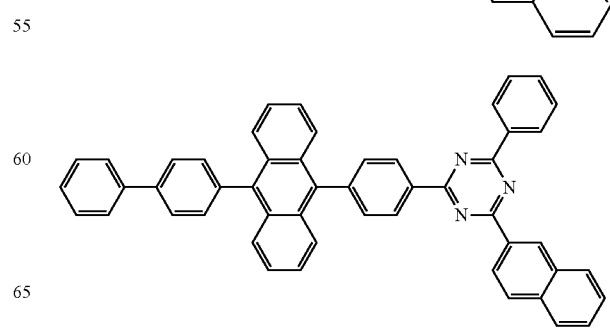

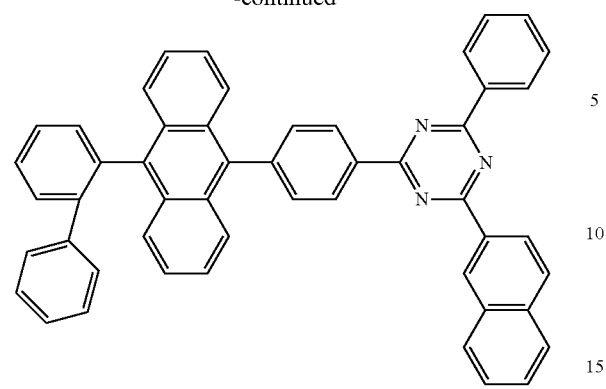
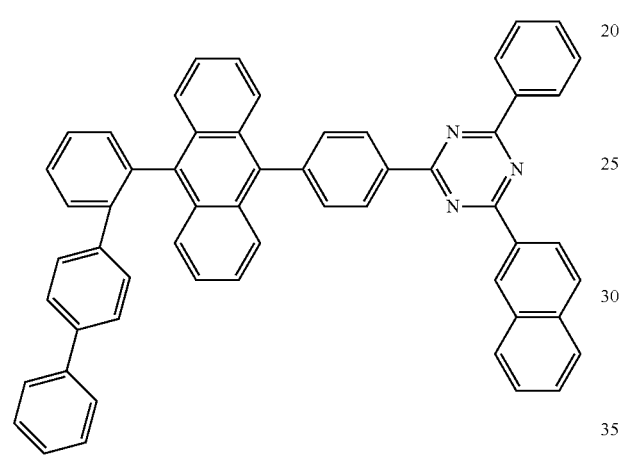
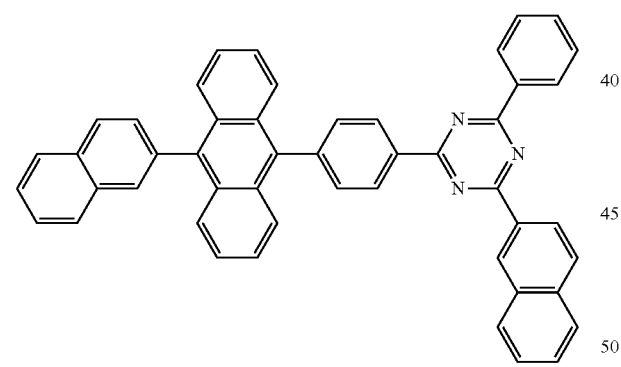
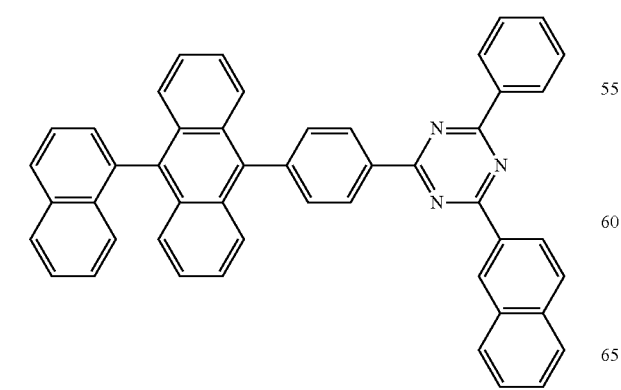
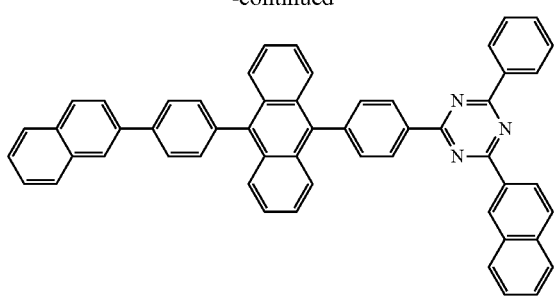
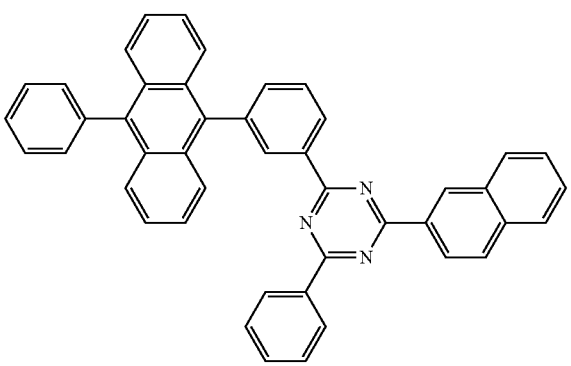
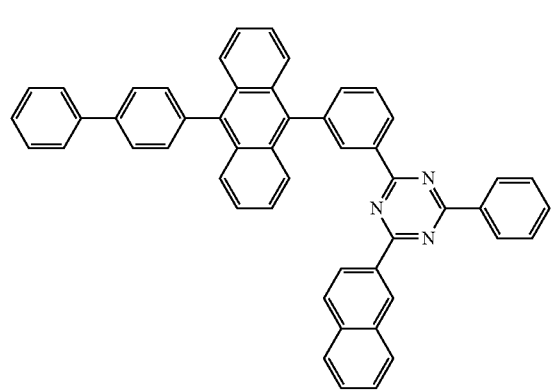
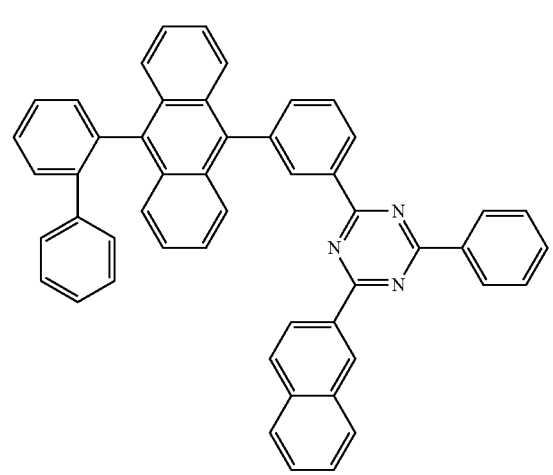

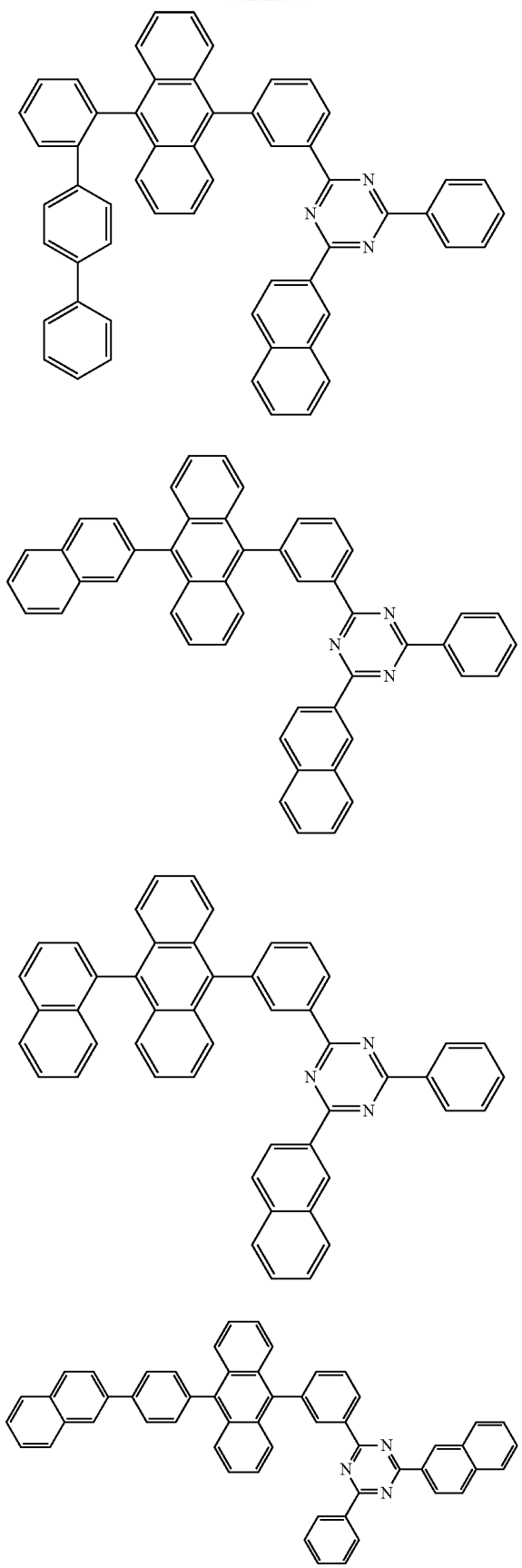
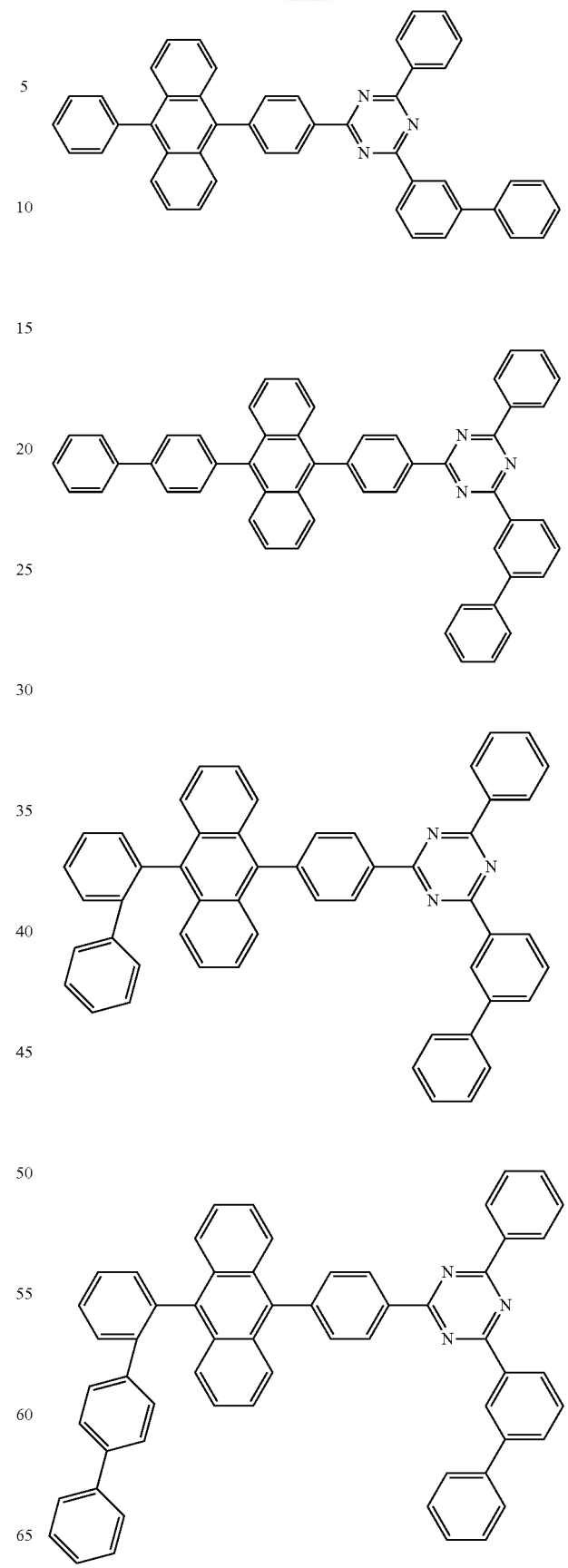

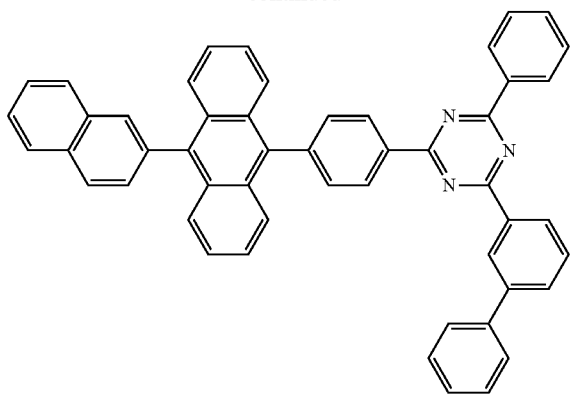
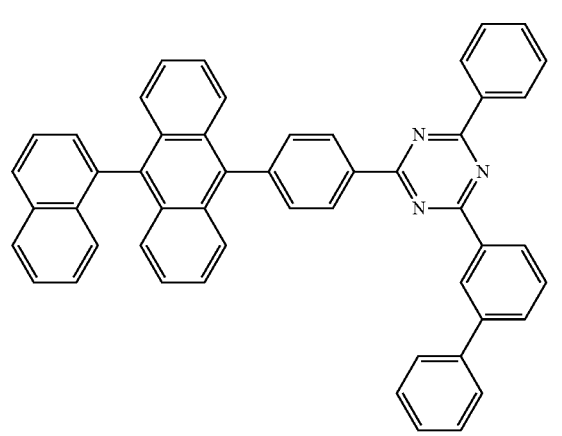
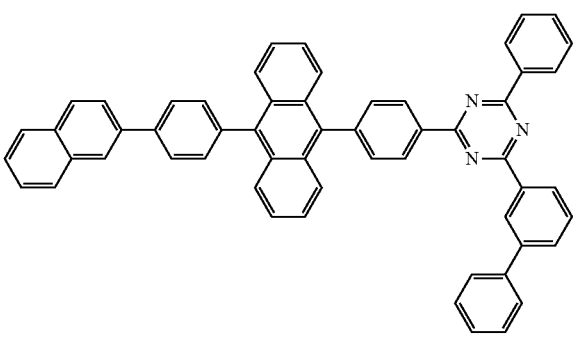
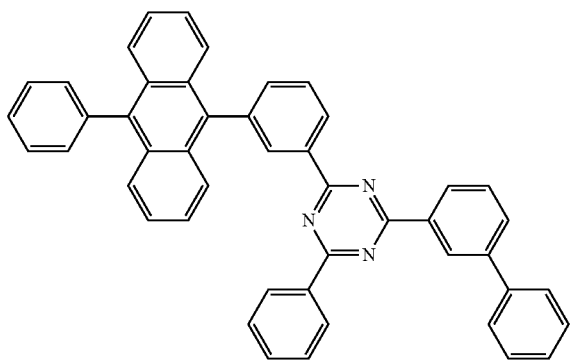
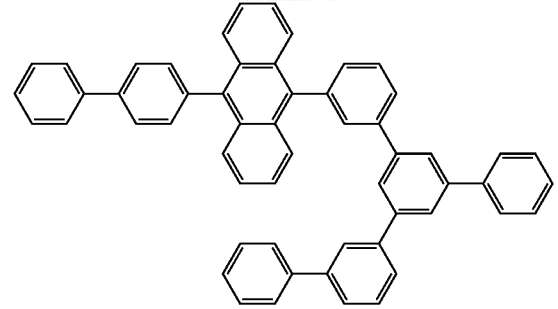
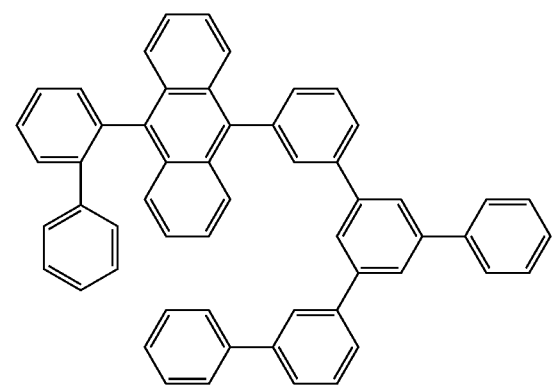
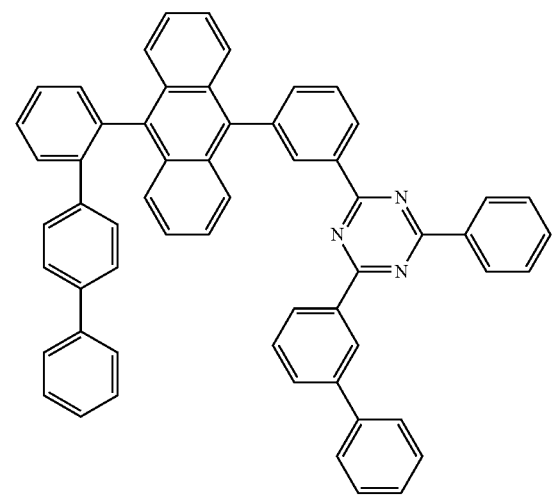
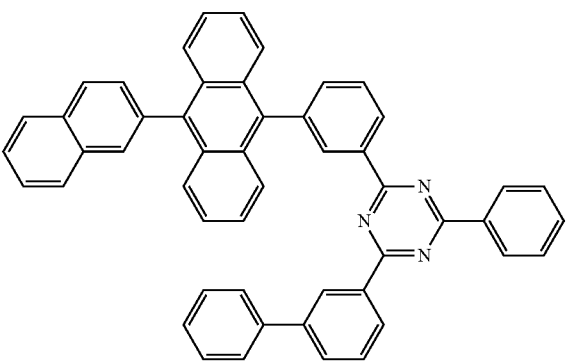

-continued
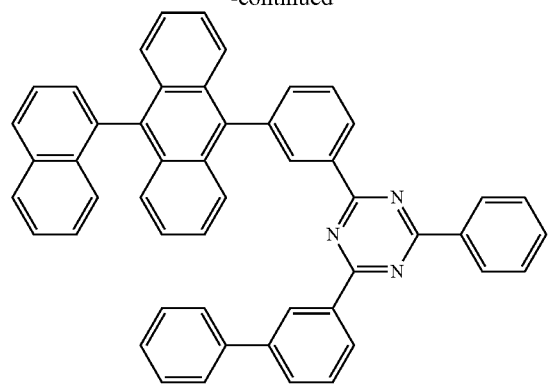
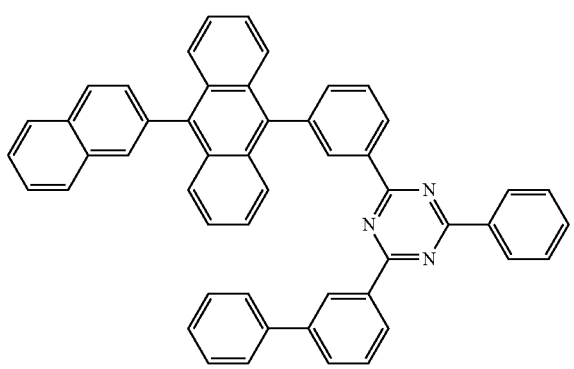
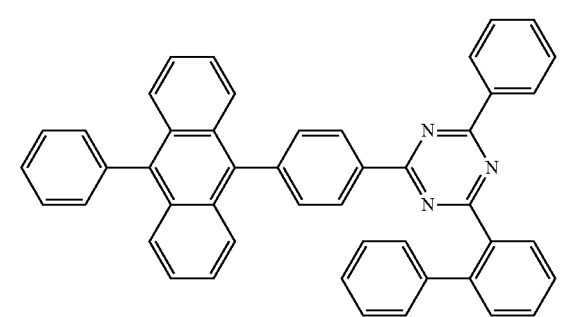
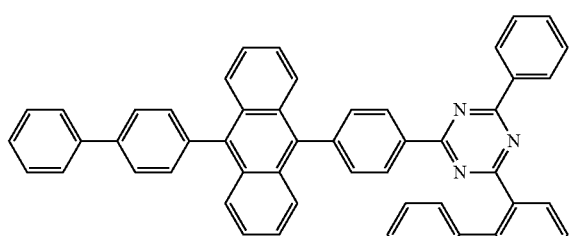
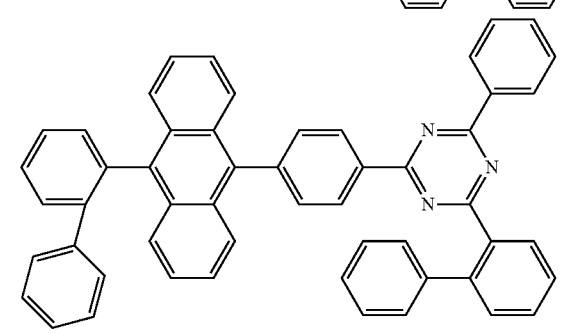
-continued
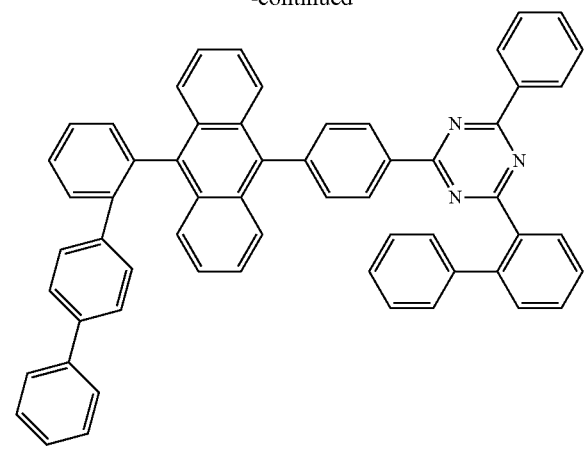
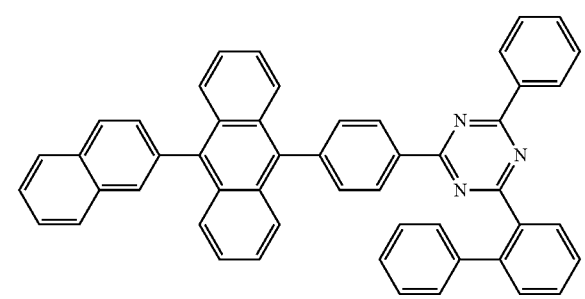
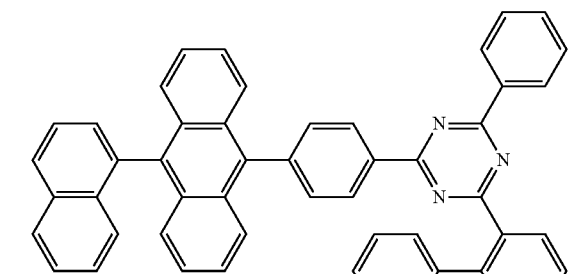
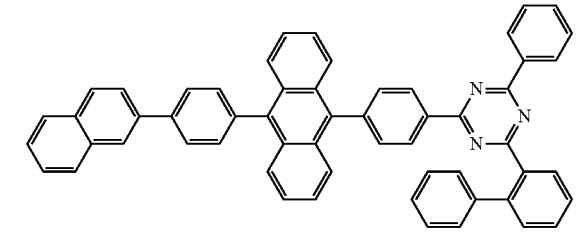
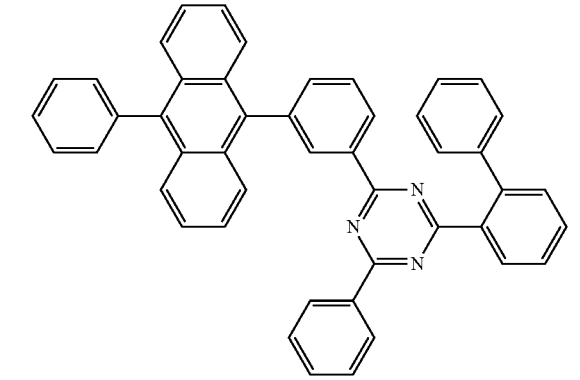

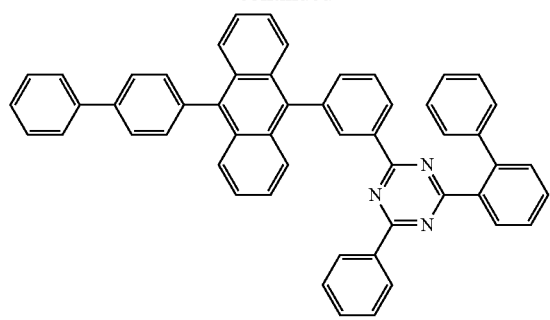
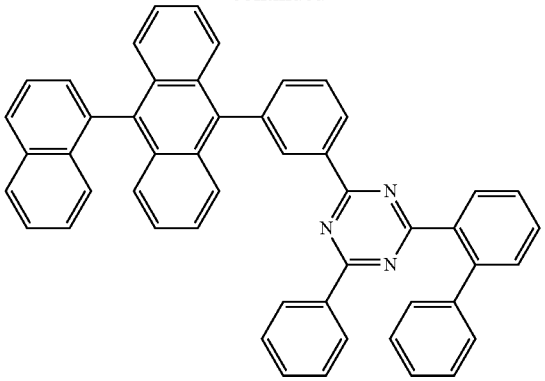
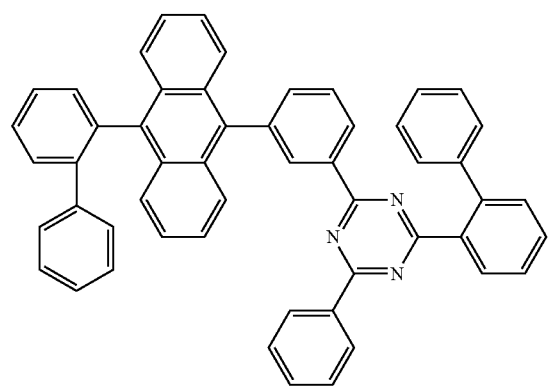
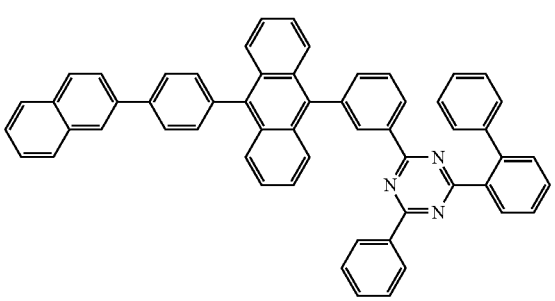
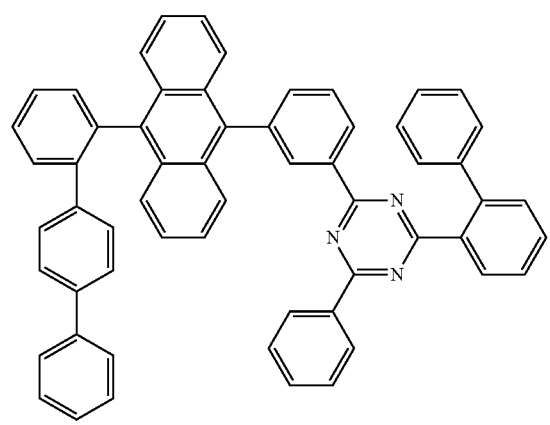
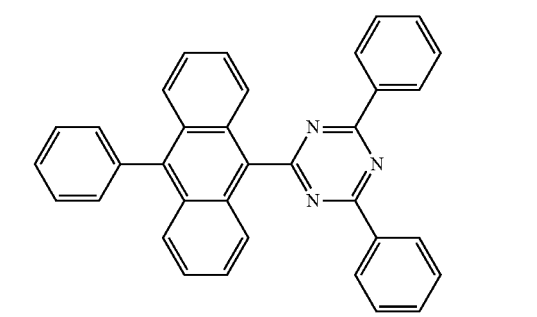
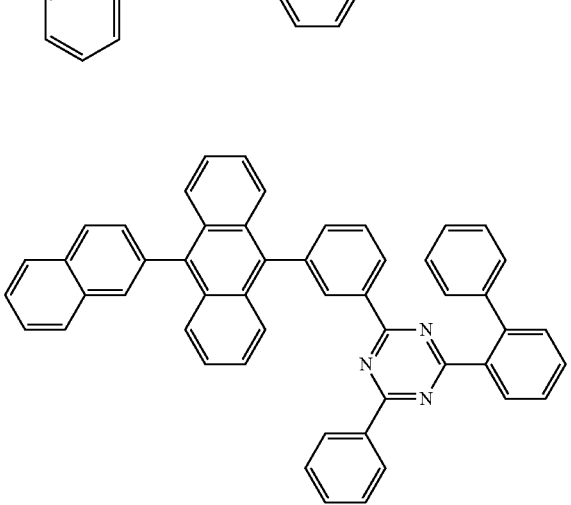
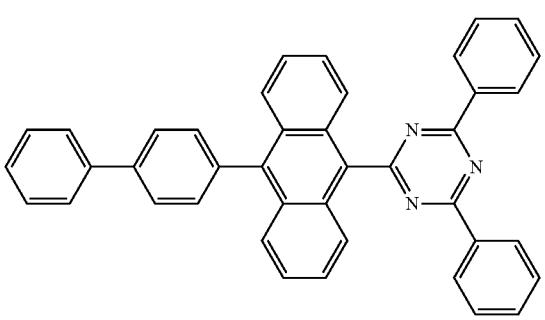
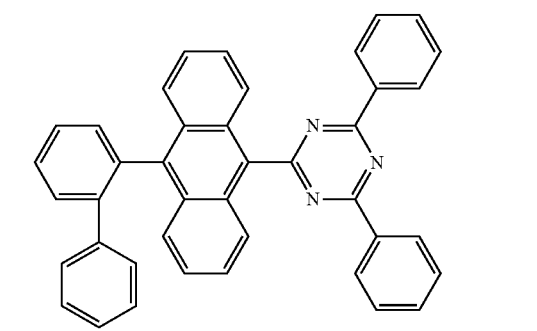

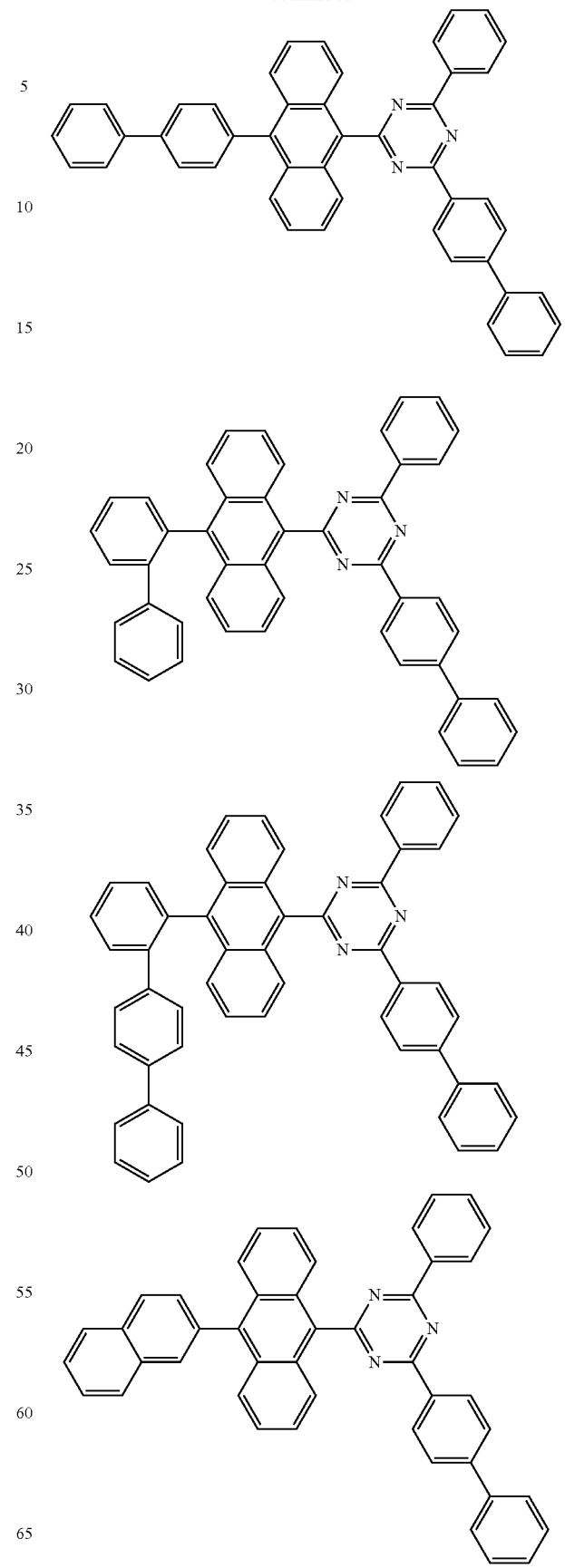

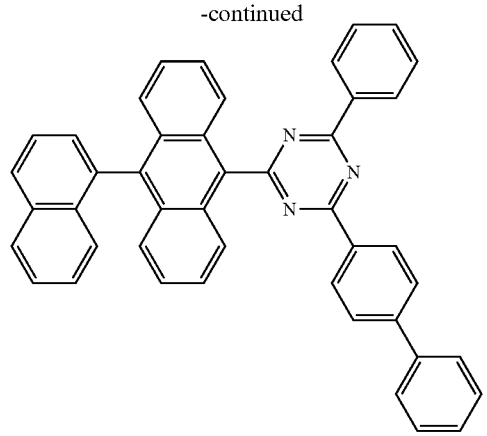
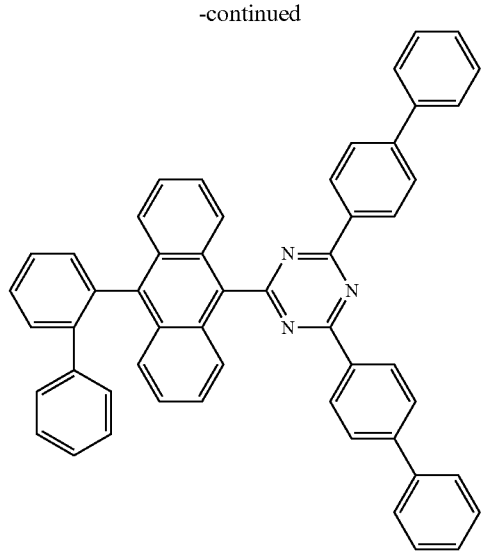
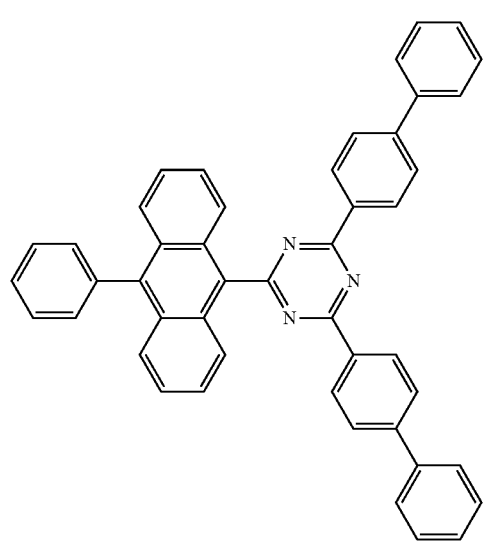
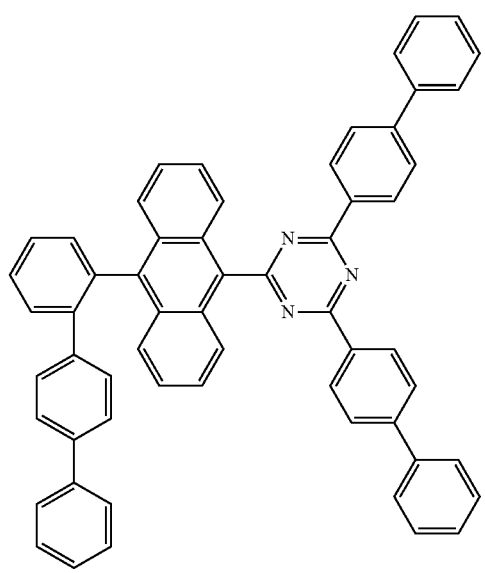
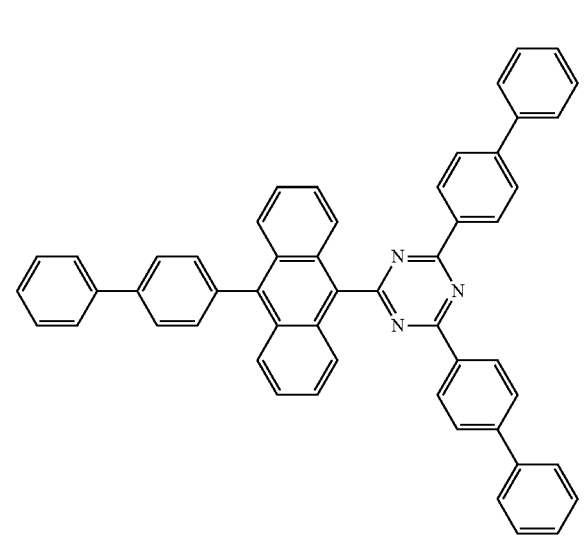
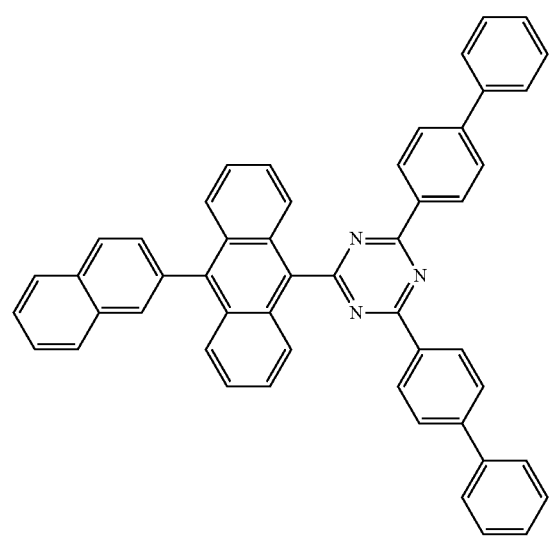

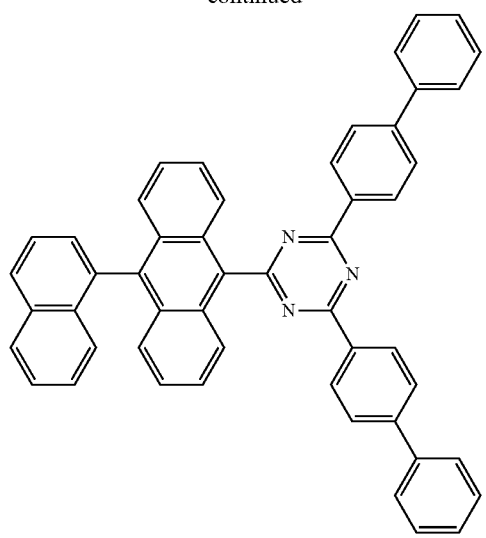
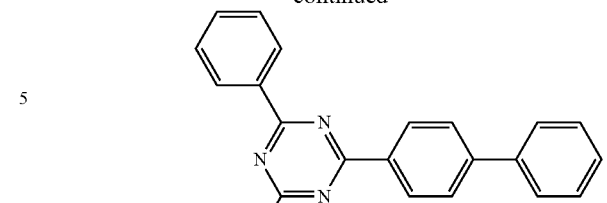
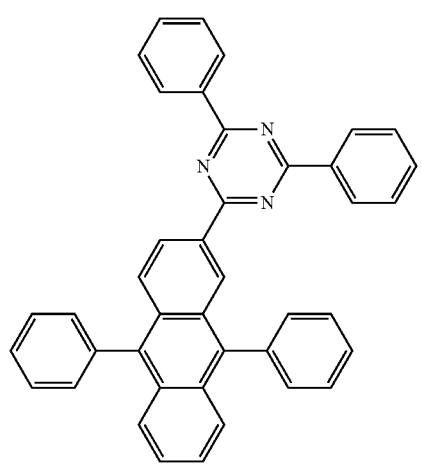
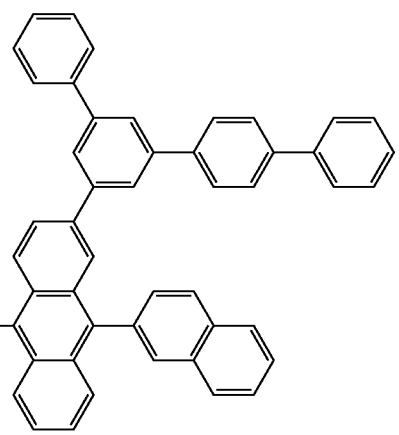
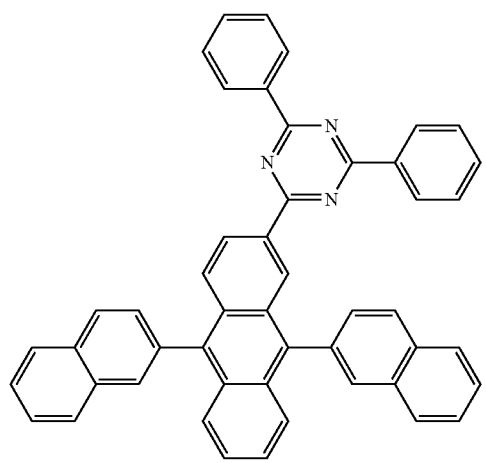
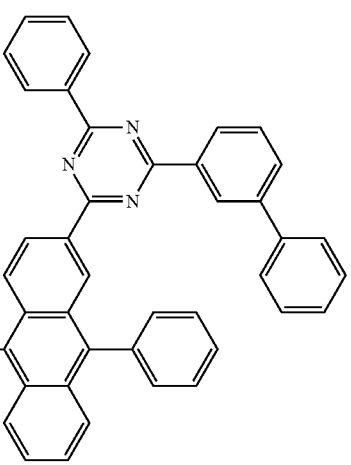

61
-continued
62
-continued
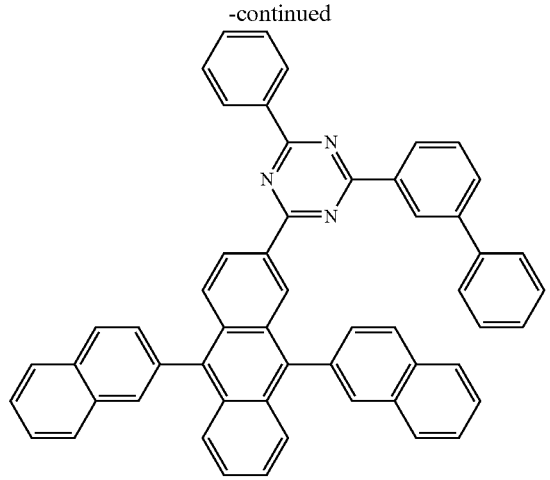
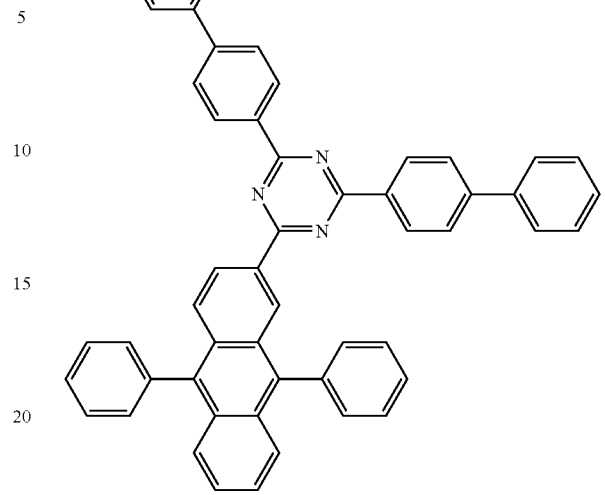
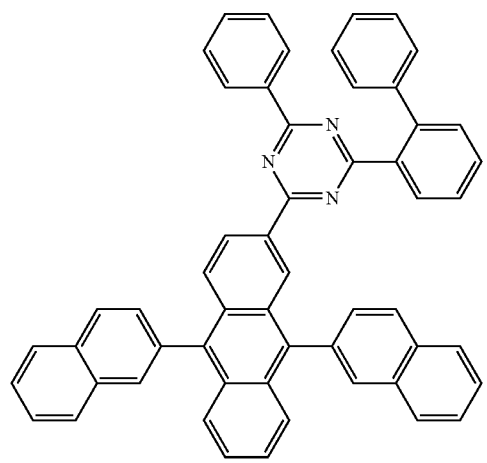
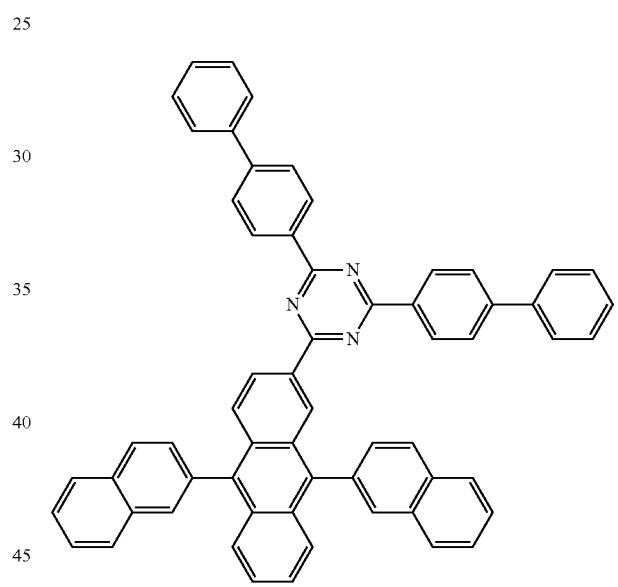
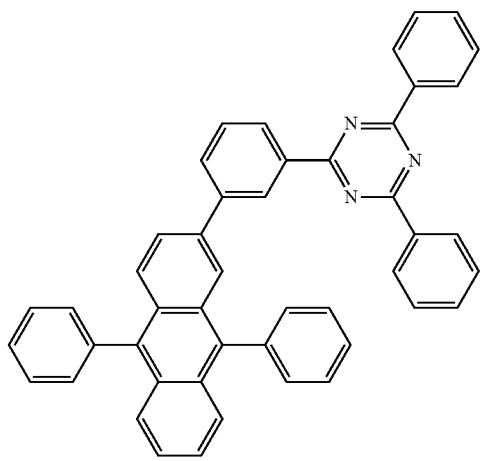

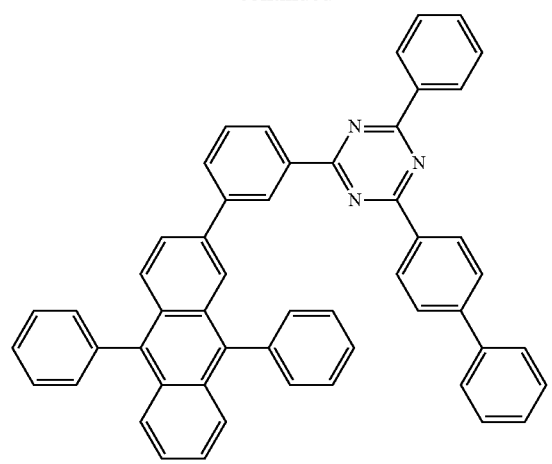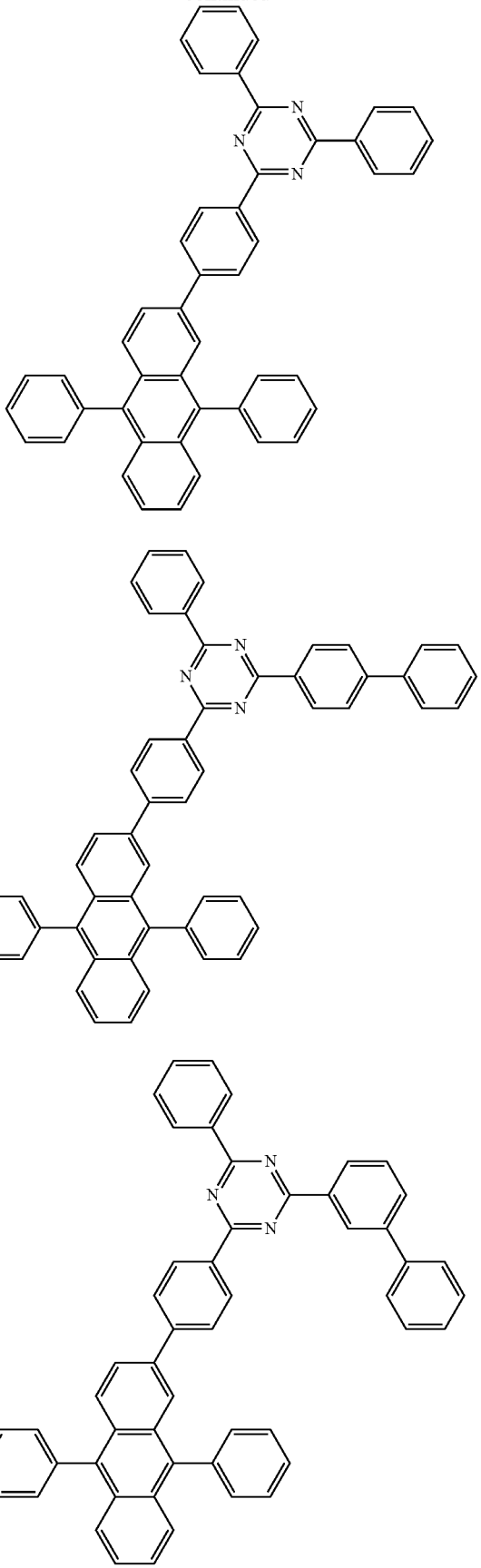

-continued
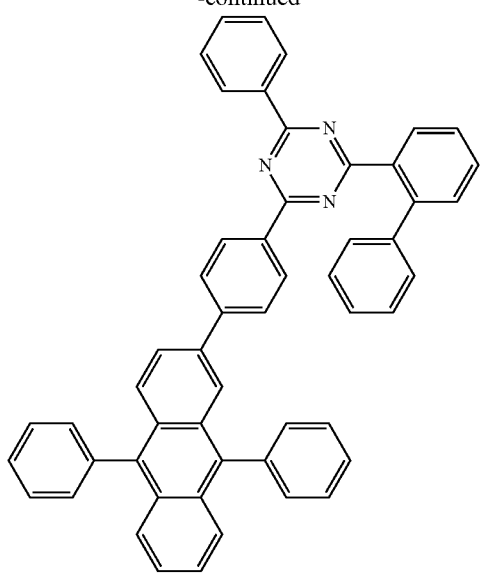
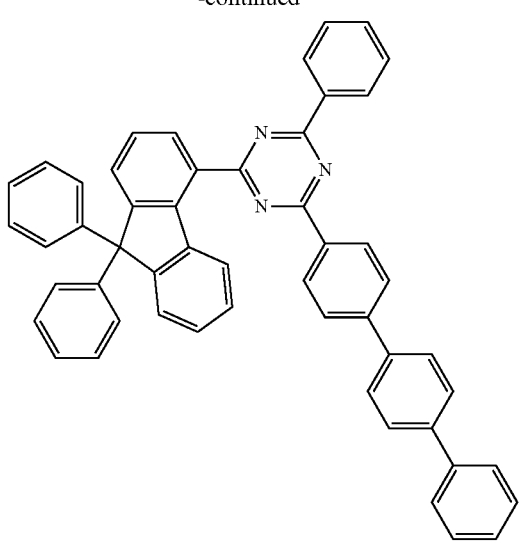
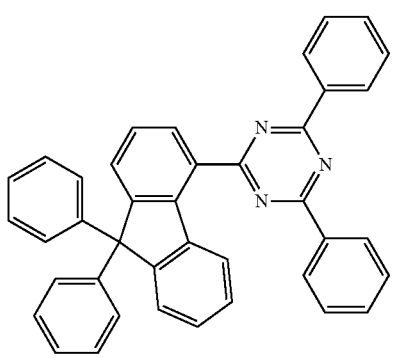
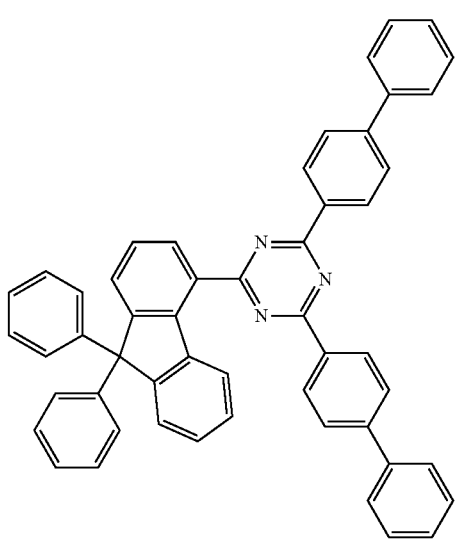
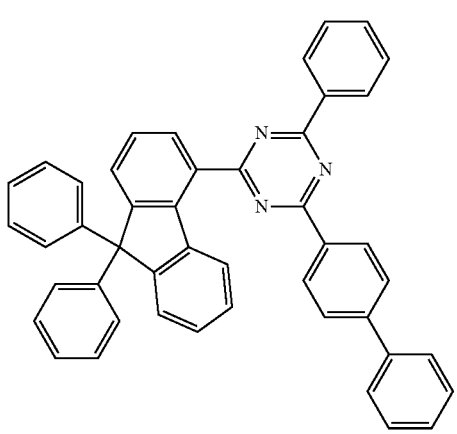
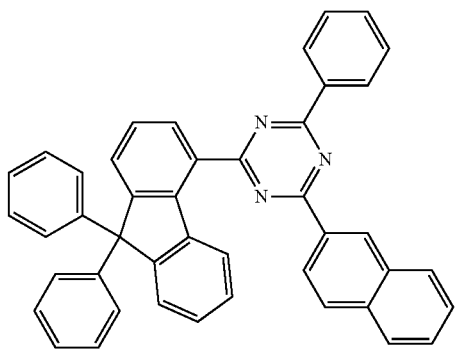

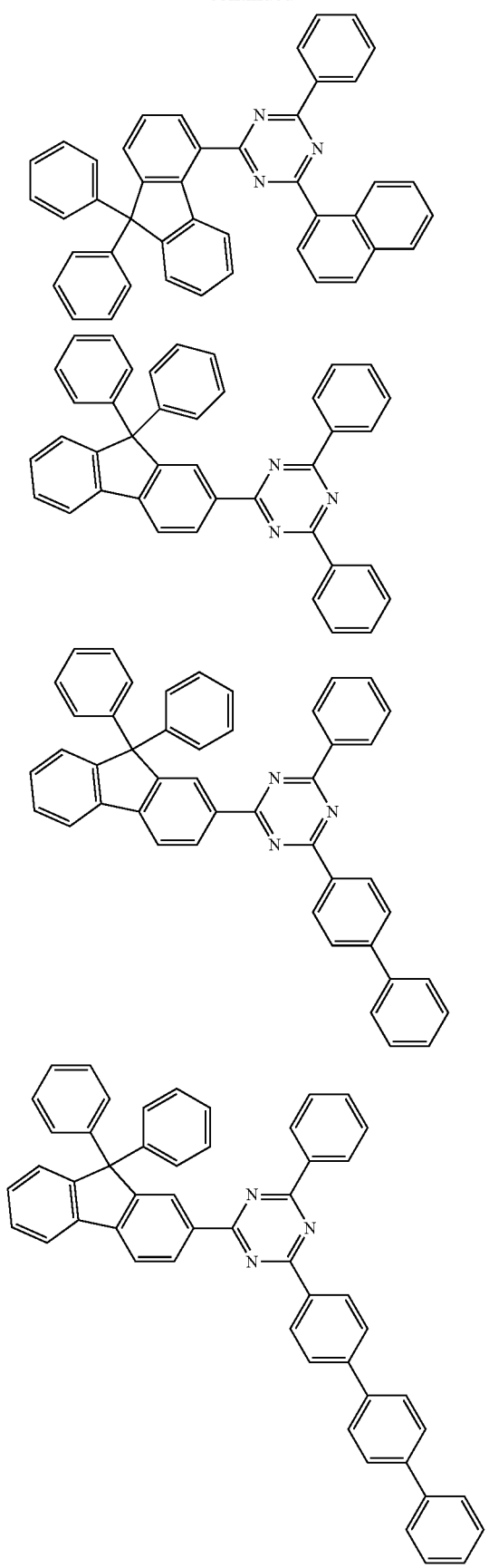
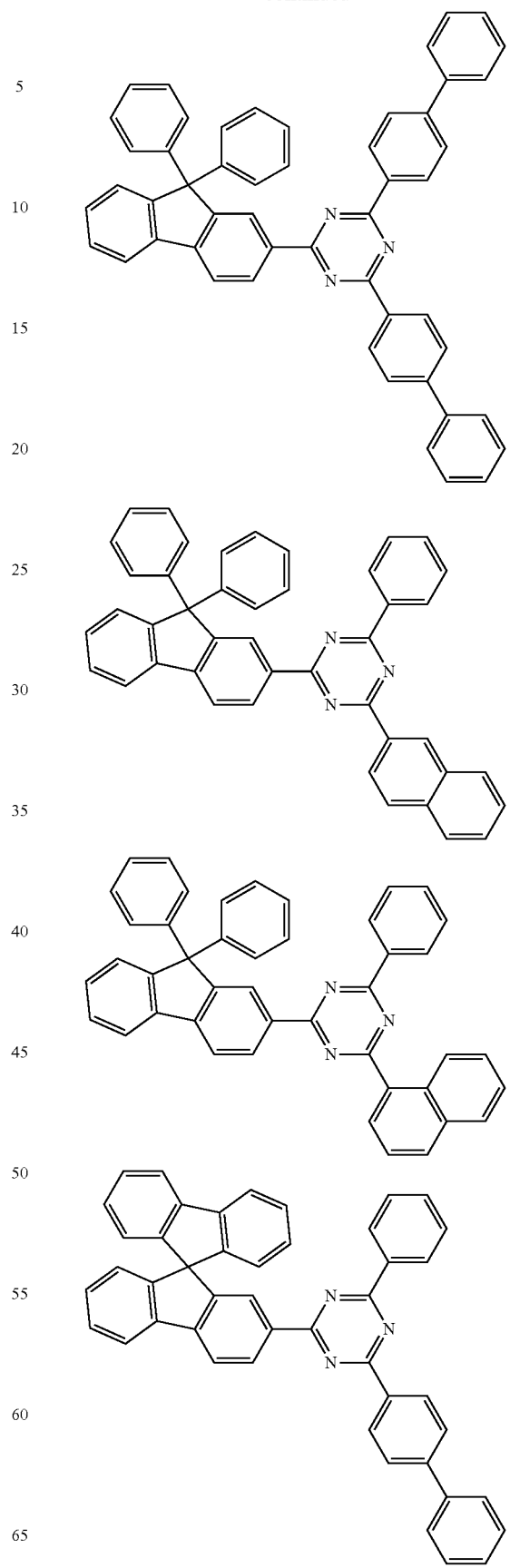

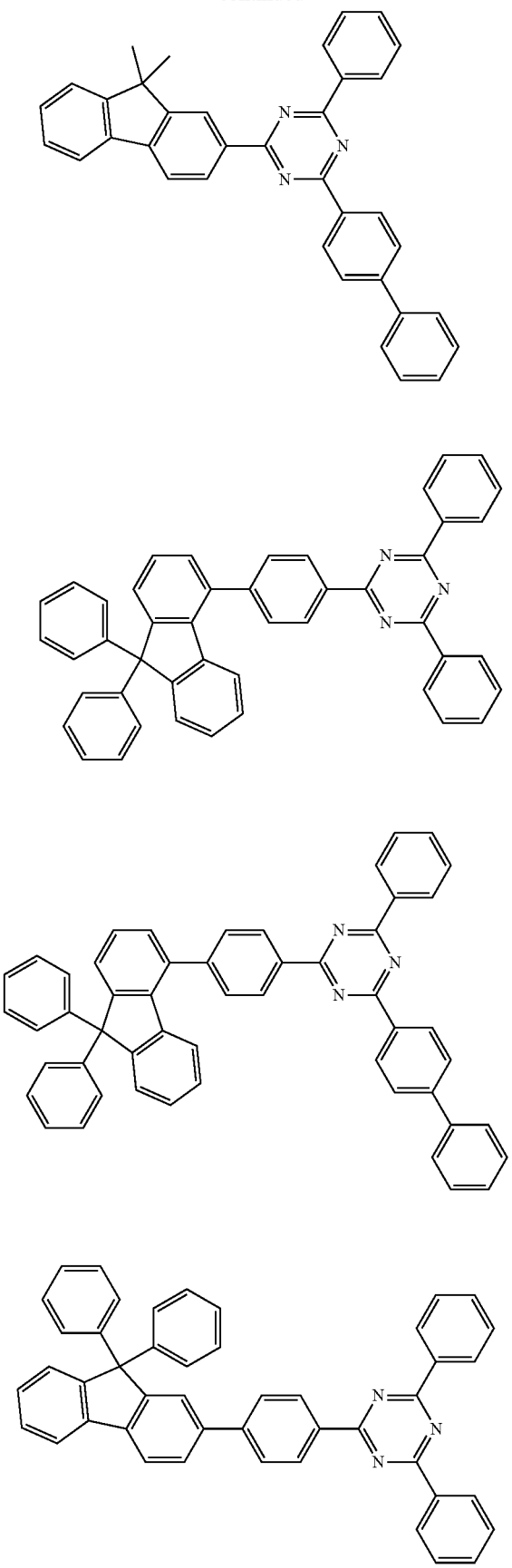
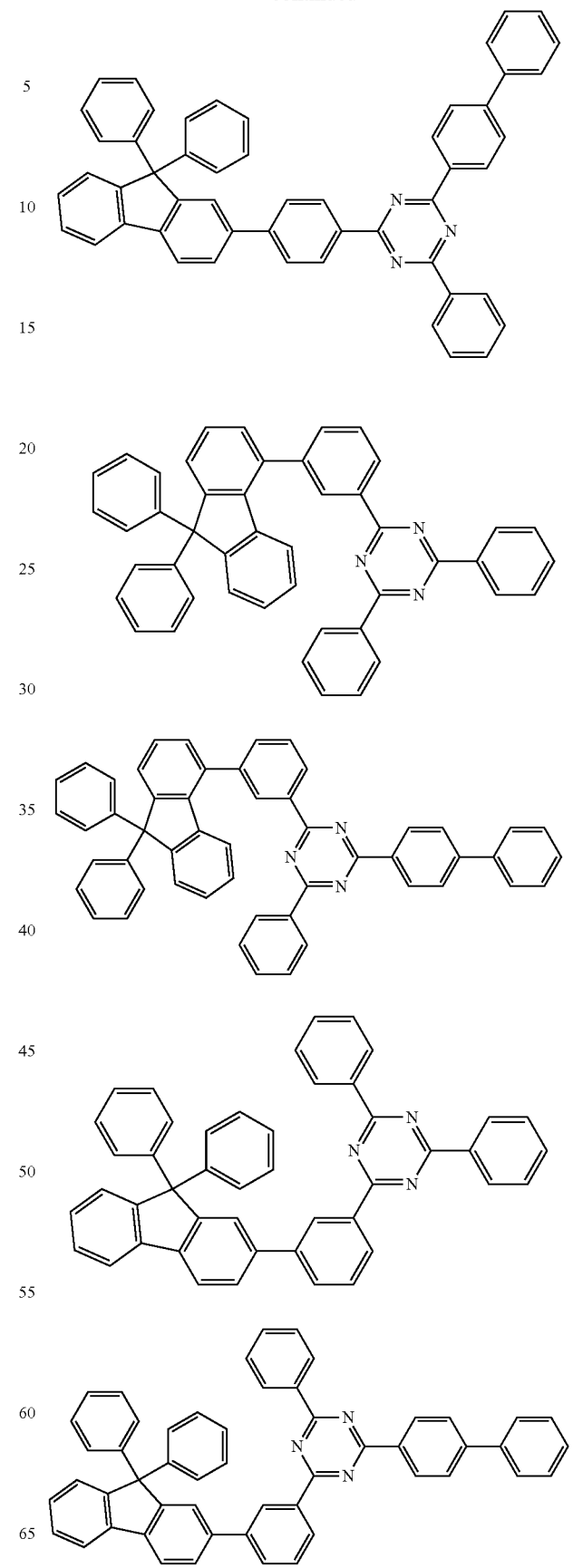

71
-continued
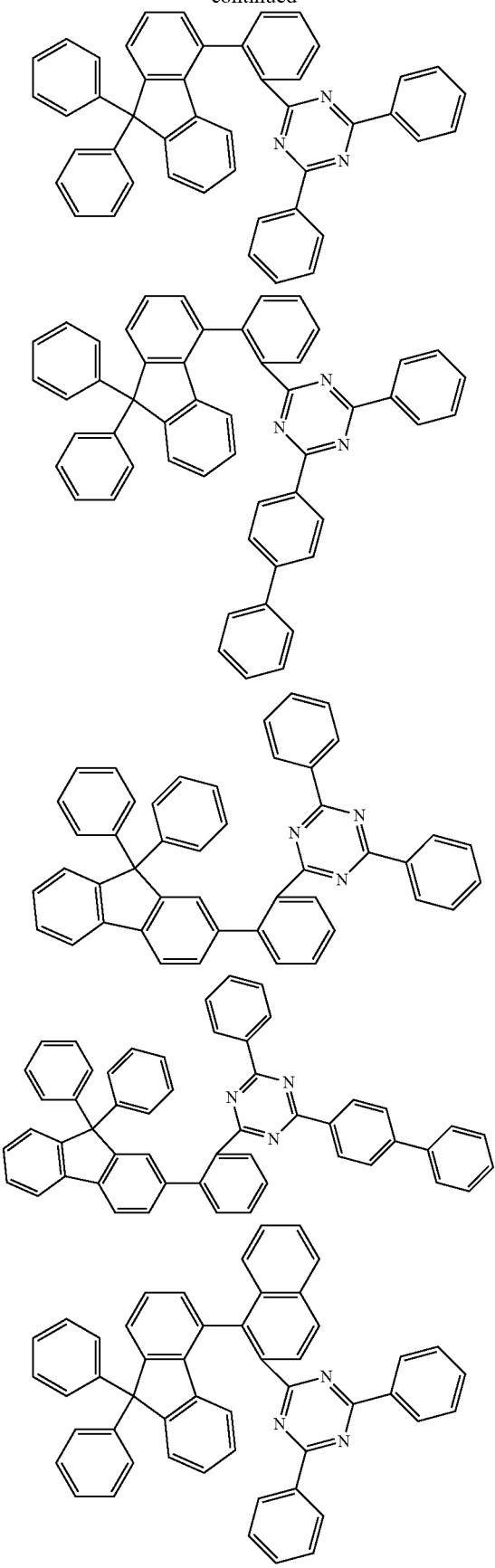
72
-continued
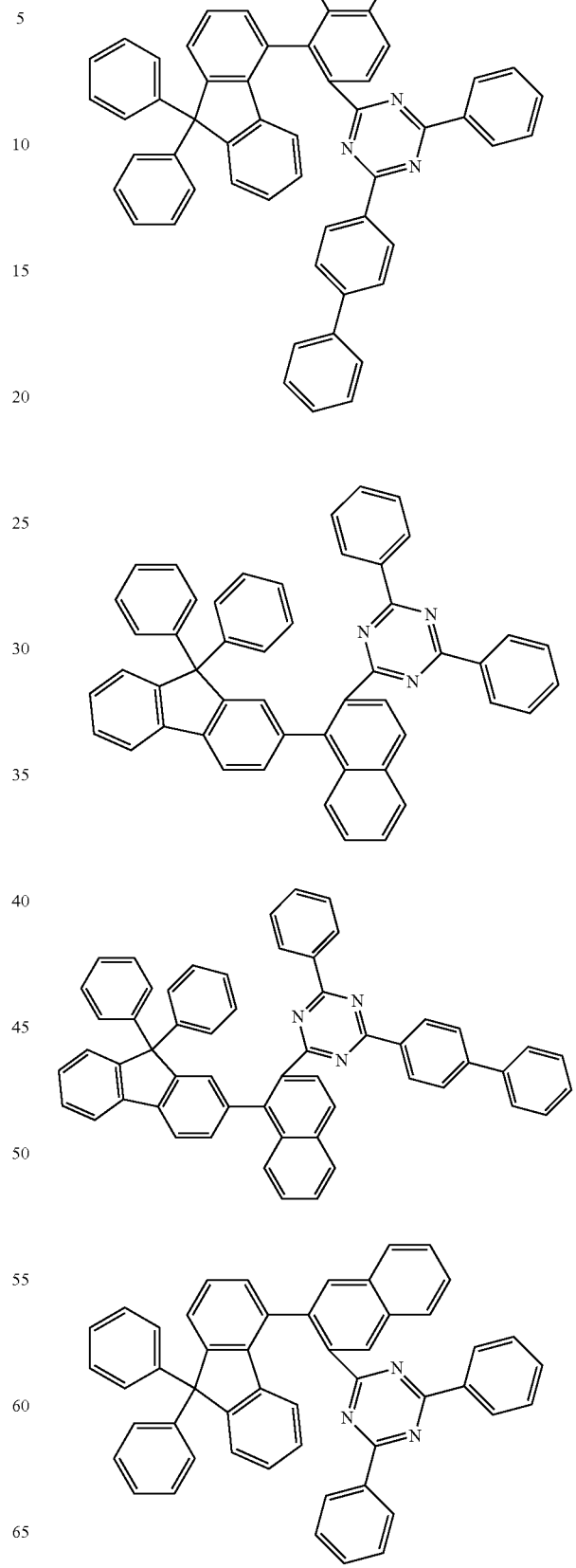

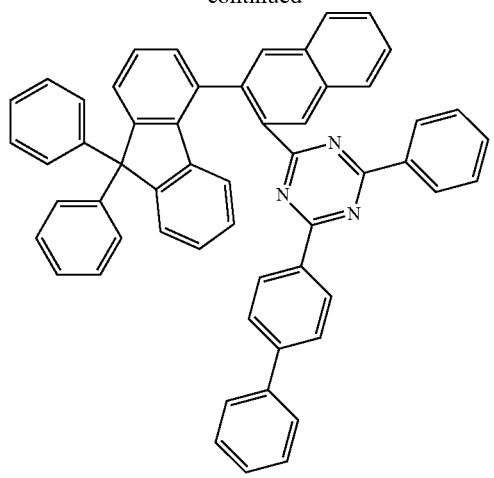
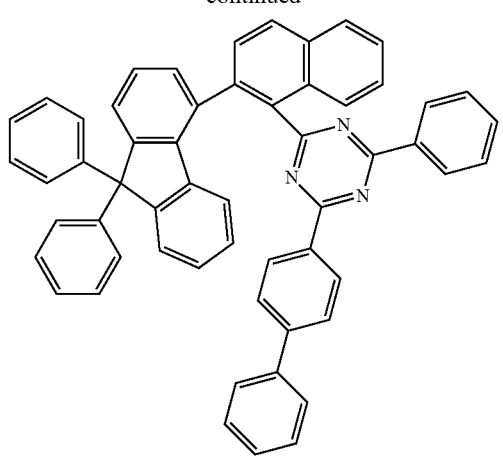
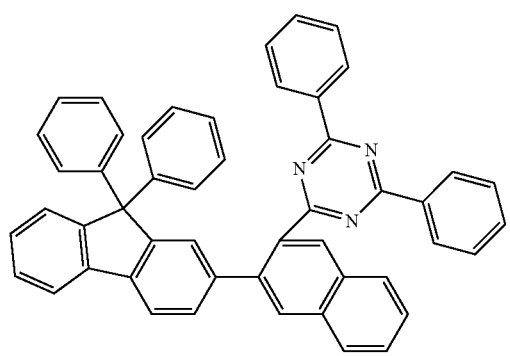
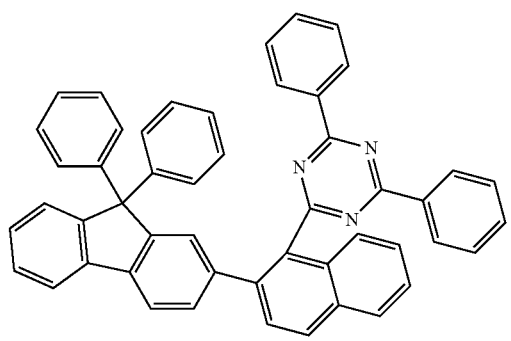
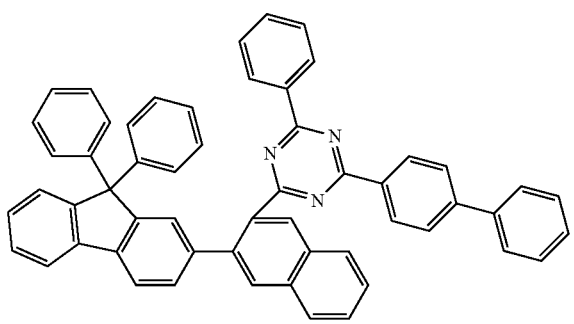
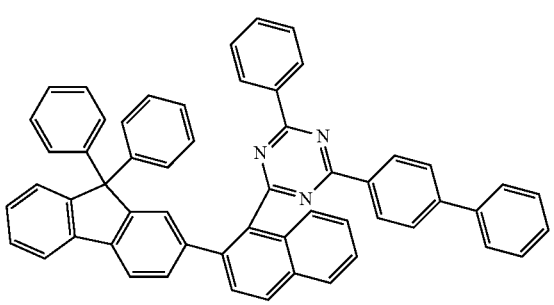
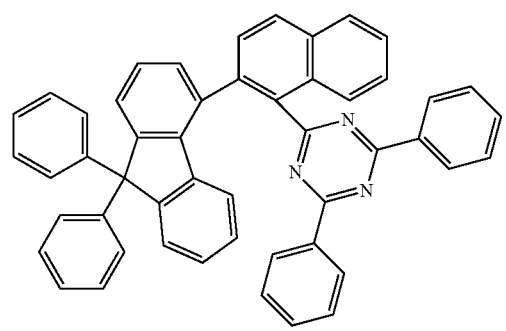
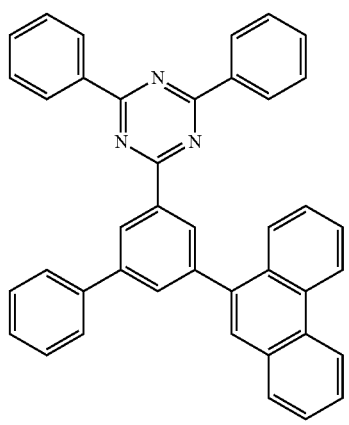

75
-continued
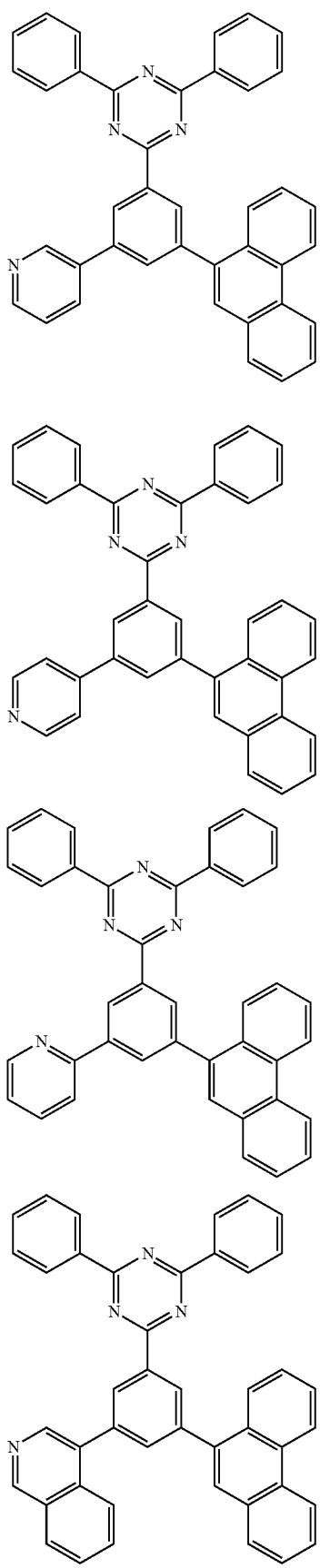
76
-continued
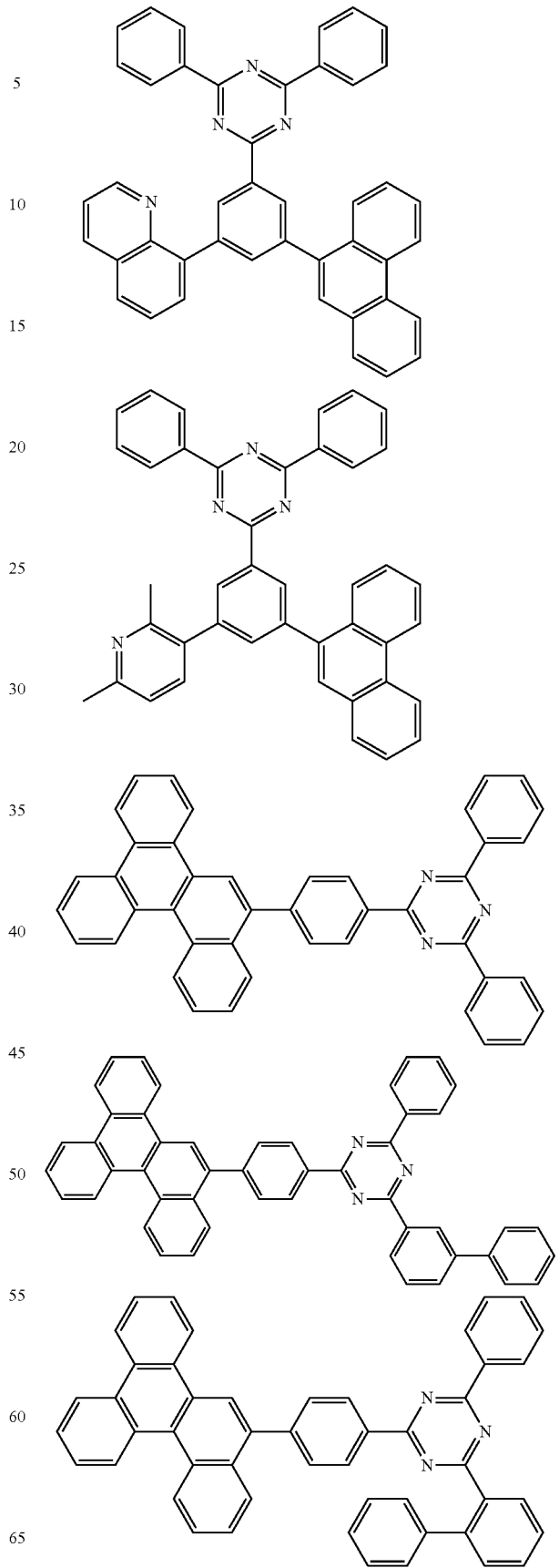

77
-continued
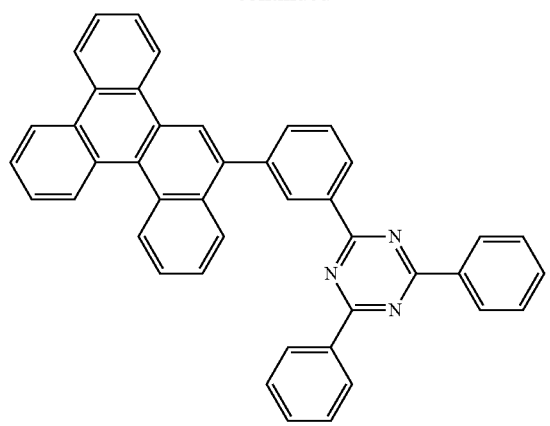
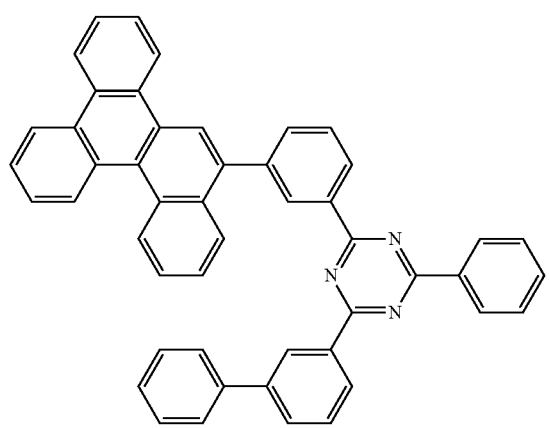
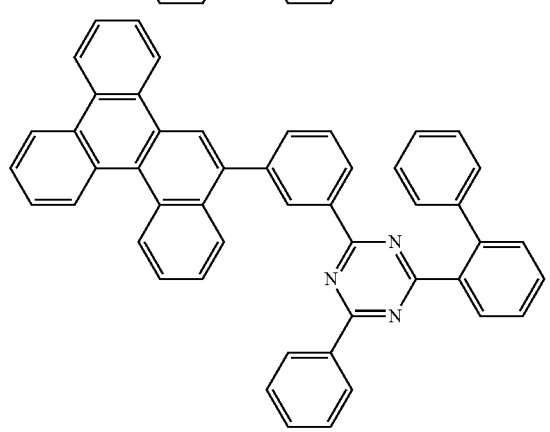
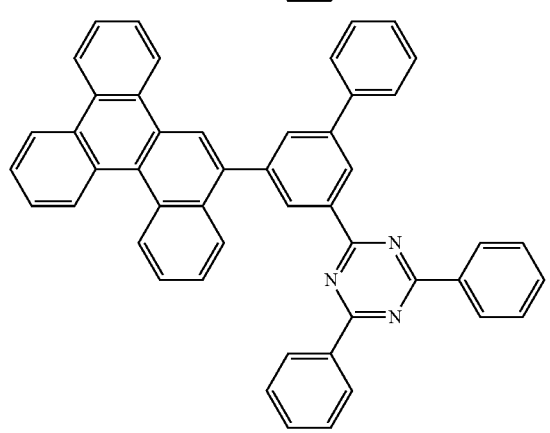
78
-continued
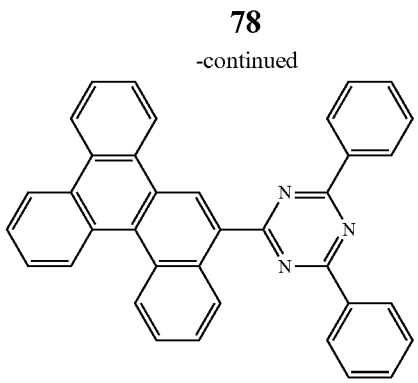
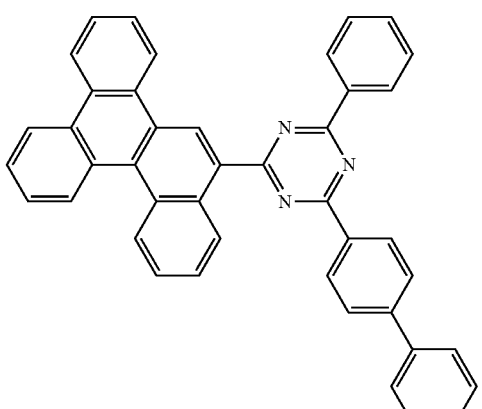
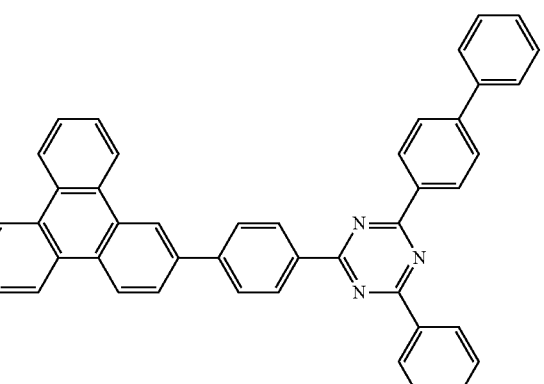
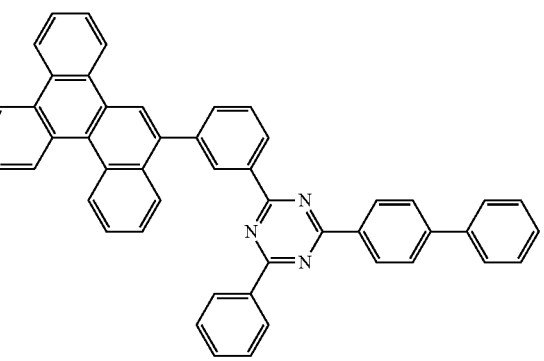

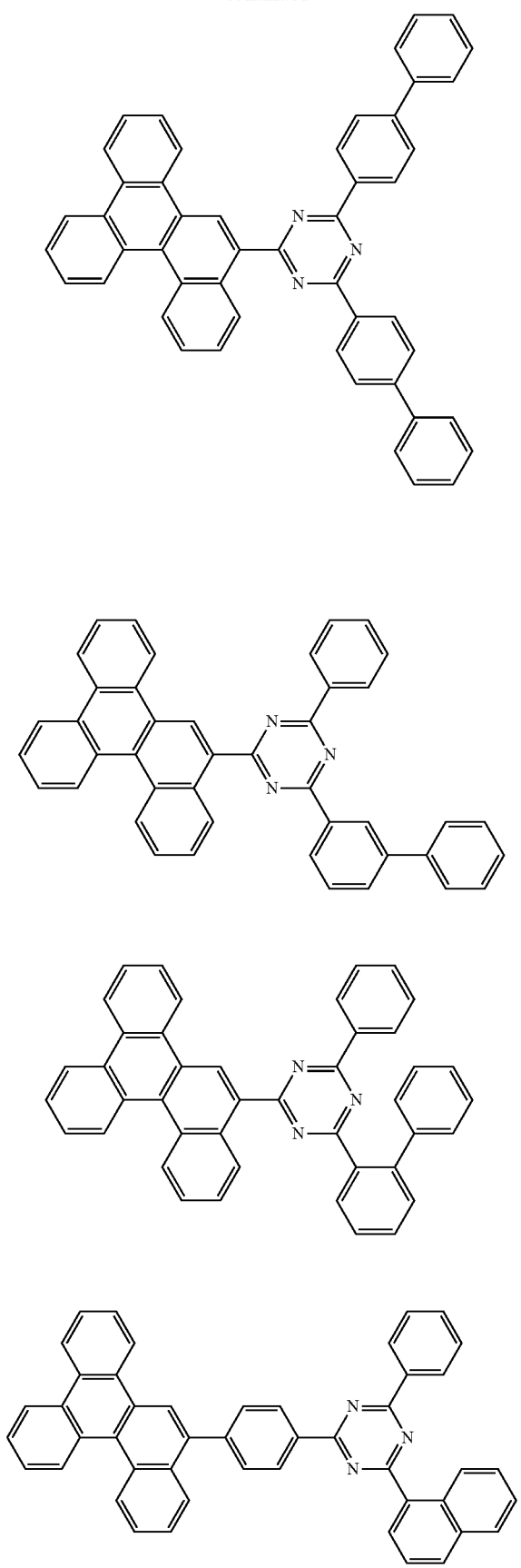
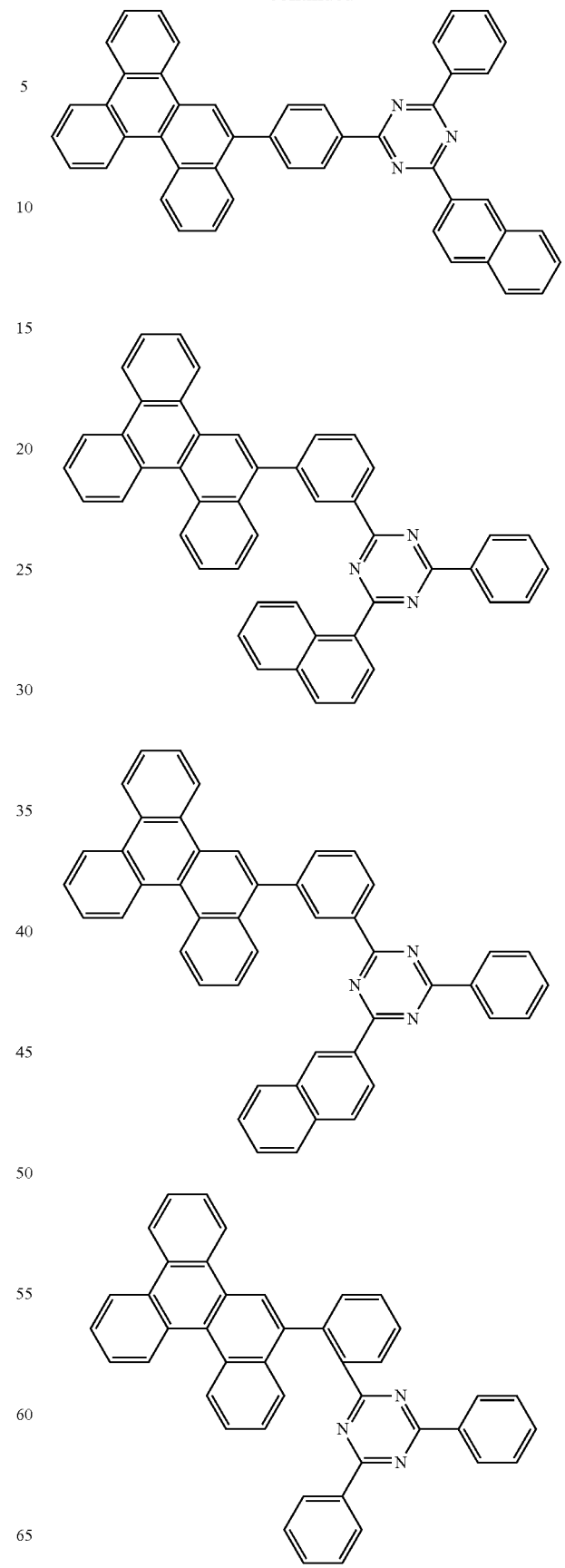

81
-continued
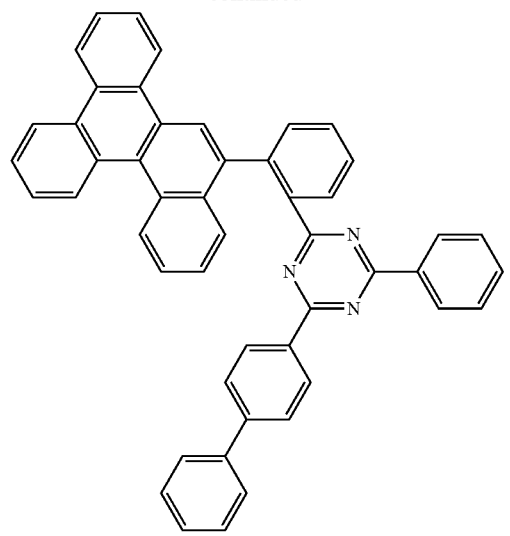
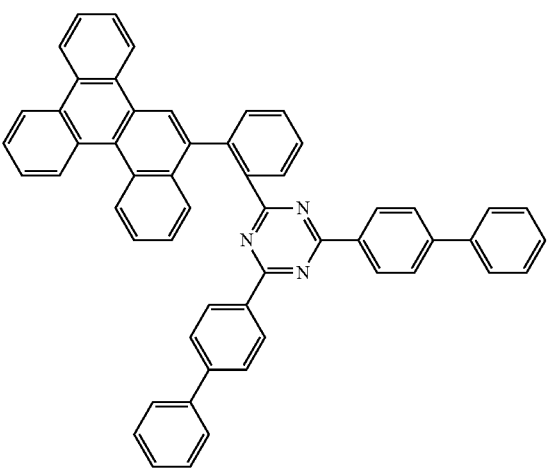
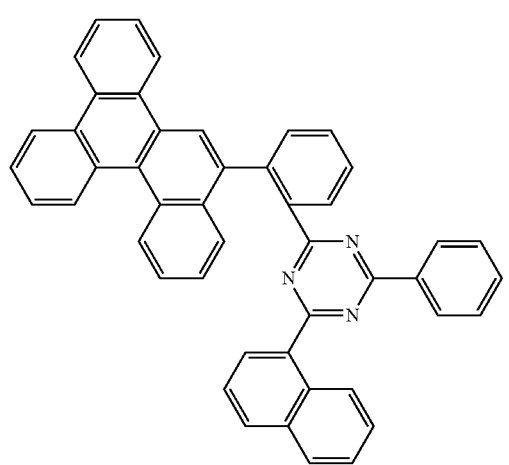
82
-continued
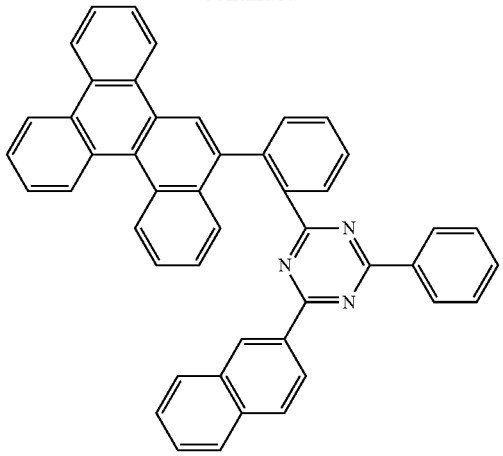
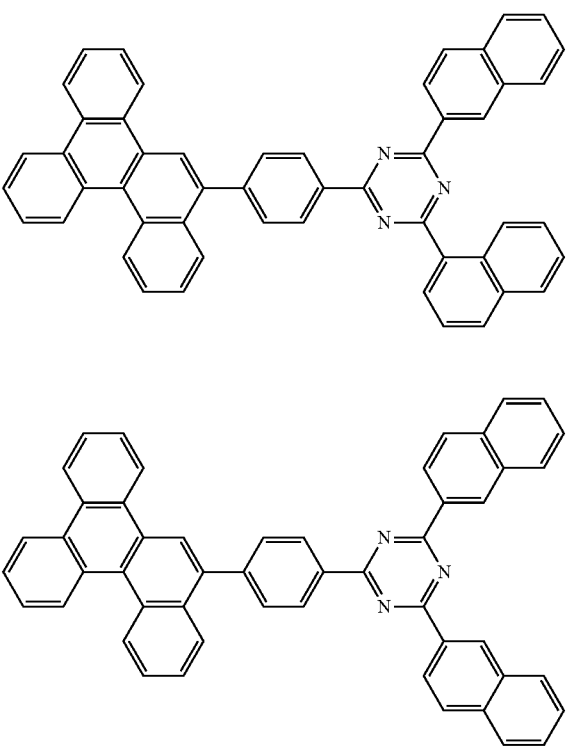
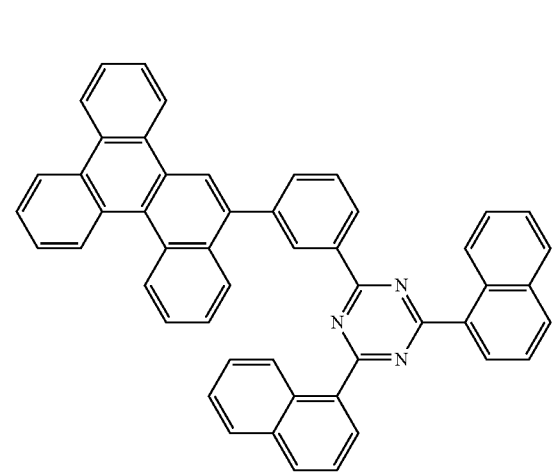

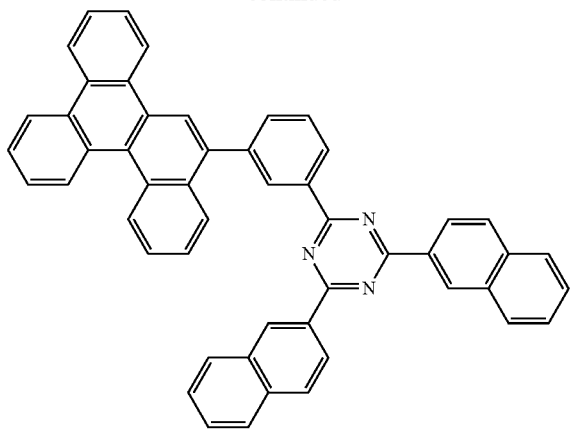
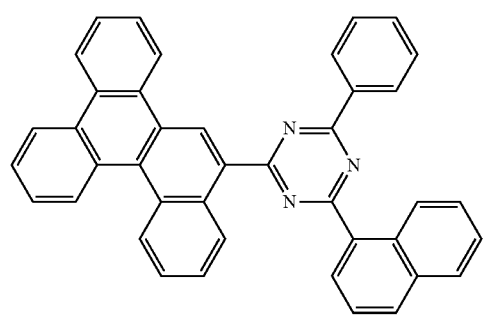
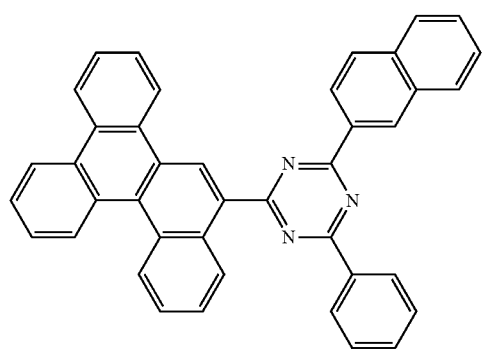
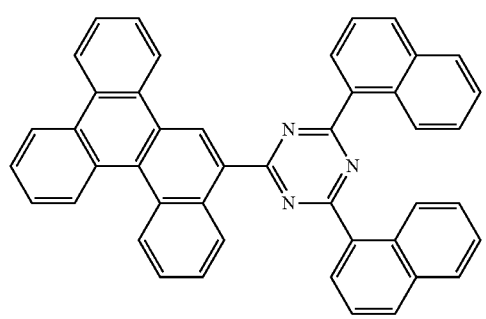
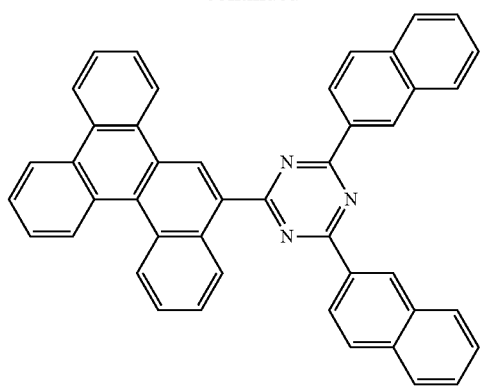
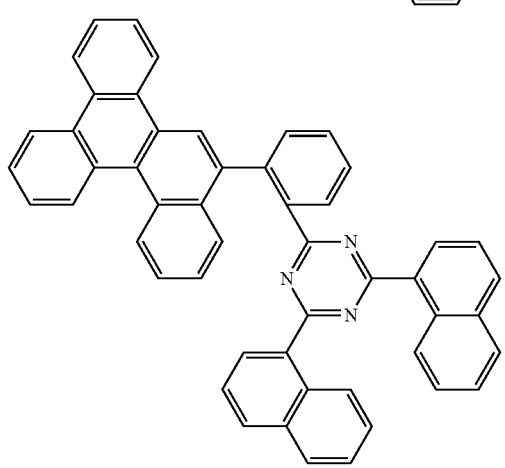
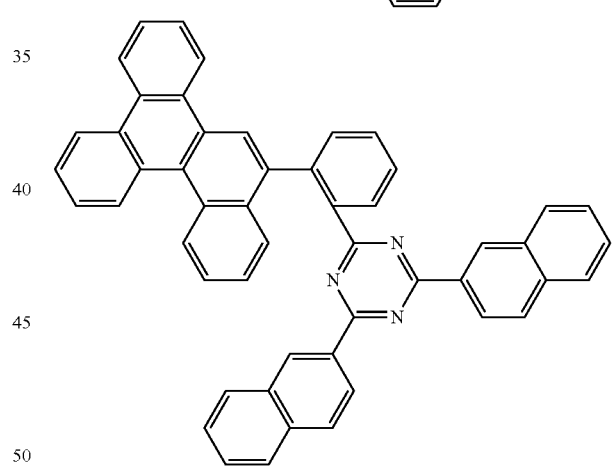
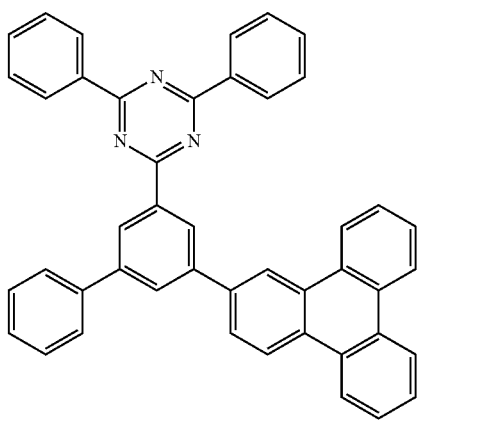

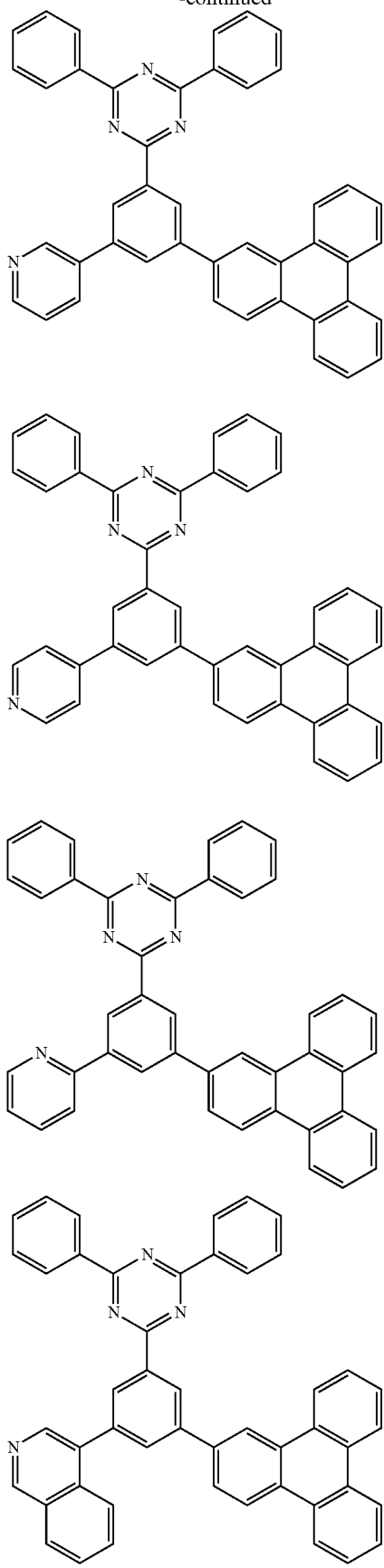
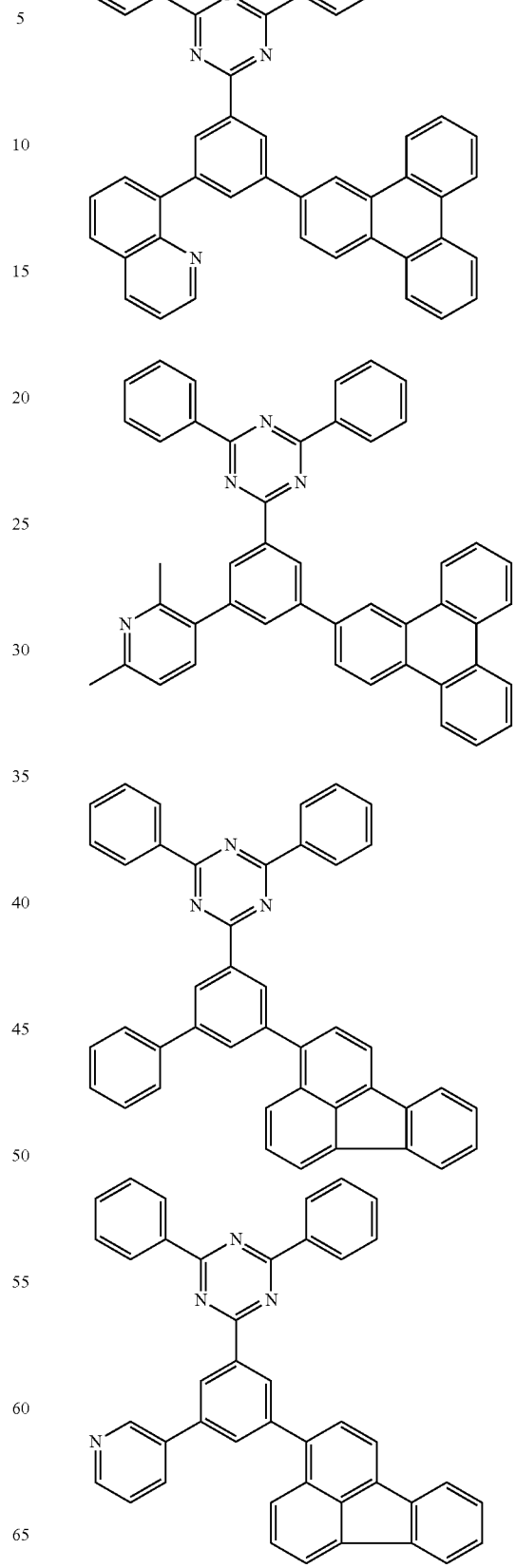

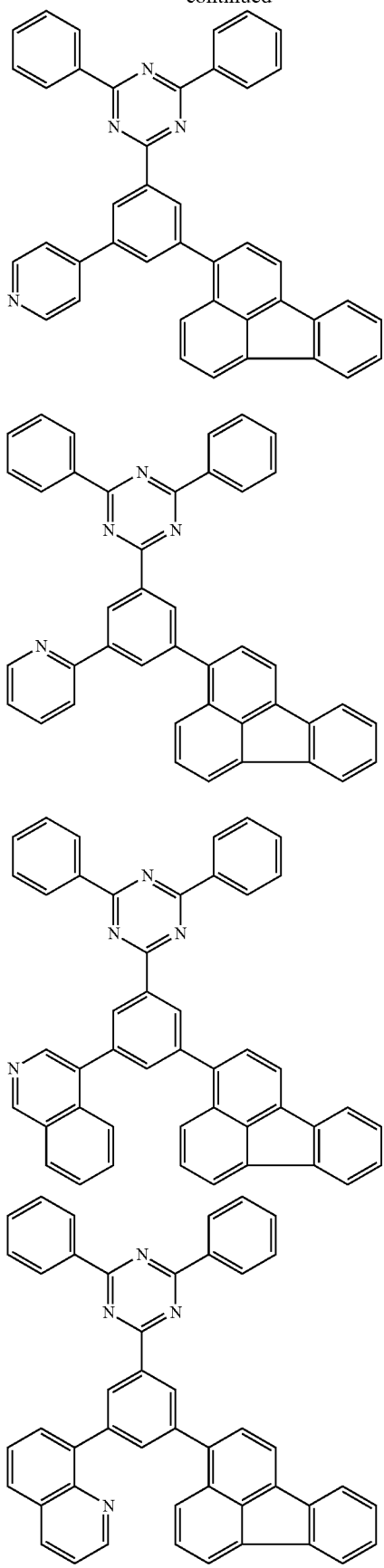
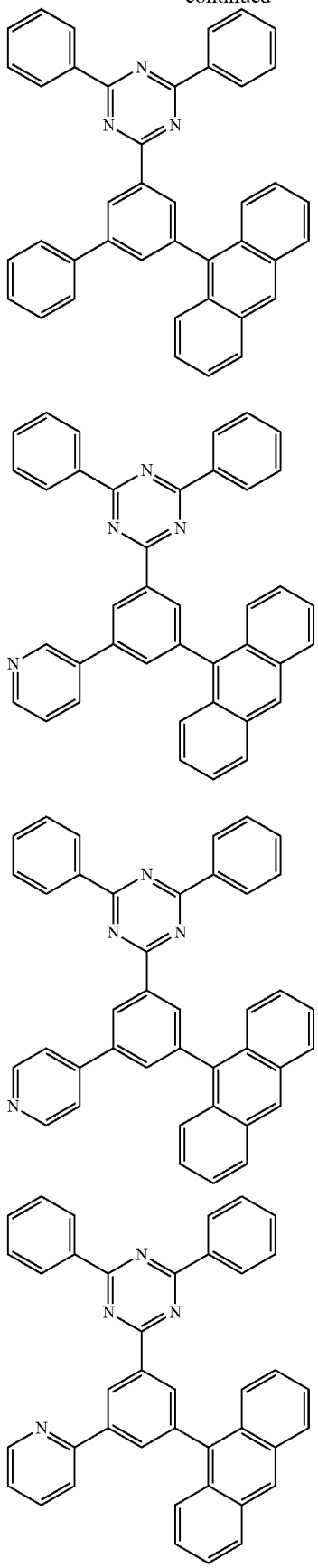

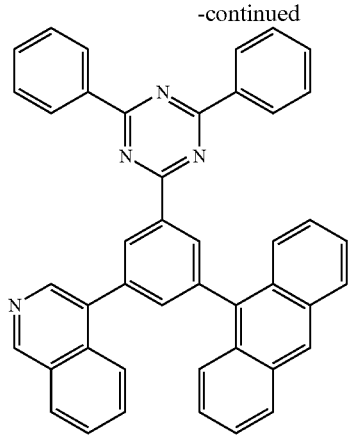
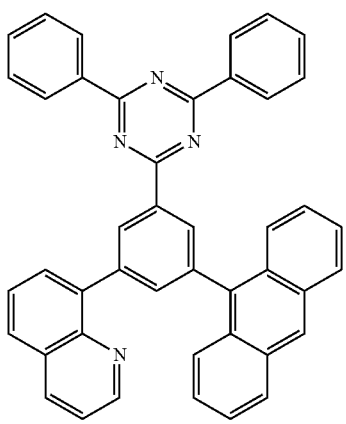
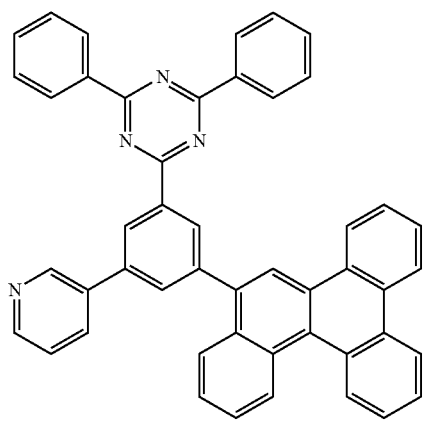
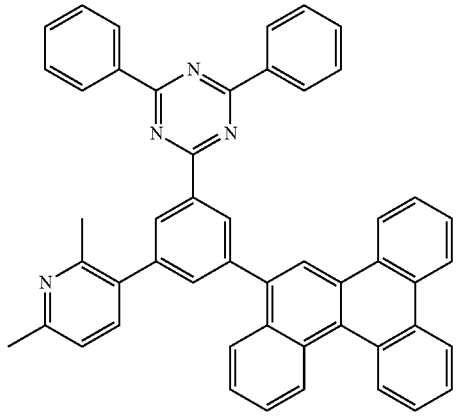
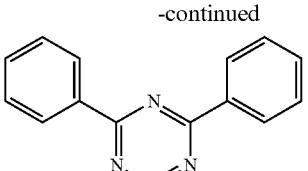
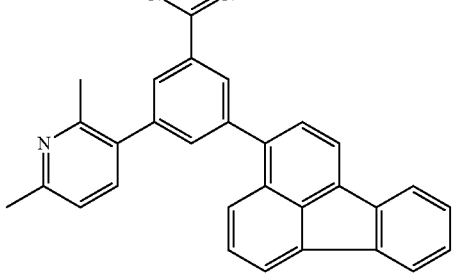
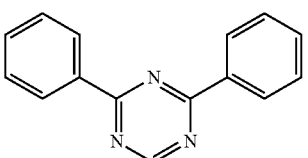
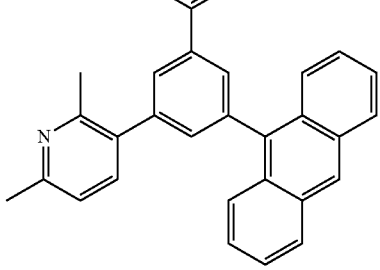
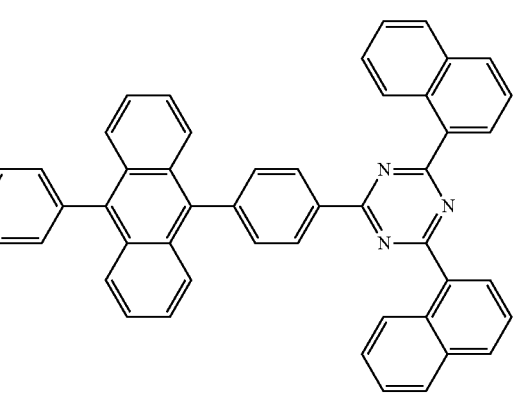

91
-continued
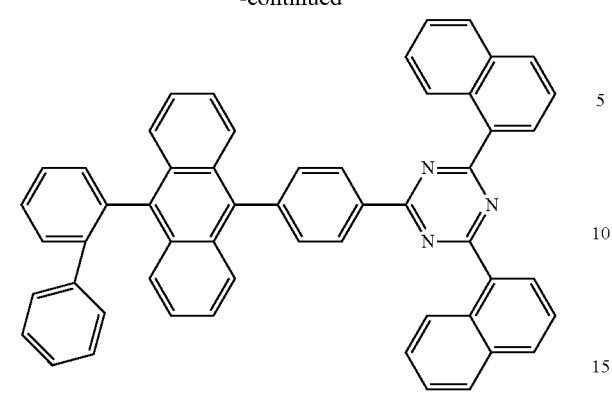
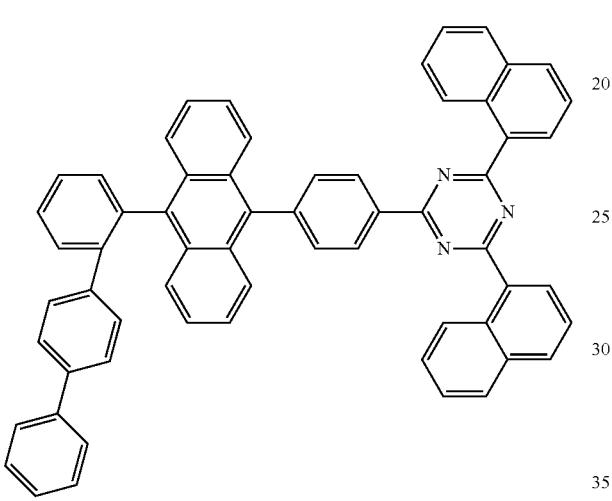
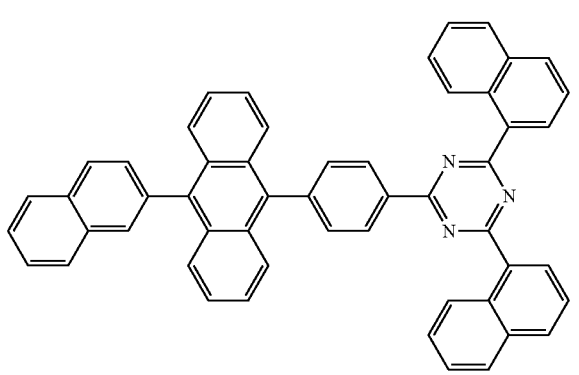
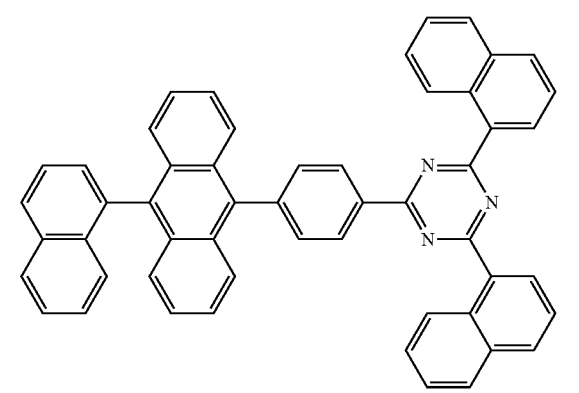
92
-continued
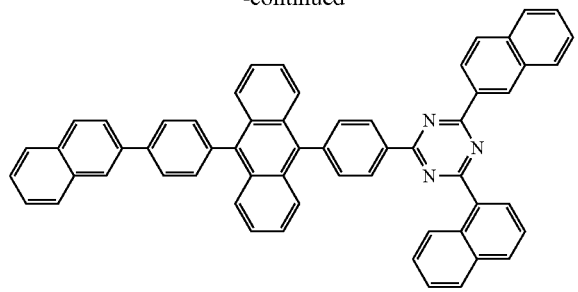
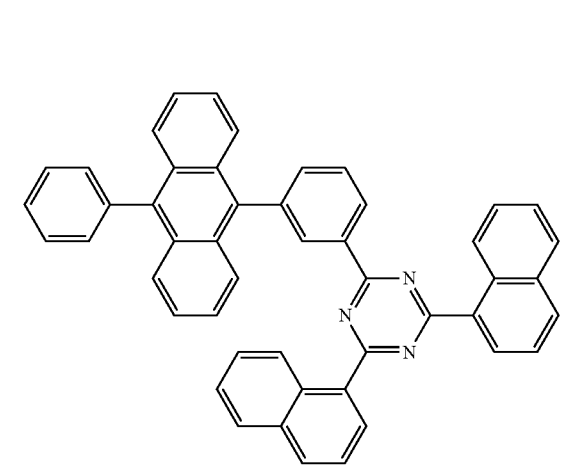
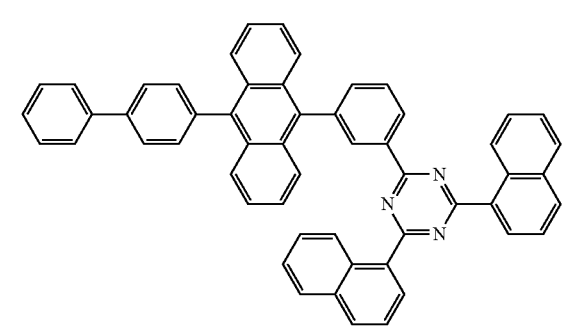
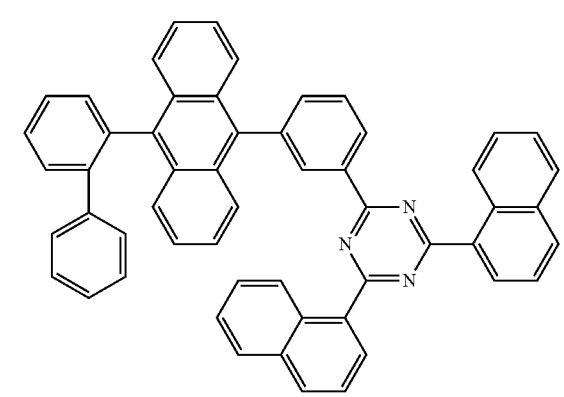

93
-continued
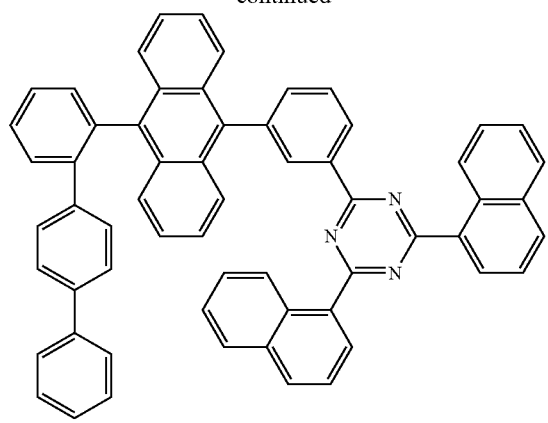
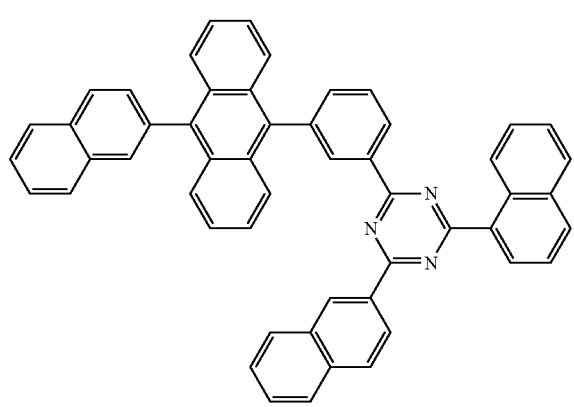
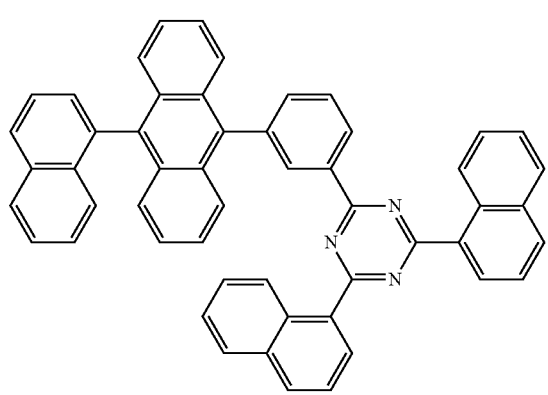
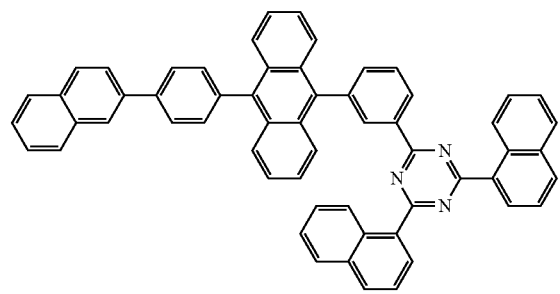
94
-continued
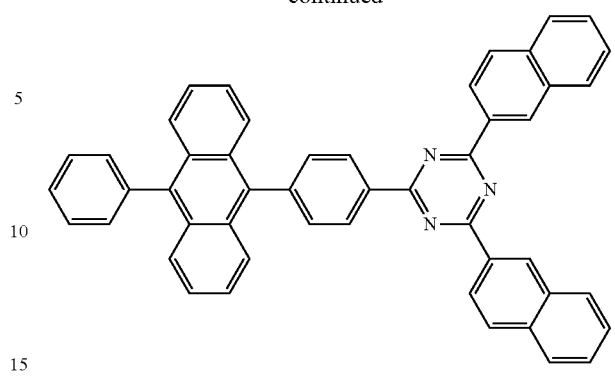
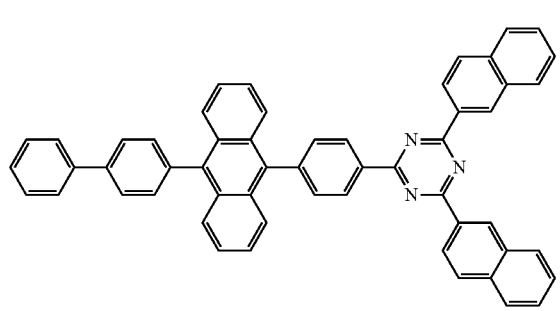
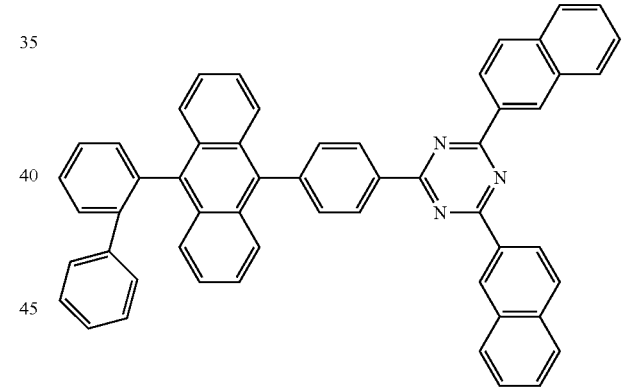
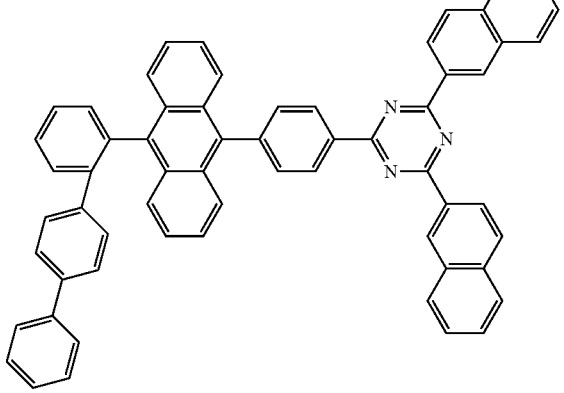

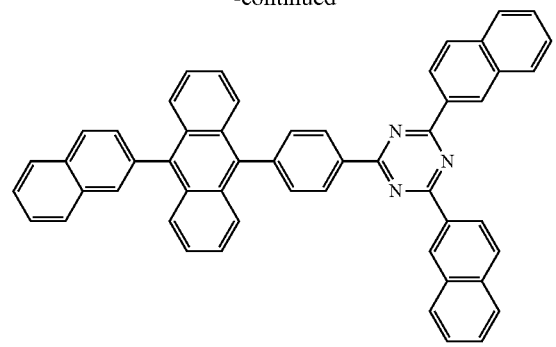
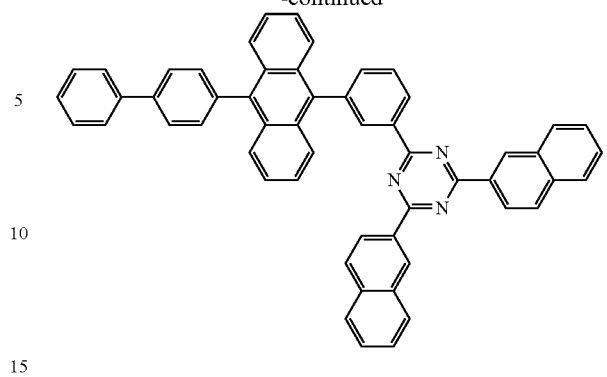
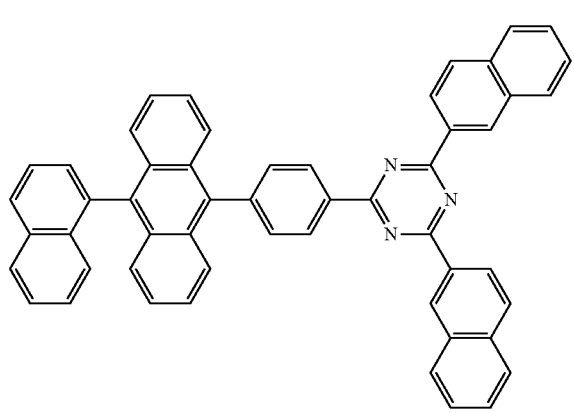
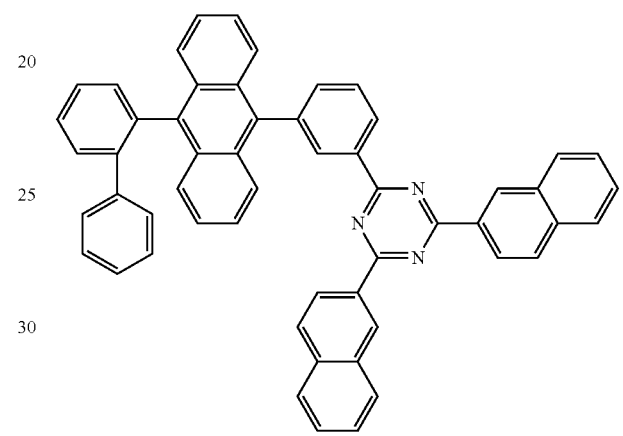
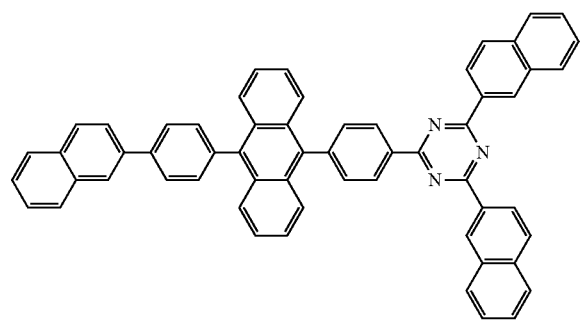
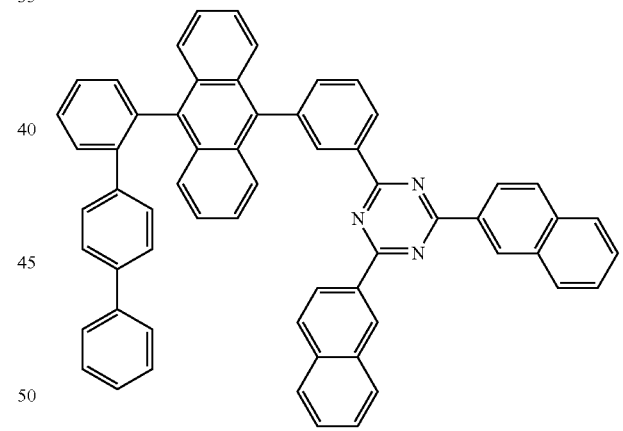
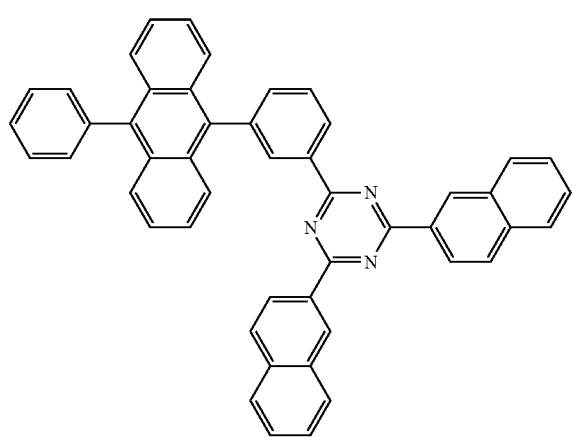
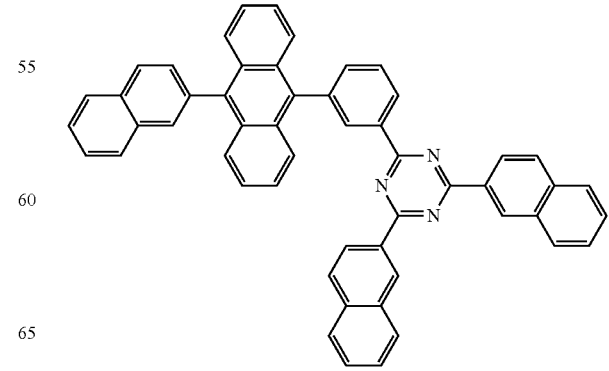

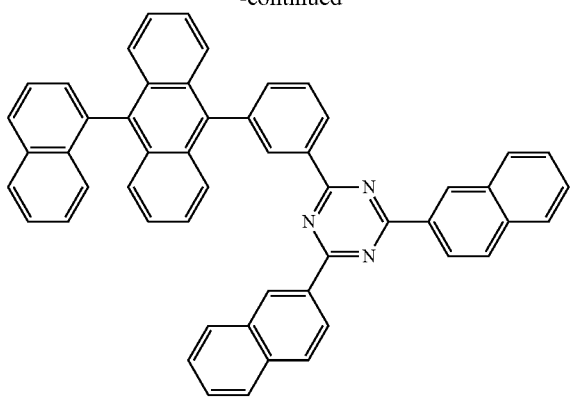
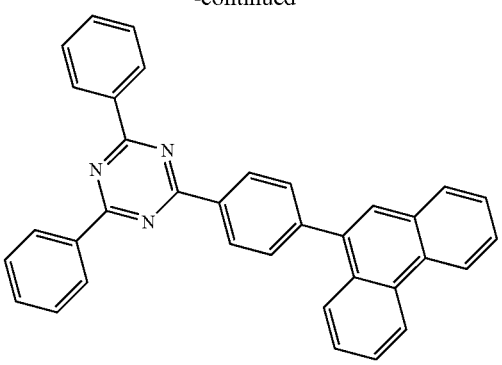
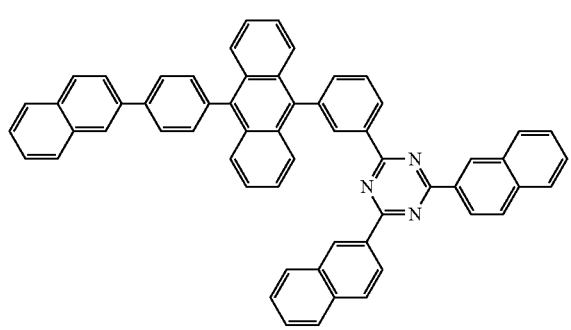
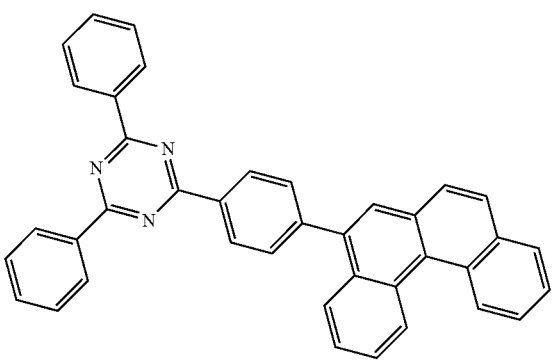
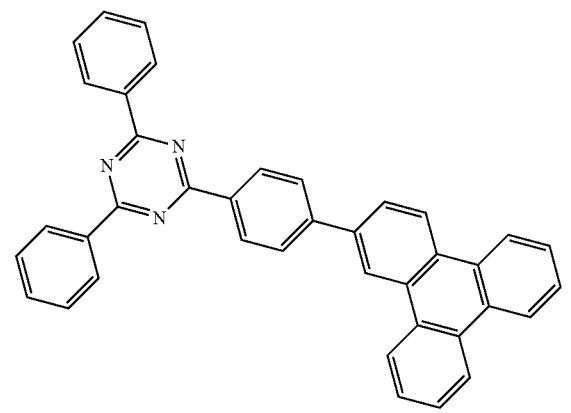
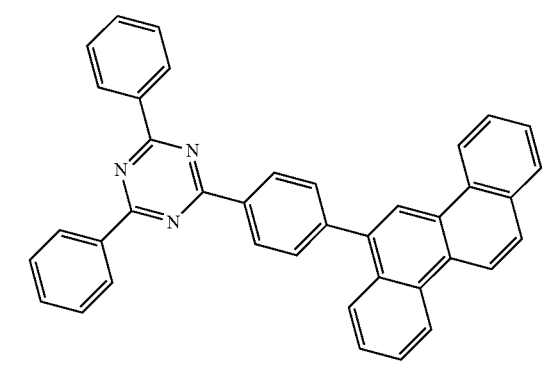
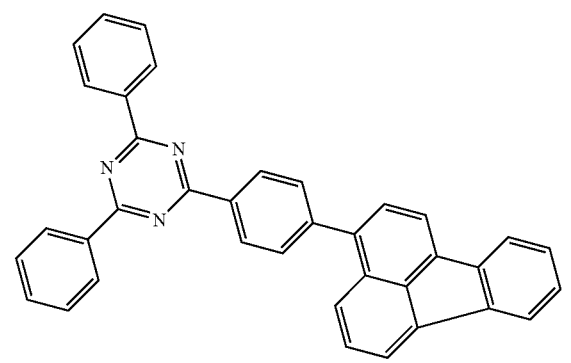
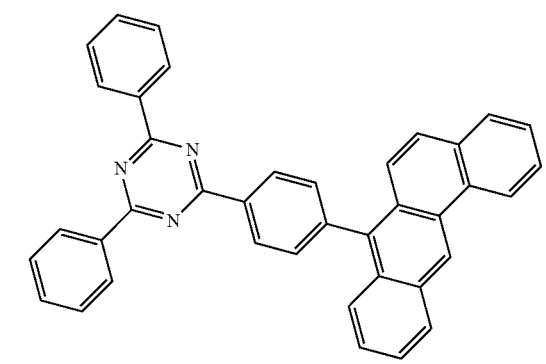

99
-continued
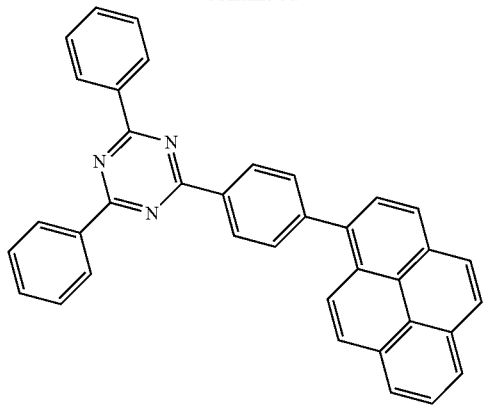
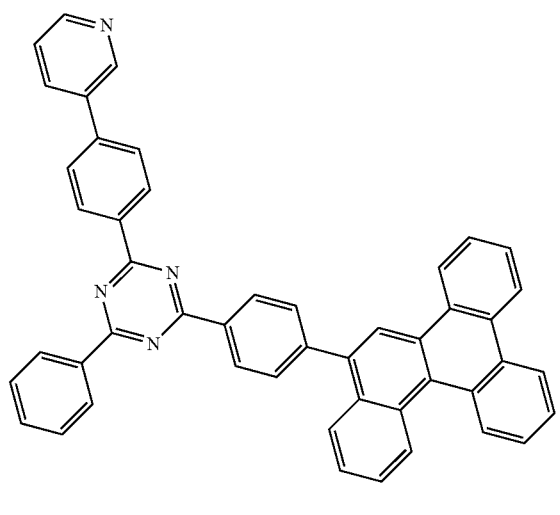
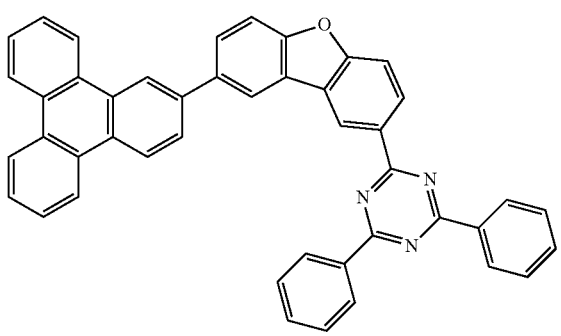
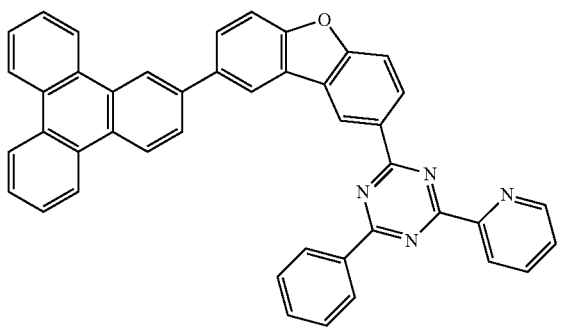
100
-continued
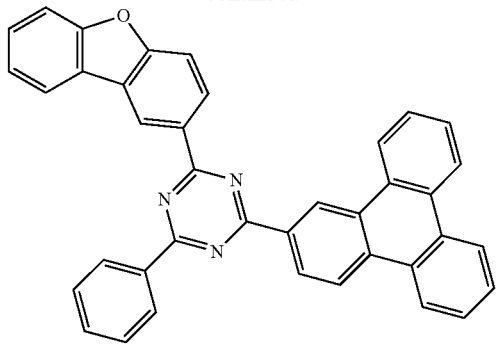
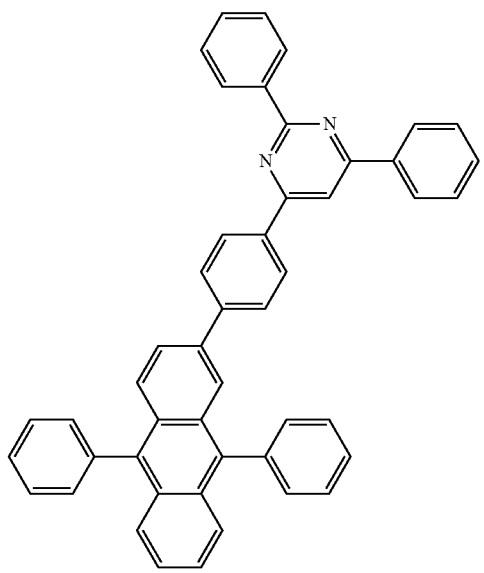
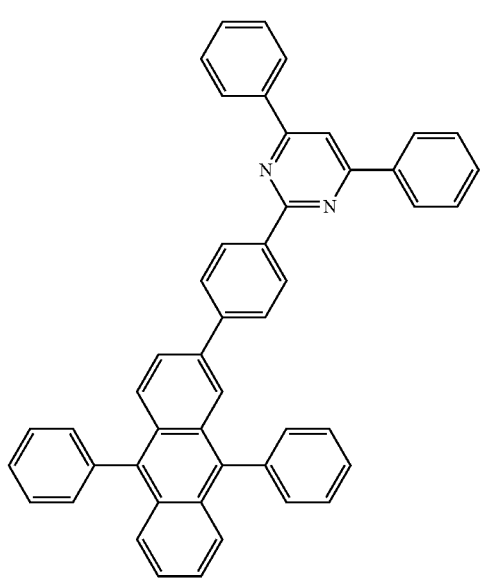

101
-continued

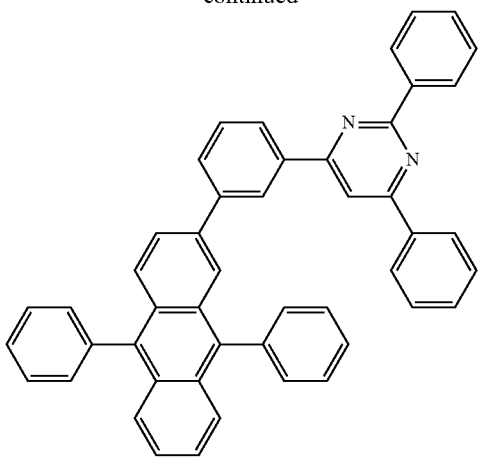

102
-continued

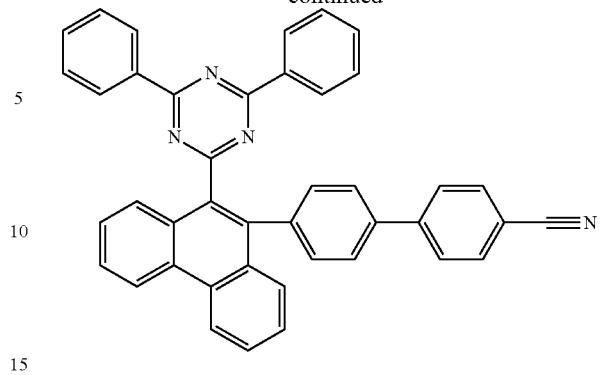

Next, the compound represented by the formula (10) will be described.

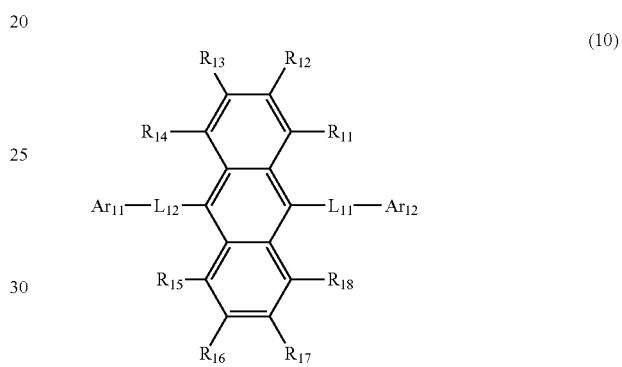

(10)

In the formula (10), $R_{11}$ to $R_{13}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{101}$)($R_{102}$)($R_{103}$),
—C(=O)$R_{104}$,
—COO$R_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms.

$R_{101}$ to $R_{107}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

When two or more of each of $R_{101}$ to $R_{107}$ are present, the two or more of each of $R_{101}$ to $R_{107}$ may be the same or different.

At least one of $Ar_{11}$ and $Ar_{12}$ is a monovalent group represented by the following formula (11);

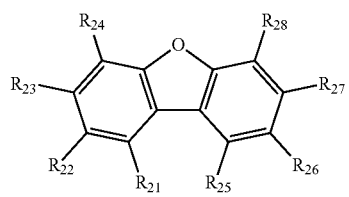

(11)

wherein in the formula (11),
one of $R_{21}$ to $R_{28}$ is bonded with $L_{11}$ or $L_{12}$; and
$R_{21}$ to $R_{28}$ which do not bonded with $L_{11}$ or $L_{12}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si$(R_{101})(R_{102})(R_{103})$,
—C(=O)$R_{104}$,
—COO$R_{105}$,
—N$(R_{106})(R_{107})$,
a halogen atom, a cyano group, a nitro group,
a substituted or unsubstituted aryl group including 6 to 50 carbon atoms, or
a substituted or unsubstituted monovalent heterocyclic group including 5 to 50 ring atoms;
$R_{101}$ to $R_{107}$ are as above:
$Ar_{11}$ or $Ar_{12}$, which is not the monovalent group represented by the formula (11), is an unsubstituted aryl group including 6 to 50 ring carbon atoms, an aryl group including 6 to 50 ring carbon atoms, which is substituted with an unsubstituted alkyl group including 1 to 50 carbon atoms, or an aryl group including 6 to 50 ring carbon atoms, which is substituted with an unsubstituted aryl group including 6 to 50 ring carbon atoms;
$L_{11}$ and $L_{12}$ are independently a single bond, a substituted or unsubstituted alkylene group including 1 to 50 carbon atoms, a substituted or unsubstituted arylene group including 6 to 50 ring carbon atoms, or a substituted or unsubstituted divalent heterocyclic group including 5 to 50 ring atoms.

In one embodiment, the compound represented by the formula (10) is represented by the following formula (10-1):

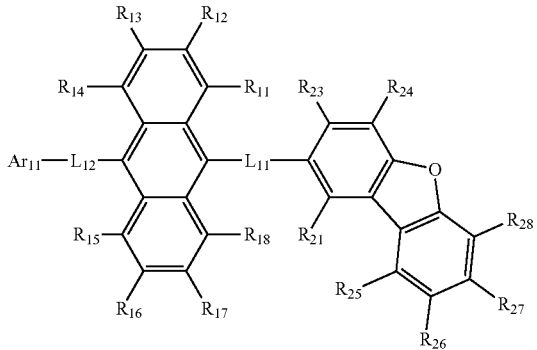

(10-1)

wherein in the formula (10-1), $R_{11}$ to $R_{18}$, $Ar_{11}$, $L_{11}$, $L_{12}$, $R_{21}$, and $R_{23}$ to $R_{28}$ are as defined in the formula (10).

In one embodiment, the compound represented by the formula (10) is represented by the following formula (10-2):

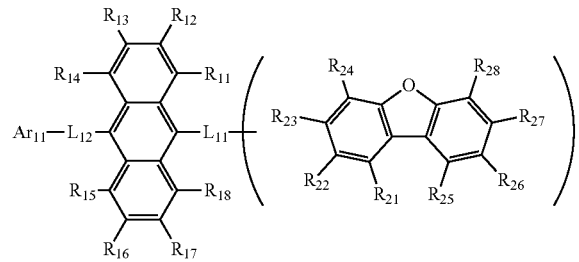

(10-2)

wherein in the formula (10-2), $L_{11}$ is a single bond; $R_{11}$ to $R_{18}$, $Ar_{11}$, $L_{12}$, and $R_{21}$ to $R_{28}$ are as defined in the formula (10).

In one embodiment, the compound represented by the formula (10) is represented by the following formula (10-3):

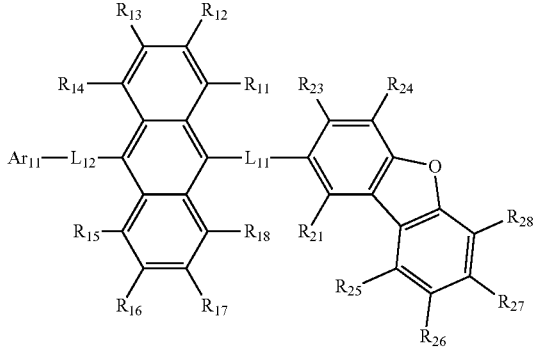

(10-3)

wherein in the formula (10-3), $L_{11}$ is a single bond; $R_{11}$ to $R_{18}$, $Ar_{11}$, $L_{12}$, $R_{21}$, and $R_{23}$ to $R_{28}$ are as defined in the formula (10).

In one embodiment, in the formulas (10), (10-1), (10-2) and (10-3), $R_{21}$ to $R_{28}$ which are not bonded with $L_{11}$ are a hydrogen atom.

In one embodiment, in the formulas (10), (10-1), (10-2) and (10-3), $R_{11}$ to $R_{18}$ are a hydrogen atom.

In one embodiment, the compound represented by the formula (10) is represented by the following formula (10-4):

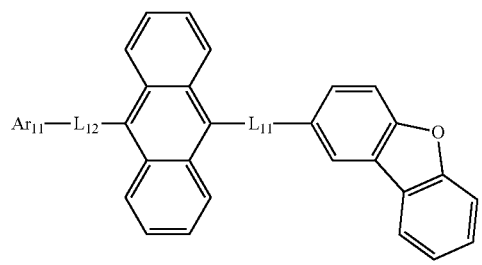

(10-4)

wherein in the formula (10-4), $L_{11}$ is a single bond; $Ar_{11}$ and $L_{12}$ are as defined in the formula (10).

In one embodiment, the substituent in the case of "substituted or unsubstituted" in the formulas (10), (10-1), (10-2), (10-3) and (10-4) is selected from the group consisting of an alkyl group including 1 to 50 carbon atoms, an alkenyl group including 2 to 50 carbon atoms, an alkynyl group including 2 to 50 carbon atoms, a cycloalkyl group including 3 to 50 carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, —Si($R_{41}$)($R_{42}$)($R_{43}$), —C(═O)$R_{44}$, —COO$R_{45}$, —S(═O)$_2R_{46}$, —P(═O)($R_{47}$)($R_{48}$), —Ge($R_{49}$)($R_{50}$)($R_{51}$), —N($R_{52}$)($R_{53}$), a hydroxy group, a halogen atom, a cyano group, a nitro group, an aryl group including 6 to 50 ring carbon atoms, and a monovalent heterocyclic group including 5 to 50 ring atoms;

$R_{41}$ to $R_{53}$ are independently a hydrogen atom, an alkyl group including 1 to 50 carbon atoms, an aryl group including 6 to 50 ring carbon atoms, or a heterocyclic group including 5 to 50 ring atoms, and when two or more of each of $R_{41}$ to $R_{53}$ are present, the two or more of each of $R_{41}$ to $R_{53}$ may be the same or different.

In one embodiment, the substituent in the case of "substituted or unsubstituted" in the formulas (10), (10-1), (10-2), (10-3) and (10-4) is selected from the group consisting of an alkyl group including 1 to 50 carbon atoms, an aryl group including 6 to 50 ring carbon atoms, and a heterocyclic group including 5 to 50 ring atoms.

In one embodiment, the substituent in the case of "substituted or unsubstituted" in the formulas (10), (10-1), (10-2), (10-3) and (10-4) is selected from the group consisting of an alkyl group including 1 to 18 carbon atoms, an aryl group including 6 to 18 ring carbon atoms, and a heterocyclic group including 5 to 18 ring atoms.

Specific examples of the compound represented by the above formula (2) are described below, but the invention is not limited thereto.

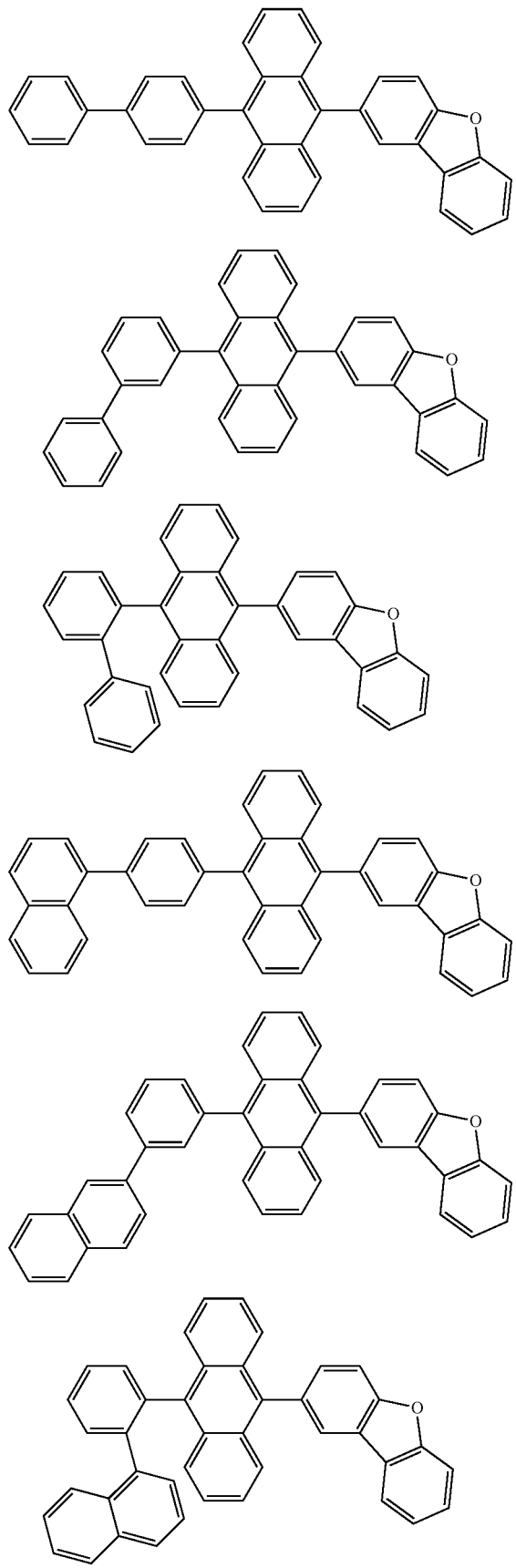

107
-continued
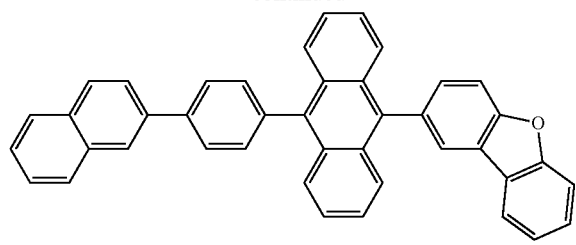
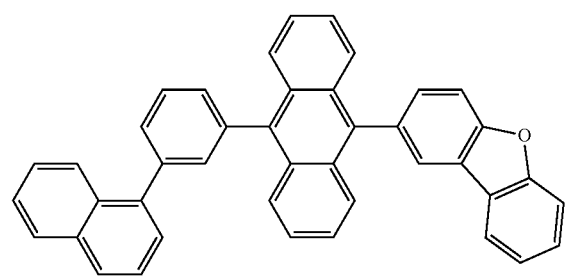
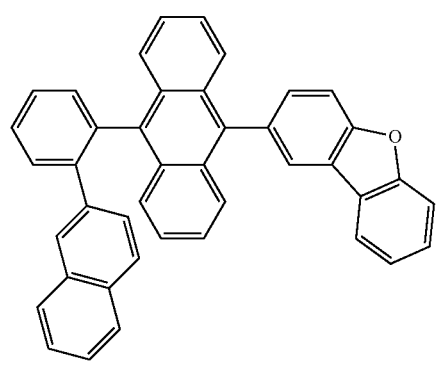
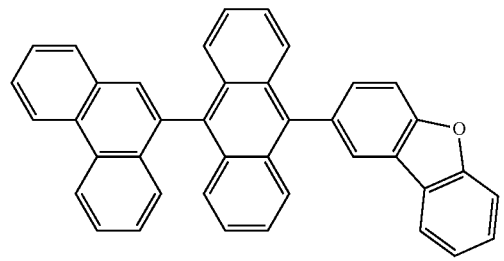
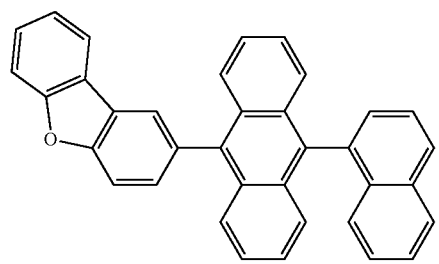
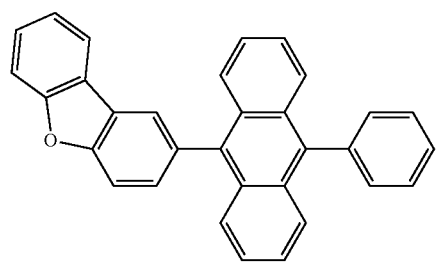
108
-continued
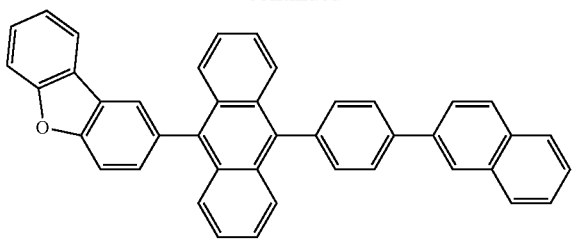
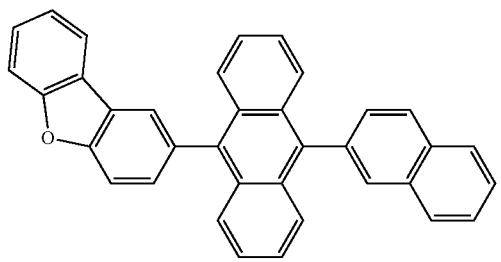
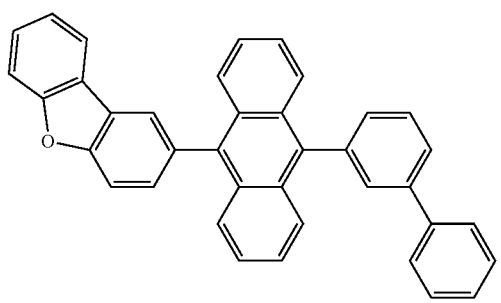
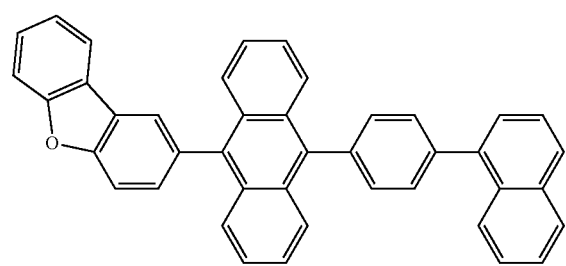
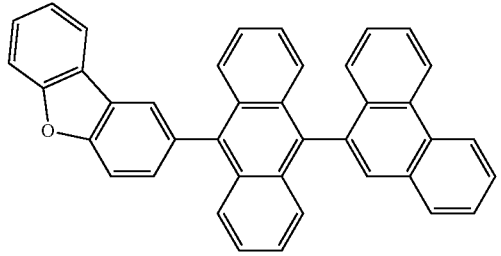
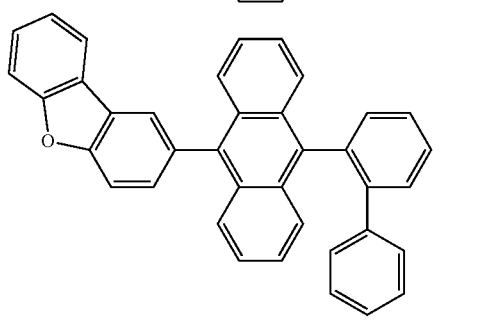

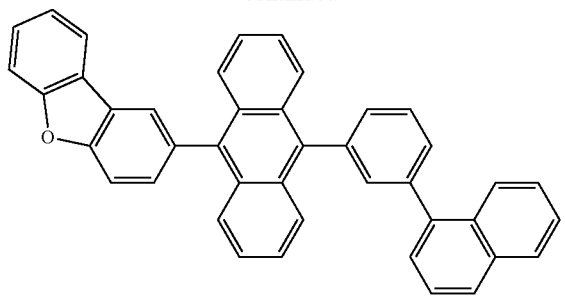
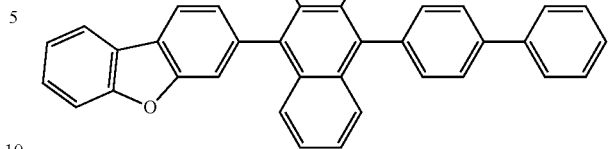
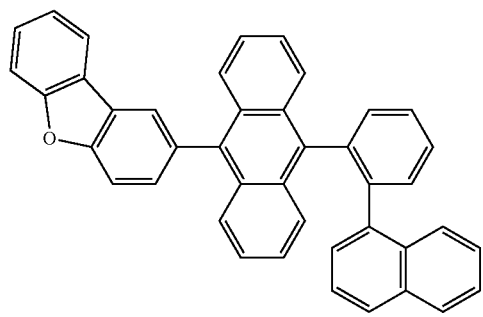
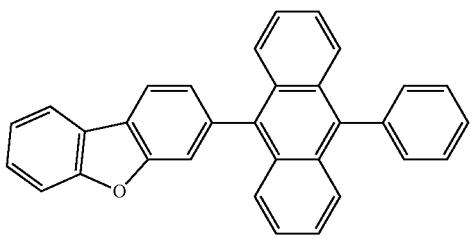
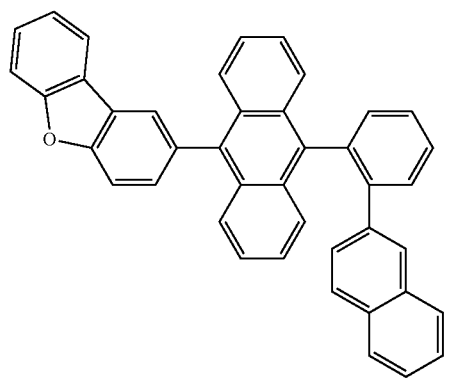
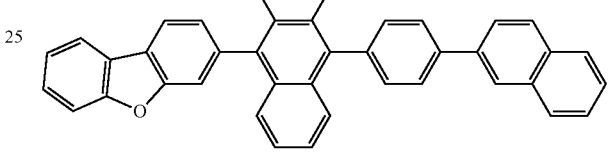
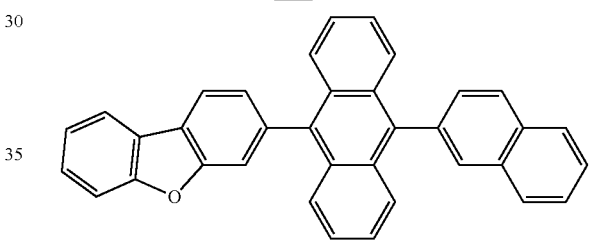
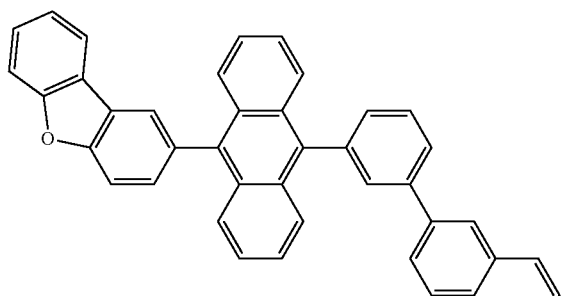
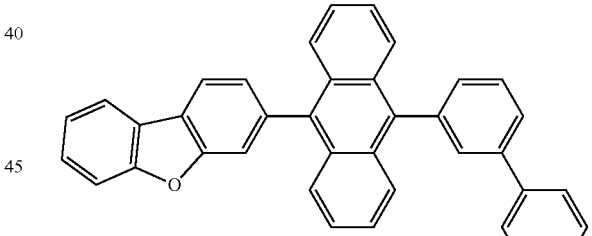
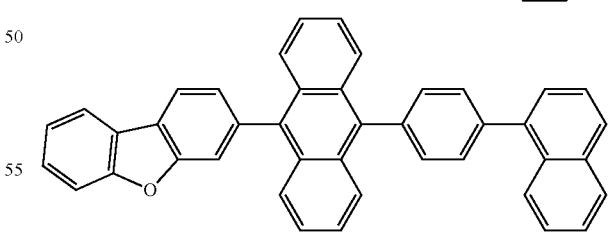
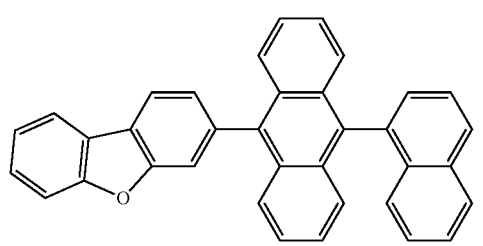
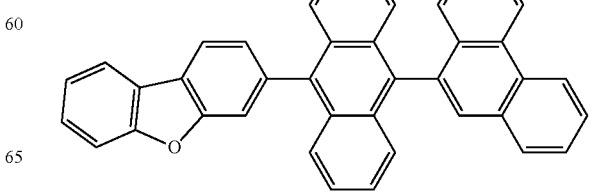

111
-continued
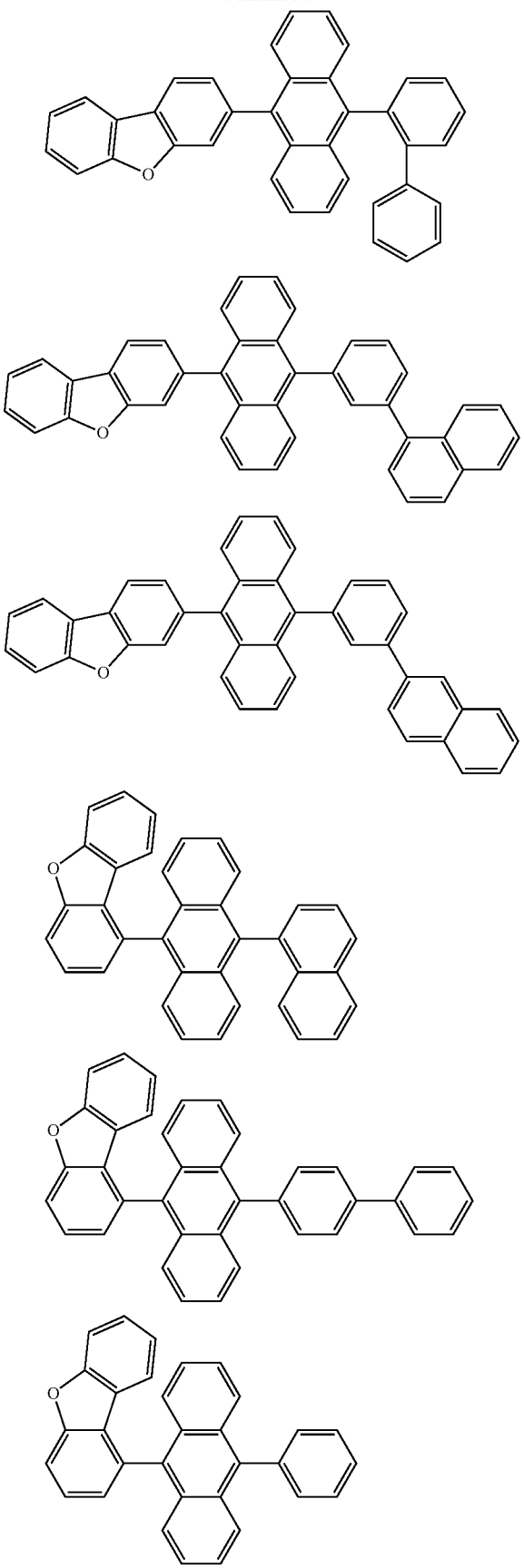
112
-continued
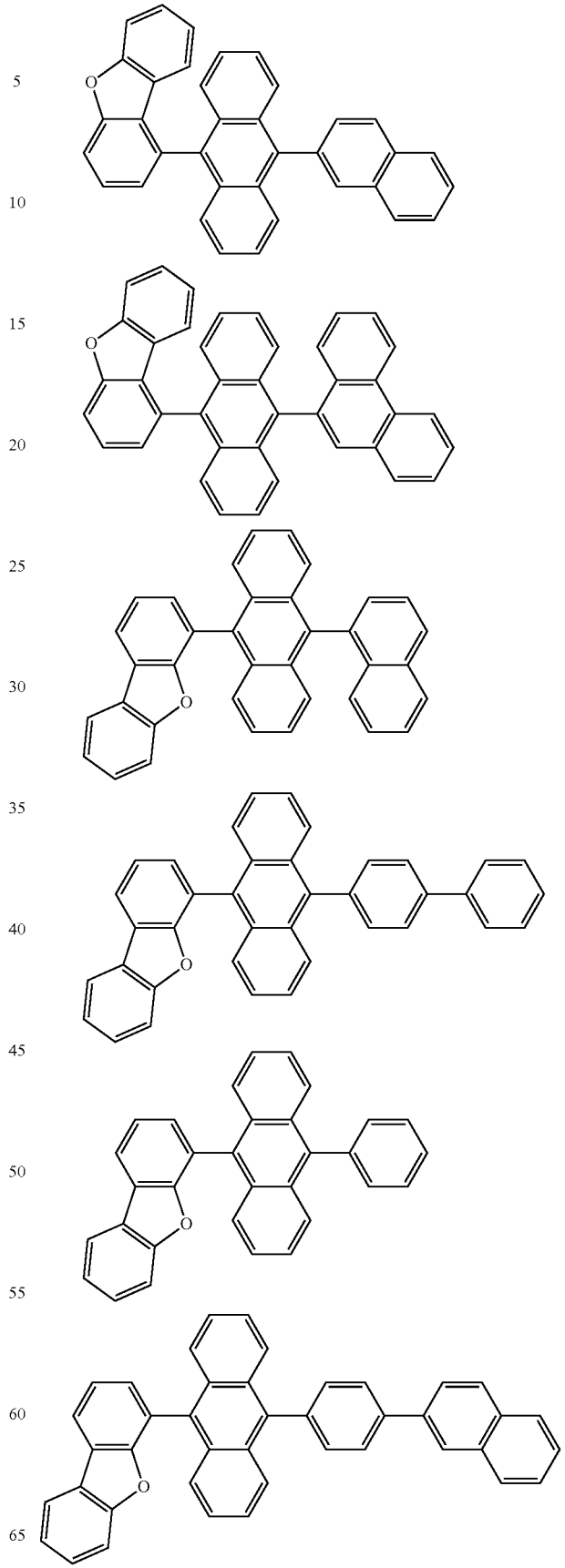

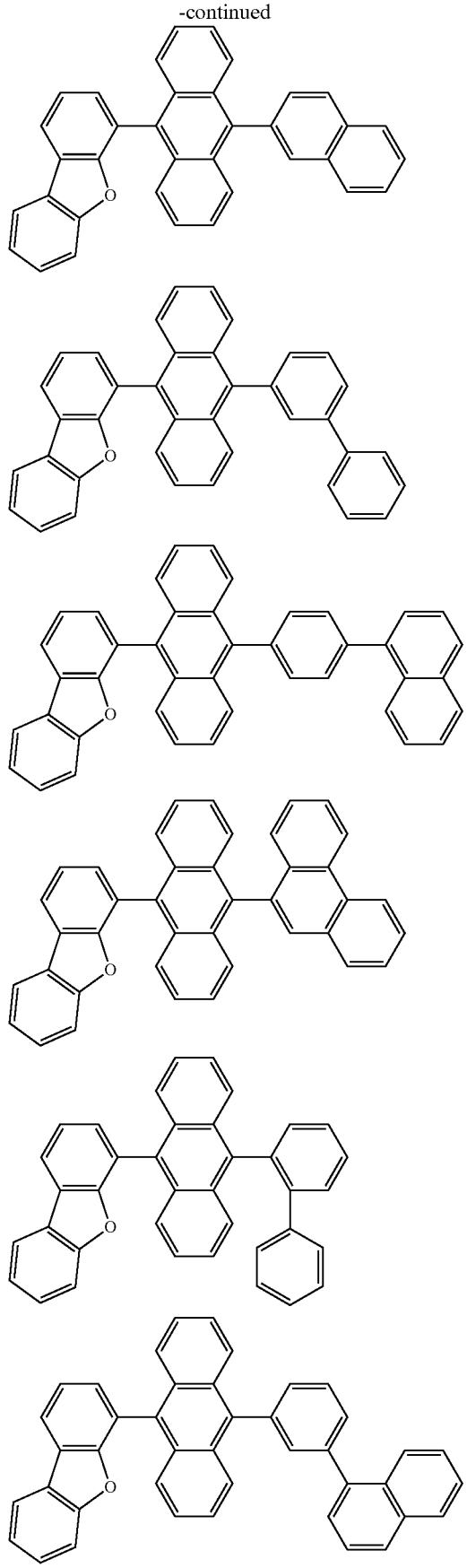
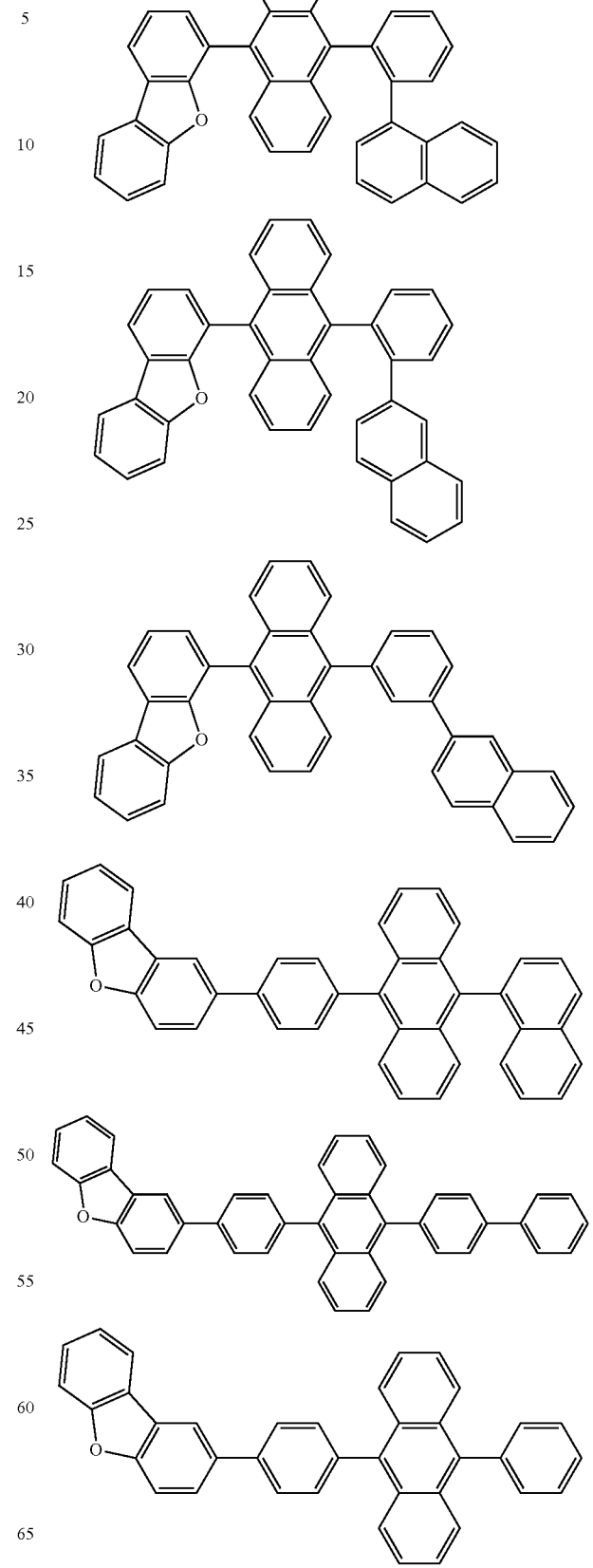

115
-continued
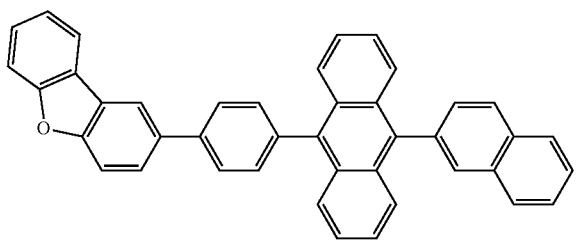
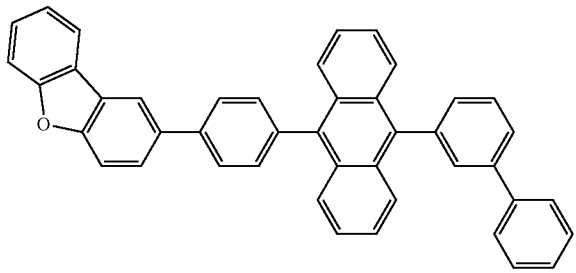
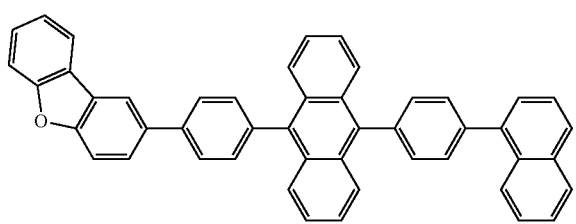
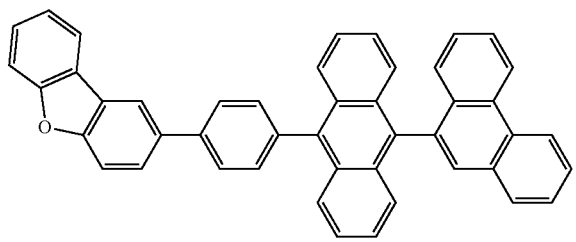
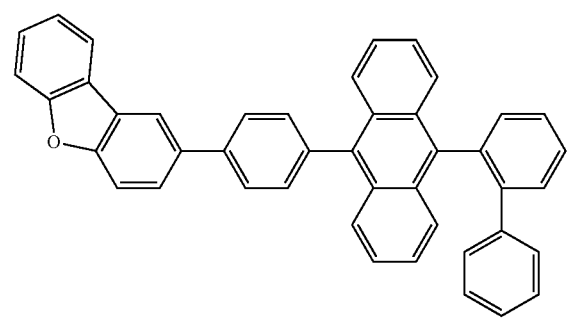
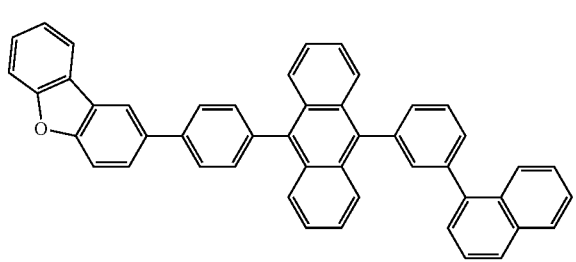
116
-continued
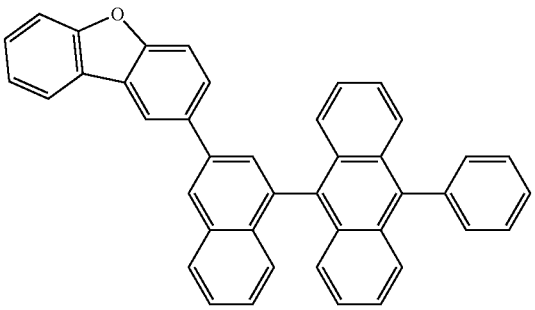
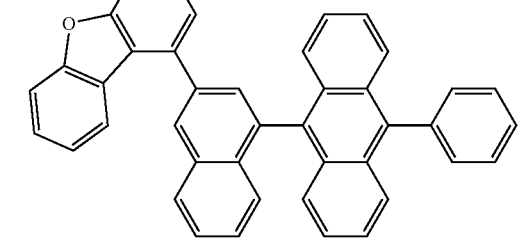
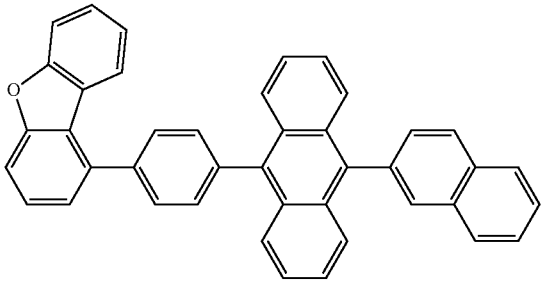
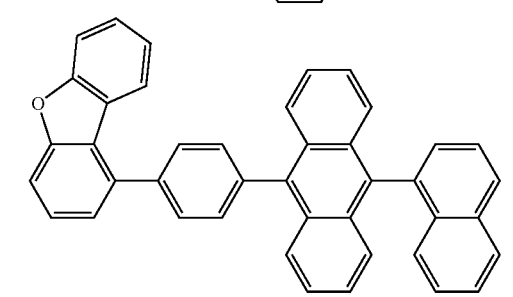
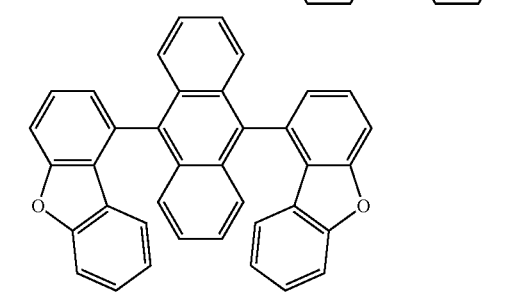
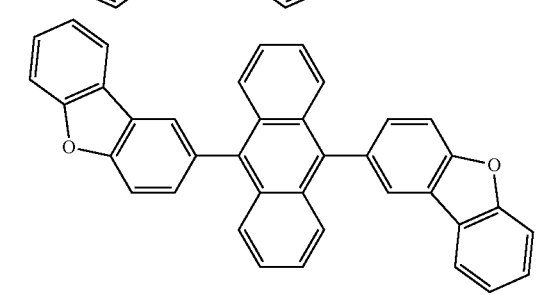

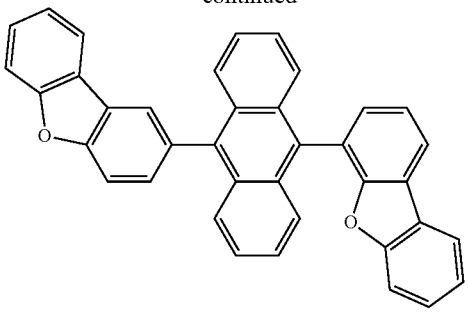

In one embodiment, the second electron-transporting layer further comprises one or two or more selected from the group consisting of an alkali metal, an alkaline earth metal, a rare earth metal, an alkali metal oxide, an alkali metal halide, an alkaline earth metal oxide, an alkaline earth metal halide, a rare earth metal oxide, a rare earth metal halide, an alkali metal-containing organic complex, an alkaline earth metal-containing organic complex, and a rare earth metal-containing organic complex. Among the above compounds, an organic complex containing an alkali metal is preferable, and Liq (8-hydroxyquinolinolato-lithium) is particularly preferable.

In one embodiment, the first electron-transporting layer comprises a compound represented by the following formula (30):

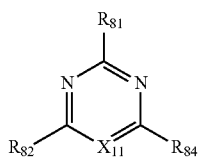

(30)

wherein in the formula (30), $X_{11}$ is a nitrogen atom, CH or $CR_{83}$;

when $X_{11}$ is $CR_{83}$, the adjacent two among $R_{82}$ to $R_{84}$ may be bonded to each other, to form together with the two ring carbon atoms to which they are bonded, a substituted or unsubstituted aromatic hydrocarbon ring including 10 to 30 ring carbon atoms or a substituted or unsubstituted heterocyclic ring including 5 to 32 ring atoms;

$R_{81}$, and $R_{82}$ to $R_{84}$ which do not form the ring are independently a group represented by any one of the following formulas (31) to (34):

 (31)

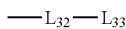 (32)

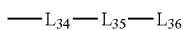 (33)

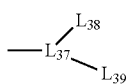 (34)

wherein in the formulas (31) to (34), $L_{31}$, $L_{33}$, $L_{36}$, $L_{38}$ and $L_{39}$ are independently a substituted or unsubstituted aryl group including 6 to 30 ring carbon atoms, or a substituted or unsubstituted monovalent heterocyclic group including 5 to 32 ring atoms;

$L_{32}$, $L_{34}$ and $L_{35}$ are independently a substituted or unsubstituted arylene group including 6 to 30 ring carbon atoms, or a substituted or unsubstituted divalent heterocyclic group including 5 to 32 ring atoms;

$L_{37}$ is a substituted or unsubstituted trivalent aromatic hydrocarbon ring group including 6 to 30 ring carbon atoms, or a substituted or unsubstituted trivalent heterocyclic group including 5 to 32 ring atoms.

In one embodiment, the compound represented by the formula (30) is represented by the following formula (30a) or the following formula (30b). That is, $X_{11}$ is N or CH.

(30a)

(30b)

In the formula (30a) and (30b), $R_{81}$, $R_{82}$ and $R_{84}$ are as defined in the formula (30).

In one embodiment, the compound represented by the formula (30) is represented by the following formula (30c). That is, $X_{11}$ is N or $CR_{83}$.

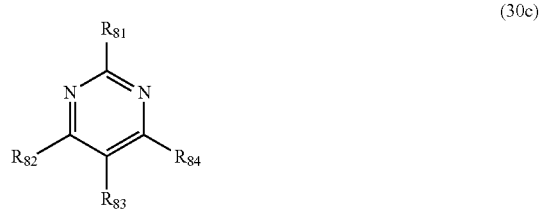

(30c)

In the formula (30c), $R_{81}$ to $R_{84}$ are as defined in the formula (30).

The adjacent two among $R_{82}$ to $R_{84}$ are bonded to each other specifically, when $R_{82}$ and $R_{83}$ or $R_{83}$ and $R_{84}$ are bonded to each other.

In one embodiment, when the adjacent two among $R_{82}$ to $R_{84}$ are bonded to each other to form an aromatic hydrocarbon ring including 10 to 30 ring carbon atoms or a heterocyclic ring including 5 to 32 ring atoms, the structure formed by bonding adjacent two among $R_{82}$ to $R_{84}$ to each other is selected from the following group. The following structure may have a substituent.

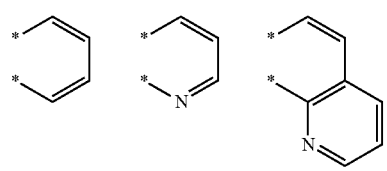

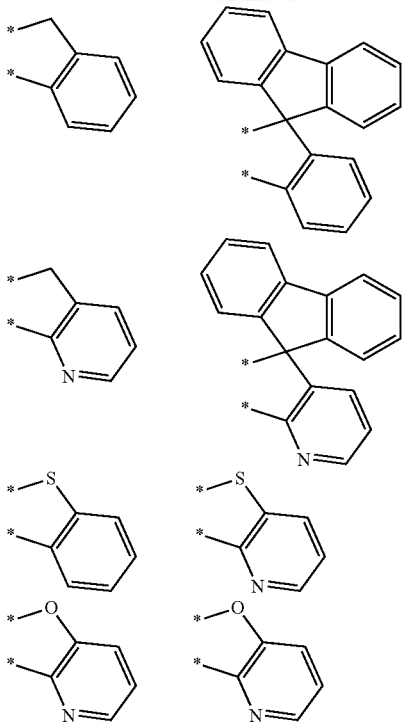

In the above formula, * indicates the bonding position of $R_{82}$ and $R_{83}$ or $R_{83}$ and $R_{84}$.

In one embodiment, the structure formed by bonding adjacent two among $R_2$ to $R_4$ to each other is selected from the following group. The following structure may have a substituent.

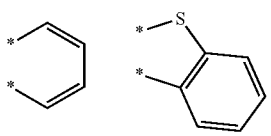

In the above formula, * indicates the bonding position of $R_{82}$ and $R_{83}$ or $R_{83}$ and $R_{84}$.

In one embodiment, for $L_{31}$ to $L_{39}$ in the formulas (31) to (34), the substituted or unsubstituted aryl group, arylene group and trivalent hydrocarbon ring group, which include 6 to 30 ring carbon atoms, are each a substituted or unsubstituted aryl group, arylene group and trivalent hydrocarbon ring group, which include 6 to 18 ring carbon atoms.

In the formulas (31) to (34), specific examples of the aromatic hydrocarbon ring including 6 to 30 ring carbon atoms which forms the substituted or unsubstituted aryl group including 6 to 30 ring carbon atoms, the arylene group and the trivalent aromatic hydrocarbon ring group of $L_{31}$ to $L_{39}$ include, for example, benzene, biphenyl, terphenyl (including isomers), quaterphenyl (including isomers), naphthalene, fluorene, acenaphthalene, anthracene, benzoanthracene, aceanthracene, phenanthrene, benzophenanthrene, phenalene, pentacene, picene, pentaphenylene, pyrene, chrysene, benzochrysene, s-indacene, as-indacene, fluoranthene, benzofluoranthene, perylene, triphenylene, benzotriphenylene, spirofluorene and so on.

In one embodiment, the aromatic hydrocarbon ring including 6 to 30 ring carbon atoms which forms the substituted or unsubstituted aryl group including 6 to 30 ring carbon atoms, the arylene group and the trivalent aromatic hydrocarbon ring group of $L_{31}$ to $L_{39}$ is selected from the following group. The following rings may have a substituent.

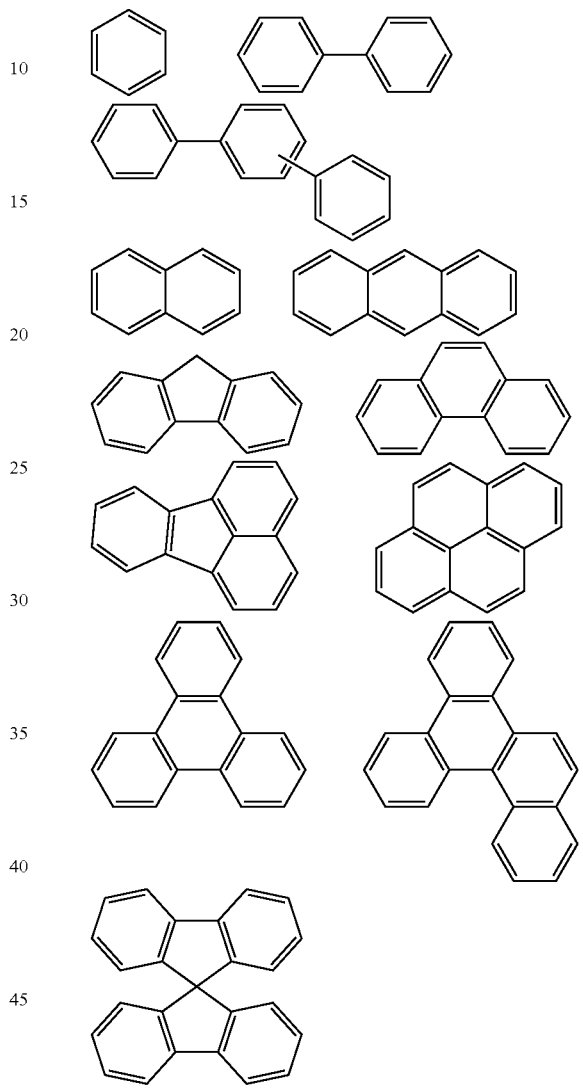

Specific examples of the substituted or unsubstituted aryl group including 6 to 30 ring carbon atoms in $L_{31}$, $L_{33}$, $L_{36}$, $L_{38}$ and $L_{39}$ are a monovalent residue which can be obtained by removing one hydrogen atom from the aromatic hydrocarbon rings mentioned above. The monovalent residue may have a substituent.

In one embodiment, in $L_{31}$, $L_{33}$, $L_{36}$, $L_{38}$ and $L_{39}$, the substituted or unsubstituted aryl group including 6 to 30 ring carbon atoms is a monovalent residue which is obtained by removing one hydrogen atom from the aromatic hydrocarbon rings selected from the group consisting of a substituted or unsubstituted benzene, a substituted or unsubstituted biphenyl, a substituted or unsubstituted terphenyl, a substituted or unsubstituted naphthalene, a substituted or unsubstituted fluorene, a substituted or unsubstituted phenanthrene, a substituted or unsubstituted anthracene, a substituted or unsubstituted triphenyl, a substituted or unsubstituted benzochrysene, a substituted or unsubstituted fluoranthene, a substituted or unsubstituted pyrene, a substituted or unsubstituted spirofluorene, a substituted or unsubstituted 9,9-diphenylfluorene, and a substituted or unsubstituted 9,9-dimethylfluorene. The monovalent residue may have a substituent.

In one embodiment, in $L_{31}$, $L_{33}$, $L_{36}$, $L_{38}$ and $L_{39}$, the substituted or unsubstituted aryl group including 6 to 30 ring carbon atoms is selected from the following group. The following groups may have a substituent.

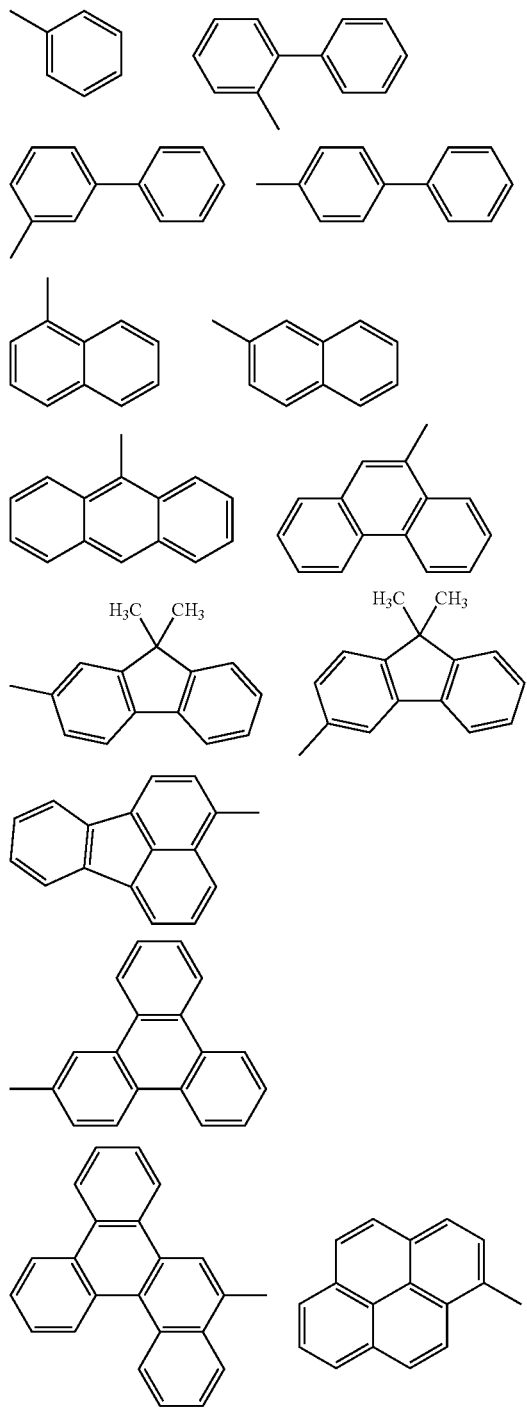

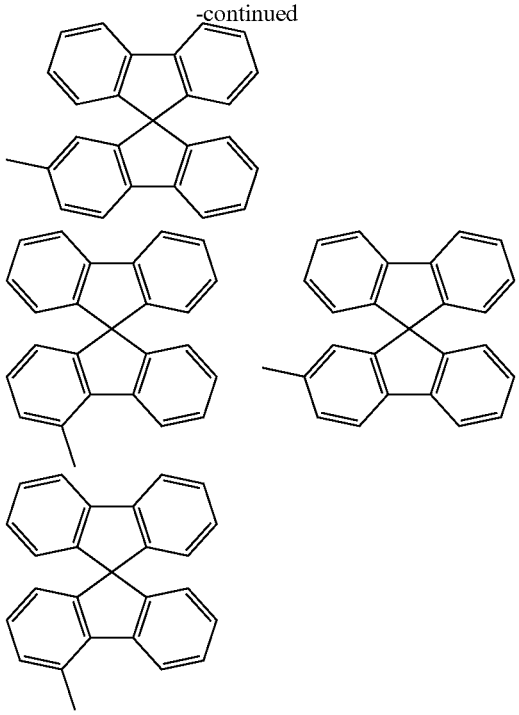

In $L_{32}$, $L_{34}$ and $L_{35}$, specific examples of the substituted or unsubstituted arylene group including 6 to 30 ring carbon atoms include a divalent residue which can be obtained by removing one hydrogen atom from each of two ring carbon atoms of the aromatic hydrocarbon rings mentioned above. The divalent residue may have a substituent.

In one embodiment, in $L_{32}$, $L_{34}$ and $L_{35}$, the substituted or unsubstituted arylene group including 6 to 30 ring carbon atoms is a divalent residue which is obtained by removing one hydrogen atom from each of two ring carbon atoms of the aromatic hydrocarbon ring selected from the group consisting of a substituted or unsubstituted benzene, a substituted or unsubstituted naphthalene, a substituted or unsubstituted biphenyl, a substituted or unsubstituted terphenyl, a substituted or unsubstituted quarterphenyl, a substituted or unsubstituted 9,9-dimethylfluorene, a substituted or unsubstituted 9,9-diphenylfluorene, a substituted or unsubstituted spirofluorene, and a substituted or unsubstituted anthracene.

In one embodiment, the substituted or unsubstituted arylene group including 6 to 30 ring carbon atoms is selected from the following group. The following divalent groups may have a substituent.

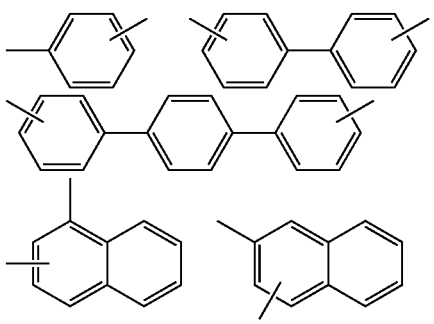

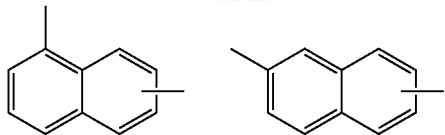

In $L_{37}$, specific examples of the substituted or unsubstituted trivalent aromatic hydrocarbon ring group including 6 to 30 ring carbon atoms include a trivalent residue which can be obtained by removing one hydrogen atom from each of three ring carbon atoms of the aromatic hydrocarbon rings mentioned above. The trivalent residue may have a substituent.

In one embodiment, in $L_{37}$, the substituted or unsubstituted trivalent aromatic hydrocarbon ring group including 6 to 30 ring carbon atoms is a trivalent residue which is obtained by removing one hydrogen atom from each of three ring carbon atoms of the aromatic hydrocarbon rings selected from the group consisting of a substituted or unsubstituted benzene, a substituted or unsubstituted naphthalene, and a substituted or unsubstituted anthracene.

In one embodiment, in $L_{37}$, the substituted or unsubstituted trivalent aromatic hydrocarbon ring group including 6 to 30 ring carbon atoms is a trivalent residue of a substituted or unsubstituted benzene.

In one embodiment, in $L_{37}$, the substituted or unsubstituted trivalent aromatic hydrocarbon ring group including 6 to 30 ring carbon atoms is a benzene-1,3,5-triyl group. The trivalent group may have a substituent.

In one embodiment, in the formulas (31) to (34), the substituted or unsubstituted monovalent to trivalent heterocyclic group including 5 to 32 ring atoms of $L_{31}$ to $L_{39}$ is a monovalent to trivalent residue which can be obtained by removing one hydrogen atom from each of the one to three ring atoms of a heterocyclic group including 5 to 32 ring atoms.

In one embodiment, in the formulas (31) to (34), the substituted or unsubstituted monovalent to trivalent heterocyclic group including 5 to 32 ring atoms of $L_{31}$ to $L_{39}$ is a substituted or unsubstituted monovalent to trivalent heterocyclic group including 5 to 18 ring atoms.

In one embodiment, the substituted or unsubstituted monovalent to trivalent heterocyclic group including 5 to 32 ring atoms of $L_{31}$ to $L_{39}$ Includes 1 to 5, 1 to 3 or 1 to 2 heteroatoms such as a nitrogen atom, a sulfur atom and an oxygen atom.

In the formulas (31) to (34), specific examples of the substituted or unsubstituted heterocyclic ring including 5 to 32 ring atoms which forms the substituted or unsubstituted monovalent to trivalent heterocyclic group including 5 to 32 ring atoms of $L_{31}$ to $L_{39}$ include, for example, pyrrole, imidazole, imidazoline, pyrazole, triazole, furan, thiophene, thiazole, isothiazole, oxazole, isooxazole, oxadiazole, thiadiazole, pyridine, pyrazine, pyridazine, pyrimidine, triazine, bipyrrole, terpyrrole, Bithiophene, terthiophene, biviridine, terpyridine, indole, isoindole, benzofuran, isobenzofuran, benzothiophene, indolizine, quinolidine, quinoline, isoquinoline, cinnoline, phthalazine, quinazoline, quinoxaline, benzimidazole, benzoxazole, benzothiazole, indazole, benzisoxazole, benzisothiazole, benzofuran, dibenzofuran, naphthobenzofuran, benzothiophene, dibenzothiophene, naphthobenzothiophene, carbazole, benzocarbazole, phenanthridine, acridine, phenanthroline, phenazine, phenothiazine, phenoxazine, xanthene and so on. The above heterocyclic ring may have a substituent.

In one embodiment, the substituted or unsubstituted heterocyclic group including 5 to 32 ring atoms which forms the substituted or unsubstituted monovalent to trivalent heterocyclic group including 5 to 32 ring atoms of $L_{31}$ to $L_{39}$ is selected from the following group. The following rings may have a substituent.

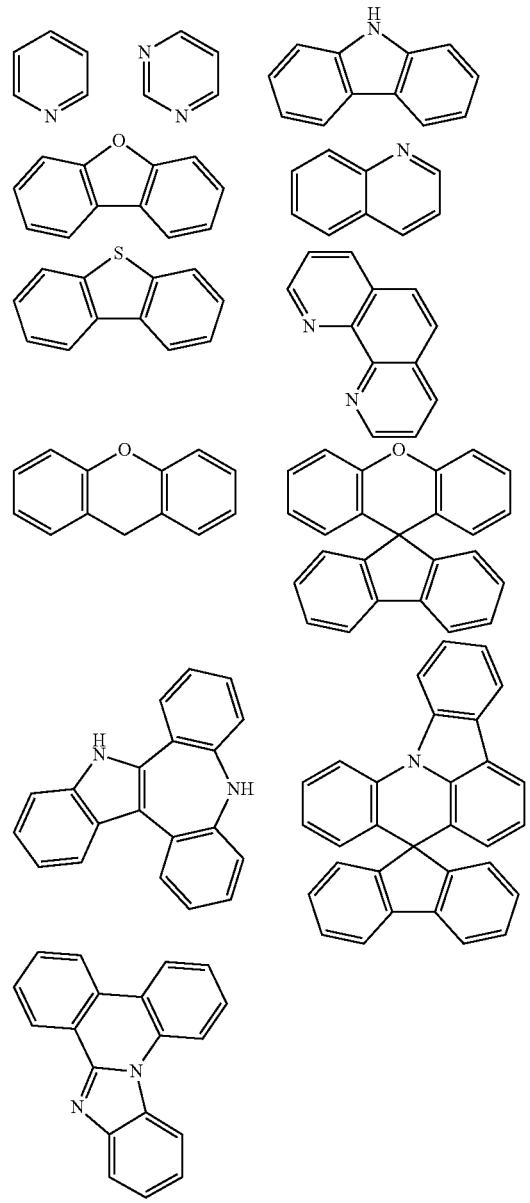

Specific examples of the substituted or unsubstituted monovalent heterocyclic group including 5 to 32 ring atoms in $L_{31}$, $L_{33}$, $L_{36}$, $L_{38}$ and $L_{39}$ are a monovalent residue which can be obtained by removing one hydrogen atom from one ring atom of the heterocyclic rings mentioned above. The monovalent residue may have a substituent.

In one embodiment, in $L_{31}$, $L_{33}$, $L_{36}$, $L_{38}$ and $L_{39}$, the substituted or unsubstituted monovalent heterocyclic group including 5 to 32 ring atoms is a monovalent residue which is obtained by removing one hydrogen atom on a ring atom of the heterocyclic rings selected from the group consisting of a substituted or unsubstituted pyridine, a substituted or unsubstituted pyrazine, a substituted or unsubstituted pyridazine, a substituted or unsubstituted pyrimidine, a substituted or unsubstituted triazine, a substituted or unsubstituted bipyridine, a substituted or unsubstituted carbazole, a substituted or unsubstituted dibenzofuran, a substituted or unsubstituted dibenzothiophene, a substituted or unsubstituted xanthene, a substituted or unsubstituted phenanthroline, and a substituted or unsubstituted quinoline.

In one embodiment, in $L_{31}$, $L_{33}$, $L_{36}$, $L_{38}$ and $L_{39}$, the substituted or unsubstituted monovalent heterocyclic group including 5 to 32 ring atoms is selected from the following group. The following groups may have a substituent.

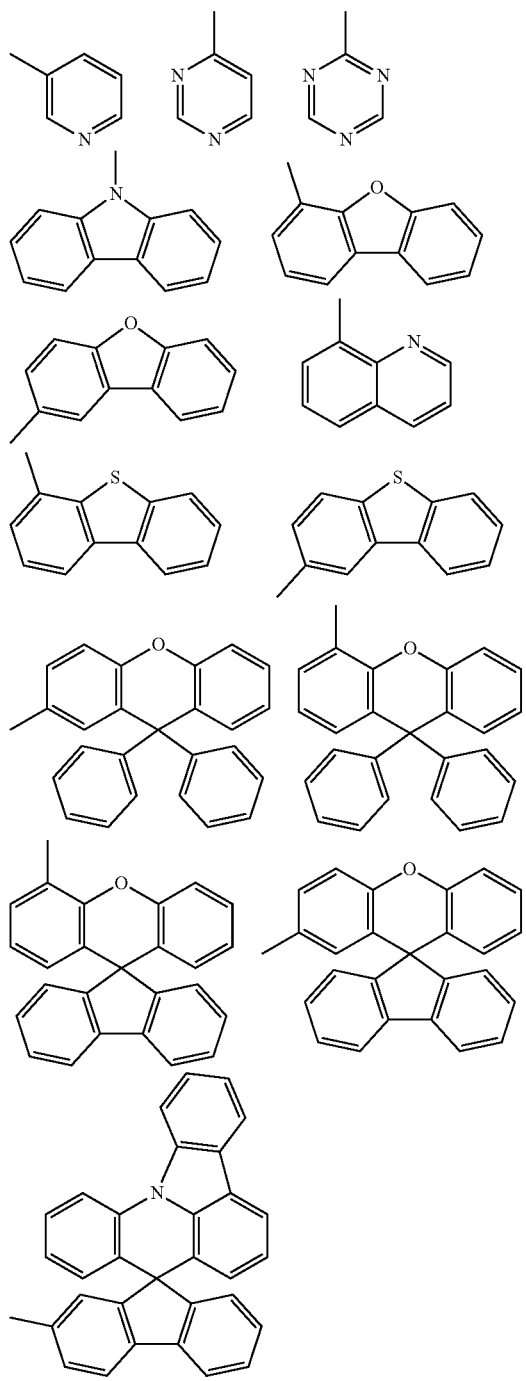

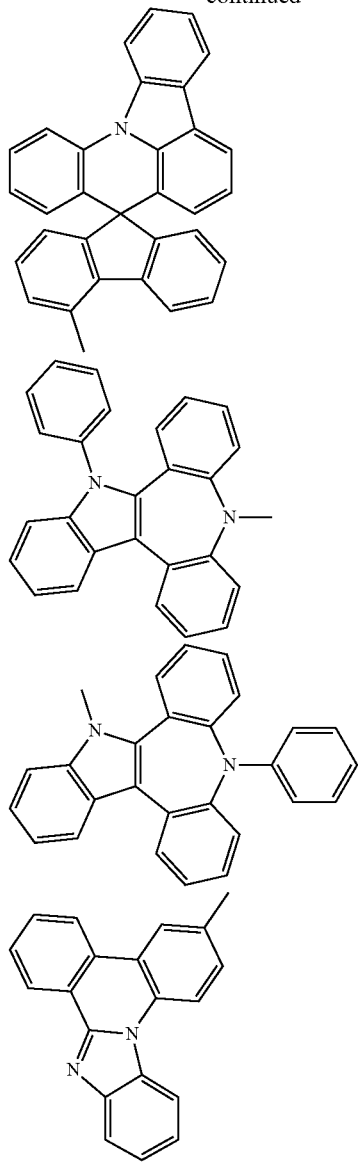

In $L_{32}$, $L_{34}$ and $L_{35}$, specific examples of the substituted or unsubstituted divalent heterocyclic group including 5 to 32 ring atoms include a divalent residue which can be obtained by removing one hydrogen atom from each of two ring atoms of the heterocyclic rings mentioned above. The divalent residue may have a substituent.

In one embodiment, in $L_{32}$, $L_{34}$ and $L_{35}$, the substituted or unsubstituted divalent heterocyclic group including 5 to 32 ring atoms is a divalent residue which is obtained by removing one hydrogen atom from each of two ring atoms of the heterocyclic ring selected from the group consisting of a substituted or unsubstituted a substituted or unsubstituted indole, a substituted or unsubstituted isoindole, a substituted or unsubstituted benzofuran, a substituted or unsubstituted isobenzofuran, a substituted or unsubstituted benzothiophene, a substituted or unsubstituted indolizine, a substituted or unsubstituted quinolidine, a substituted or unsubstituted quinoline, a substituted or unsubstituted isoquinoline, a substituted or unsubstituted cinnoline, a substituted or unsubstituted phthalazine, a substituted or unsubstituted quinazoline, a substituted or unsubstituted quinoxaline, a substituted or unsubstituted benzimidazole, a substituted or unsubstituted benzisothiazole, a substituted or unsubstituted benzofuran, a substituted or unsubstituted dibenzofuran, a substituted or unsubstituted naphthobenzofuran, a substituted or unsubstituted benzothiophene, a substituted or unsubstituted dibenzothiophene, a substituted or unsubstituted naphthobenzothiophene, a substituted or unsubstituted carbazole, a substituted or unsubstituted benzocarbazole, a substituted or unsubstituted phenanthridine, a substituted or unsubstituted acridine, a substituted or unsubstituted phenanthroline, a substituted or unsubstituted phenazine, a substituted or unsubstituted phenothiazine, a substituted or unsubstituted phenoxazine, and a substituted or unsubstituted xanthene.

In one embodiment, in $L_{32}$, $L_{34}$ and $L_{35}$, the substituted or unsubstituted divalent heterocyclic group including 5 to 32 ring atoms is a divalent residue which is obtained by removing one hydrogen atom from each of two ring atoms of the heterocyclic ring selected from the group consisting of a substituted or unsubstituted dibenzofuran, a substituted or unsubstituted dibenzothiophene, and a substituted or unsubstituted carbazole.

In one embodiment, in $L_{32}$, $L_{34}$ and $L_{35}$, the substituted or unsubstituted divalent heterocyclic group including 5 to 32 ring atoms is a divalent residue which is obtained by removing one hydrogen atom from each of two ring atoms of a substituted or unsubstituted pyridine and a substituted or unsubstituted carbazole.

In $L_{37}$, specific examples of the substituted or unsubstituted trivalent heterocyclic group including 5 to 32 ring atoms include a trivalent residue which can be obtained by removing one hydrogen atom from each of three ring atoms of the heterocyclic rings mentioned above. The trivalent residue may have a substituent.

In one embodiment, in $L_{37}$, the substituted or unsubstituted trivalent heterocyclic group including 5 to 32 ring atoms is a trivalent residue which is obtained by removing one hydrogen atom from each of three ring atoms of the heterocyclic ring selected from the group consisting of a substituted or unsubstituted pyridine, a substituted or unsubstituted pyrazine, a substituted or unsubstituted pyridazine, a substituted or unsubstituted pyrimidine, a substituted or unsubstituted triazine, a substituted or unsubstituted quinoline, a substituted or unsubstituted benzofuran and a substituted or unsubstituted benzothiophene.

Specific examples of the compound represented by the above formula (30) are described below, but the invention is not limited thereto.

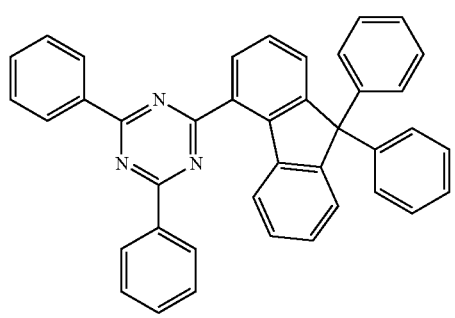

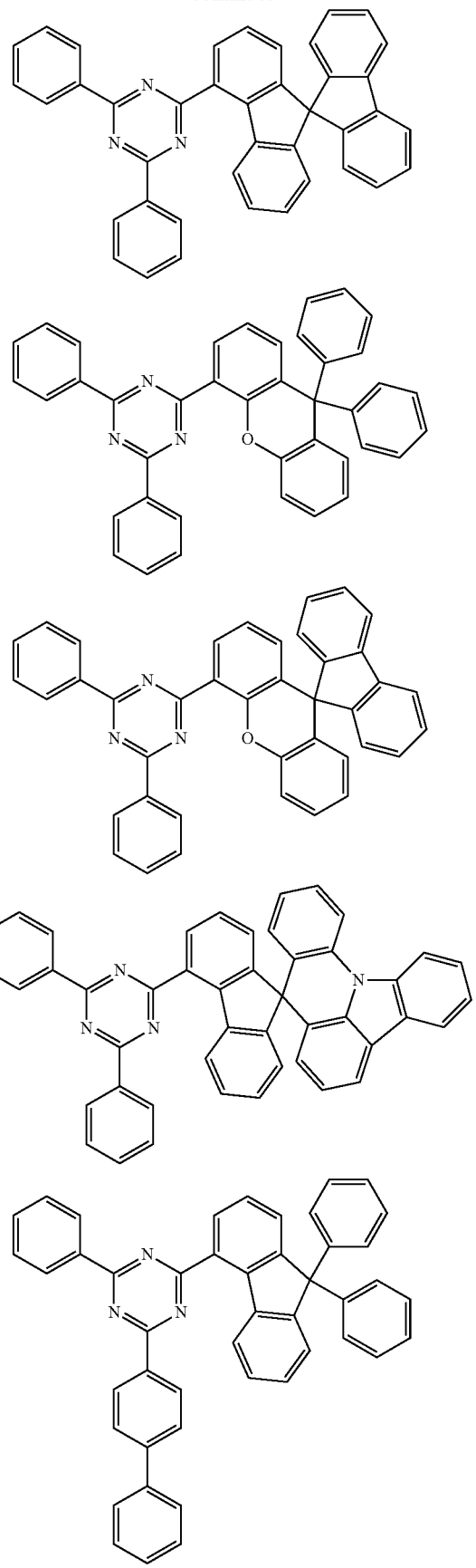

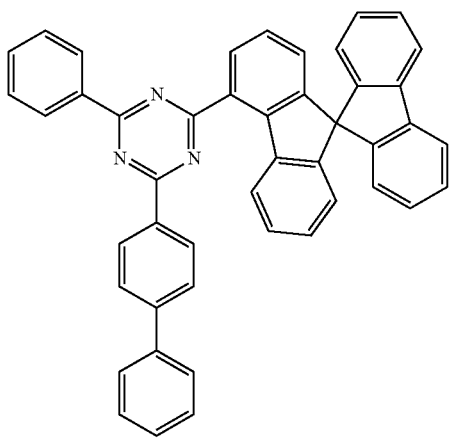
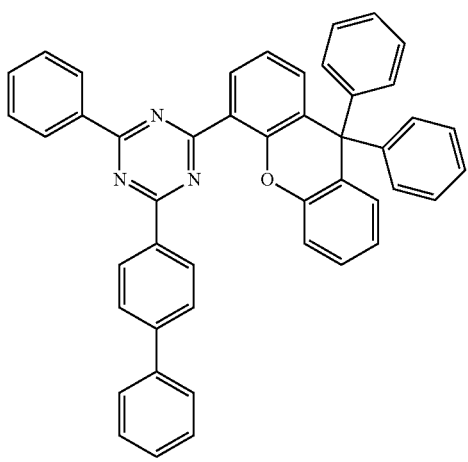
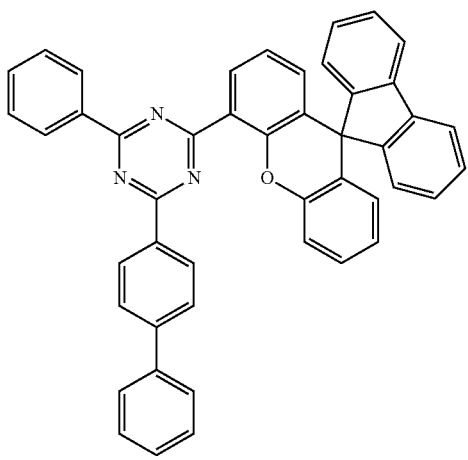
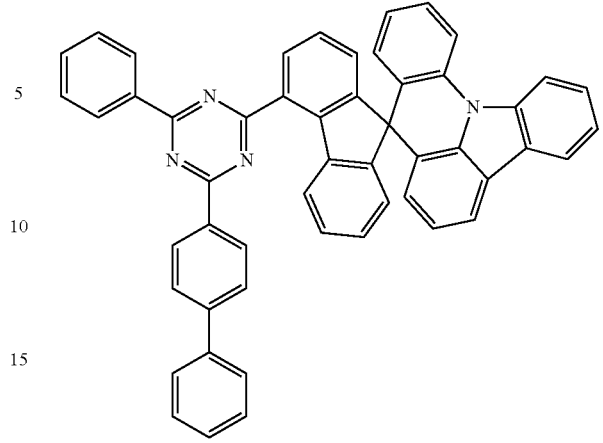
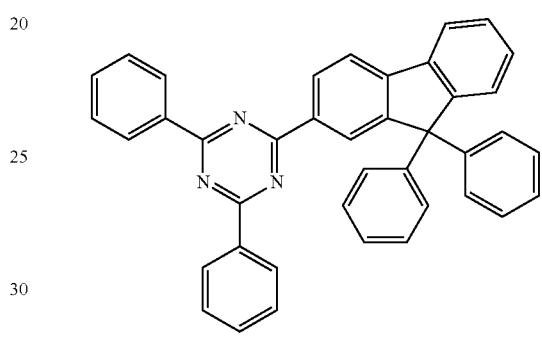
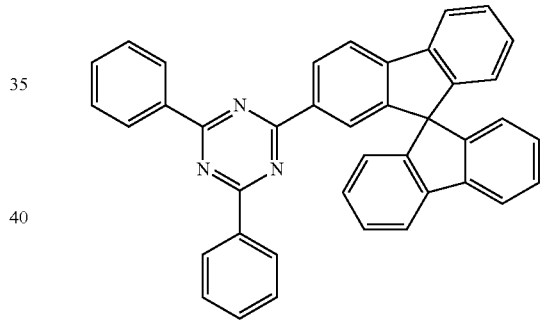
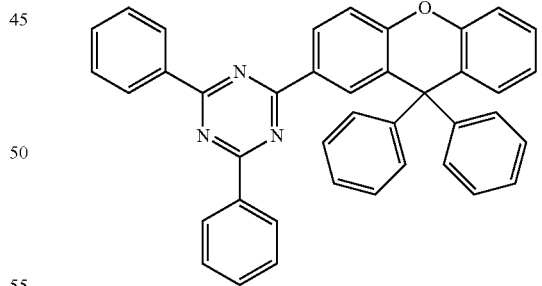
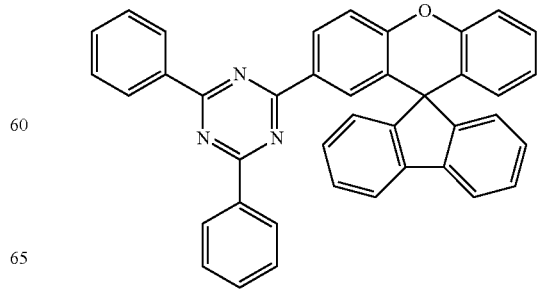

-continued
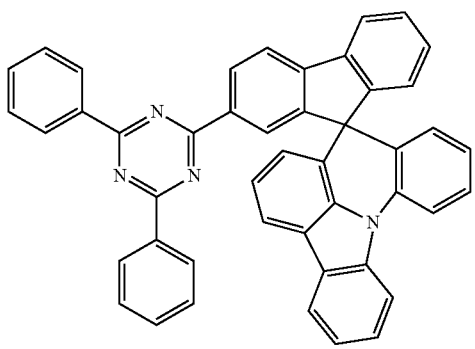
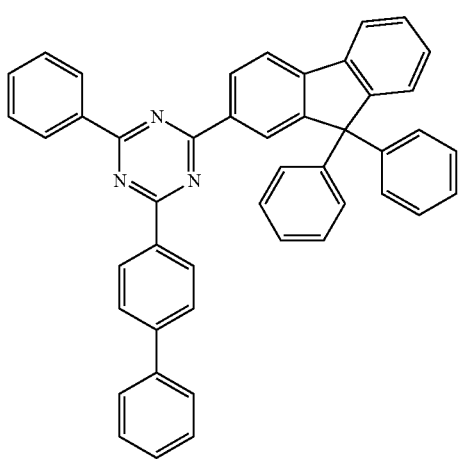
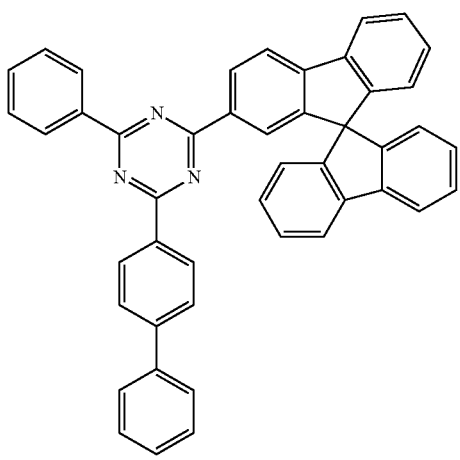
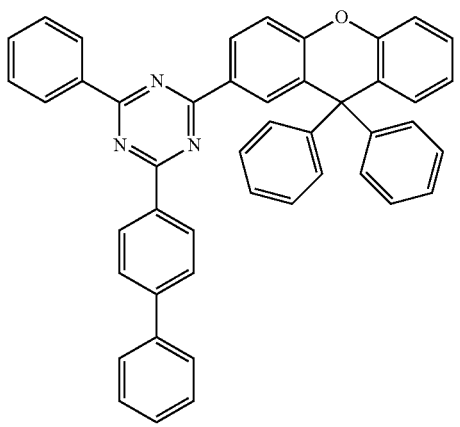
-continued
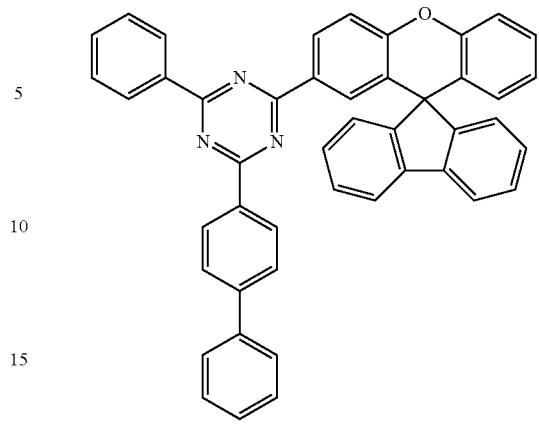
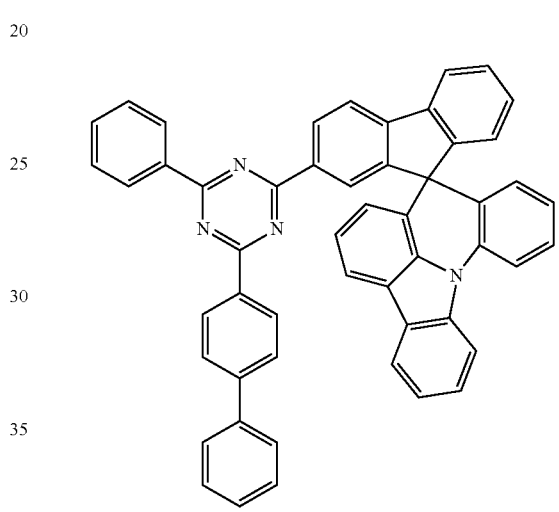
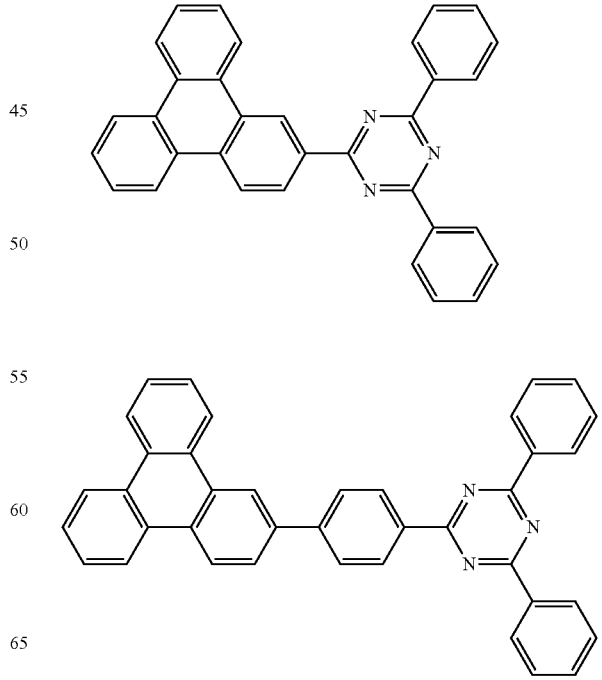

133
-continued
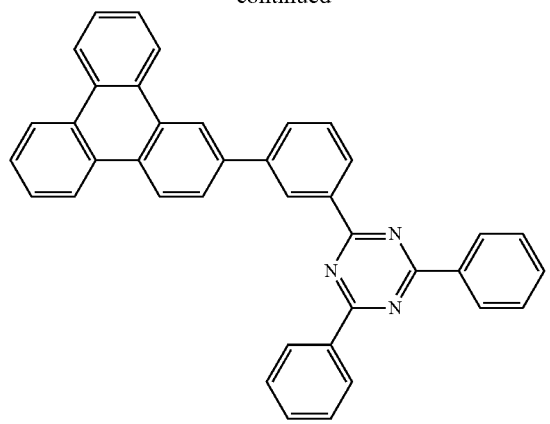
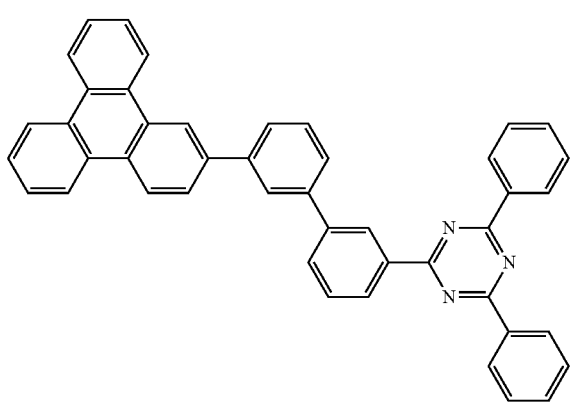
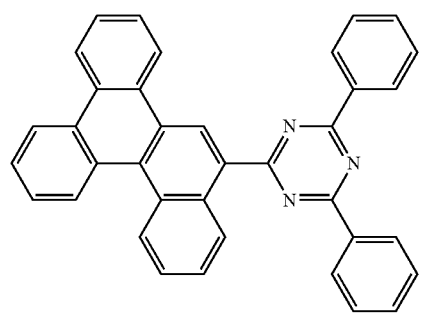
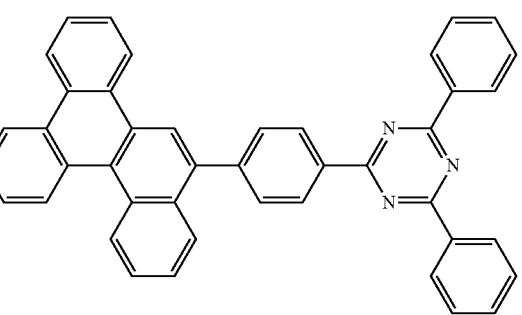
134
-continued
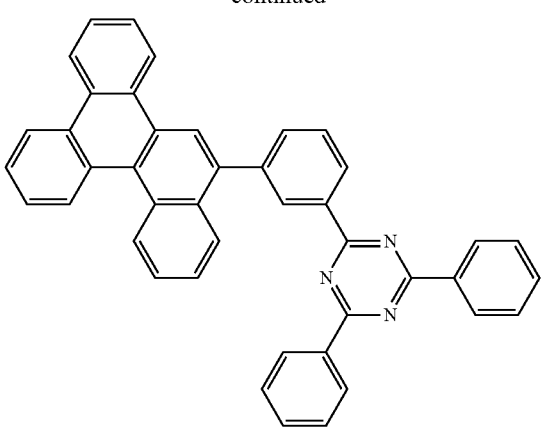
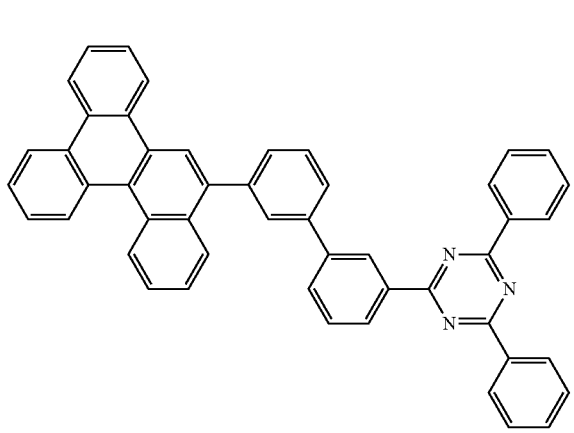
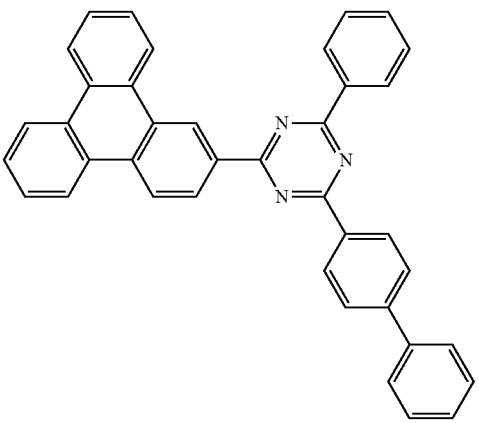

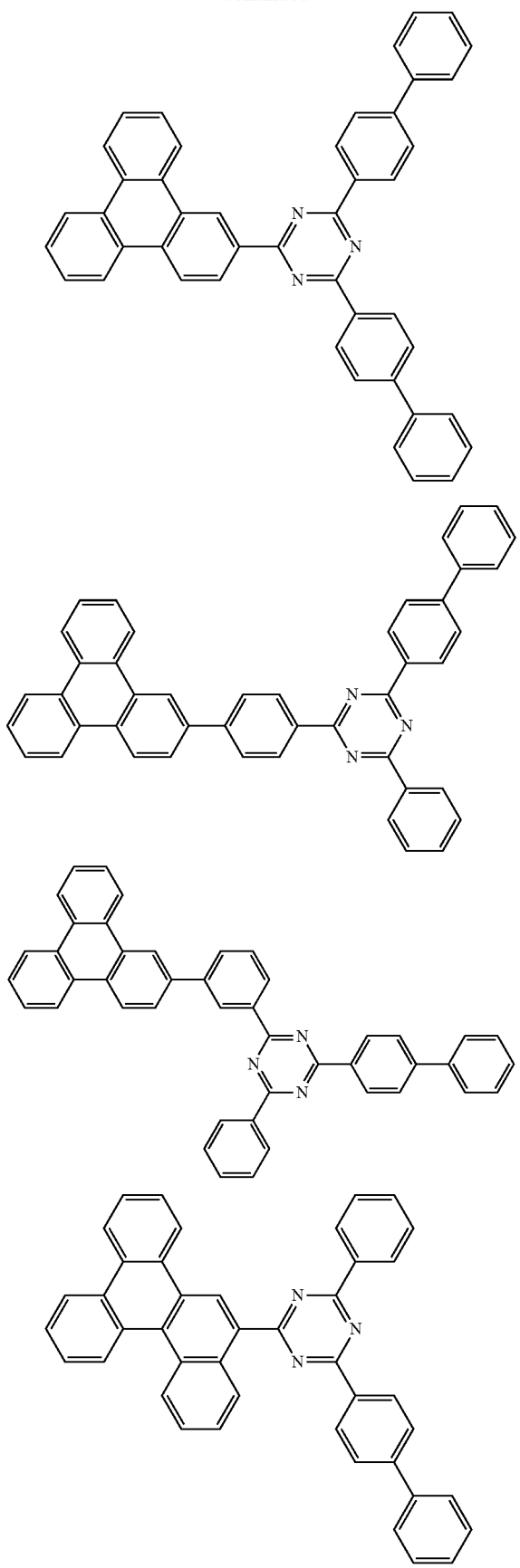
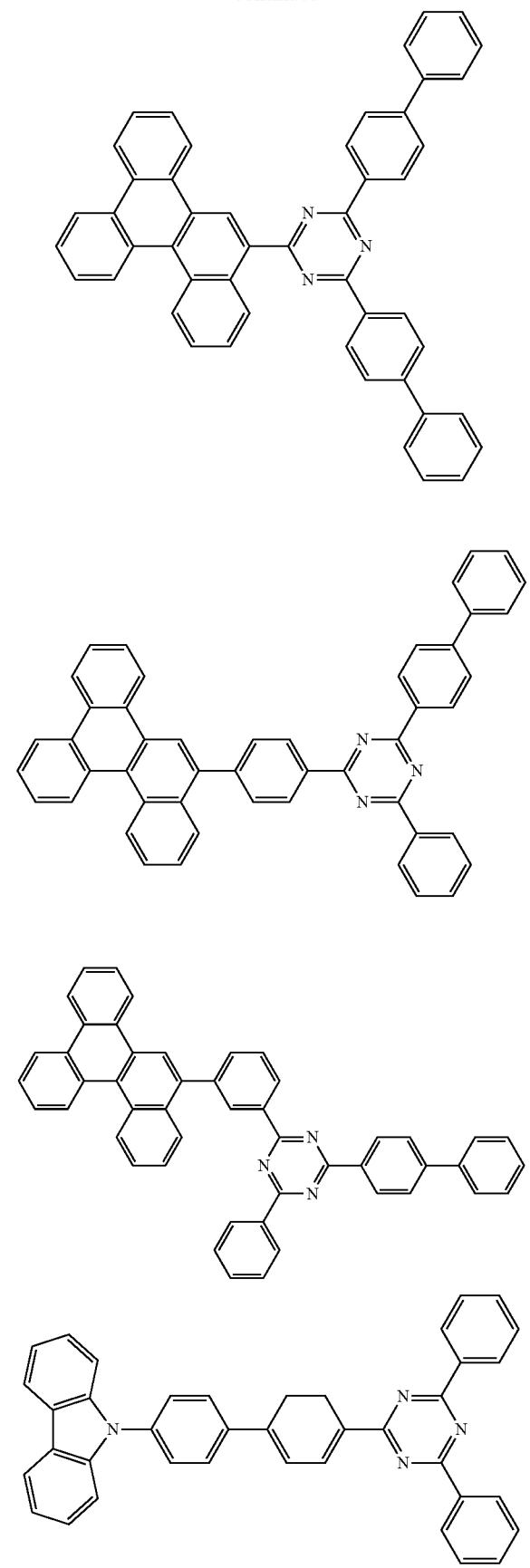

137
-continued
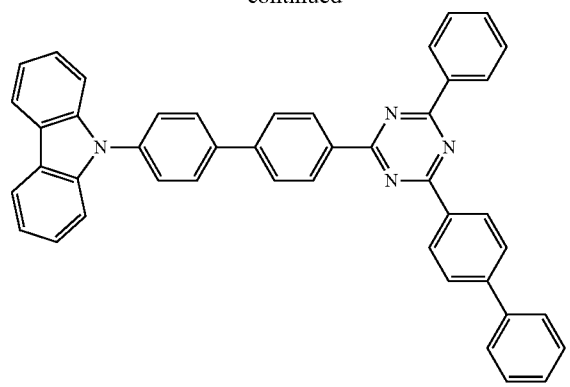
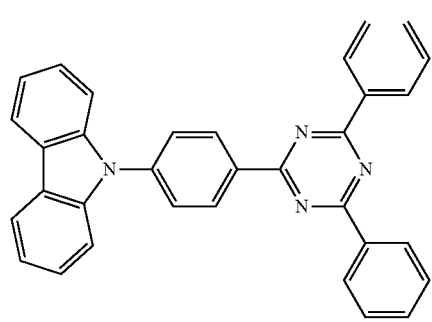
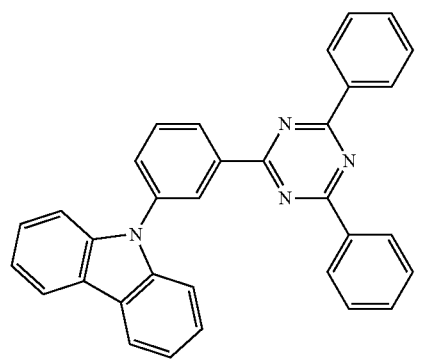
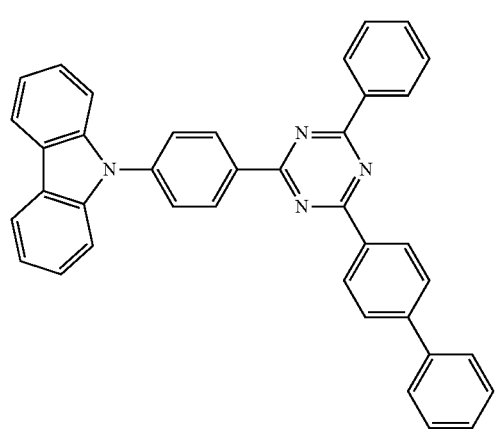
138
-continued
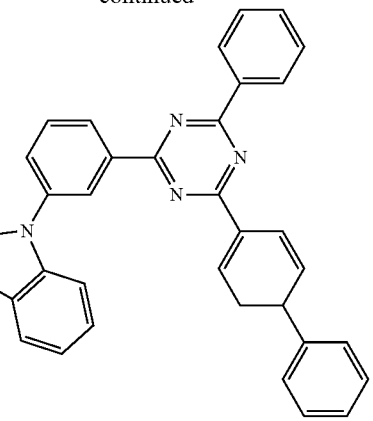
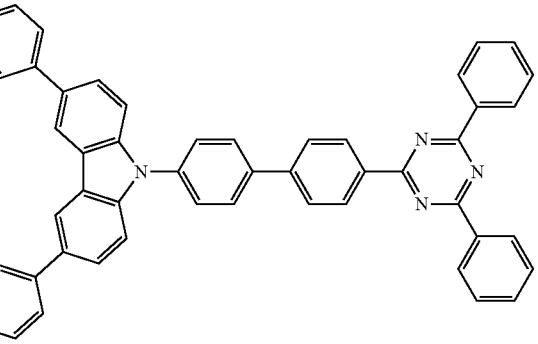
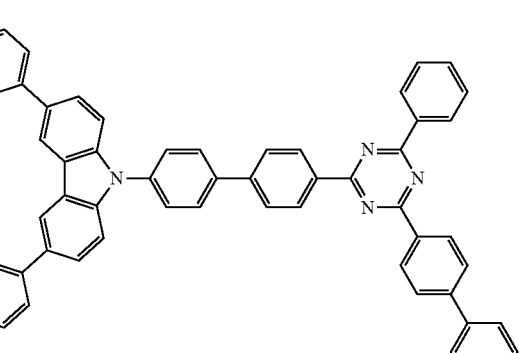
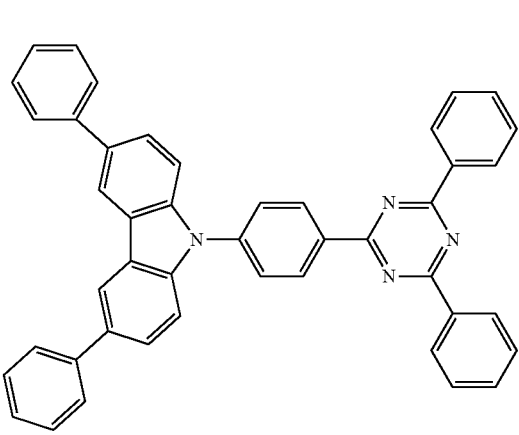

139
-continued
140
-continued
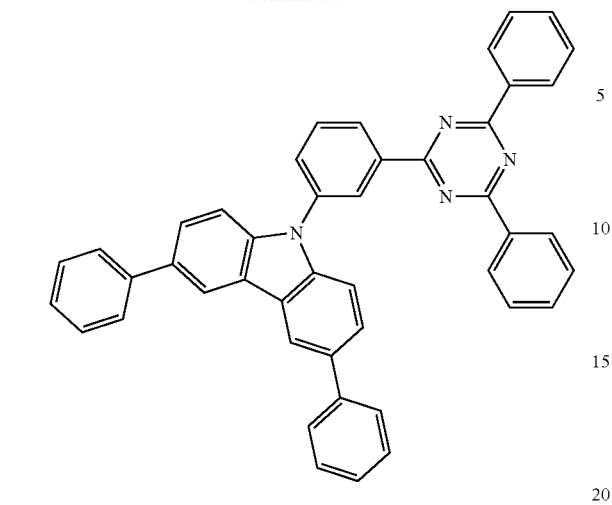
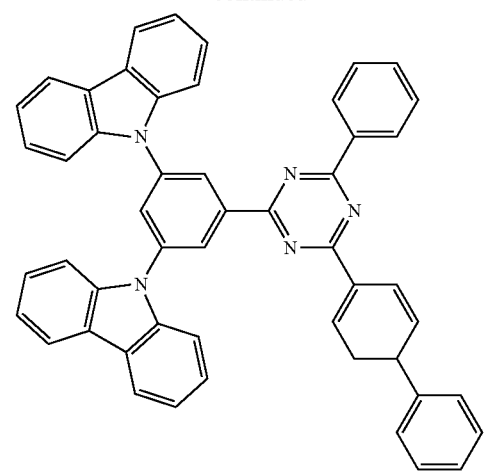
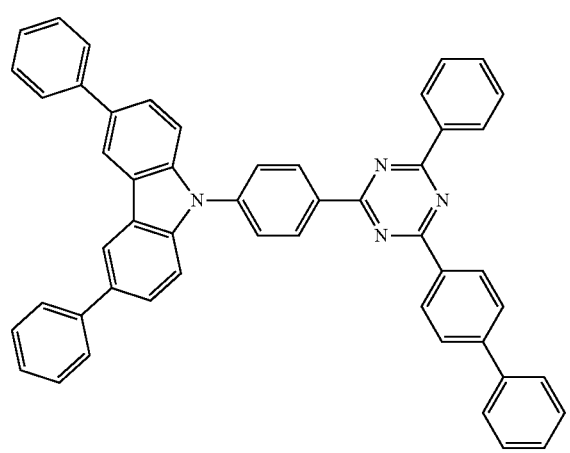
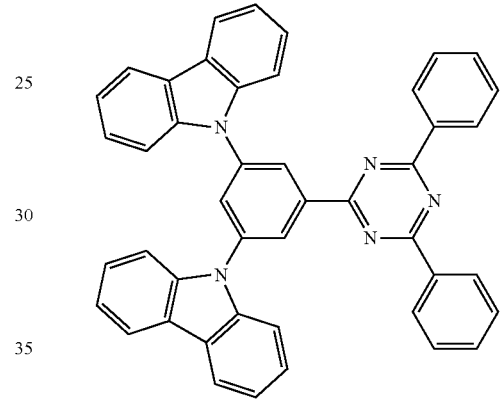
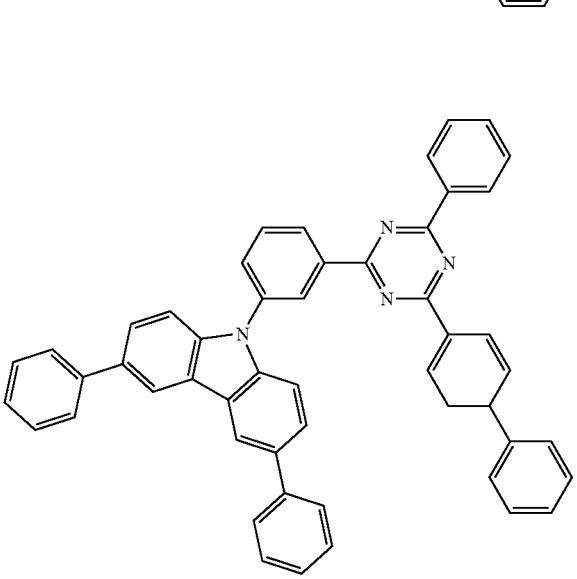
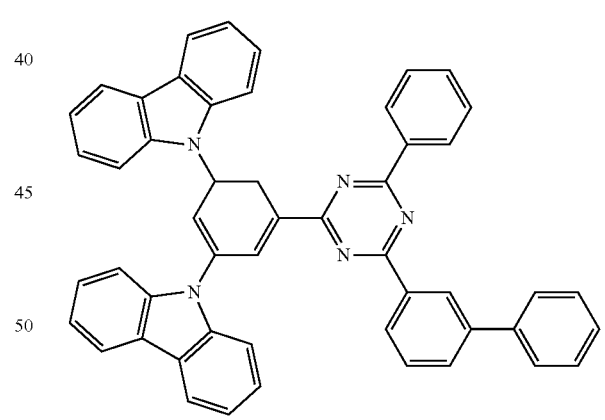
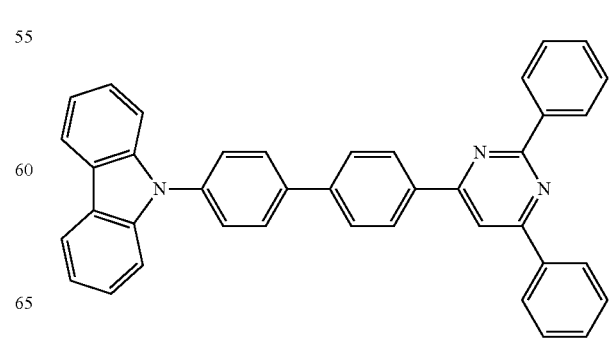

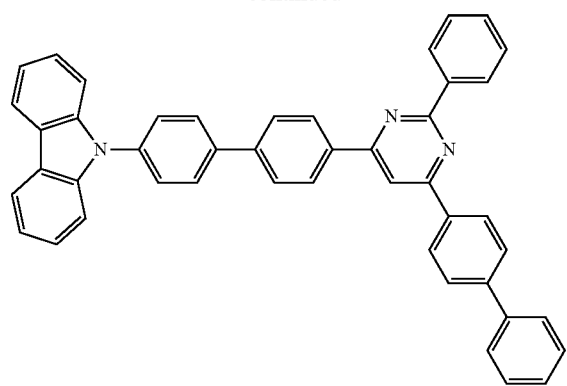
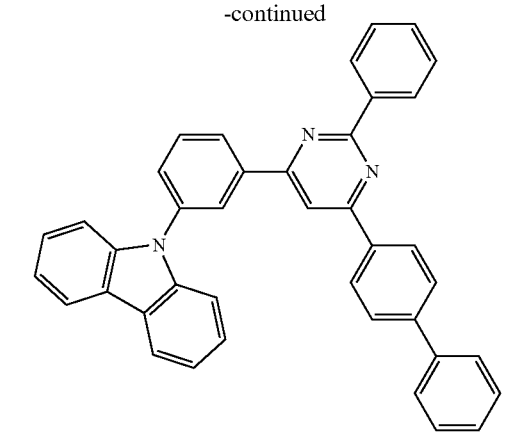
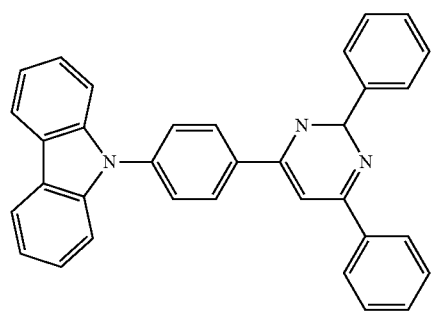
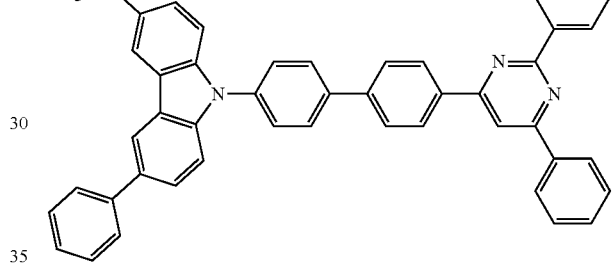
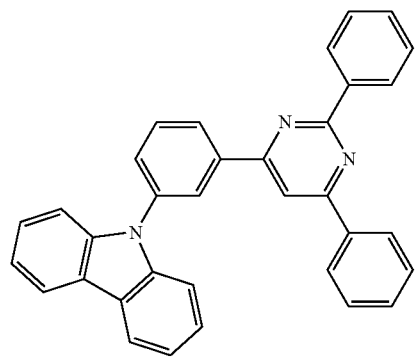
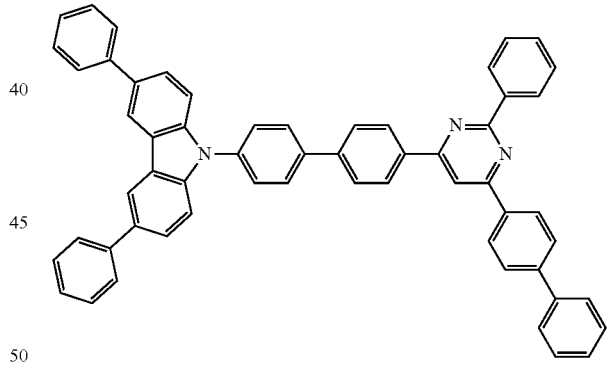
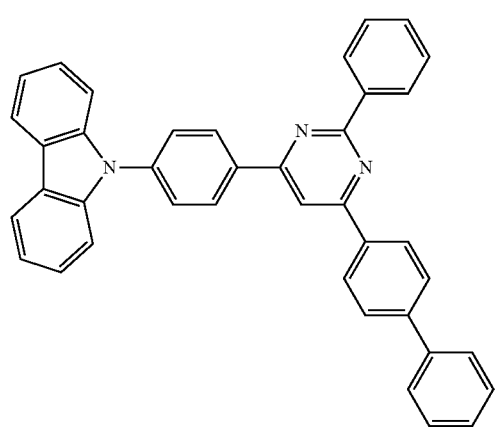
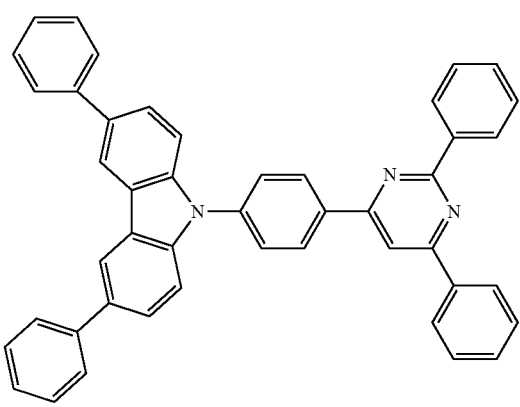

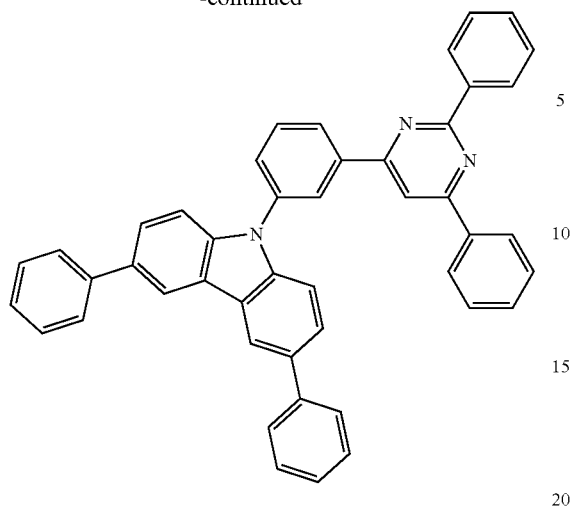
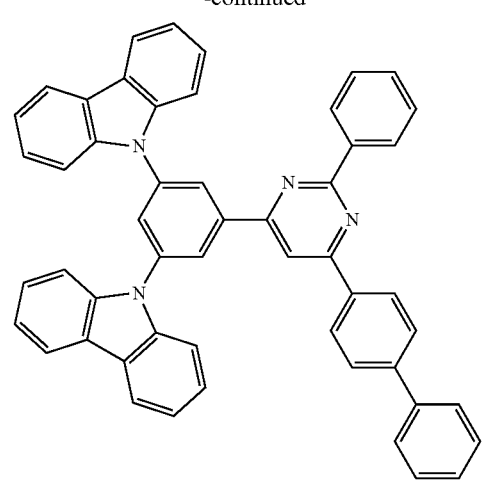
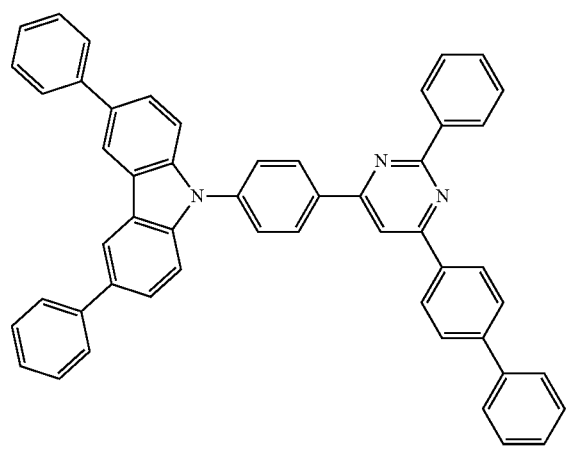
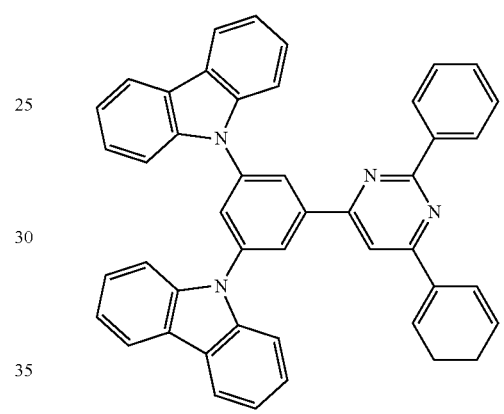
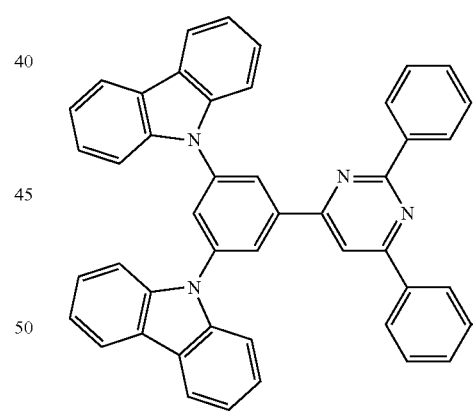
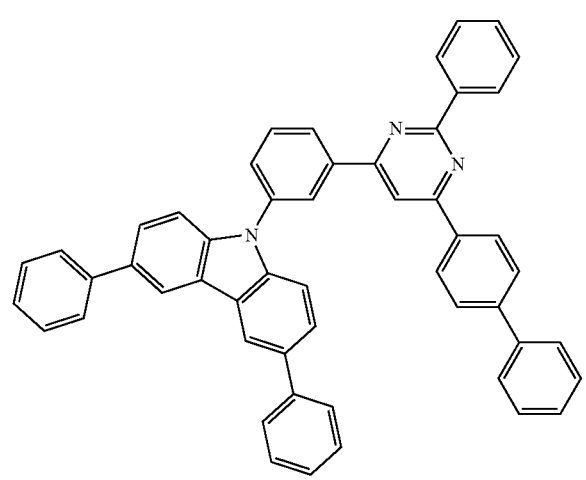
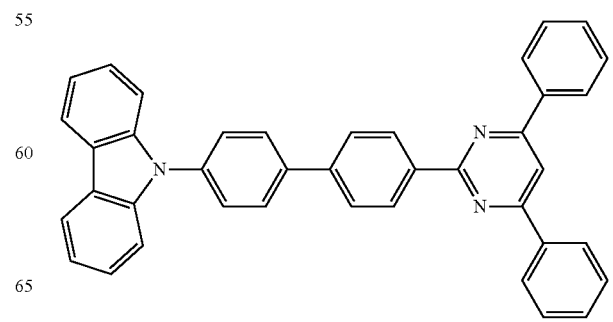

145
-continued
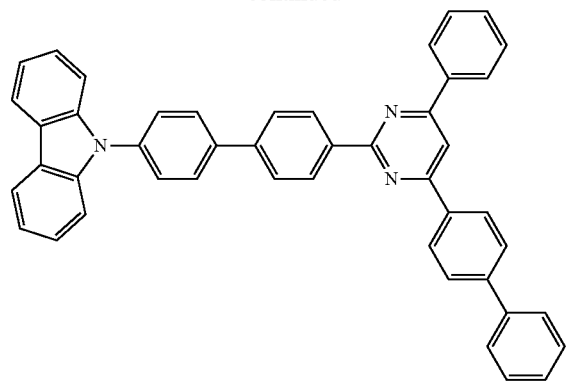
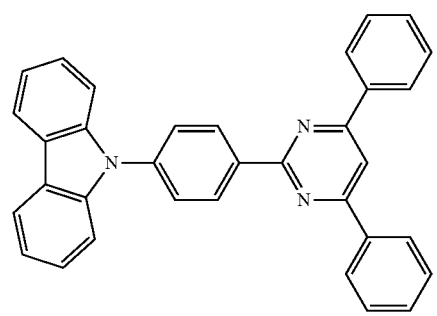
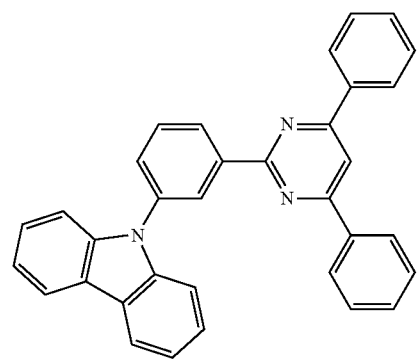
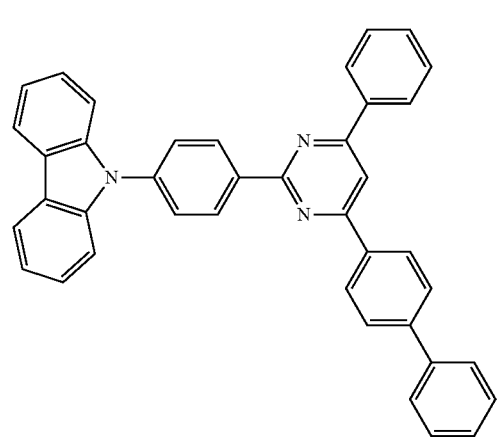
146
-continued
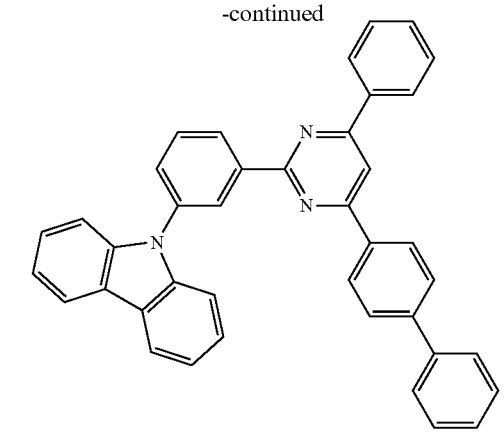
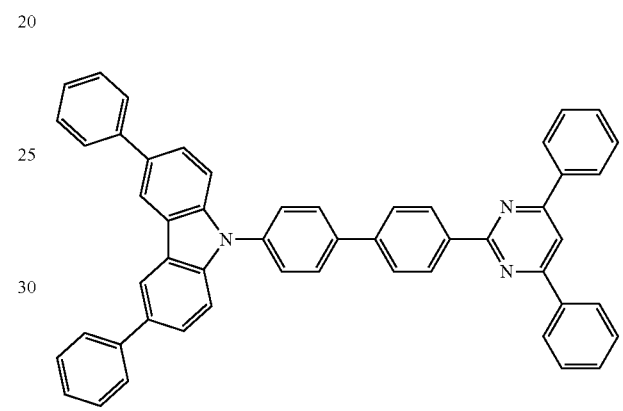
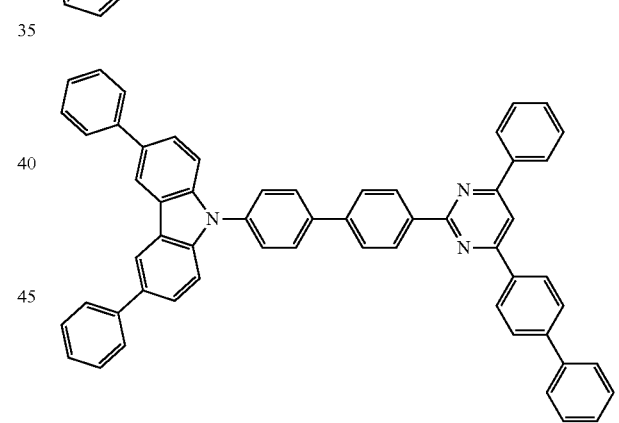
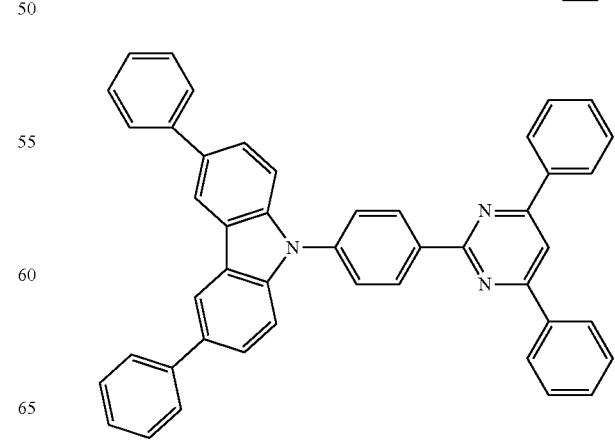

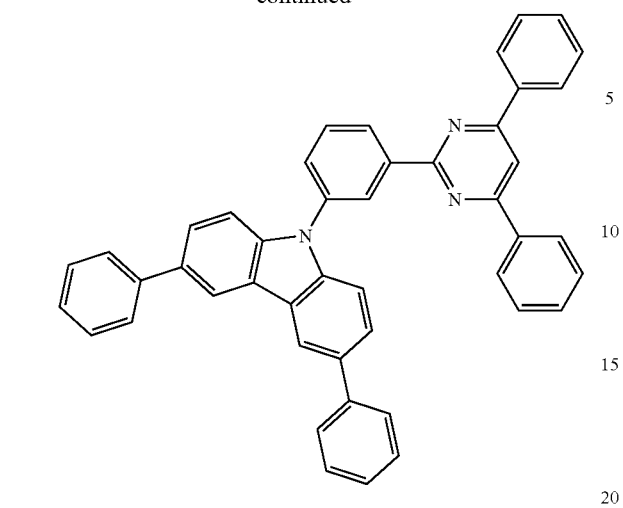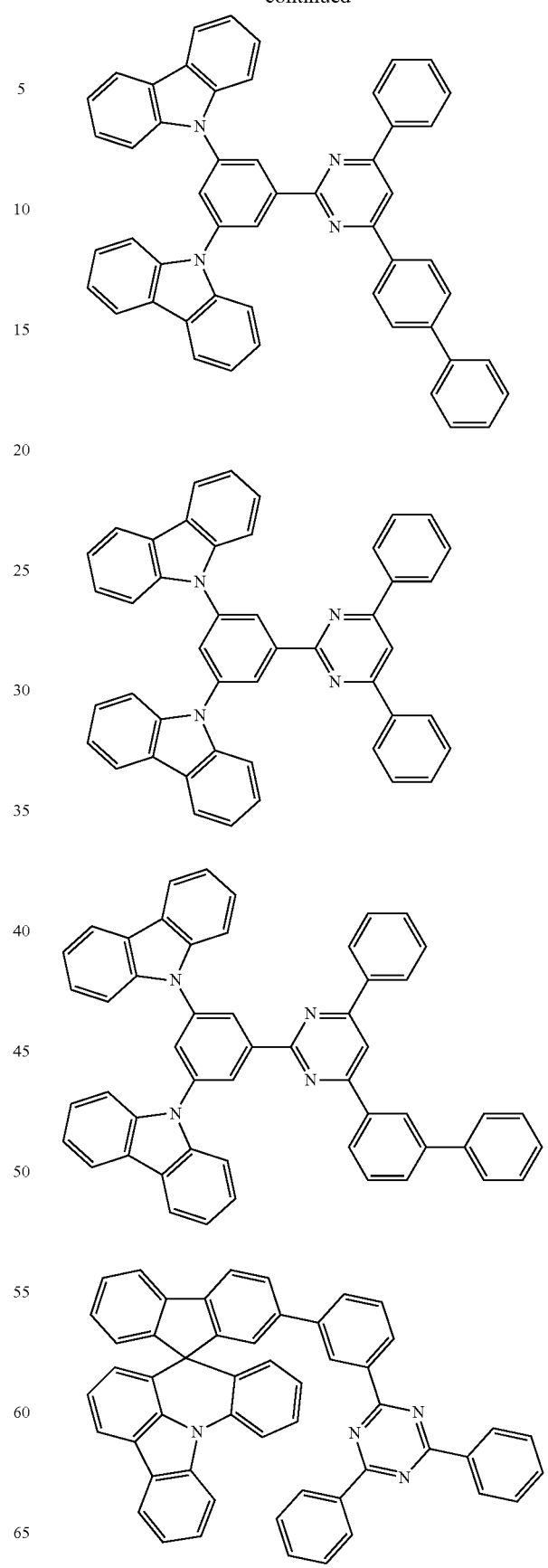

149
-continued
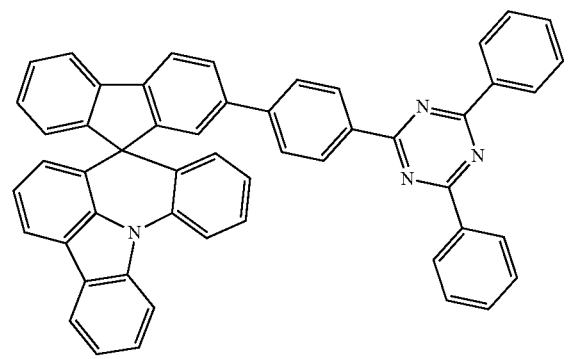
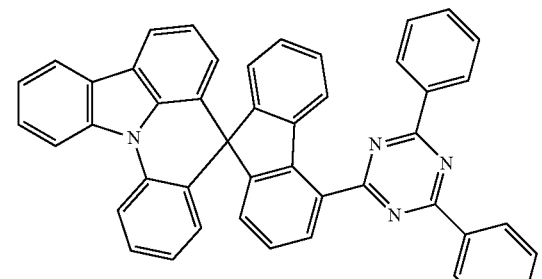
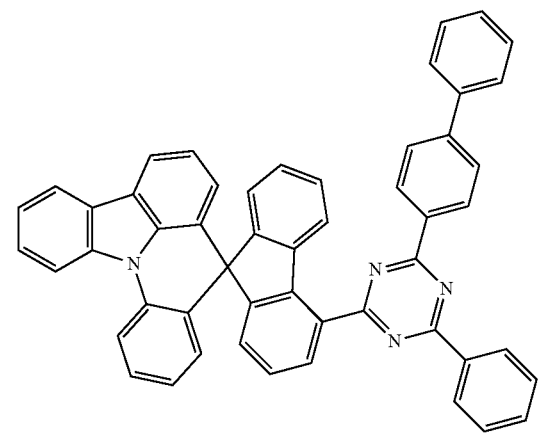
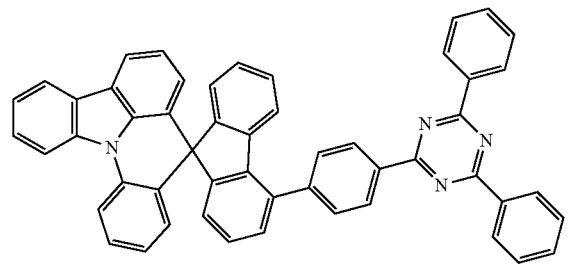
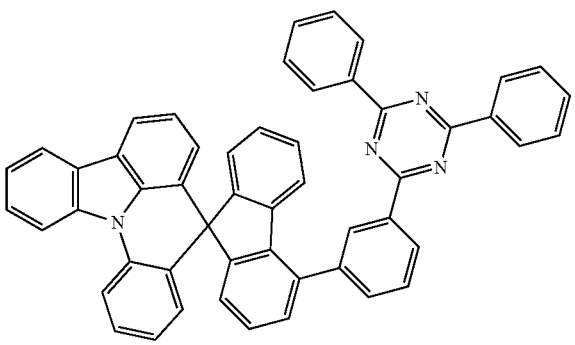
150
-continued
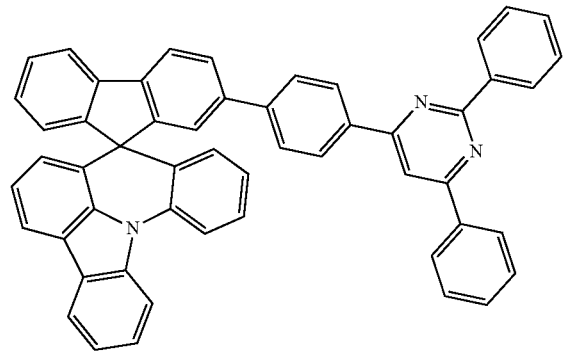
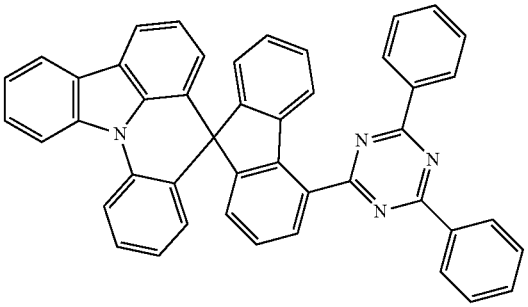
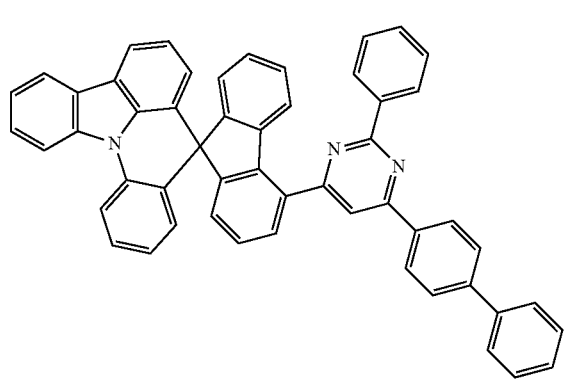
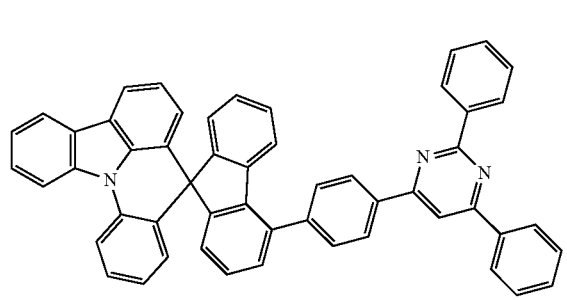
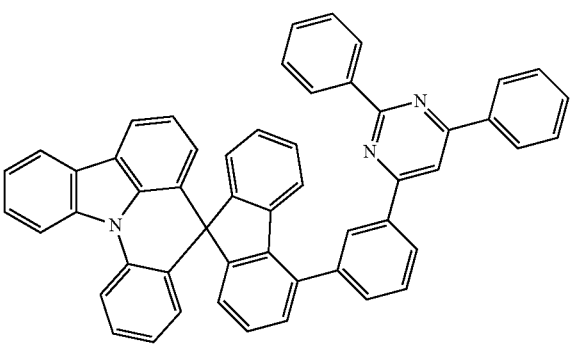

151
-continued
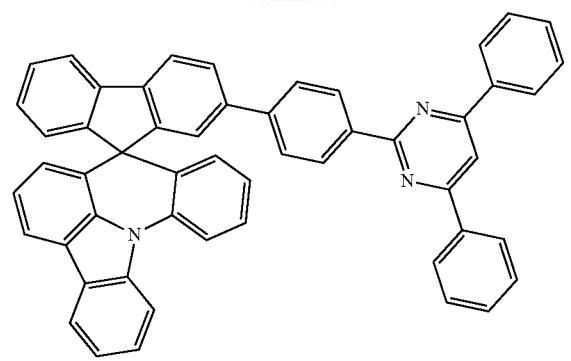
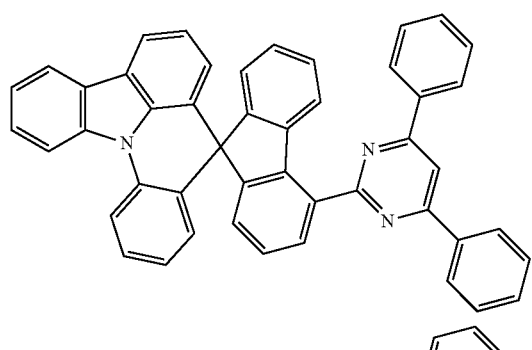
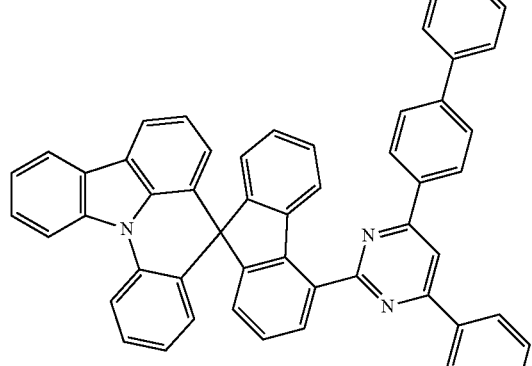
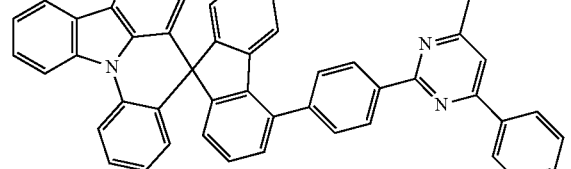
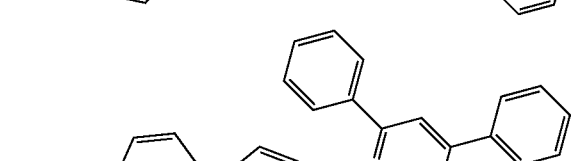
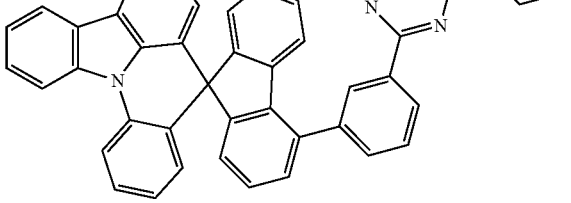
152
-continued
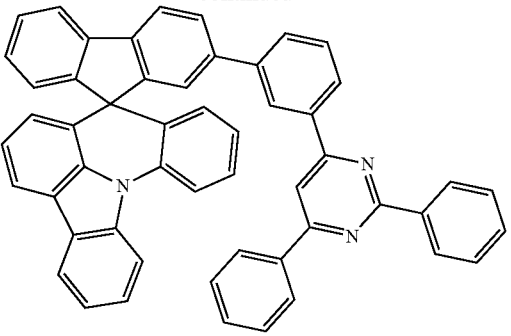
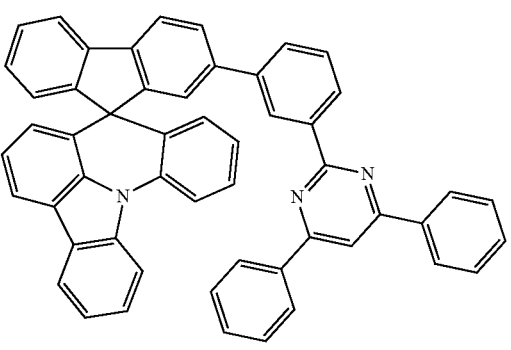
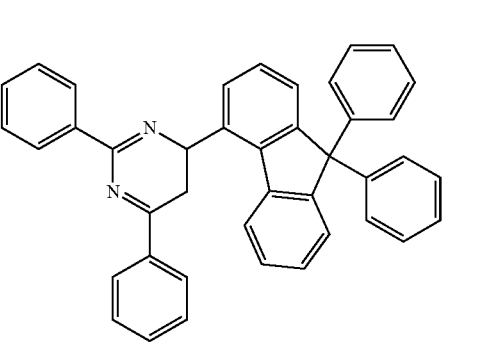
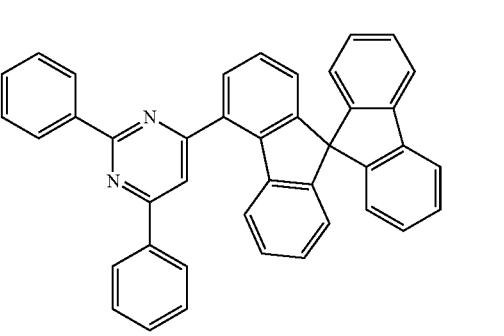
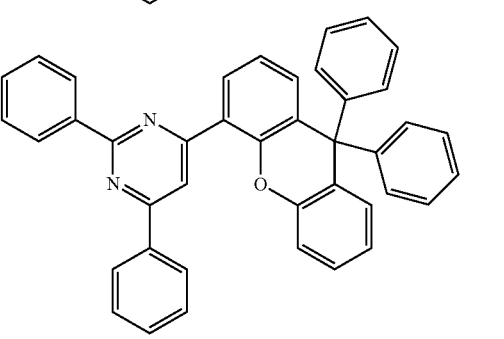

153
-continued
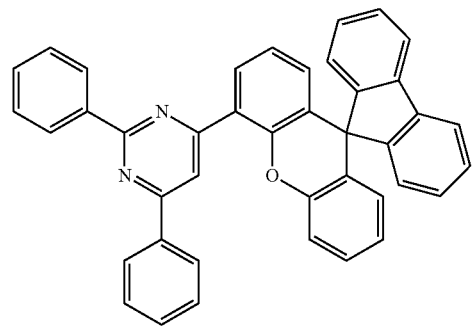
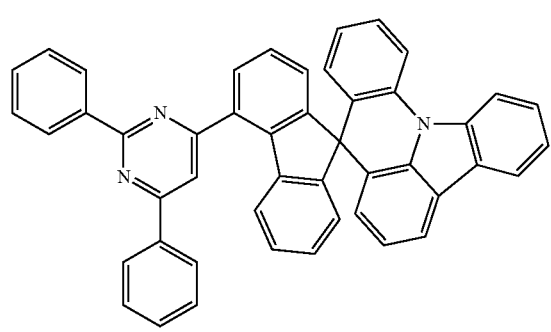
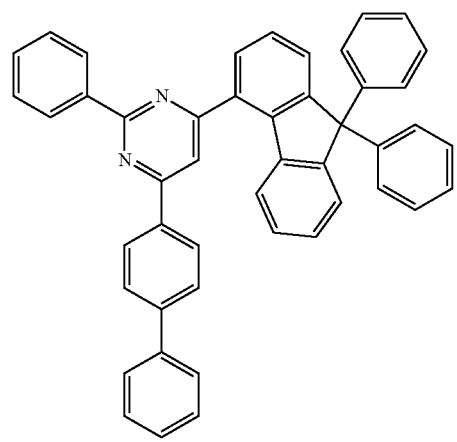
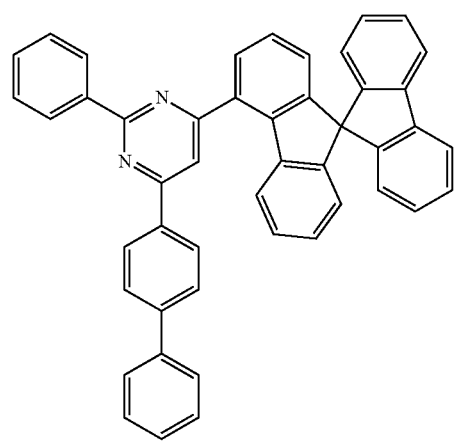
154
-continued
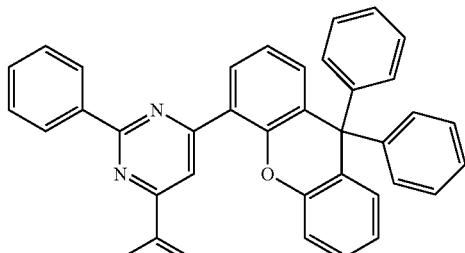
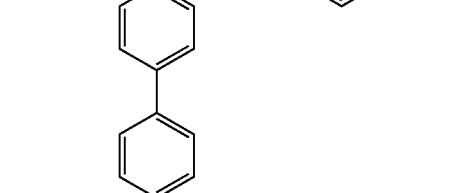
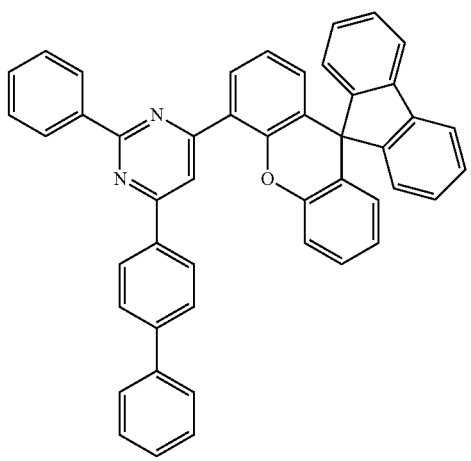
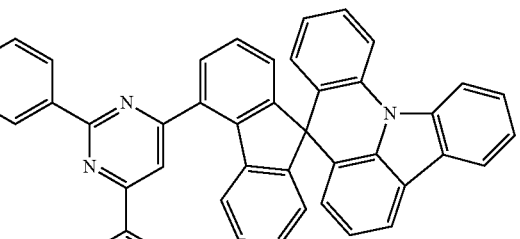
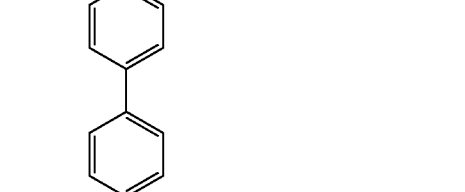
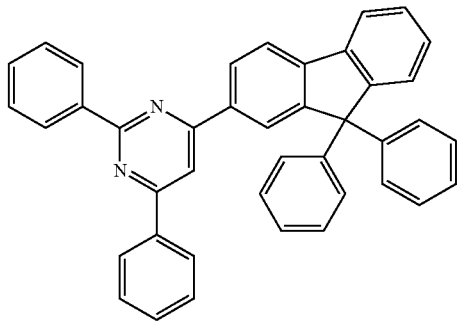

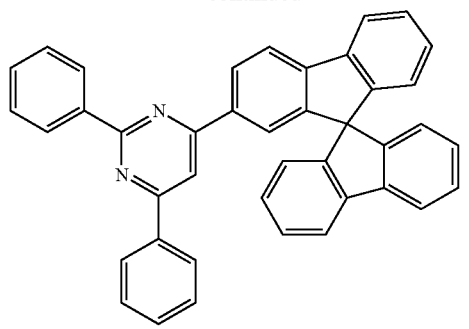
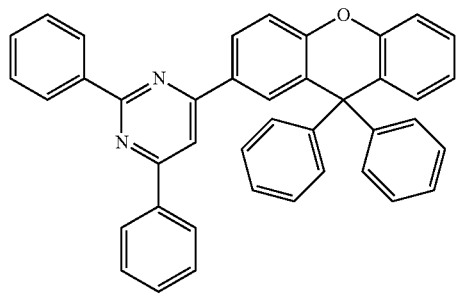
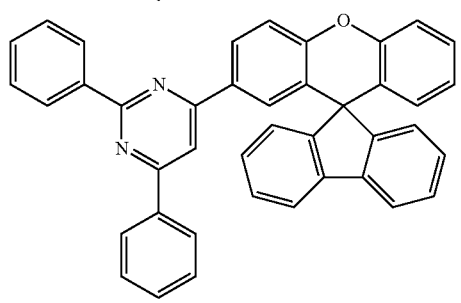
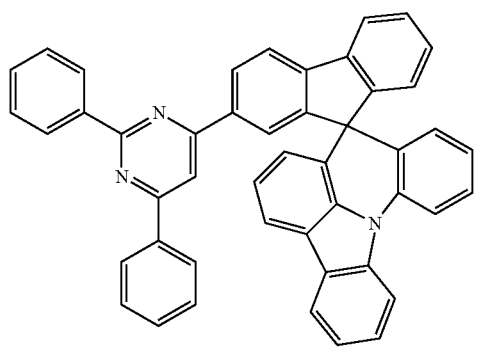
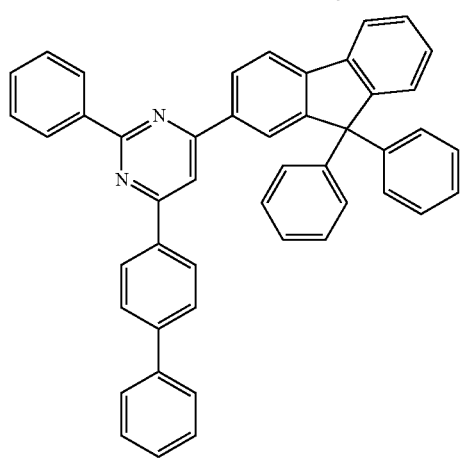
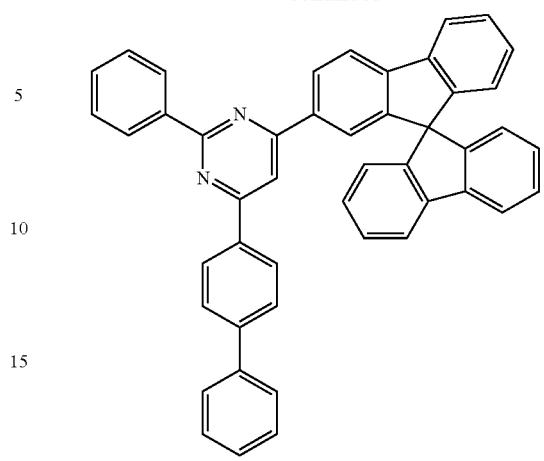
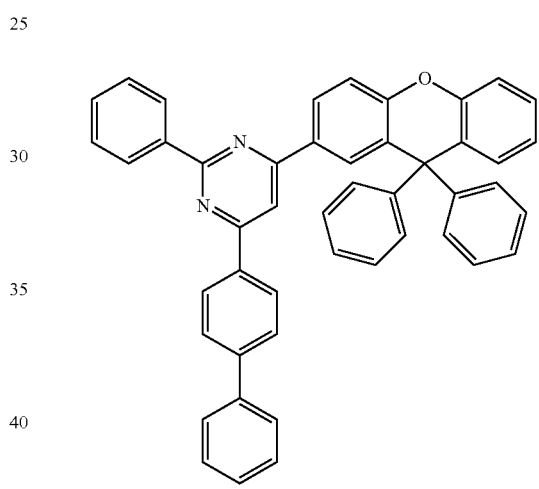
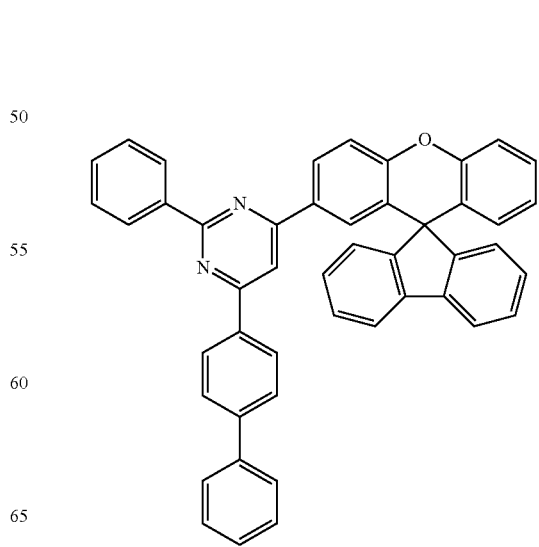

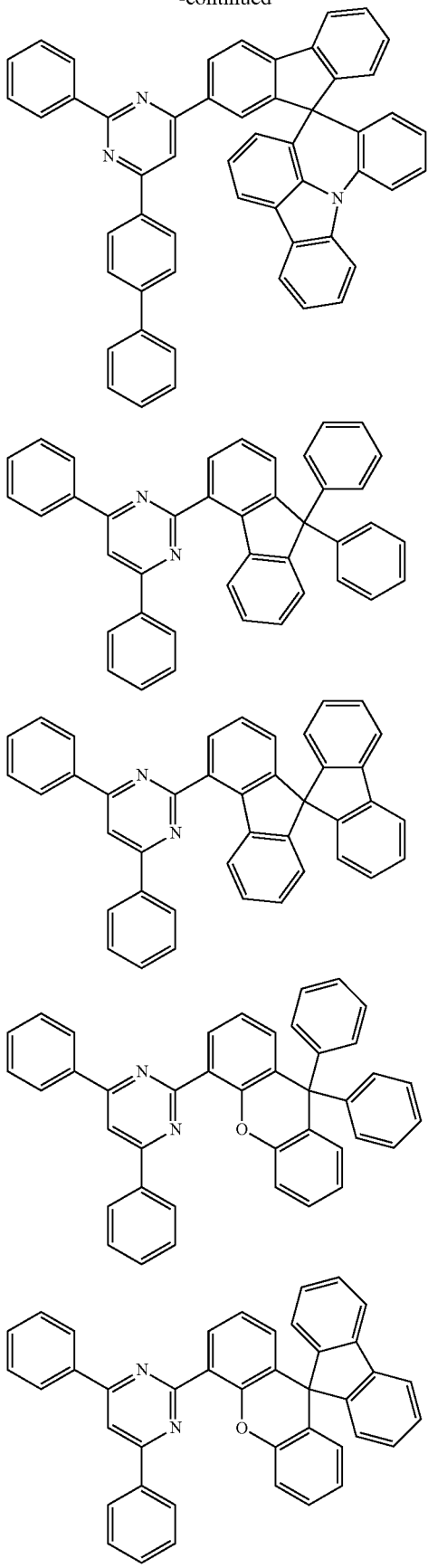
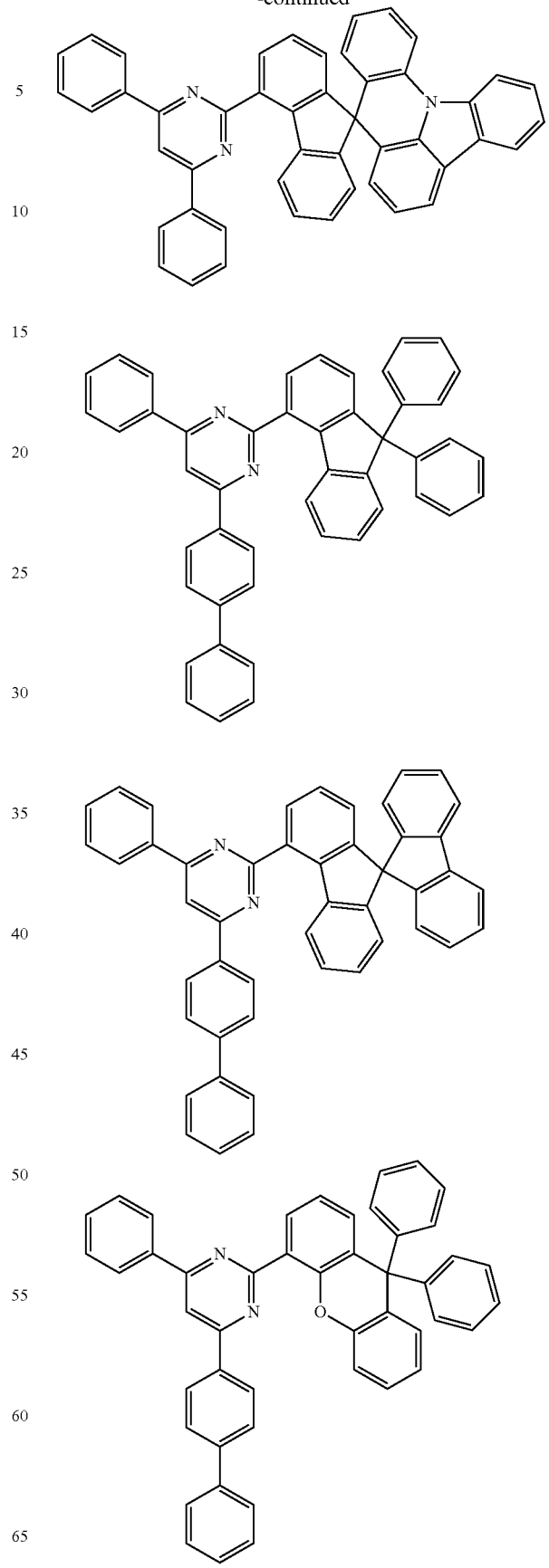

159
-continued
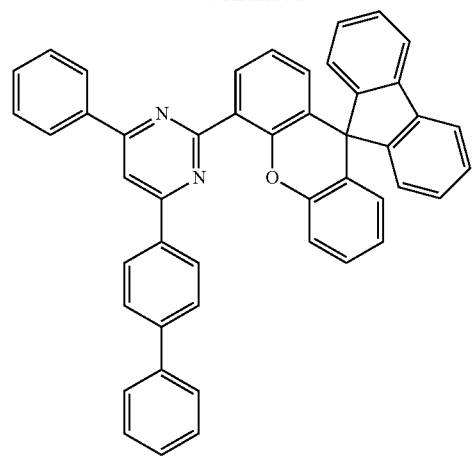
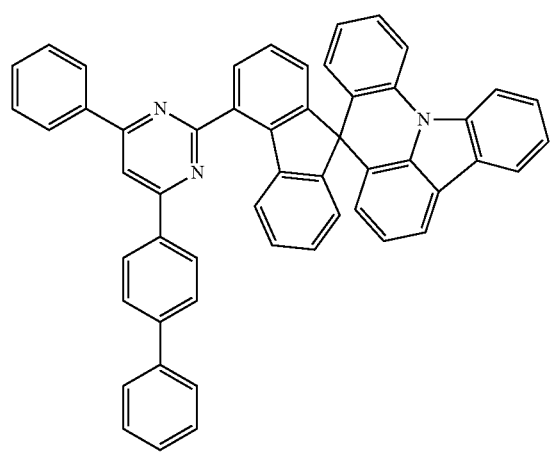
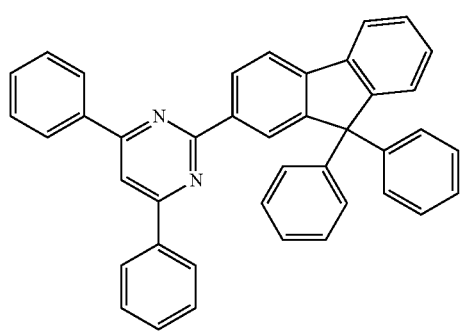
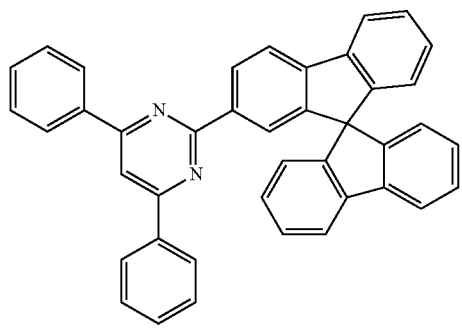
160
-continued
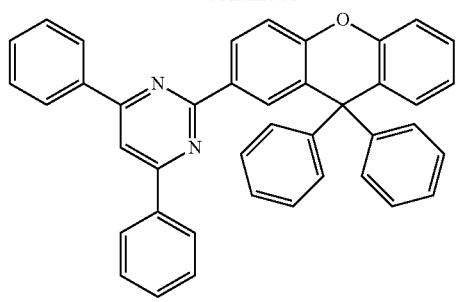
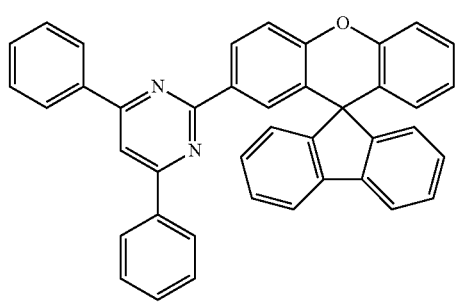
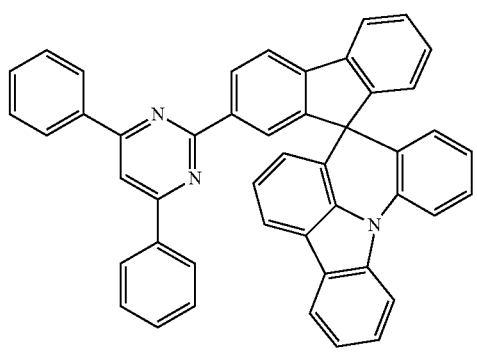
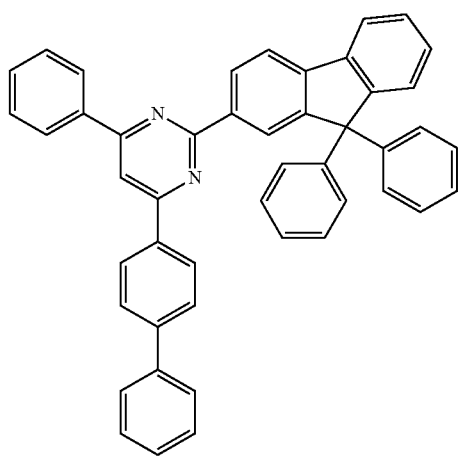

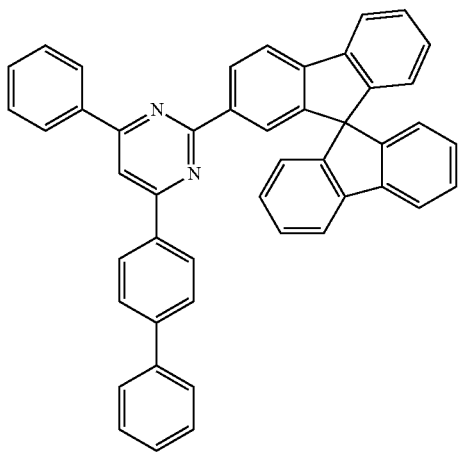
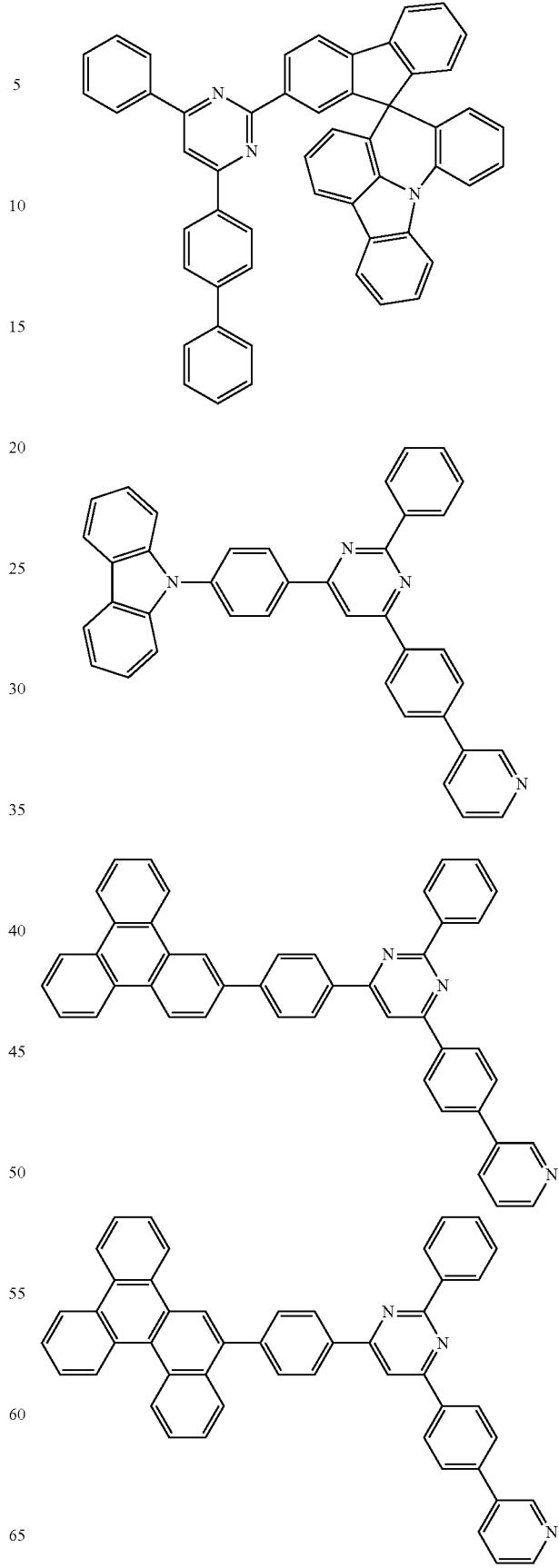

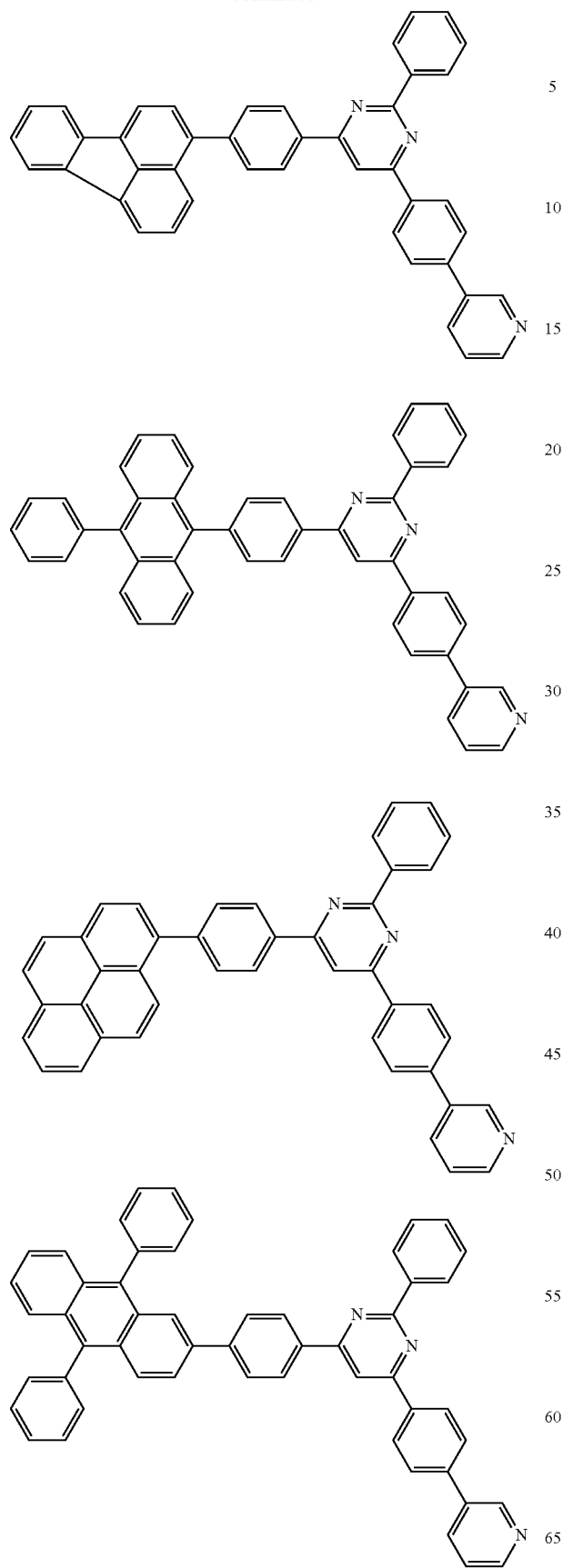

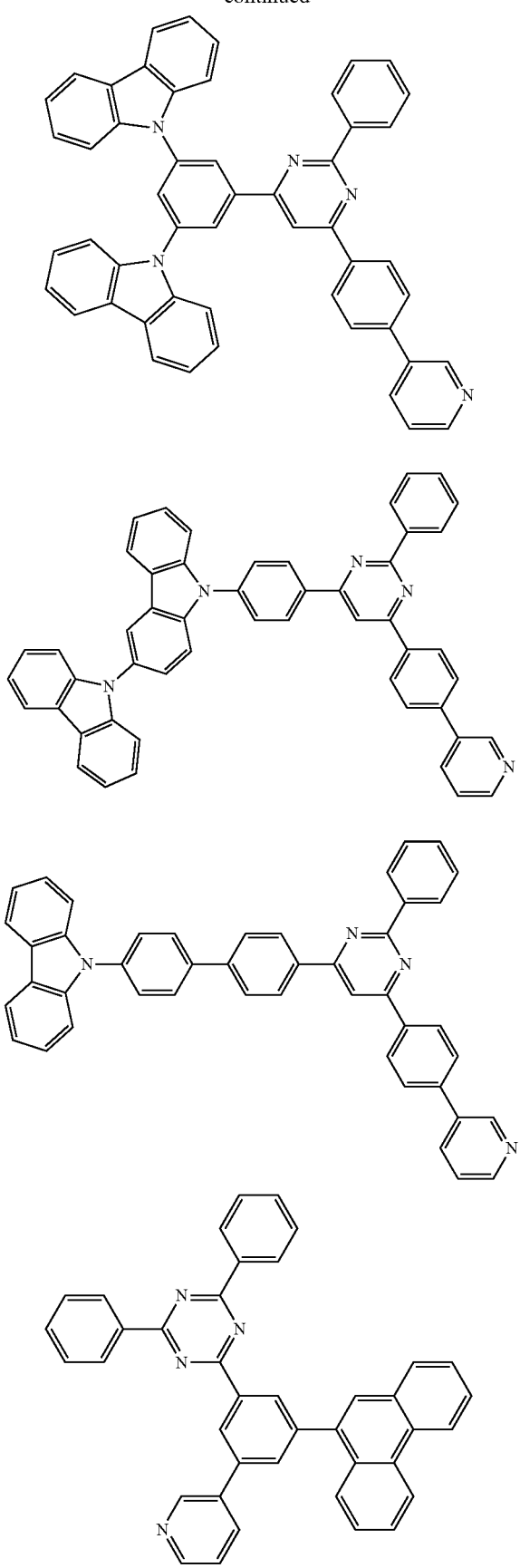
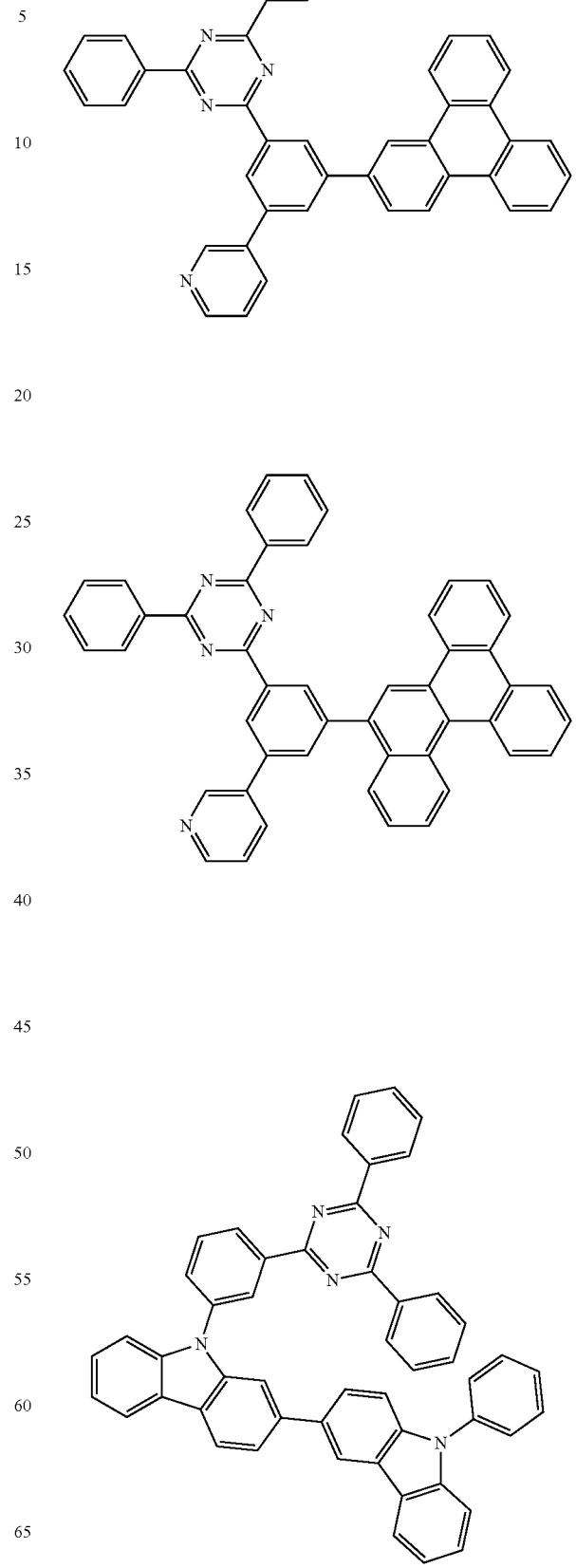

167
-continued
168
-continued
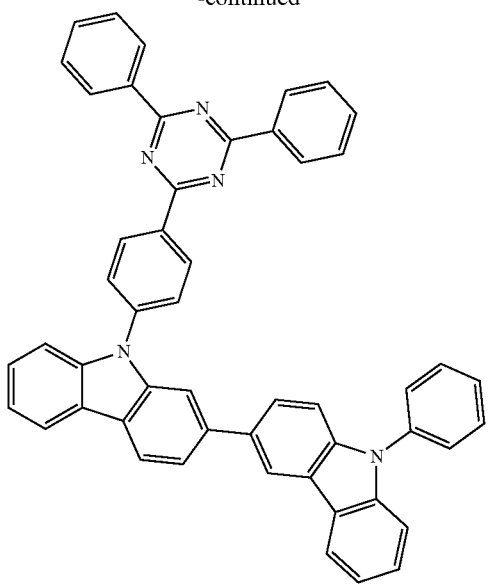
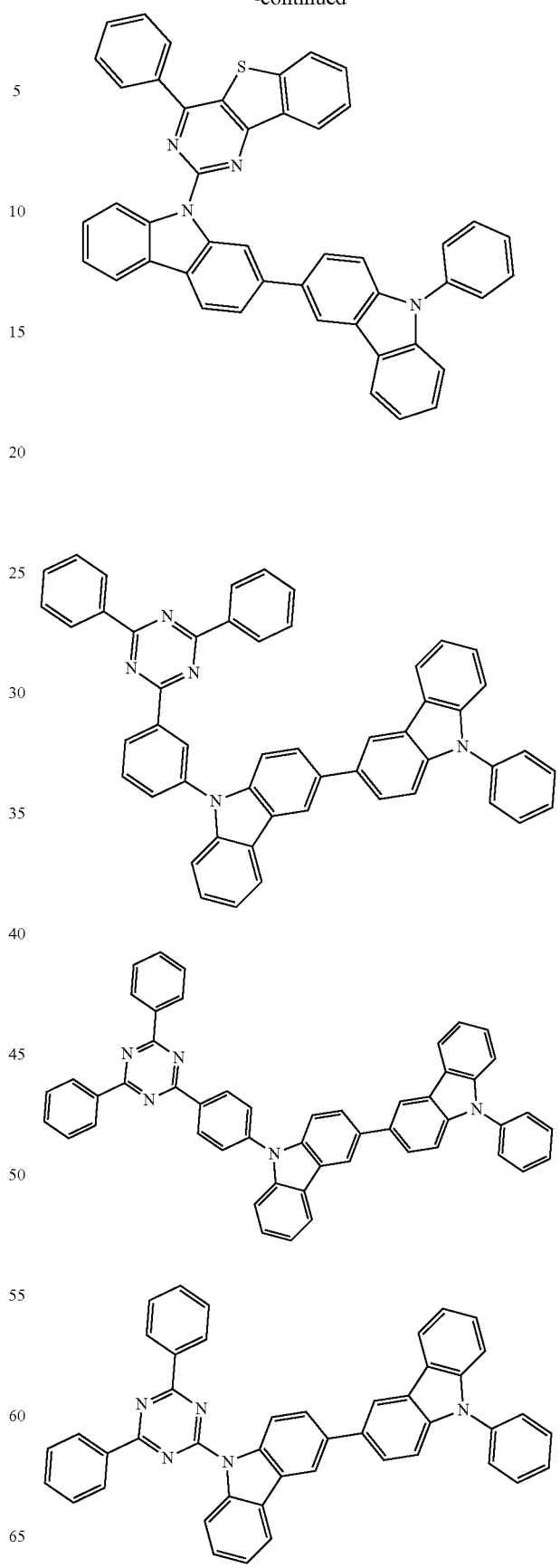

169
-continued
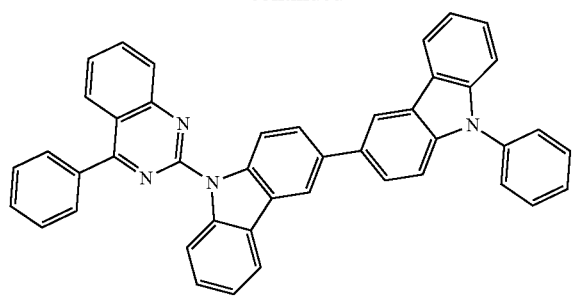
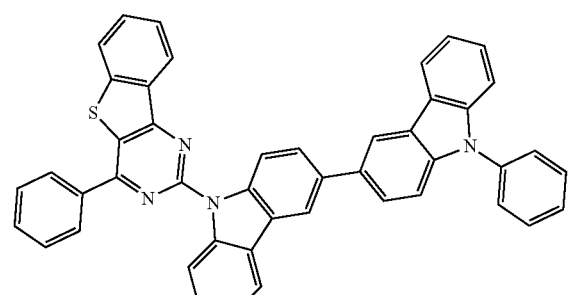
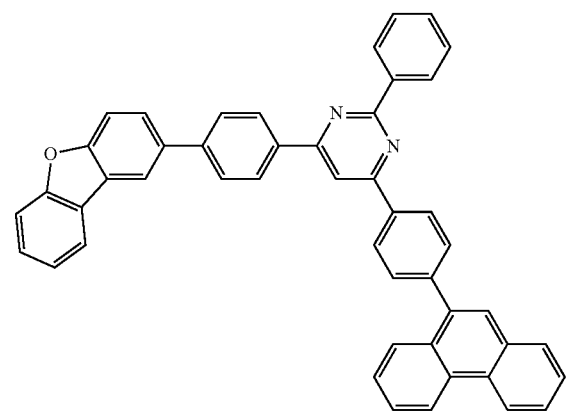
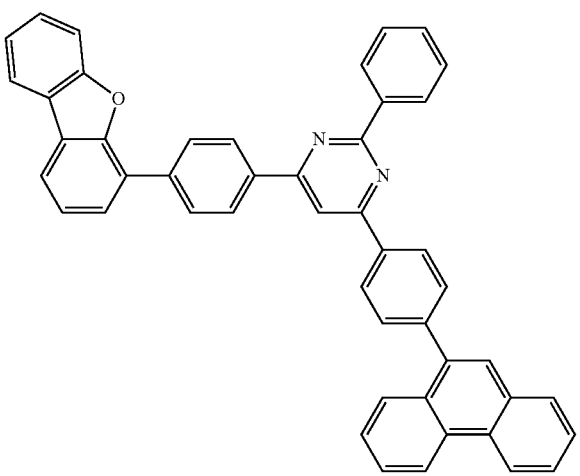
170
-continued
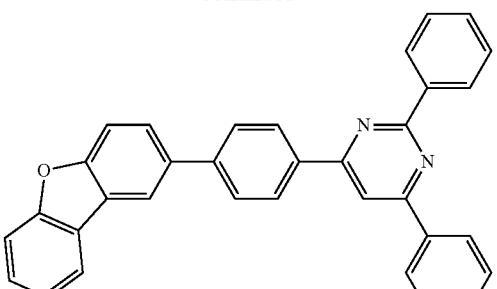
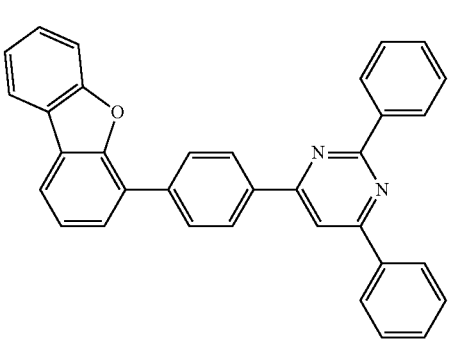
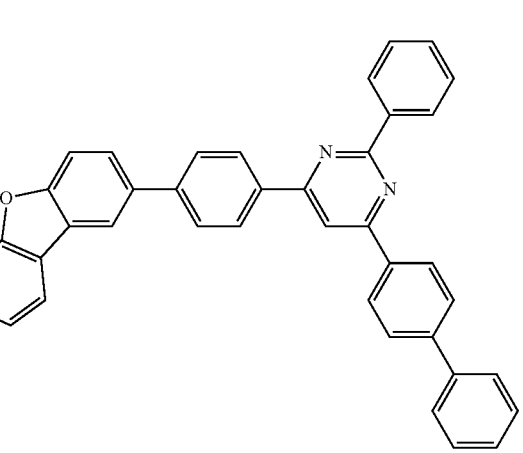
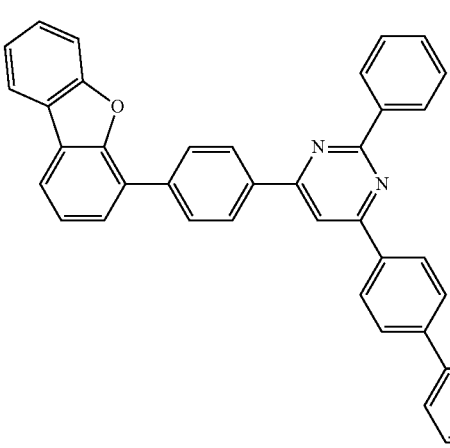

171
-continued
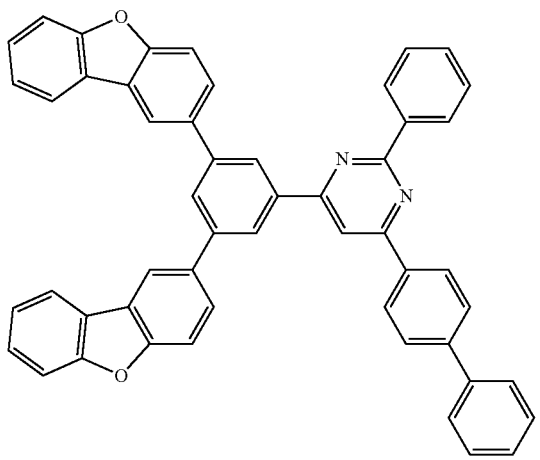
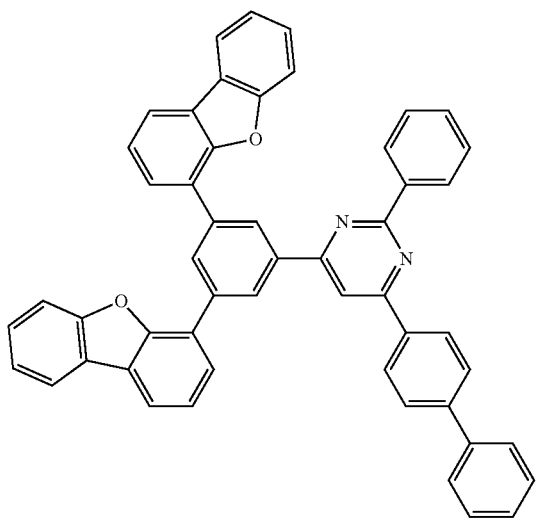
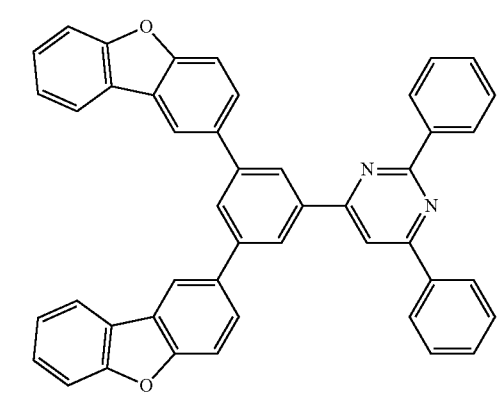
172
-continued
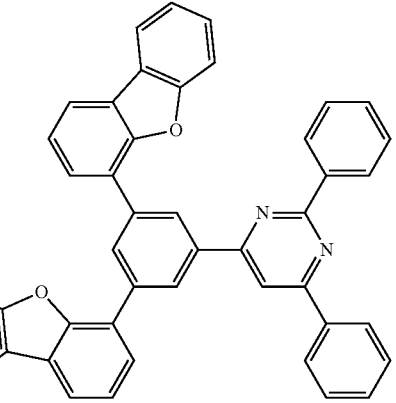
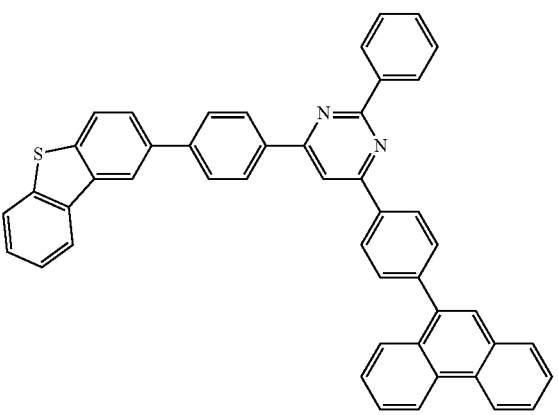
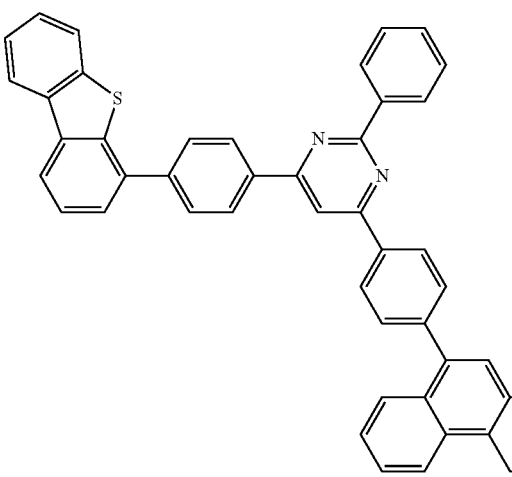
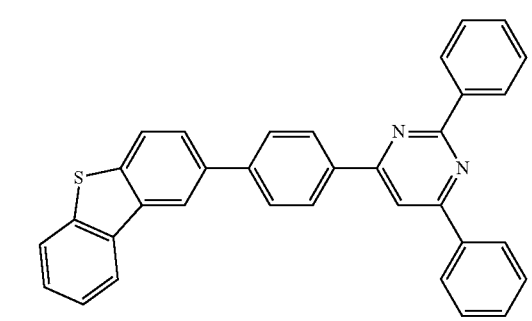

173
-continued
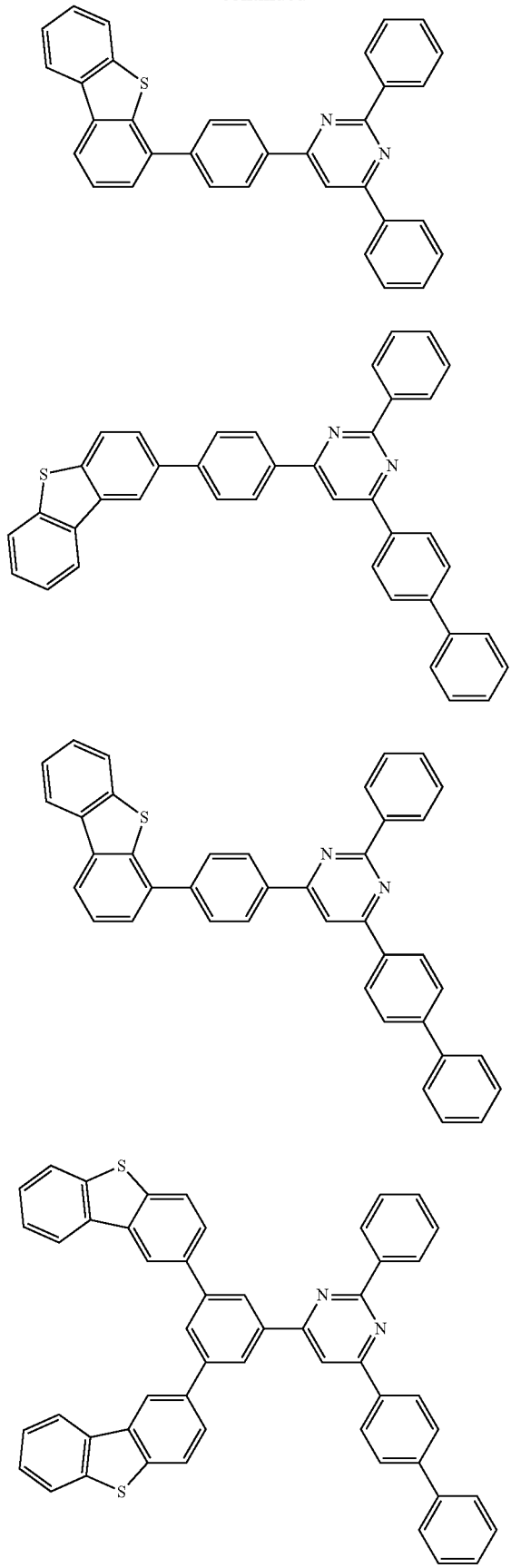
174
-continued
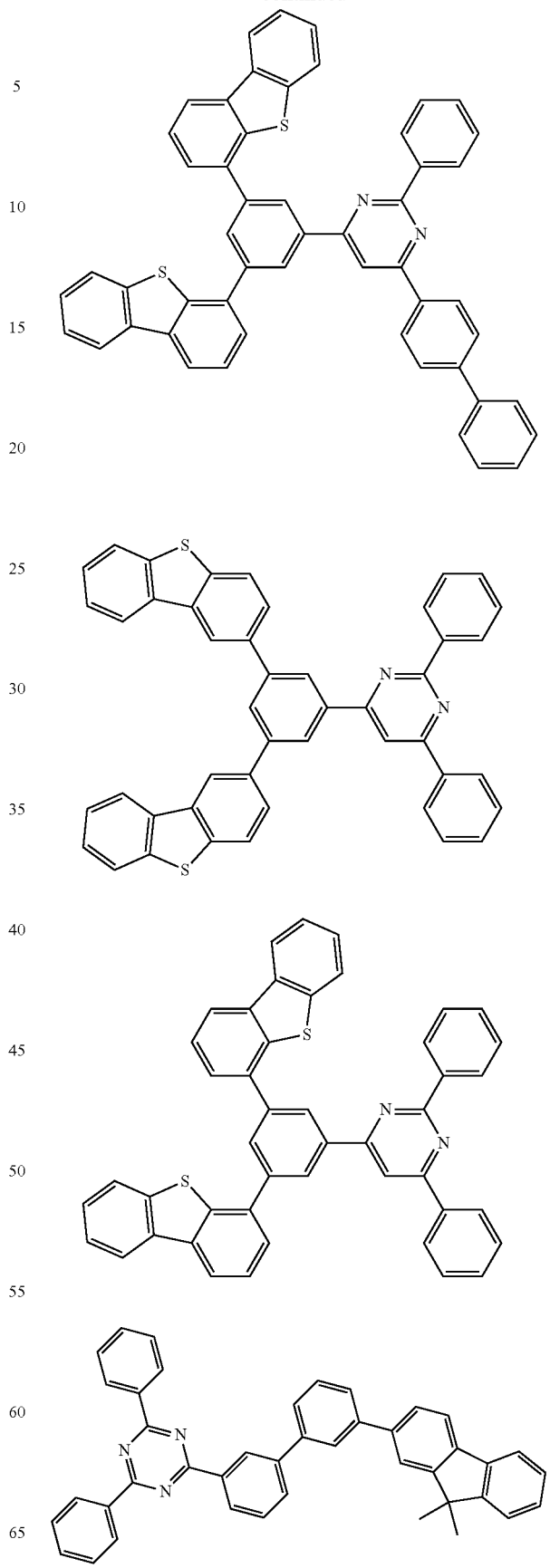

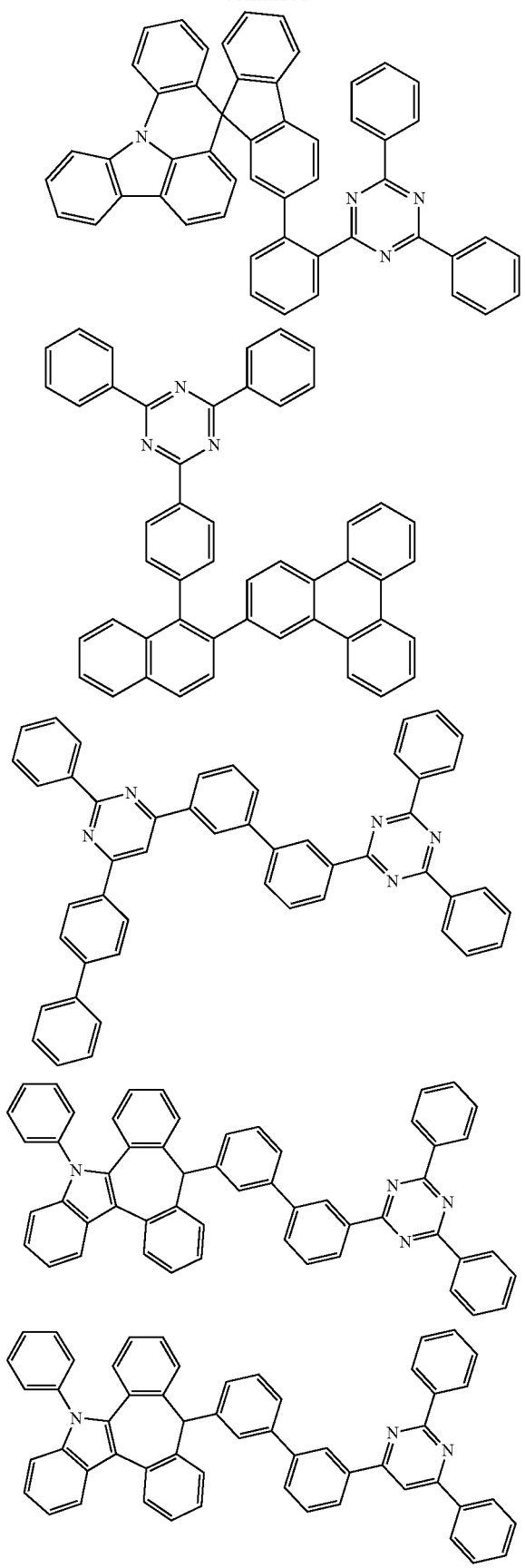
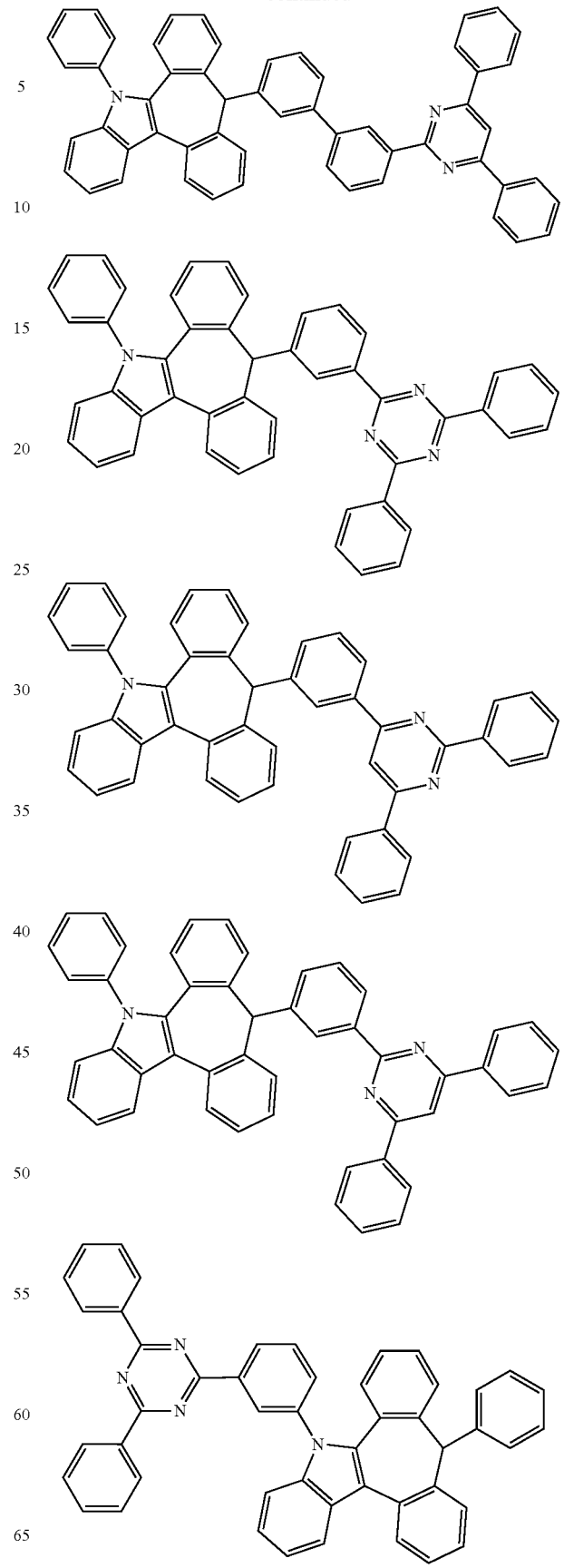

177
-continued
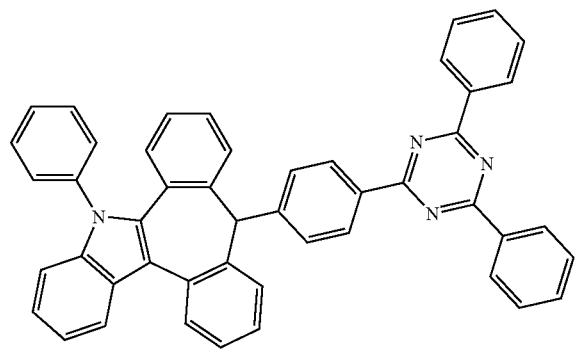
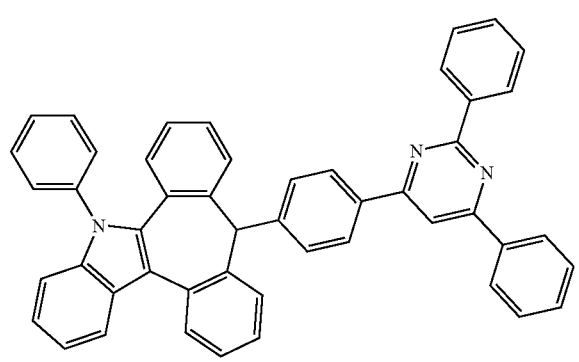
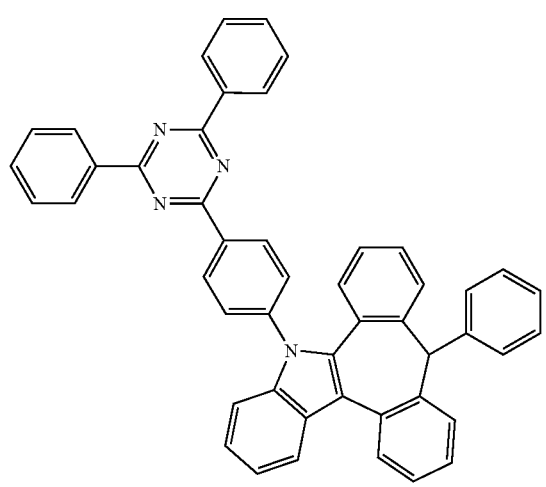
178
-continued
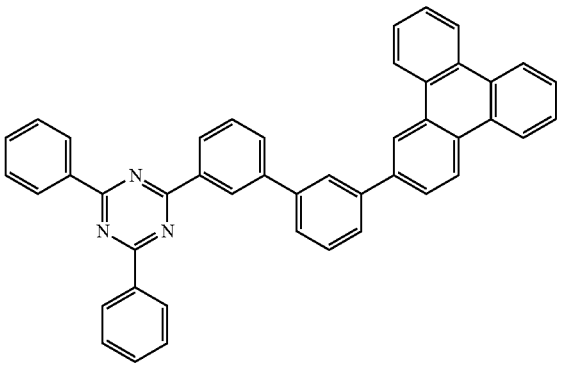
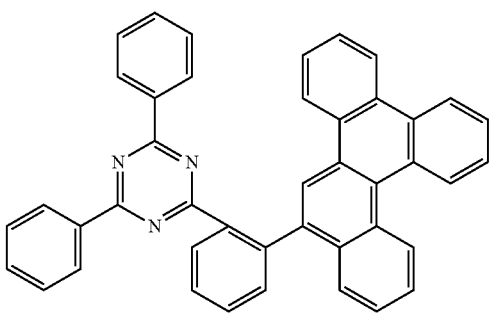
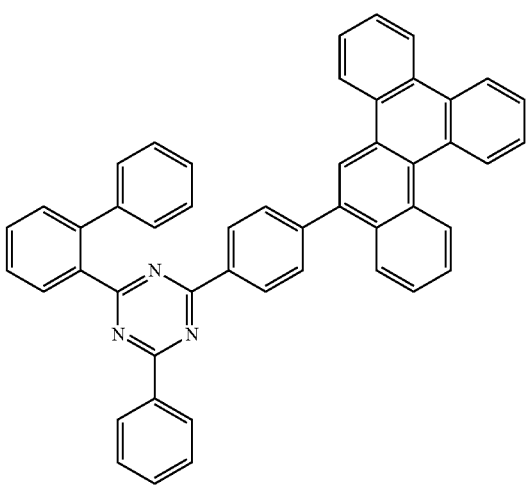

-continued

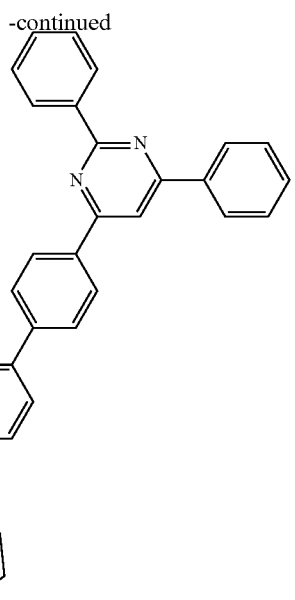

The organic EL device of the first aspect includes at least an anode/a emitting layer/a first electron-transporting layer/a second electron-transporting layer/a cathode, the emitting layer comprises the compound (10), and the second electron-transporting layer comprises the compound (1).

As far as the emitting layer comprising the compound (10), the first electron-transporting layer, and the second electron-transporting layer comprising the compound (1) are provided, a layer other than these may be provided between the emitting layer and the cathode, or the organic EL device may have one or more layers between the emitting layer and the anode.

FIG. 1 shows a schematic configuration of an embodiment of the organic EL device of the first aspect.

An organic EL device 1 has a substrate 2, an anode 3, an emitting layer 5, and a first electron-transporting layer 7 and a second electron-transporting layer 8 as an organic layer 6 between the emitting layer 5 and the cathode 10.

The organic layer 6 between the cathode 10 and the emitting layer 5 functions as an electron injecting/transporting layer.

The organic EL device 1 may include the organic layer 4 between the anode 3 and the emitting layer 5. The organic layer 4 functions as a hole injecting/transporting layer.

Here, "electron injection/transport layer" means "at least one of an electron injection layer and an electron transport layer", and "hole injection/transport layer" means "at least one of a hole injection layer and a hole transport layer".

Further, an electron blocking layer may be provided on the anode 3 side of the emitting layer 5, and a hole blocking layer may be provided on the cathode 4 side of the emitting layer 5, respectively.

This makes it possible to confine electrons and holes in the emitting layer 5 and increase the probability of exciton generation in the emitting layer 5.

In FIG. 1, two of the first electron-transport layer 7 and the second electron-transport layer 8 are drawn between the cathode 10 and the emitting layer 5, but the organic EL device 1 may have three or more organic layers. When having three or more organic layers, the compound represented by the formula (1) is contained in the organic layer closest to the cathode 10.

A layer other than the organic layer may be provided between the second electron-transport layer 8 and the cathode 10. Examples of layers other than the organic layer include inorganic layers such as LiF and Yb.

In one embodiment, the organic electroluminescent device includes at least one organic layer between the anode and the emitting layer.

In one embodiment, at least one layer of the organic layer 4 (hole injecting/transporting layer) between the anode 3 and the emitting layer 5 contains a compound represented by the following formula (20).

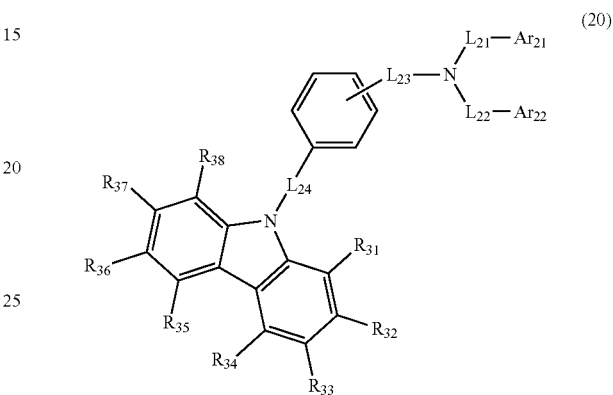

In the formula (20),
one or more pairs of adjacent two or more among $R_{31}$ to $R_{38}$ may form a substituted or unsubstituted, saturated or unsaturated ring; $R_{31}$ to $R_{38}$ which do not form the ring is independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{201}$)($R_{202}$)($R_{203}$),
—C(=O)$R_{204}$,
—COO$R_{205}$,
a halogen atom, a cyano group, a nitro group,
a substituted or unsubstituted aryl group including 6 to 50 carbon atoms, or
a substituted or unsubstituted heterocyclic group including 5 to 50 ring atoms;
$R_{201}$ to $R_{205}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted heterocyclic group including 5 to 50 ring atoms;

when two or more of each of $R_{201}$ to $R_{205}$ are present, the two or more of each of $R_{201}$ to $R_{205}$ may be the same or different;

$L_{21}$ to $L_{24}$ are independently a single bond, a substituted or unsubstituted alkylene group including 1 to 50 carbon atoms, a substituted or unsubstituted arylene group including 6 to 50 ring carbon atoms, or a substituted or unsubstituted divalent heterocyclic group including 5 to 50 ring atoms;

$Ar_{21}$ and $Ar_{22}$ are independently a substituted or unsubstituted aryl group including 6 to 50 ring carbon atoms, or a substituted or unsubstituted heterocyclic group including 5 to 50 ring atoms.

In the compound (20), the positional relationship on benzene ring with which $L_{23}$ and $L_{24}$ are bonded may be ortho (o), meta (m) or para (p). The positional relationship is preferably ortho or meta, and particularly preferably meta.

Hereinafter, "one or more pairs of adjacent two or more among $R_{31}$ to $R_{38}$ may form a substituted or unsubstituted, saturated or unsaturated ring" in the compound represented by formula (20) will be described.

The "one or more pairs of adjacent two or more among $R_{31}$ to $R_{38}$" is, for example, a pair of $R_{31}$ and $R_{32}$, $R_{32}$ and $R_{33}$, $R_{33}$ and $R_{34}$, $R_{34}$ and $R_{35}$, $R_{35}$ and $R_{36}$, $R_{36}$ and $R_{37}$, $R_{37}$ and $R_{38}$, $R_{31}$, $R_{32}$ and $R_{33}$, $R_{32}$, $R_{33}$ and $R_{34}$, and the like.

The substituent in "substituted or unsubstituted" for the saturated or unsaturated ring is as described later for the formula (20).

The "saturated or unsaturated ring" means, for example, when the ring is formed of $R_{31}$ and $R_{32}$, a ring formed by a carbon atom with which $R_{31}$ is bonded, a carbon atom with which $R_{32}$ is bonded, and one or more arbitrary elements. Specifically, when the ring is formed of $R_{31}$ and $R_{32}$, and an unsaturated ring is formed of a carbon atom with which $R_{31}$ is bonded, a carbon atom with which $R_{32}$ is bonded, and four carbon atoms, the ring formed of $R_{31}$ and $R_{32}$ is a benzene ring.

The "arbitrary element" is preferably a C element, a N element, an O element, and a S element. In the arbitrary element (e.g., for element C or element N), chemical bonding sites which are not involved in the ring formation may be terminated by a hydrogen atom and the like.

The "one or more arbitrary element" is preferably two or more and 15 or less, more preferably 3 or more and 12 or less, and further preferably 3 or more and 5 or less arbitrary elements.

When a pair of $R_{32}$, $R_{33}$ and $R_{34}$ forms a ring, the compound represented by the formula (20) is, for example, a compound represented by the following formula (20-10). In the formula (20-10), for example, when $R_{61}$ is a phenyl group, a pair of $R_{32}$, $R_{33}$ and $R_{34}$ forms a substituted ring.

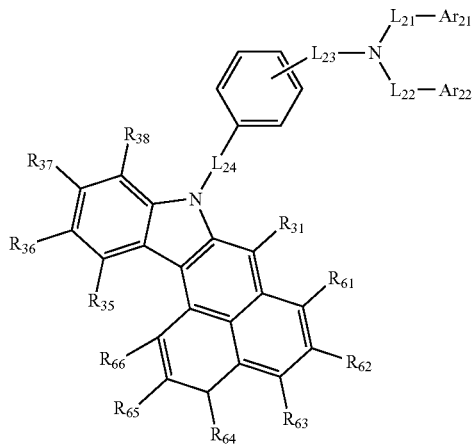

(20-10)

In the formula (20-10), $R_{31}$, $R_{35}$ to $R_{38}$, $L_{21}$ to $L_{24}$, $Ar_{21}$ and $Ar_{22}$ are as defined in the formula (20), and $R_{61}$ to $R_{66}$ is the same as the substituent in the case of "substituted or unsubstituted" in the compound (20) described later (the arbitrary substituent in the compound (20)).

The "one or more pairs" means that, for example, $R_{31}$ and $R_{32}$ form a ring, and $R_{37}$ and $R_{38}$ may form a ring at the same time. In this case, the compound represented by the formula (20) is a compound represented by the following formula (20-11), for example. In the formula (20-11), for example, when $R_{71}$ is a phenyl group, $R_{31}$ and $R_{32}$ form a substituted ring.

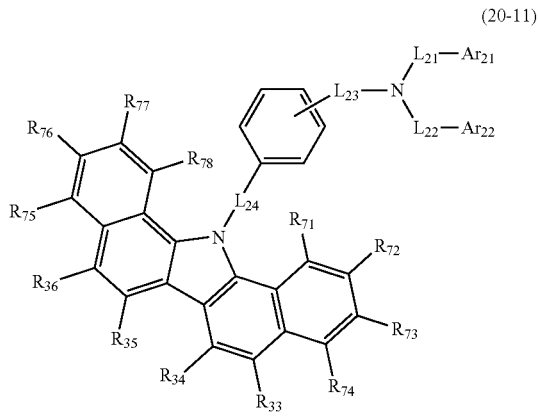

(20-11)

In the formula (20-11), $R_{33}$ to $R_{36}$, $L_{21}$ to $L_{24}$, $Ar_{21}$ and $Ar_{22}$ are as defined in the formula (20), and $R_{71}$ to $R_{78}$ is the same as the substituent in the case of "substituted or unsubstituted" in the compound (2) described later (the arbitrary substituent in the compound (2)).

In one embodiment, it is preferable that the compound (20) contain any one or both of a compound represented by the following formula (20a) and a compound represented by the following formula (20b) (hereinafter, referred to as a compound (20a) and a compound (20b)).

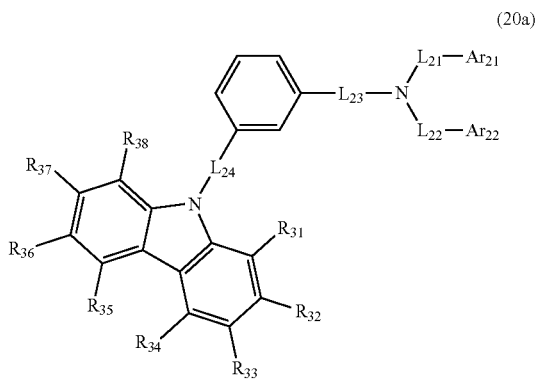
(20a)

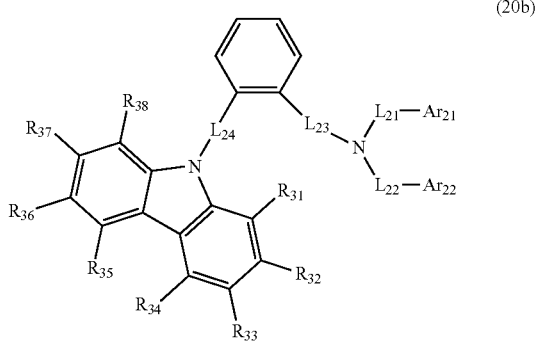
(20b)

In the formulas (20a) and (20b), $R_{31}$ to $R_{38}$, $L_{21}$ to $L_{24}$, $Ar_{21}$ and $Ar_{22}$ are as defined in the formula (20).

In one embodiment, it is preferable that the compound (20) be a compound (20a), i.e., $L_{23}$ and $L_{24}$ are substituted with each other at the meta-position of a benzene ring.

In one embodiment, $L_{24}$ in the compound (20) is preferably a single bond.

In one embodiment, $L_{23}$ in the compound (20) is preferably a single bond.

In one embodiment, it is preferable that one of $Ar_{21}$ and $Ar_{22}$ in the compound (20) be a substituted or unsubstituted aryl group including 6 to 50 ring carbon atoms, and the other be a substituted or unsubstituted aryl group including 6 to 50 ring carbon atoms or a substituted or unsubstituted heterocyclic group including 5 to 50 ring atom.

In one embodiment, $R_{31}$ to $R_{38}$ in the compound (20) are preferably hydrogen atoms.

In one embodiment, the compound (20) is a compound represented by the following formula (20a-1) and/or a compound represented by the following formula (20b-1).

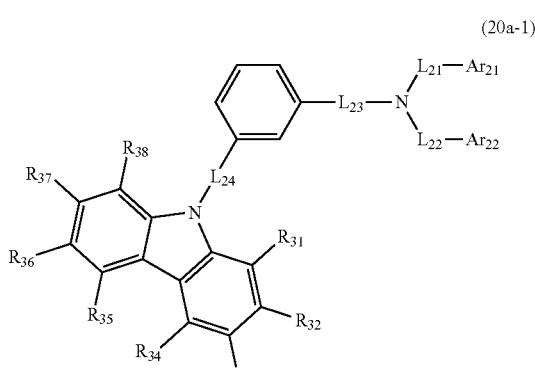
(20a-1)

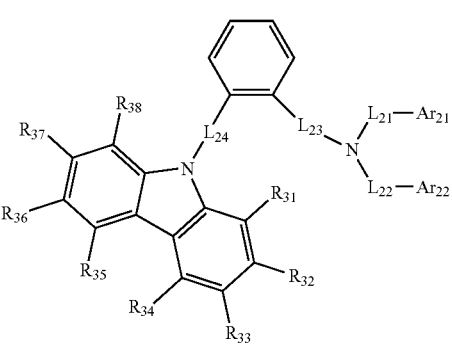
(20b-1)

In the formulas (20a-1) and (20b-1), $L_{24}$ is a single bond and $R_{31}$ to $R_{38}$, $L_{21}$ to $L_{23}$, $Ar_{21}$ and $Ar_{22}$ are as defined in the formula (20).

In one embodiment, the compound (20) is a compound represented by the following formula (20a-2) and/or a compound represented by the following formula (20b-2).

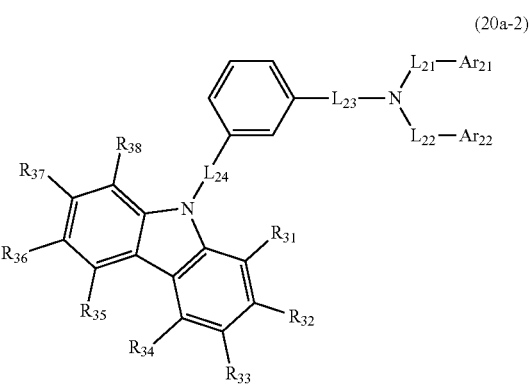
(20a-2)

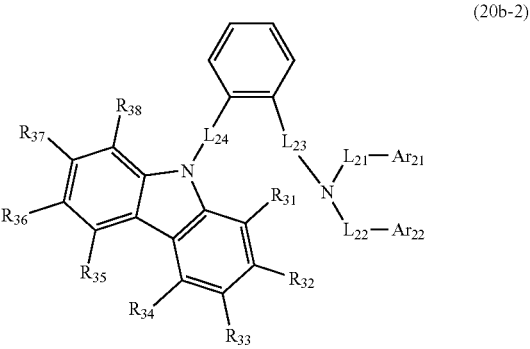
(20b-2)

In the formulas (20a-2) and (20b-2), $L_{23}$ is a single bond and $R_{31}$ to $R_{38}$, $L_{21}$, $L_{22}$, $L_{24}$, $Ar_{21}$ and $Ar_{22}$ are as defined in the formula (20).

In one embodiment, the compound (20) is a compound represented by the following formula (20a-3) and/or a compound represented by the following formula (20b-3).

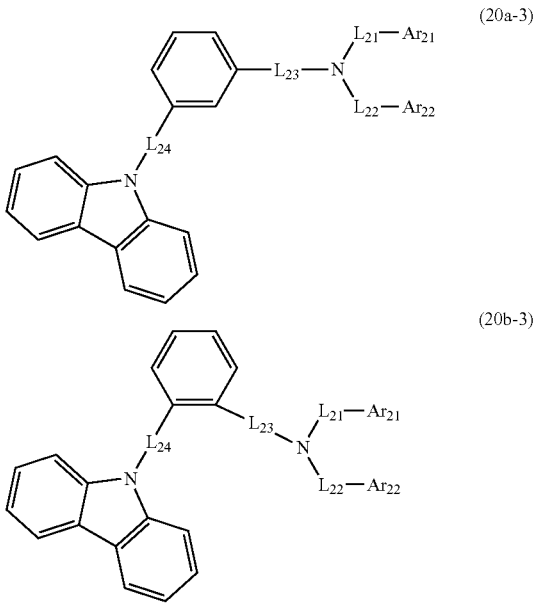

(20a-3)

(20b-3)

In the formulas (20a-3) and (20b-3), $L_{21}$ to $L_{24}$, $Ar_{21}$ and $Ar_{22}$ are as defined in the formula (20).

In one embodiment, the compound (20) is a compound represented by the following formula (20a-4).

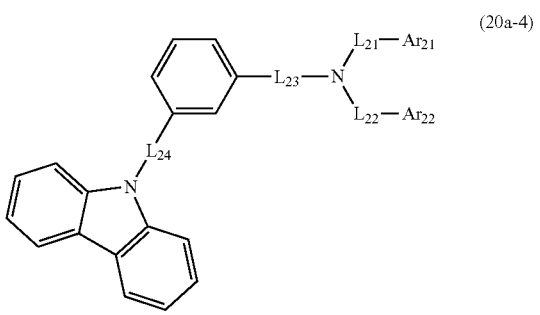

(20a-4)

In the formula (20a-4), $L_{23}$ is a single bond and $L_{21}$, $L_{22}$, $L_{24}$, $Ar_{21}$ and $Ar_{22}$ are as defined in the formula (20).

Examples of the substituent in the case of "substituted or unsubstituted" in the compounds (20), (20a), (20b), (20a-1), (20b-1), (20a-2), (20b-2), (20a-3), (20b-3), and (20a-4) (hereinafter, also referred to as the arbitrary substituent of the compound (20)) include an alkyl group including 1 to 50 carbon atoms, an alkenyl group including 2 to 50 carbon atoms, an alkynyl group including 2 to 50 carbon atoms, a cycloalkyl group including 3 to 50 ring carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, —Si($R_{41}$)($R_{42}$)($R_{43}$), —C(=O)$R_{44}$, —COOR$_{45}$, —S(=O)$_2R_{46}$, —P(=O)($R_{47}$)($R_{48}$), —Ge($R_{49}$)($R_{50}$)($R_{51}$), a hydroxyl group, a halogen atom, a cyano group, a nitro group, an aryl group including 6 to 50 ring carbon atoms, and a heterocyclic group including 5 to 50 ring atoms. $R_{41}$ to $R_{51}$ are independently a hydrogen atom, an alkyl group including 1 to 50 carbon atoms, an aryl group including 6 to 50 ring carbon atoms, or a heterocyclic group including 5 to 50 ring atoms. When two or more $R_{41}$ to $R_{51}$ are present, the two or more $R_{41}$ to $R_{51}$ may be the same or different. Among these, an alkyl group including 1 to 50 carbon atoms, an aryl group including 6 to 50 ring carbon atoms, or a heterocyclic group including 5 to 50 ring atoms is preferable, and an alkyl group including 1 to 18 carbon atoms, an aryl group including 6 to 18 ring carbon atoms, or a heterocyclic group including 5 to 18 ring atoms is more preferable.

Specific examples of each substituent, arbitrary substituent, and halogen atom in the compound (20) are the same as those described above, respectively, but each substituent and arbitrary substituent in the compound (20) do not contain a substituted or unsubstituted amino group. Thus, in the compound (20), there is only one amino group.

Specific examples of the compound (20) include, for example, the following compounds.

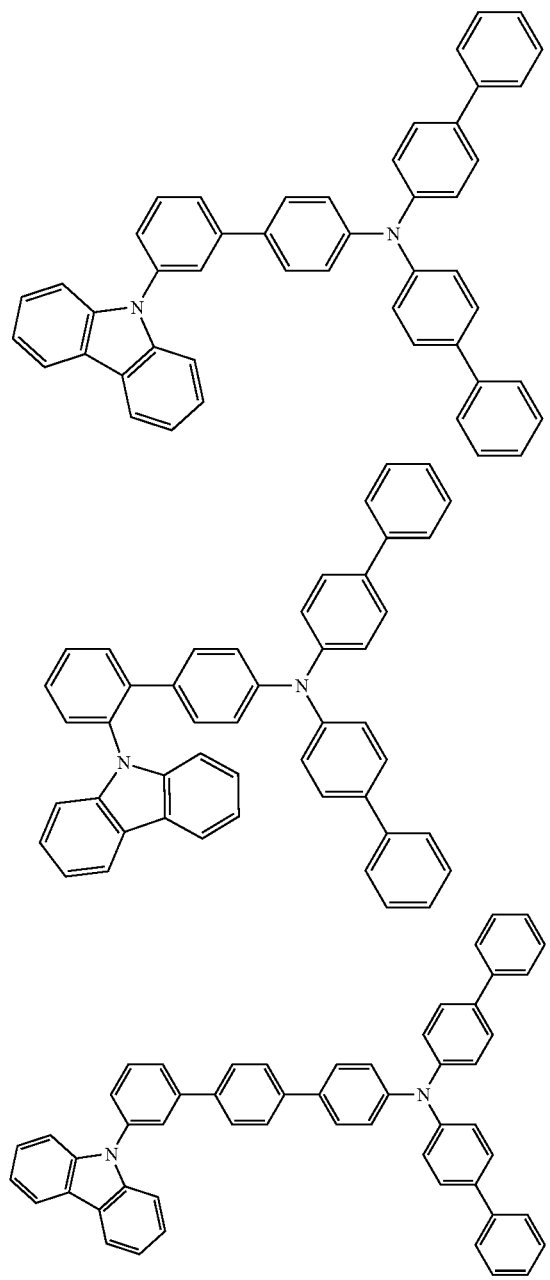

187
-continued
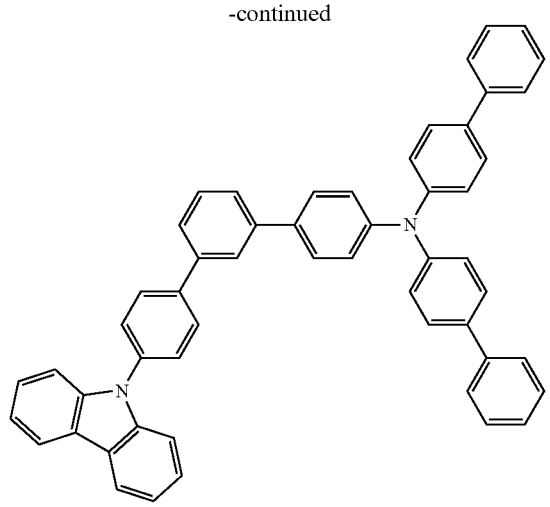
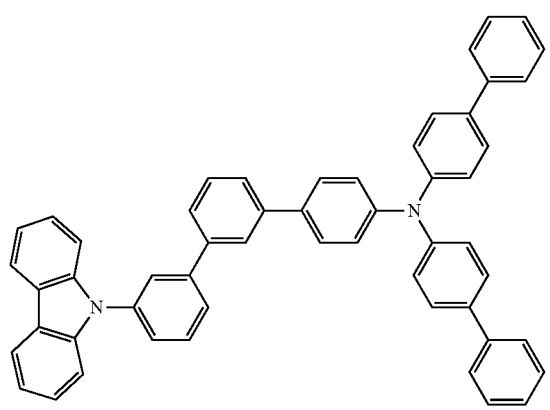
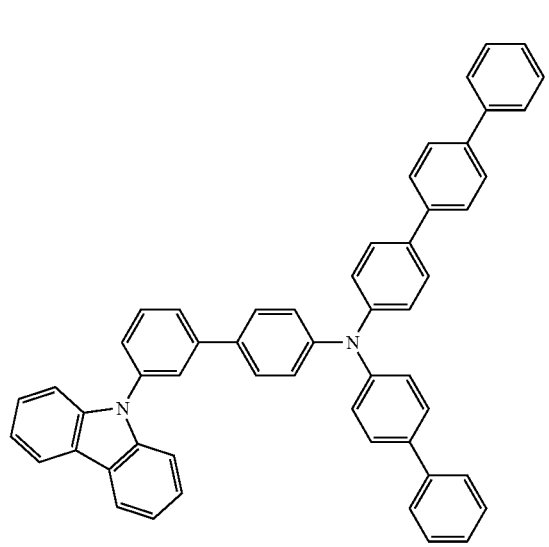
188
-continued
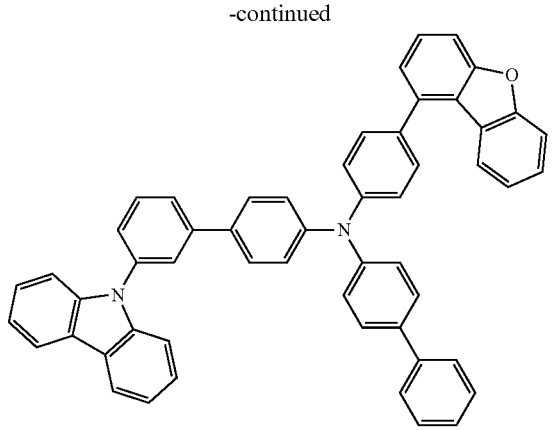
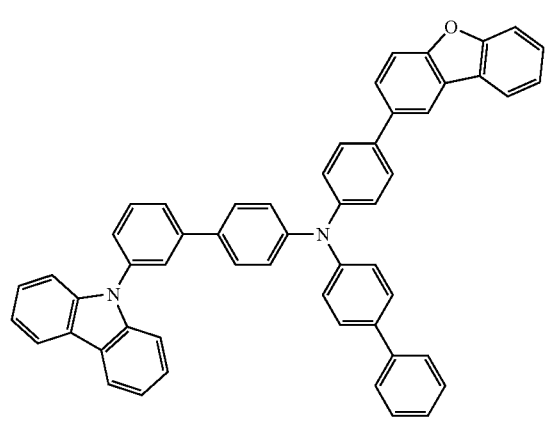
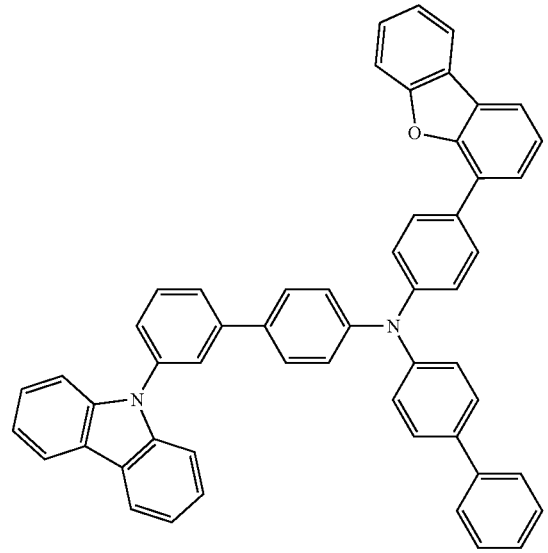

-continued

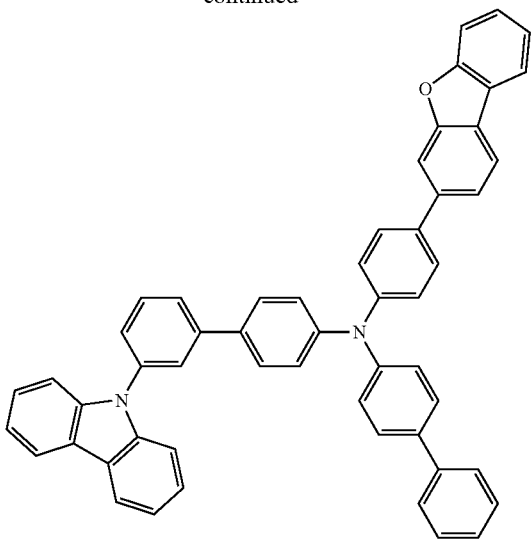

In addition to the above layers, an organic semiconductor layer, an adhesion-improving layer, an insulating layer, and the like may be provided between an emitting layer and an anode, or between an emitting layer and a cathode.

In one embodiment, it is preferable that the compound (10) be a host material of an emitting layer.

Further, the emitting layer containing the compound (10) may be a phosphorescent emitting layer or a fluorescent emitting layer, and may be a plurality of layers. The emitting layer containing the compound (10) is preferably a fluorescent emitting layer. When the plurality of emitting layers is present, a space layer may be provided between the respective emitting layers for the purpose of preventing excitons generated in the phosphorescent emitting layer from diffusing into the fluorescent emitting layer.

In one embodiment, the emitting layer further contains one or both of a fluorescent dopant and a phosphorescent dopant.

The emitting layer containing the compound (10) may further contain one or both of a fluorescent dopant and a phosphorescent dopant. The emitting layer containing the compound (10) preferably contains a fluorescent dopant.

Examples of the fluorescent dopant and the phosphorescent dopant include a fluorescence emitting material and a phosphorescence emitting material of a guest material of an emitting layer described later.

The organic EL device of the first embodiment includes, as described above, an anode, an emitting layer, a first electron-transporting layer, a second electron-transporting layer, and a cathode in this order, and the conventionally known materials and device structures can be applied as long as the effect of the present invention is not impaired except that the second electron-transporting layer contains the compound (1) and the emitting layer contains the compound (10).

Hereinafter, members and compounds constituting each layer which can be used in one embodiment of the organic EL device according to the first embodiment, other than the compound (1) and the compound (10) and the compounds (20) optionally used in the layer between the anode and the emitting layer will be described.

(Substrate)

A substrate is used as a support of an emitting device. As the substrate, glass, quartz, plastic, or the like can be used, for example. Further, a flexible substrate may be used. A term "flexible substrate" means a bendable (flexible) substrate, and specific examples thereof include a plastic substrate formed of polycarbonate or polyvinyl chloride.

(Anode)

For the anode formed on the substrate, metal, alloy, an electrically conductive compound, a mixture thereof or the like, each having a large work function (specifically 4.0 eV or more), is preferably used. Specific examples thereof include indium oxide-tin oxide (ITO: Indium Tin Oxide), indium oxide-tin oxide containing silicon or silicon oxide, indium oxide-zinc oxide, tungsten oxide and indium oxide containing zinc oxide, graphene, and the like. In addition thereto, specific examples thereof include gold (Au), platinum (Pt), or a nitride of a metallic material (for example, titanium nitride) and the like.

(Hole-Injecting Layer)

The hole-injecting layer is a layer containing a material having high hole-injection properties. As the material having high hole-injection properties, such a material can be used as molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomer, dendrimer, polymer, etc.).

(Hole-Transporting Layer)

The hole-transporting layer is a layer containing a material having high hole-transporting properties. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a material other than the above-described materials may be used as long as the material has higher transporting properties of holes in comparison with electrons. It should be noted that the layer containing the material having high hole-transporting properties may be formed into not only a monolayer, but also a layer in which two or more layers formed of the above-described materials are stacked.

(Guest Material of an Emitting Layer)

An emitting layer is a layer containing a material having high emitting property, and various material can be used. For example, as a material having high emitting property, a fluorescent compound which emits fluorescence or a phosphorescent compound which emits phosphorescence can be used. A fluorescent compound is a compound which can emit from a singlet excited state, and a phosphorescent compound is a compound which can emit from a triplet excited state.

As the blue fluorescent emitting material which can be used for an emitting layer, a pyrene derivative, a styrylamine derivative, a chrysene derivative, a fluoranthene derivative, a fluorene derivative, a diamine derivative, a triarylamine derivative, and the like can be used. As a green fluorescent emitting material which can be used for an emitting layer, an aromatic amine derivative, and the like can be used. As a red fluorescent emitting material which can be used for an emitting layer, a tetracene derivative, a diamine derivative, and the like can be used.

As a blue phosphorescent emitting material which can be used for an emitting layer, a metal complex such as an iridium complex, an osmium complex, a platinum complex, and the like is used. As a green phosphorescent emitting material which can be used for an emitting layer, an iridium complex, and the like is used. As a red phosphorescent emitting material which can be used for an emitting layer, a metal complex such as an iridium complex, a platinum complex, a terbium complex, a europium complex, and the like can be used.

(Host Material of an Emitting Layer)

As an emitting layer, a configuration may be employed in which the above-described material having high emitting property (guest material) is dispersed in another material (host material). As a material for dispersing a material having a high emitting property, various materials can be used, and it is preferable to use a material having a higher lowest unoccupied orbital level (LUMO level) and a lower highest occupied orbital level (HOMO level) than a material having a high emitting property.

As a material for dispersing a material having high emitting property (host material), 1) metal complex such as an aluminum complex, a beryllium derivative, and a zinc complex, 2) heterocyclic compound such as an oxadiazole derivative, a benzimidazole derivative, a phenanthroline derivative and the like, 3) fused aromatic compound such as a carbazole derivative, an anthracene derivative, a phenanthrene derivative, a pyrene derivative, a chrysene derivative and the like, and 3) aromatic amine compound such as an triarylamine derivative, a fused polycyclic aromatic amine derivative and the like can be used.

(Electron-Transporting Layer)

An electron-transporting layer is a layer that comprises a substance having high electron-transporting property. As an electron-transporting layer, 1) metal complex such as an aluminum complex, a beryllium complex, and a zinc complex, 2) heteroaromatic compound such as an imidazole derivative a benzimidazole derivative, an azine derivative, a carbazole derivative, a phenanthroline derivative and the like, and 3) polymer can be used.

(Electron-Injecting Layer)

An electron-injecting layer is a layer containing a material high electron-injecting property. As an electron-injecting layer, a metal complex compound such as lithium (Li), ytterbium (Yb), lithium fluoride (LiF), cesium fluoride (CsF), calcium fluoride (CaF$_2$), 8-hydroxyquinolinolato-lithium (Liq), and an alkali metal such as lithium oxide (LiO$_x$), an alkaline earth metal, or a compound thereof.

(Cathode)

For the cathode, a metal, an alloy, an electrically conductive compound, a mixture thereof, or the like, having a small work function (specifically, 3.8 eV or less) is preferably used. Specific examples of such a cathode material include elements belonging to Group 1 or Group 2 of the Periodic Table of the Elements, i.e., an alkali metal such as lithium (Li) and cesium (Cs), an alkaline earth metal such as magnesium (Mg), calcium (Ca) and strontium (Sr), and alloys containing these metals (e.g., MgAg and AlLi); a rare earth metal such as europium (Eu) and ytterbium (Yb), and alloys containing these metals.

In the organic EL device of the first aspect, a method for forming each layer is not limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process and a roll coating process, using a solution prepared by dissolving the material in the solvent.

In the organic EL device of the first aspect, a film thickness of each layer is not particularly limited, but is ordinarily preferably in the range of several nm to 1 μm generally in order to suppress a defect such as a pinhole, keep low applied voltage, or improve the luminous efficiency.

The electronic apparatus according to the second aspect of the present invention is characterized by containing the organic electroluminescence device according to the first aspect.

Specific examples of the electronic apparatus include a display component such as an organic EL panel module, a display device such as a television, a mobile telephone, or a personal computer, and an emitting device such as a light, a vehicular lamp, and the like.

EXAMPLES

Next, the invention will be explained in more detail in accordance with the following Examples and Comparative Examples, which should not be construed as limiting the scope of the invention.

Example 1

(Fabrication of Organic EL Device)

A 25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of ITO was adjusted to 130 nm.

The glass substrate after being cleaned was mounted onto a substrate holder in a vacuum vapor deposition apparatus. Compounds HT and HI were co-deposited on a surface on the side on which the transparent electrode was formed so as to cover the transparent electrode to be 3% in a proportion (mass ratio) of the Compound HI to form a Compound HI film having a thickness of 10 nm. This HI film functions as a hole-injecting layer.

Following the formation of the HI film, Compound HT was deposited to form an 80 nm-thickness HT film on the HI film. The HT film functions as a first hole-transporting layer.

After formation of the HT film, Compound EB was deposited to form an EB film having a thickness of 5 nm on the HT film. The EB film functions as a second hole-transporting layer.

BH-1 (host material) and Compound BD (dopant material) were co-deposited on the EB film to be 4% in a proportion (mass ratio) of the Compound BD to form a 20 nm-thickness BH-1:BD film. The BH-1:BD film functions as an emitting layer.

HB-1 was deposited on the emitting layer to form a 5 nm-thickness HB-1 film. The HB-1 film functions as a first electron-transporting layer. Following the formation of the HB-1 film, Compound E-1 and Liq were co-deposited to be 50% in a proportion (mass ratio) of the Compound Liq to form a 20 nm-thickness E-1:Liq film. The E-1:Liq film functions as a second electron-transporting layer. Liq was deposited on the E-1:Liq film to form a Liq film having a thickness of 1 nm. Metal Al was deposited on the Liq film to form a metal cathode having a thickness of 80 nm. As described above, an organic EL device was fabricated.

(Evaluation of Organic EL Device)

Voltage was applied to the organic EL device to be 10 mA/cm$^2$ in current density, thereby measuring an EL emission spectrum of the obtained organic EL device by using Spectroradiometer CS-2000 (manufactured by Konica Minolta, Inc.). External quantum efficiency (EQE) (%) was calculated from the obtained spectral radiance spectrum. The results are shown in Table 1.

Further, a voltage was applied to the organic EL device so that the current density was 50 mA/cm$^2$, and the time until the brightness was 95% of the initial brightness (LT95@50 mA/cm$^2$) was measured. The results are shown in Table 1.

Examples 2 to 39 and Comparative Examples 1 to 7

The organic EL devices were fabricated and evaluated in the same manner as in Example 1 except that the compounds shown in the following Tables 1 to 4 were used as host materials of emitting layers, electron-transporting layers and electron injecting layer materials. The results are shown in Tables 1 to 4.

The compounds used in Examples and Comparative examples are shown below.

EB

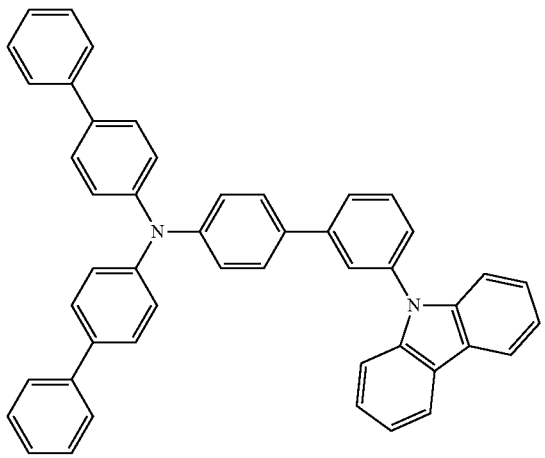

HI

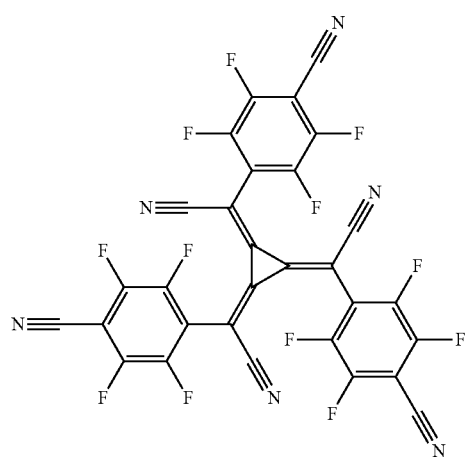

BH-1

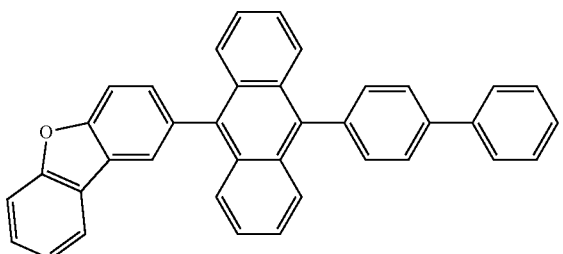

BH-2

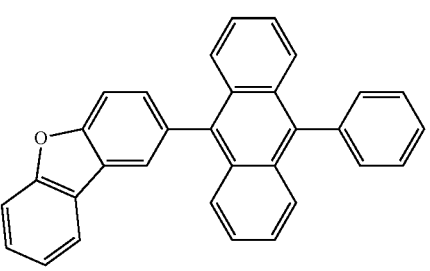

HT

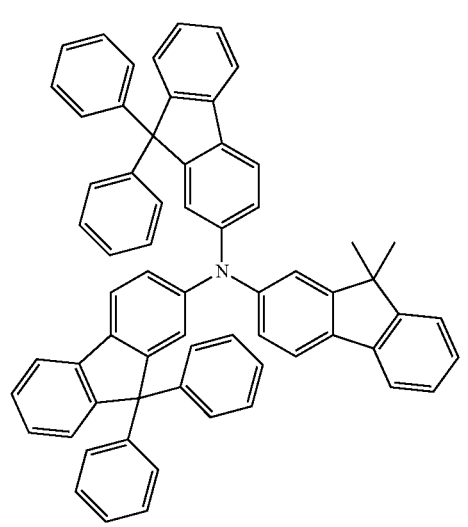

BH-3

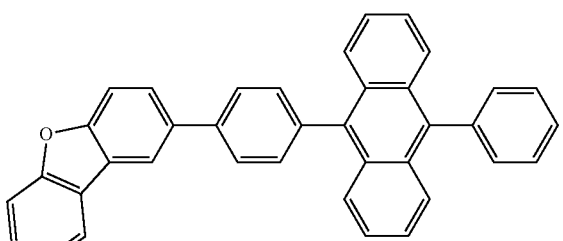

BH-4

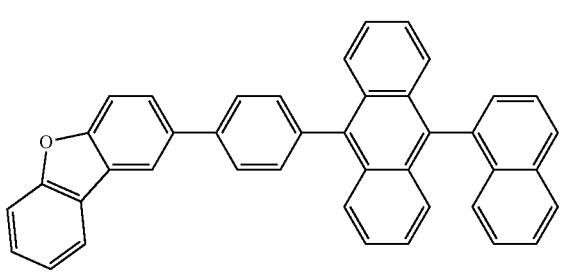

BHC-1
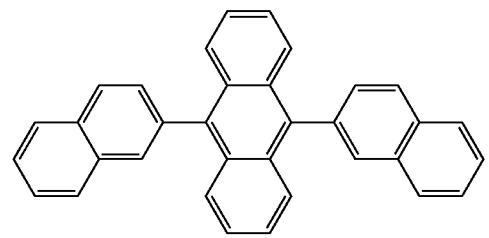
BHC-2
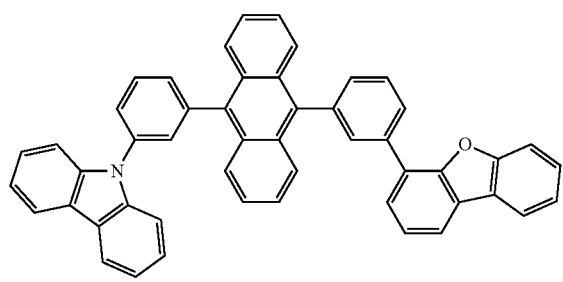
BD
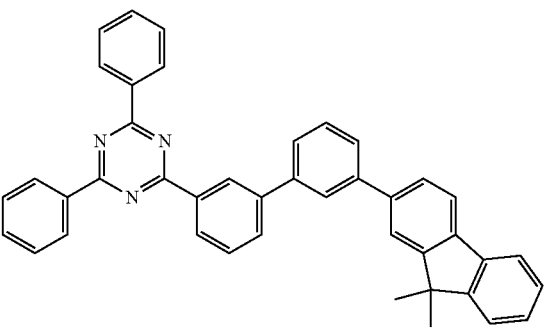
HB-1
HB-2
HB-3
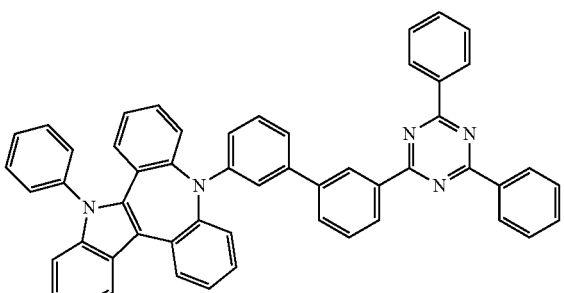
HB-4
HB-5
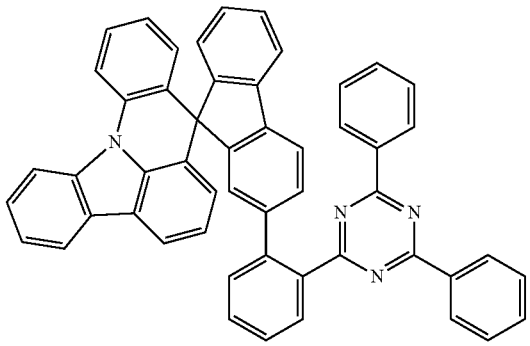
E-1
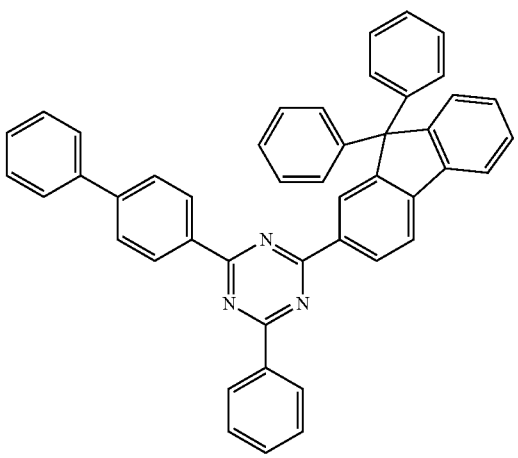

-continued
E-2
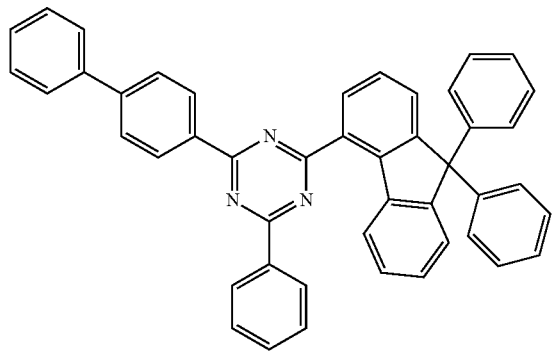
E-3
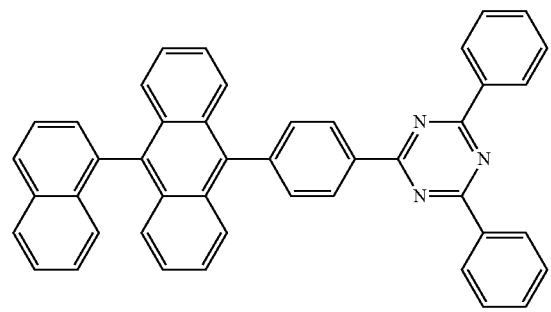
E-4
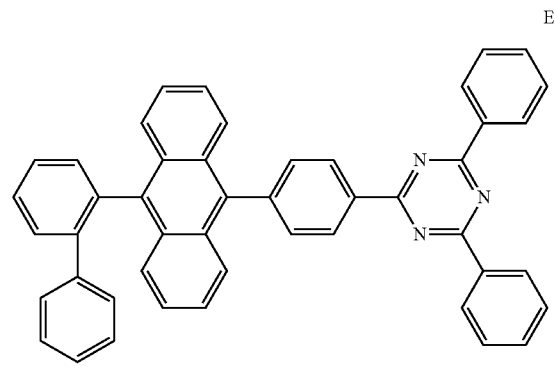
E-5
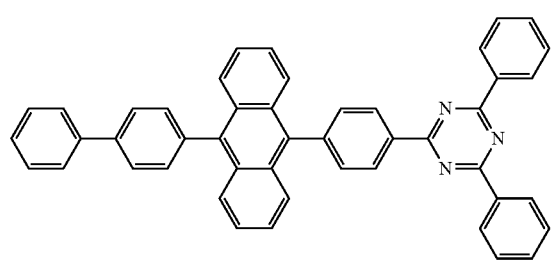
-continued
E-6
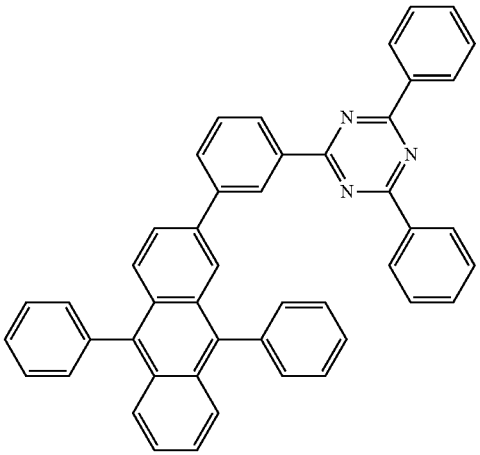
E-7
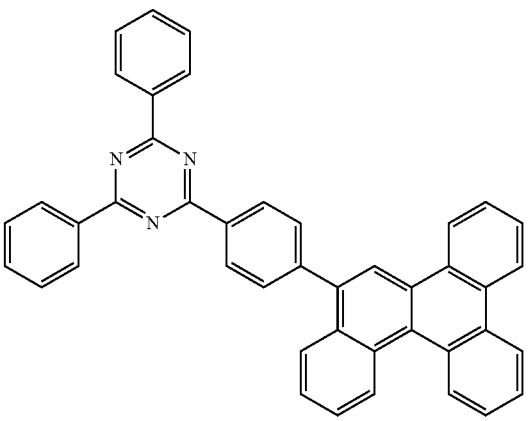
E-8
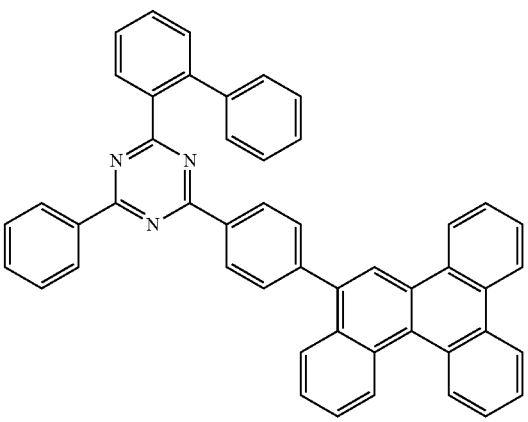
E-9
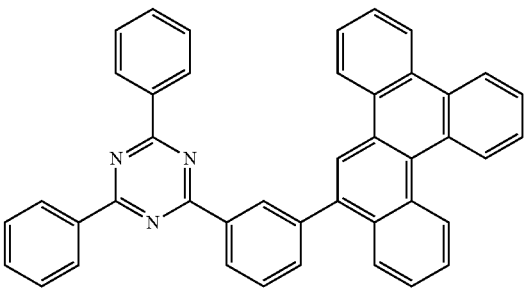

-continued

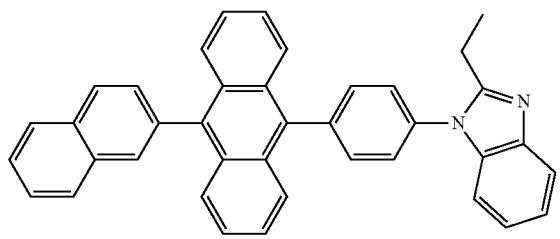
EC-1

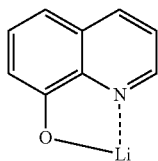
Liq

From the results of Table 1, it can be seen that the devices of Examples 1 to 9 in which the compound represented by the formula (1) was used for the electron injection layer and the compound represented by the formula (10) was used as the host material of the emitting layer, have a high external quantum efficiency EQE and an improved device life.

In contrast, Comparative Examples 1 and 2 in which the compound represented by the formula (1) is not used in the electron injection layer have poor external quantum efficiency EQE and short device life.

In Comparative Examples 3 and 4 in which the organic layer between the cathode and the emitting layer is one layer, it can be seen that the external quantum efficiency EQE is inferior even if the compound represented by the formula (1) is used.

It can be seen that even if the organic layer between the cathode and the emitting layer is two layers, the external quantum efficiency EQE is inferior also in Comparative Example 5 in which the materials of the electron-transport layer and the electron-injection layer are exchanged.

It can be seen that in Comparative Examples 6 and 7 in which the compound represented by the formula (10) is not used as the host material of the emitting layer, the external quantum efficiency EQE and the device life are significantly inferior.

TABLE 1

| No. | Hole-injecting layer | 1st hole-transporting layer | 2nd hole-transporting layer | Emitting layer Host | Emitting layer Dopant | 1st electron-transporting layer | 2nd electron-transporting layer | EQE (%) | LT95 (hr) |
|---|---|---|---|---|---|---|---|---|---|
| Example-1 | HT:HI | HT | EB | Compound BH-1 | BD | HB-1 | Compound E-1:Liq | 10.5 | 88 |
| Example-2 | HT:HI | HT | EB | Compound BH-1 | BD | HB-1 | Compound E-2:Liq | 10.4 | 90 |
| Example-3 | HT:HI | HT | EB | Compound BH-1 | BD | HB-1 | Compound E-3:Liq | 10.3 | 121 |
| Example-4 | HT:HI | HT | EB | Compound BH-1 | BD | HB-1 | Compound E-4:Liq | 10.3 | 118 |
| Example-5 | HT:HI | HT | EB | Compound BH-1 | BD | HB-1 | Compound E-5:Liq | 10.3 | 112 |
| Example-6 | HT:HI | HT | EB | Compound BH-1 | BD | HB-1 | Compound E-6:Liq | 10.4 | 109 |
| Example-7 | HT:HI | HT | EB | Compound BH-1 | BD | HB-1 | Compound E-7:Liq | 10.3 | 97 |
| Example-8 | HT:HI | HT | EB | Compound BH-1 | BD | HB-1 | Compound E-8:Liq | 10.3 | 103 |
| Example-9 | HT:HI | HT | EB | Compound BH-1 | BD | HB-1 | Compound E-9:Liq | 10.3 | 111 |
| Comp. Ex-1 | HT:HI | HT | EB | Compound BH-1 | BD | HB-1 | Comp. Compound EC-1:Liq | 9.7 | 59 |
| Comp. Ex-2 | HT:HI | HT | EB | Compound BH-1 | BD | HB-2 | Comp. Compound EC-1:Liq | 9.7 | 53 |
| Comp. Ex-3 | HT:HI | HT | EB | Compound BH-1 | BD | Compound E-1 | | 8.2 | — |
| Comp. Ex-4 | HT:HI | HT | EB | Compound BH-1 | BD | Compound E-1:Liq | | 9.0 | — |
| Comp. Ex-5 | HT:HI | HT | EB | Compound BH-1 | BD | Compound E-1 | HB-1:Liq | 9.1 | — |
| Comp. Ex-6 | HT:HI | HT | EB | Comp. Compound BHC-1 | BD | HB-1 | Compound E-1:Liq | 7.2 | 10 |
| Comp. Ex-7 | HT:HI | HT | EB | Comp. Compound BHC-2 | BD | HB-1 | Compound E-1:Liq | 8.4 | 34 |

TABLE 2

| No. | Hole-injecting layer | 1st hole-transporting layer | 2nd hole-transporting layer | Emitting layer Host | Emitting layer Dopant | 1st electron-transporting layer | 2nd electron-transporting layer | EQE (%) | LT95 (hr) |
|---|---|---|---|---|---|---|---|---|---|
| Example-10 | HT:HI | HT | EB | Compound BH-1 | BD | HB-2 | Compound E-1:Liq | 10.7 | 81 |
| Example-11 | HT:HI | HT | EB | Compound BH-1 | BD | HB-2 | Compound E-2:Liq | 10.7 | 84 |
| Example-12 | HT:HI | HT | EB | Compound BH-1 | BD | HB-2 | Compound E-3:Liq | 10.5 | 110 |
| Example-13 | HT:HI | HT | EB | Compound BH-1 | BD | HB-2 | Compound E-4:Liq | 10.5 | 111 |
| Example-14 | HT:HI | HT | EB | Compound BH-1 | BD | HB-2 | Compound E-5:Liq | 10.4 | 104 |
| Example-15 | HT:HI | HT | EB | Compound BH-1 | BD | HB-2 | Compound E-6:Liq | 10.5 | 106 |
| Example-16 | HT:HI | HT | EB | Compound BH-1 | BD | HB-2 | Compound E-7:Liq | 10.5 | 88 |
| Example-17 | HT:HI | HT | EB | Compound BH-1 | BD | HB-2 | Compound E-8:Liq | 10.4 | 85 |
| Example-18 | HT:HI | HT | EB | Compound BH-1 | BD | HB-2 | Compound E-9:Liq | 10.4 | 98 |
| Comp. Ex.-2 | HT:HI | HT | EB | Compound BH-1 | BD | HB-2 | Comp. Compound EC-1:Liq | 9.7 | 53 |

From the results of Table 2, it can be seen that in Examples 10 to 18, the external quantum efficiency EQE is high and the device life is improved even if the electron-transport layer material different from those in Examples B to 9 is used.

In contrast, in Comparative Example in which only the material of the electron-injection layer is changed to Compound EC-1 which is not the compound represented by the formula (1), it can be seen that the device life is short.

TABLE 3

| No. | Hole-injecting layer | 1st hole-transporting layer | 2nd hole-transporting layer | Emitting layer Host | Emitting layer Dopant | 1st electron-transporting layer | 2nd electron-transporting layer | EQE (%) | L195 (hr) |
|---|---|---|---|---|---|---|---|---|---|
| Example-19 | HT:HI | HT | EB | Compound BH-2 | BD | HB-1 | Compound E-1:Liq | 9.9 | 116 |
| Example-20 | HT:HI | HT | EB | Compound BH-2 | BD | HB-1 | Compound E-2:Liq | 9.9 | 120 |
| Example-21 | HT:HI | HT | EB | Compound BH-2 | BD | HB-1 | Compound E-3:Liq | 10.0 | 135 |
| Example-22 | HT:HI | HT | EB | Compound BH-3 | BD | HB-1 | Compound E-1:Liq | 10.0 | 93 |
| Example-23 | HT:HI | HT | EB | Compound BH-3 | BD | HB-1 | Compound E-2:Liq | 10.1 | 89 |
| Example-24 | HT:HI | HT | EB | Compound BH-3 | BD | HB-1 | Compound E-3:Liq | 10.1 | 106 |
| Example-25 | HT:HI | HT | EB | Compound BH-4 | BD | HB-1 | Compound E-1:Liq | 10.4 | 85 |
| Example-26 | HT:HI | HT | EB | Compound BH-4 | BD | HB-1 | Compound E-2:Liq | 10.4 | 87 |
| Example-27 | HT:HI | HT | EB | Compound BH-4 | BD | HB-1 | Compound E-3:Liq | 10.3 | 99 |
| Comp. Ex.-1 | HT:HI | HT | EB | Compound BH-1 | BD | HB-1 | Comp. Compound EC-1:Liq | 9.7 | 59 |
| Comp. Ex.-6 | HT:HI | HT | EB | Comp. Compound BHC-1 | BD | HB-1 | Compound E-1:Liq | 7.2 | 10 |
| Comp. Ex.-7 | HT:HI | HT | EB | Comp. Compound BHC-2 | BD | HB-1 | Compound E-1:Liq | 8.4 | 34 |

From the results of Table 3, in Examples 19 to 27 in which the material of the electron-injection layer is the compound represented by the formula (1) and the host material of the emitting layer is the compound represented by the formula (10), it can be seen that the efficiency EQE is high and the device life is improved.

TABLE 4

| No. | Hole-injecting layer | 1st hole-transporting layer | 2nd hole-transporting layer | Emitting layer Host | Emitting layer Dopant | 1st electron-transporting layer | 2nd electron-transporting layer | EQE (%) | LT95 (hr) |
|---|---|---|---|---|---|---|---|---|---|
| Example-28 | HT:HI | HT | EB | Compound BH-1 | BD | HB-3 | Compound E-1:Liq | 10.7 | 97 |
| Example-29 | HT:HI | HT | EB | Compound BH-1 | BD | HB-3 | Compound E-2:Liq | 10.5 | 105 |
| Example-30 | HT:HI | HT | EB | Compound BH-1 | BD | HB-3 | Compound E-4:Liq | 10.4 | 114 |
| Example-31 | HT:HI | HT | EB | Compound BH-1 | BD | HB-3 | Compound E-8:Liq | 10.3 | 108 |
| Example-32 | HT:HI | HT | EB | Compound BH-1 | BD | HB-4 | Compound E-1:Liq | 10.4 | 98 |
| Example-33 | HT:HI | HT | EB | Compound BH-1 | BD | HB-4 | Compound E-2:Liq | 10.5 | 99 |
| Example-34 | HT:HI | HT | EB | Compound BH-1 | BD | HB-4 | Compound E-4:Liq | 10.5 | 110 |
| Example-35 | HT:HI | HT | EB | Compound BH-1 | BD | HB-4 | Compound E-8:Liq | 10.4 | 112 |
| Example-36 | HT:HI | HT | EB | Compound BH-1 | BD | HB-5 | Compound E-1:Liq | 10.6 | 92 |
| Example-37 | HT:HI | HT | EB | Compound BH-1 | BD | HB-5 | Compound E-2:Liq | 10.5 | 89 |
| Example-38 | HT:HI | HT | EB | Compound BH-1 | BD | HB-5 | Compound E-4:Liq | 10.6 | 97 |
| Example-39 | HT:HI | HT | EB | Compound BH-1 | BD | HB-5 | Compound E-8:Liq | 10.5 | 95 |

From the results of Table 4, in Examples 28 to 39 in which the material of the electron-injection layer is the compound represented by the formula (1) and the host material of the emitting layer is the compound represented by the formula (10), it can be seen that the efficiency EQE is high and the device life is improved.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An organic electroluminescence device, comprising:

an anode, an emitting layer, a first electron-transporting layer, a second electron-transporting layer and a cathode in this order, wherein the first electron-transporting layer comprises a compound represented by the following formula (30):

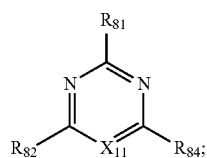

the second electron-transporting layer comprises a compound represented by the following formula (1):

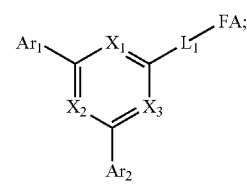

the second electron-transporting layer further comprises one or two or more selected from the group consisting of an alkali metal, an alkaline earth metal, a rare earth metal, an alkali metal oxide, an alkali metal halide, an alkaline earth metal oxide, an alkaline earth metal halide, a rare earth metal oxide, a rare earth metal halide, an alkali metal-containing organic complex, an alkaline earth metal-containing organic complex, and a rare earth metal-containing organic complex; and the emitting layer comprises a compound represented by the following formula (10):

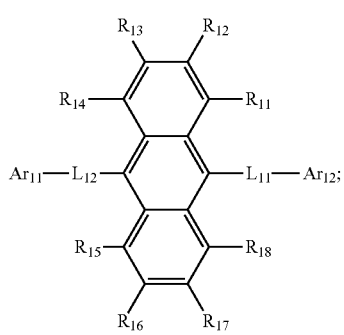

wherein in the formula (1),

FA is a substituted or unsubstituted fused aryl group including 13 to 50 ring carbon atoms and FA does not comprise a substituted or unsubstituted fluorenyl group, which is formed by condensing three or more hydrocarbon rings;

$L_1$ is a single bond, or selected from the group consisting of a substituted or unsubstituted phenylene group,
a substituted or unsubstituted biphenylene group,
a substituted or unsubstituted terphenylene group,
a substituted or unsubstituted quarter phenylene group,
an arylene group which is a substituted or unsubstituted condensed ring including 10 to 30 ring carbon atoms, and
a group that 1 to 3 substituted or unsubstituted phenylene groups and 1 to 3 substituted or unsubstituted arylene groups which is a condensed ring including 10 to 30 ring carbon atoms are linked via a single bond, and $L_1$ does not comprise a substituted or unsubstituted fluorenylene group;

$Ar_1$ and $Ar_2$ are independently a substituted or unsubstituted aryl group including 6 to 12 ring carbon atoms, or a substituted or unsubstituted monovalent heterocyclic group including 5 to 30 ring atoms;

$X_1$ to $X_3$ are independently N or $CR_1$;

provided that two or more of $X_1$ to $X_3$ are N; $R_1$ does not form a ring by combining with adjacent $L_1$, $Ar_1$ or $Ar_2$;

$R_1$ is a hydrogen atom, a halogen atom, a substituted or unsubstituted alkyl group including 1 to 20 carbon atoms, a substituted or unsubstituted cycloalkyl group including 3 to 20 carbon atoms, a substituted or unsubstituted aryl group including 6 to 30 ring carbon atoms, or a substituted or unsubstituted monovalent heterocyclic group including 5 to 30 ring atoms;

wherein in the formula (10), $R_{11}$ to $R_{18}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{101}$)($R_{102}$)($R_{103}$),
—C(=O)$R_{104}$,
—COO$R_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms;

$R_{101}$ to $R_{107}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms;

when two or more of each of $R_{101}$ to $R_{107}$ are present, the two or more of each of $R_{101}$ to $R_{107}$ may be the same or different;

provided that at least one of $Ar_{11}$ and $Ar_{12}$ is a monovalent group represented by the following formula (11):

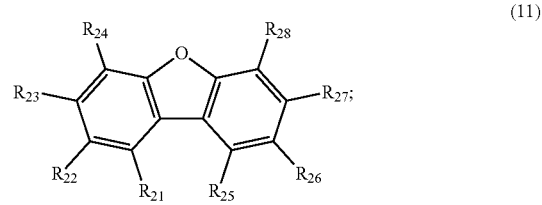

wherein in the formula (11), one of $R_{21}$ to $R_{28}$ is bonded with $L_{11}$ or $L_{12}$; and $R_{21}$ to $R_{28}$ which do not bonded with $L_{11}$ or $L_{12}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{101}$)($R_{102}$)($R_{103}$),
—C(=O)$R_{104}$,
—COO$R_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms;

$R_{101}$ to $R_{107}$ are as defined above:

$Ar_{11}$ or $Ar_{12}$, which is not the monovalent group represented by the formula (11), is an unsubstituted aryl group including 6 to 50 ring carbon atoms, an aryl group including 6 to 50 ring carbon atoms, which is substituted with an unsubstituted alkyl group including 1 to 50 carbon atoms, or an aryl group including 6 to 50 ring carbon atoms, which is substituted with an unsubstituted aryl group including 6 to 50 ring carbon atoms;

$L_{11}$ and $L_{12}$ are independently a single bond, a substituted or unsubstituted alkylene group including 1 to 50 carbon atoms, a substituted or unsubstituted arylene group including 6 to 50 ring carbon atoms, or a substituted or unsubstituted divalent heterocyclic group including 5 to 50 ring atoms; and wherein in the formula (30), $X_{11}$ is a nitrogen atom, CH or $CR_{83}$;

when $X_{11}$ is $CR_{83}$, the adjacent two among $R_{82}$ to $R_{84}$ may be bonded to each other, to form together with the two ring carbon atoms to which they are bonded, a substituted or unsubstituted aromatic hydrocarbon ring including 10 to 30 ring carbon atoms or a substituted or unsubstituted heterocyclic ring including 5 to 32 ring atoms;

$R_{81}$, and $R_{82}$ to $R_{84}$ which do not form the ring are independently a group represented by any one of the following formulas (31) to (34):

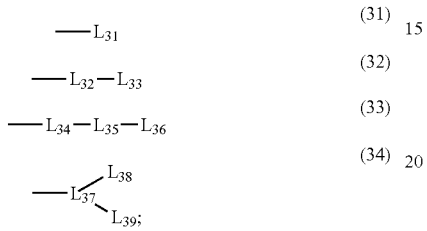

wherein in the formulas (31) to (34), $L_{31}$, $L_{33}$, $L_{36}$, $L_{38}$ and $L_{39}$ are independently a substituted or unsubstituted aryl group including 6 to 30 ring carbon atoms, or a substituted or unsubstituted monovalent heterocyclic group including 5 to 32 ring atoms;

$L_{32}$, $L_{34}$ and $L_{35}$ are independently a substituted or unsubstituted arylene group including 6 to 30 ring carbon atoms, or a substituted or unsubstituted divalent heterocyclic group including 5 to 32 ring atoms;

$L_{37}$ is a substituted or unsubstituted trivalent aromatic hydrocarbon ring group including 6 to 30 ring carbon atoms, or a substituted or unsubstituted trivalent heterocyclic group including 5 to 32 ring atoms.

2. The organic electroluminescence device according to claim 1, wherein FA is an unsubstituted fused aryl group including 13 to 50 ring carbon atoms, which is formed by condensing three or more hydrocarbon rings, a fused aryl group including 13 to 50 ring carbon atoms, which is formed by condensing three or more hydrocarbon rings, and substituted with a substituted or unsubstituted aryl group including 6 to 30 ring carbon atoms, or a fused aryl group including 13 to 50 ring carbon atoms, which is formed by condensing three or more hydrocarbon rings, and substituted with a substituted or unsubstituted monovalent heterocyclic group including 5 to 30 ring atoms.

3. The organic electroluminescence device according to claim 1, wherein FA is an unsubstituted fused aryl group including 13 to 30 ring carbon atoms, which is formed by condensing three or more hydrocarbon rings, or a fused aryl group including 13 to 30 ring carbon atoms, which is formed by condensing three or more hydrocarbon rings, and substituted with a substituted or unsubstituted aryl group including 6 to 30 ring carbon atoms.

4. The organic electroluminescence device according to claim 1, wherein FA is a group selected from the group consisting of a substituted or unsubstituted anthracenyl group, a substituted or unsubstituted phenanthrenyl group, a substituted or unsubstituted fluoranthenyl group, a substituted or unsubstituted triphenylenyl group, a substituted or unsubstituted pyrenyl group, a substituted or unsubstituted chrysenyl group, and a substituted or unsubstituted benzochrysenyl group.

5. The organic electroluminescence device according to claim 1, wherein $L_1$ is a single bond, or a group selected from the group consisting of a substituted or unsubstituted phenylene group, a substituted or unsubstituted biphenylene group, and a substituted or unsubstituted naphthylene group, and in case that $L_1$ has a substituent, the substituent is a substituted or unsubstituted aryl group including 6 to 30 ring carbon atoms or a substituted or unsubstituted monovalent heterocyclic group including 5 to 30 ring atoms, except for a carbazolyl group.

6. The organic electroluminescence device according to claim 1, wherein $L_1$ is a single bond, or a group selected from the group consisting of divalent groups represented by the following formulas (a1) to (a3).

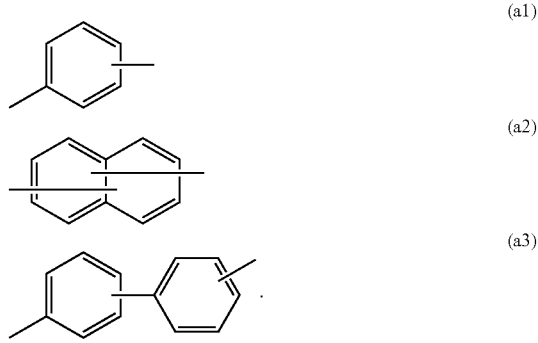

7. The organic electroluminescence device according to claim 1, wherein $L_1$ is a single bond, or a group selected from the group consisting of divalent groups represented by the following formulas (a1-1) to (a1-3).

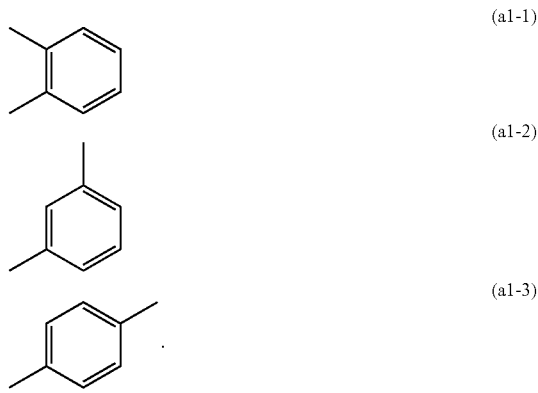

8. The organic electroluminescence device according to claim 1, wherein $L_1$ is a substituted or unsubstituted arylene group including 6 to 12 ring carbon atoms.

9. The organic electroluminescence device according to claim 1, wherein $L_1$ is an unsubstituted arylene group including 6 to 12 ring carbon atoms, an arylene group including 6 to 12 ring carbon atoms, which is substituted with a substituted or unsubstituted aryl group including 6 to 30 ring carbon atoms, or an arylene group including 6 to 12 ring carbon atoms, which is substituted with a substituted or unsubstituted monovalent heterocyclic group including 5 to 12 ring atoms.

10. The organic electroluminescence device according to claim 1, wherein $Ar_1$ and $Ar_2$ are independently a substituted or unsubstituted aryl group including 6 to 12 ring carbon atoms, or a substituted or unsubstituted monovalent heterocyclic group including 5 to 12 ring atoms.

11. The organic electroluminescence device according to claim 1, wherein $Ar_1$ and $Ar_2$ are independently a substituted or unsubstituted aryl group including 6 to 12 ring carbon atoms.

12. The organic electroluminescence device according to claim 1, wherein $Ar_1$ and $Ar_2$ are independently a group selected from the group consisting of monovalent groups represented by the following formulas (b1) to (b3):

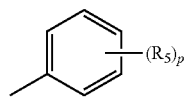
(b1)

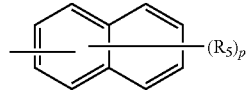
(b2)

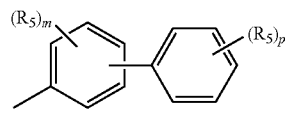
(b3)

wherein in the formulas (b1) to (b3), $R_5$'s are independently a substituent, p's are an integer of 0 to 5, q is an integer of 0 to 7, m is an integer of 0 to 4:

when p, q or m is two or more, plural $R_5$'s may be the same or different, and when p, q or m is two or more, plural $R_5$'s are not bonded with each other to form a ring.

13. The organic electroluminescence device according to claim 1, wherein $Ar_1$ and $Ar_2$ are independently a group selected from the group consisting of monovalent groups represented by the following formulas (b1-1), and (b3-1) to (b3-3):

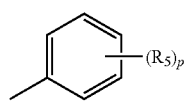
(b1-1)

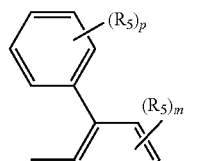
(b3-1)

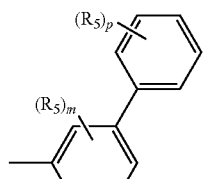
(b3-2)

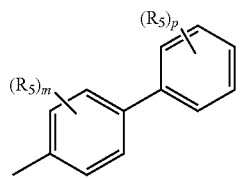
(b3-3)

wherein in the formulas (b1-1), and (b3-1) to (b3-3), $R_5$'s are independently a substituent, p's are an integer of 0 to 5, m's are an integer of 0 to 4:

when p or m is two or more, plural $R_5$'s may be the same or different, and when p or m is two or more, plural $R_5$'s are not bonded with each other to form a ring.

14. The organic electroluminescence device according to claim 1, wherein $X_1$ to $X_3$ are N.

15. The organic electroluminescence device according to claim 1, wherein the compound represented by the formula (1) is represented by the following formula (2):

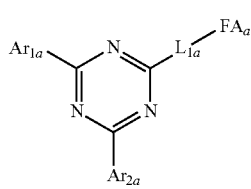
(2)

wherein in the formula (2), $FA_a$ is an unsubstituted fused aryl group including 13 to 50 ring carbon atoms, which is formed by condensing three or more hydrocarbon rings, a fused aryl group including 13 to 50 ring carbon atoms, which is formed by condensing three or more hydrocarbon rings, and substituted with a substituted or unsubstituted aryl group including 6 to 30 ring carbon atoms, or a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;

$L_{1a}$ is a single bond, an unsubstituted arylene group including 6 to 12 ring carbon atoms, an arylene group including 6 to 12 ring carbon atoms, which is substituted with a substituted or unsubstituted aryl group including 6 to 50 ring carbon atoms, or an arylene group including 6 to 12 ring carbon atoms, which is substituted with a substituted or unsubstituted monovalent heterocyclic group including 5 to 50 ring atoms, except for a carbazolyl group;

$Ar_{1a}$ and $Ar_{2a}$ are independently a substituted or unsubstituted aryl group including 6 to 12 ring carbon atoms.

16. The organic electroluminescence device according to claim 1, wherein the compound represented by the formula (1) is represented by the following formula (2-1):

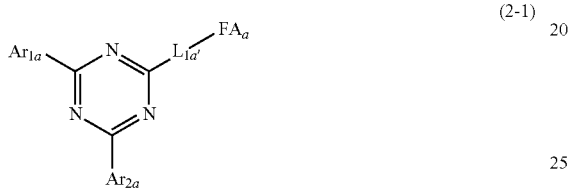

(2-1)

wherein in the formula (2-1), $FA_a$ is an unsubstituted fused aryl group including 13 to 50 ring carbon atoms, which is formed by condensing three or more hydrocarbon rings, a fused aryl group including 13 to 50 ring carbon atoms, which is formed by condensing three or more hydrocarbon rings, and substituted with a substituted or unsubstituted aryl group including 6 to 30 ring carbon atoms, or a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;

$L_{1a'}$ is a single bond or an unsubstituted arylene group including 6 to 12 ring carbon atoms;

$Ar_{1a}$ and $Ar_{2a}$ are independently a substituted or unsubstituted aryl group including 6 to 12 ring carbon atoms.

17. The organic electroluminescence device according to claim 1, wherein the compound represented by the formula (1) is represented by the following formula (3)

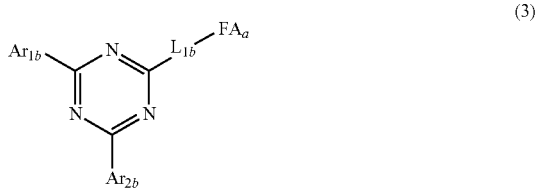

(3)

wherein in the formula (3), $FA_a$ is an unsubstituted fused aryl group including 13 to 50 ring carbon atoms, which is formed by condensing three or more hydrocarbon rings, a fused aryl group including 13 to 50 ring carbon atoms, which is formed by condensing three or more hydrocarbon rings, and substituted with a substituted or unsubstituted aryl group including 6 to 30 ring carbon atoms, or a fused aryl group including 13 to 50 ring carbon atoms, which is formed by condensing three or more hydrocarbon rings, and substituted with a substituted or unsubstituted monovalent heterocyclic group including 5 to 30 ring atoms, except for a carbazolyl group;

$L_{1b}$ is a single bond or a group selected from the group consisting of divalent groups represented by the following formulas (a1) to (a3):

(a1)

(a2)

(a3)

$Ar_{1b}$ and $Ar_{2b}$ are independently a group selected from the group consisting of monovalent groups represented by the following formulas (b1) to (b3):

(b1)

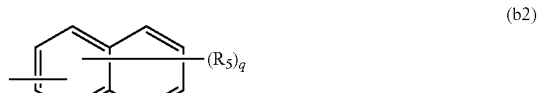

(b2)

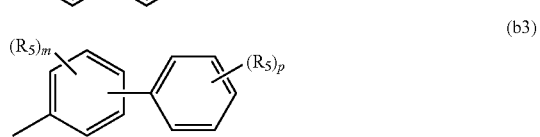

(b3)

wherein in the formulas (b1) to (b3), $R_5$'s are independently a substituent, p's are an integer of 0 to 5, q is an integer of 0 to 7, m is an integer of 0 to 4:

when p, q or m is two or more, plural $R_5$'s may be the same or different, and when p, q or m is two or more, plural $R_5$'s are not bonded with each other to form a ring.

18. The organic electroluminescence device according to claim 1, wherein the compound represented by the formula (1) is represented by the following formula (4):

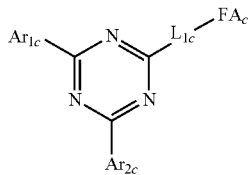
(4)

wherein in the formula (4),

FA$_c$ is a group selected from the group consisting of a substituted or unsubstituted anthracenyl group, a substituted or unsubstituted phenanthrenyl group, a substituted or unsubstituted fluoranthenyl group, a substituted or unsubstituted triphenylenyl group, a substituted or unsubstituted pyrenyl group, a substituted or unsubstituted chrysenyl group, and a substituted or unsubstituted benzochrysenyl group;

L$_{1c}$ is a single bond or a group selected from the group consisting of divalent groups represented by the following formulas (a1-1) to (a1-3):

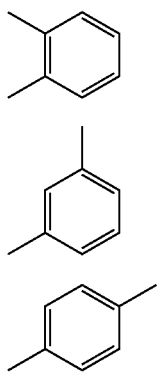

(a1-1)

(a1-2)

(a1-3)

Ar$_{1c}$ and Ar$_{2c}$ are independently a group selected from the group consisting of monovalent groups represented by the following formulas (b1-1), and (b3-1) to (b3-3):

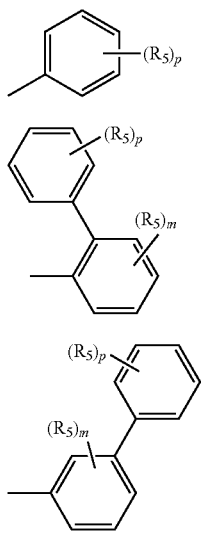

(b1-1)

(b3-1)

(b3-2)

(b3-3)

wherein in the formulas (b1-1), and (b3-1) to (b3-3),

R$_5$'s are independently a substituent, p's are an integer of 0 to 5, m's are an integer of 0 to 4:

when p or m is two or more, plural R$_5$'s may be the same or different, and when p or m is two or more, plural R$_5$'s are not bonded with each other to form a ring.

19. The organic electroluminescence device according to claim 1, wherein the compound represented by the formula (1) is represented by the following formula (5):

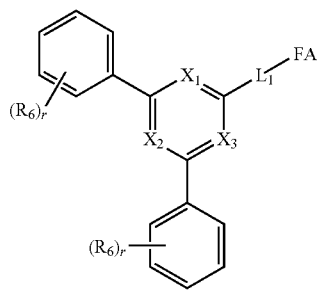

(5)

wherein in the formula (5), FA, L$_1$ and X$_1$ to X$_3$ are the same as in the formula (1);

R$_6$'s are independently a halogen atom, a cyano group, a substituted or unsubstituted alkyl group including 1 to 20 carbon atoms, a substituted or unsubstituted alkoxy group including 1 to 20 carbon atoms, a substituted or unsubstituted aryl group including 6 to 12 carbon atoms, or a substituted or unsubstituted monovalent heterocyclic group including 5 to 12 ring atoms;

r's are independently an integer of 0 to 5; when r is 2 to 5, plural R$_6$'s may be the same or different, and when plural R$_6$'s are present, plural R$_6$'s are not bonded with each other to form a ring.

20. The organic electroluminescence device according to claim 1, wherein the compound represented by the formula (1) is represented by the following formula (6):

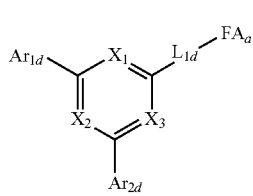

(6)

wherein in the formula (6), X$_1$ to X$_3$ are as defined in the formula (1);

$FA_a$ is
an unsubstituted fused aryl group including 13 to 50 ring carbon atoms, which is formed by condensing three or more hydrocarbon rings,
a fused aryl group including 13 to 50 ring carbon atoms, which is formed by condensing three or more hydrocarbon rings, and substituted with a substituted or unsubstituted aryl group including 6 to 30 ring carbon atoms, or
a fused aryl group including 13 to 50 ring carbon atoms, which is formed by condensing three or more hydrocarbon rings, and substituted with a substituted or unsubstituted monovalent heterocyclic group including 5 to 12 ring atoms;

$L_{1d}$ is
a single bond,
an unsubstituted arylene group including 6 to 12 ring carbon atoms,
an arylene group including 6 to 12 ring carbon atoms, which is substituted with an unsubstituted aryl group including 6 to 30 ring carbon atoms, or
an arylene group including 6 to 12 ring carbon atoms, which is substituted with an unsubstituted monovalent heterocyclic group including 5 to 12 ring atoms;

$Ar_{1d}$ and $Ar_{2d}$ are independently
an unsubstituted aryl group including 6 to 12 ring carbon atoms,
an unsubstituted monovalent heterocyclic group including 5 to 12 ring atoms,
an aryl group including 6 to 12 ring carbon atoms, which is substituted with a substituted or unsubstituted aryl group including 6 to 30 ring carbon atoms,
an aryl group including 6 to 12 ring carbon atoms, which is substituted with a substituted or unsubstituted monovalent heterocyclic group including 5 to 12 ring atoms,
a monovalent heterocyclic group including 5 to 12 ring atoms, which is substituted with a substituted or unsubstituted aryl group including 6 to 30 ring carbon atoms, or
a monovalent heterocyclic group including 5 to 12 ring atoms, which is substituted with a substituted or unsubstituted monovalent heterocyclic group including 5 to 12 ring atoms.

21. The organic electroluminescence device according to claim 1, wherein the substituent in the case of "substituted or unsubstituted" in the formula (1) is selected from the group consisting of an alkyl group including 1 to 50 carbon atoms, an alkenyl group including 2 to 50 carbon atoms, an alkynyl group including 2 to 50 carbon atoms, a cycloalkyl group including 3 to 50 carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, $-Si(R_{41})(R_{42})(R_{43})$, $-C(=O)R_{44}$, $-COOR_{45}$, $-S(=O)_2R_{46}$, $-P(=O)(R_{47})(R_{48})$, $-Ge(R_{49})(R_{50})(R_{51})$, $-N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms, except for a carbazolyl group;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms, and when two or more of each of $R_{41}$ to $R_{53}$ are present, the two or more of each of $R_{41}$ to $R_{53}$ may be the same or different.

22. The organic electroluminescence device according to claim 12, wherein $R_5$ is selected from the group consisting of an alkyl group including 1 to 50 carbon atoms, an alkenyl group including 2 to 50 carbon atoms, an alkynyl group including 2 to 50 carbon atoms, a cycloalkyl group including 3 to 50 carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, $-Si(R_{41})(R_{42})(R_{43})$, $-C(=O)R_{44}$, $-COOR_{45}$, $-S(=O)_2R_{46}$, $-P(=O)(R_{47})(R_{48})$, $-Ge(R_{49})(R_{50})(R_{51})$, $-N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms, except for a carbazolyl group;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms, and when two or more of each of $R_{41}$ to $R_{53}$ are present, the two or more of each of $R_{41}$ to $R_{53}$ may be the same or different.

23. The organic electroluminescence device according to claim 21, wherein the substituent in the case of "substituted or unsubstituted" is selected from the group consisting of an alkyl group including 1 to 50 carbon atoms, an aryl group including 6 to 12 ring carbon atoms, and a monovalent heterocyclic group including 5 to 12 ring atoms.

24. The organic electroluminescence device according to claim 22, wherein $R_5$ is selected from the group consisting of an alkyl group including 1 to 50 carbon atoms, an aryl group including 6 to 12 ring carbon atoms, and a monovalent heterocyclic group including 5 to 12 ring atoms.

25. The organic electroluminescence device according to claim 1, wherein the compound represented by the formula (10) is represented by the following formula (10-1):

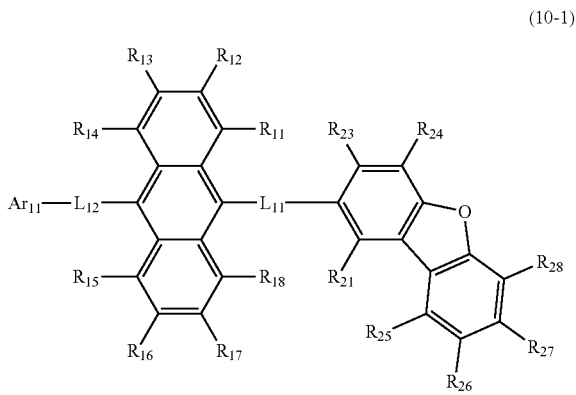

(10-1)

wherein in the formula (10-1), $R_{11}$ to $R_{18}$, $Ar_{11}$, $L_{11}$, $L_{12}$, $R_{21}$, and $R_{23}$ to $R_{28}$ are as defined in the formula (10).

26. The organic electroluminescence device according to claim 1, wherein the compound represented by the formula (10) is represented by the following formula (10-2):

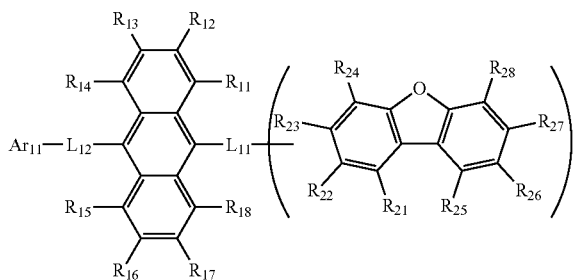

(10-2)

wherein in the formula (10-2), $L_{11}$ is a single bond; $R_{11}$ to $R_{18}$, $Ar_{11}$, $L_{12}$, and $R_{21}$ to $R_{28}$ are as defined in the formula (10).

27. The organic electroluminescence device according to claim 1, wherein the compound represented by the formula (10) is represented by the following formula (10-3):

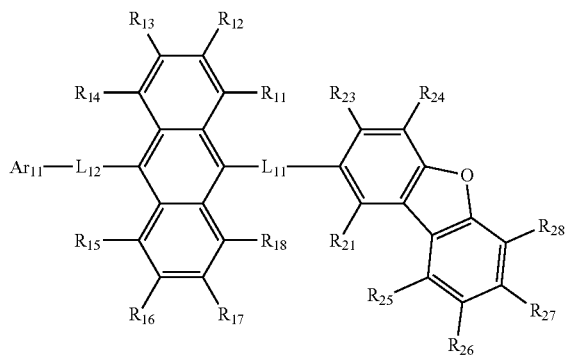

(10-3)

wherein in the formula (10-3), $L_{11}$ is a single bond; $R_{11}$ to $R_{18}$, $Ar_{11}$, $L_{12}$, $R_{21}$, and $R_{23}$ to $R_{28}$ are as defined in the formula (10).

28. The organic electroluminescence device according to claim 1, wherein $R_{21}$ to $R_{28}$ which are not bonded with $L_{11}$ are a hydrogen atom.

29. The organic electroluminescence device according to claim 1, wherein $R_{11}$ to $R_{18}$ are a hydrogen atom.

30. The organic electroluminescence device according to claim 1, wherein the compound represented by the formula (10) is represented by the following formula (10-4):

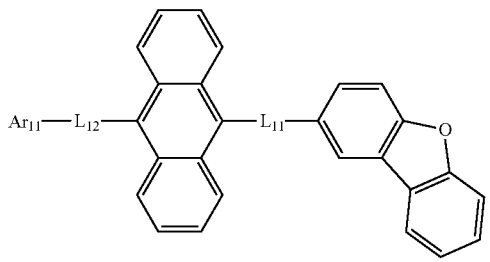

(10-4)

wherein in the formula (10-4), $L_{11}$ is a single bond; $Ar_{11}$ and $L_{12}$ are as defined in the formula (10).

31. The organic electroluminescence device according to claim 1, wherein the substituent in the case of "substituted or unsubstituted" in the formula (10) is selected from the group consisting of an alkyl group including 1 to 50 carbon atoms, an alkenyl group including 2 to 50 carbon atoms, an alkynyl group including 2 to 50 carbon atoms, a cycloalkyl group including 3 to 50 carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, $-Si(R_{41})(R_{42})(R_{43})$, $-C(=O)R_{44}$, $-COOR_{45}$, $-S(=O)_2R_{46}$, $-P(=O)(R_{47})(R_{48})$, $-Ge(R_{49})(R_{50})(R_{51})$, $-N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms, and when two or more of each of $R_{41}$ to $R_{53}$ are present, the two or more of each of $R_{41}$ to $R_{53}$ may be the same or different.

32. The organic electroluminescence device according to claim 31, wherein the substituent in the case of "substituted or unsubstituted" in the formula (10) is selected from the group consisting of an alkyl group including 1 to 50 carbon atoms, an aryl group including 6 to 50 ring carbon atoms, and a monovalent heterocyclic group including 5 to 50 ring atoms.

33. The organic electroluminescence device according to claim 31, wherein the substituent in the case of "substituted or unsubstituted" in the formula (10) is selected from the group consisting of an alkyl group including 1 to 18 carbon atoms, an aryl group including 6 to 18 ring carbon atoms, and a monovalent heterocyclic group including 5 to 18 ring atoms.

34. The organic electroluminescence device according to claim 1, further comprising at least one organic layer between the anode and the emitting layer.

35. The organic electroluminescence device according to claim 1, wherein the emitting layer further comprises one or both of a fluorescent dopant and a phosphorescent dopant.

36. An electronic apparatus, comprising the organic electroluminescence device according to claim 1.

37. An organic electroluminescence device, comprising:

an anode, an emitting layer, a first electron-transporting layer, a second electron-transporting layer and a cathode in this order, wherein the first electron-transporting layer comprises a compound represented by the following formula (30):

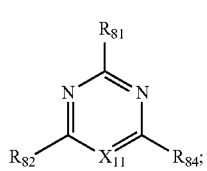

(30)

the second electron-transporting layer comprises a compound represented by the following formula (1):

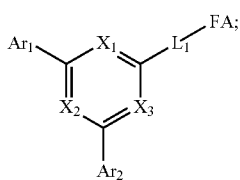

(1)

and
the emitting layer comprises a compound represented by the following formula (10):

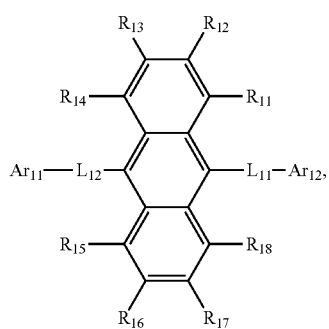

(10)

wherein in the formula (1),
FA is a substituted or unsubstituted fused aryl group including 13 to 50 ring carbon atoms, which is formed by condensing three or more hydrocarbon rings, and FA does not comprise a substituted or unsubstituted fluorenyl group;
$L_1$ is a single bond, or selected from the group consisting of
a substituted or unsubstituted phenylene group,
a substituted or unsubstituted biphenylene group,
a substituted or unsubstituted terphenylene group,
a substituted or unsubstituted quarter phenylene group,
an arylene group which is a substituted or unsubstituted condensed ring including 10 to 30 ring carbon atoms, and
a group that 1 to 3 substituted or unsubstituted phenylene groups and 1 to 3 substituted or unsubstituted arylene groups which is a condensed ring including 10 to 30 ring carbon atoms are linked via a single bond, and $L_1$ does not comprise a substituted or unsubstituted fluorenylene group;
  $Ar_1$ and $Ar_2$ are independently a substituted or unsubstituted aryl group including 6 to 12 ring carbon atoms, or a substituted or unsubstituted monovalent heterocyclic group including 5 to 30 ring atoms;
  $X_1$ to $X_3$ are independently N or $CR_1$;
  provided that two or more of $X_1$ to $X_3$ are N; $R_1$ does not form a ring by combining with adjacent $L_1$, $Ar_1$ or $Ar_2$;
  $R_1$ is a hydrogen atom, a halogen atom, a substituted or unsubstituted alkyl group including 1 to 20 carbon atoms, a substituted or unsubstituted cycloalkyl group including 3 to 20 carbon atoms, a substituted or unsubstituted aryl group including 6 to 30 ring carbon atoms, or a substituted or unsubstituted monovalent heterocyclic group including 5 to 30 ring atoms;
wherein in the formula (10),
$R_{11}$ to $R_{18}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms,
a substituted or unsubstituted arylthio group including 6 to 50 ring carbon atoms,
a substituted or unsubstituted aralkyl group including 7 to 50 carbon atoms,
—Si($R_{101}$)($R_{102}$)($R_{103}$),
—C(=O)$R_{104}$,
—COOR$_{105}$,
—N($R_{106}$)($R_{107}$),
a halogen atom, a cyano group, a nitro group,
a substituted or unsubstituted aryl group including 6 to 50 carbon atoms, or
a substituted or unsubstituted monovalent heterocyclic group including 5 to 50 ring atoms;
  $R_{101}$ to $R_{107}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms;
  when two or more of each of $R_{101}$ to $R_{107}$ are present, the two or more of each of $R_{101}$ to $R_{107}$ may be the same or different;
  provided that at least one of $Ar_{11}$ and $Ar_{12}$ is a monovalent group represented by the following formula (11):

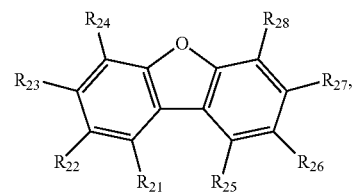

(11)

wherein in the formula (11),
one of $R_{21}$ to $R_{28}$ is bonded with $L_{11}$ or $L_{12}$; and
$R_{21}$ to $R_{28}$ which do not bonded with $L_{11}$ or $L_{12}$ are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted alkoxy group including 1 to 50 carbon atoms,
a substituted or unsubstituted alkylthio group including 1 to 50 carbon atoms,
a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{101}$)($R_{102}$)($R_{103}$),

—C(=O)$R_{104}$,

—COO$R_{105}$,

—N($R_{106}$)($R_{107}$), a halogen atom, a cyano group, a nitro group, a substituted or unsubstituted aryl group including 6 to 50 carbon atoms, or a substituted or unsubstituted monovalent heterocyclic group including 5 to 50 ring atoms;

$R_{101}$ to $R_{107}$ are as defined above:

$Ar_{11}$ or $Ar_{12}$, which is not the monovalent group represented by the formula (11), is an unsubstituted aryl group including 6 to 50 ring carbon atoms, an aryl group including 6 to 50 ring carbon atoms, which is substituted with an unsubstituted alkyl group including 1 to 50 carbon atoms, or an aryl group including 6 to 50 ring carbon atoms, which is substituted with an unsubstituted aryl group including 6 to 50 ring carbon atoms;

$L_{11}$ and $L_{12}$ are independently a single bond, a substituted or unsubstituted alkylene group including 1 to 50 carbon atoms, a substituted or unsubstituted arylene group including 6 to 50 ring carbon atoms, or a substituted or unsubstituted divalent heterocyclic group including 5 to 50 ring atoms; and wherein in the formula (30), $X_{11}$ is a nitrogen atom or CH;

$R_{81}$, $R_{82}$ and $R_{84}$ are independently a group represented by any one of the following formulas (31) to (34):

$$—L_{31} \quad (31)$$

$$—L_{32}—L_{33} \quad (32)$$

$$—L_{34}—L_{35}—L_{36} \quad (33)$$

$$—L_{37}\begin{matrix}L_{38}\\L_{39}\end{matrix} \quad (34)$$

wherein in the formulas (31) to (34), $L_{31}$, $L_{33}$, $L_{36}$, $L_{38}$ and $L_{39}$ are independently a substituted or unsubstituted aryl group including 6 to 30 ring carbon atoms, or a substituted or unsubstituted monovalent heterocyclic group including 5 to 32 ring atoms;

$L_{32}$, $L_{34}$ and $L_{35}$ are independently a substituted or unsubstituted arylene group including 6 to 30 ring carbon atoms, or a substituted or unsubstituted divalent heterocyclic group including 5 to 32 ring atoms;

$L_{37}$ is a substituted or unsubstituted trivalent aromatic hydrocarbon ring group including 6 to 30 ring carbon atoms, or a substituted or unsubstituted trivalent heterocyclic group including 5 to 32 ring atoms.

38. The organic electroluminescence device according to claim 37, wherein in the formula (30), $X_{11}$ is CH.

\* \* \* \* \*

UNITED STATES PATENT AND TRADEMARK OFFICE
CERTIFICATE OF CORRECTION

| | | |
|---|---|---|
| PATENT NO. | : 12,058,930 B2 | Page 1 of 1 |
| APPLICATION NO. | : 16/971244 | |
| DATED | : August 6, 2024 | |
| INVENTOR(S) | : Masuda et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 768 days.

Signed and Sealed this
Fourth Day of February, 2025

Coke Morgan Stewart
*Acting Director of the United States Patent and Trademark Office*